(12) United States Patent
Asai et al.

(10) Patent No.: US 8,288,664 B2
(45) Date of Patent: *Oct. 16, 2012

(54) MULTI-LAYER PRINTED CIRCUIT BOARD AND METHOD OF MANUFACTURING MULTILAYER PRINTED CIRCUIT BOARD

(75) Inventors: Motoo Asai, Ibi-gun (JP); Dongdong Wang, Ibi-gun (JP); Takahiro Mori, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/171,794

(22) Filed: Jul. 11, 2008

(65) Prior Publication Data
US 2008/0277148 A1 Nov. 13, 2008

Related U.S. Application Data

(60) Continuation of application No. 10/921,525, filed on Aug. 19, 2004, now Pat. No. 7,985,930, which is a division of application No. 09/979,388, filed as application No. PCT/JP00/03377 on May 25, 2000, now Pat. No. 6,828,510.

(30) Foreign Application Priority Data

| Jun. 2, 1999 | (JP) | 11-154497 |
| Nov. 17, 1999 | (JP) | 11-326797 |
| Dec. 13, 1999 | (JP) | 11-352659 |
| Dec. 14, 1999 | (JP) | 11-353868 |
| Feb. 10, 2000 | (JP) | 2000-033170 |

(51) Int. Cl.
*H05K 1/11* (2006.01)

(52) U.S. Cl. .................. 174/264; 174/262
(58) Field of Classification Search .......... 174/261, 174/262, 263, 264, 265, 266
See application file for complete search history.

(56) References Cited

U.S. PATENT DOCUMENTS

| 3,471,631 A | 10/1969 | Quintana |
| 4,371,744 A * | 2/1983 | Badet et al. .......... 174/254 |
| 4,769,270 A | 9/1988 | Nagamatsu et al. |
| 4,893,404 A | 1/1990 | Shirahata et al. |
| 4,963,697 A | 10/1990 | Peterson et al. |
| 5,130,179 A | 7/1992 | Miyazaki et al. |
| 5,137,461 A | 8/1992 | Bindra et al. |
| 5,252,195 A | 10/1993 | Kobayashi et al. |
| 5,440,075 A * | 8/1995 | Kawakita et al. .......... 174/265 |
| 5,442,143 A | 8/1995 | Schmidt et al. |

(Continued)

FOREIGN PATENT DOCUMENTS

EP 0 332 889 A2 9/1989
(Continued)

*Primary Examiner* — Ishwarbhai Patel
(74) *Attorney, Agent, or Firm* — Oblon, Spivak, McClelland, Maier & Neustadt, L.L.P.

(57) ABSTRACT

A metal layer 18 is sandwiched between insulating layers 14 and 20 so that required strength is maintained. Hence it follows that the thickness of a core substrate 30 can be reduced and, therefore, the thickness of a multi-layer printed circuit board can be reduced. Formation of non-penetrating openings 22 which reach the metal layer 18 in the insulating layers 14 and 20 is simply required. Therefore, small non-penetrating openings 22 can easily be formed by applying laser beams. Thus, through holes 36 each having a small diameter can be formed.

17 Claims, 70 Drawing Sheets

U.S. PATENT DOCUMENTS

| | | | |
|---|---|---|---|
| 5,478,972 | A | 12/1995 | Mizutani et al. |
| 5,509,200 | A | 4/1996 | Frankeny et al. |
| 5,662,987 | A * | 9/1997 | Mizumoto et al. ............ 428/209 |
| 5,745,333 | A | 4/1998 | Frankeny et al. |
| 5,822,856 | A | 10/1998 | Bhatt et al. |
| 5,987,732 | A | 11/1999 | Lee et al. |
| 6,098,282 | A | 8/2000 | Frankeny et al. |
| 6,121,553 | A | 9/2000 | Shinada et al. |
| 6,127,633 | A | 10/2000 | Kinoshita |
| 6,175,087 | B1 | 1/2001 | Keesler et al. |
| 6,184,477 | B1 | 2/2001 | Tanahashi |
| 6,204,453 | B1 | 3/2001 | Fallon et al. |
| 6,240,636 | B1 | 6/2001 | Asai et al. |
| 6,249,636 | B1 | 6/2001 | Daoud |
| 6,281,448 | B1 * | 8/2001 | Tsukamoto ................... 174/260 |
| 6,300,576 | B1 | 10/2001 | Nakamura et al. |
| 6,444,919 | B1 | 9/2002 | Economikos et al. |
| 6,486,394 | B1 | 11/2002 | Schmidt et al. |
| 6,828,510 | B1 | 12/2004 | Asai et al. |
| 7,985,930 | B2 | 7/2011 | Asai et al. |
| 2005/0039948 | A1 | 2/2005 | Asai et al. |

FOREIGN PATENT DOCUMENTS

| | | |
|---|---|---|
| EP | 0 400 332 A2 | 12/1990 |
| EP | 0 469 308 A1 | 2/1992 |
| EP | 0 800 336 A1 | 10/1997 |
| EP | 0 804 061 A1 | 10/1997 |
| JP | 359078336 A | 5/1984 |
| JP | 4-38079 | 3/1992 |
| JP | 4-144299 | 5/1992 |
| JP | 404314392 A | 11/1992 |
| JP | 6-244529 | 9/1994 |
| JP | 6-277863 | 10/1994 |
| JP | 7-106767 | 4/1995 |
| JP | 8-500467 | 1/1996 |
| JP | 8-64961 | 3/1996 |
| JP | 8-191187 | 7/1996 |
| JP | 9-8460 | 1/1997 |
| JP | 9-130050 | 5/1997 |
| JP | 9-232758 | 9/1997 |
| JP | 9-283933 | 10/1997 |
| JP | 10-154877 A | 6/1998 |
| JP | 10-190230 | 7/1998 |
| JP | 10-209615 | 8/1998 |
| JP | 11-017345 A | 1/1999 |
| JP | 11-87865 | 3/1999 |
| JP | 11-307933 | 11/1999 |
| JP | 11-307936 | 11/1999 |
| JP | 11-330695 | 11/1999 |
| WO | WO93/13637 | 7/1993 |
| WO | WO96/22008 | 7/1996 |

* cited by examiner

Fig. 4
(A)
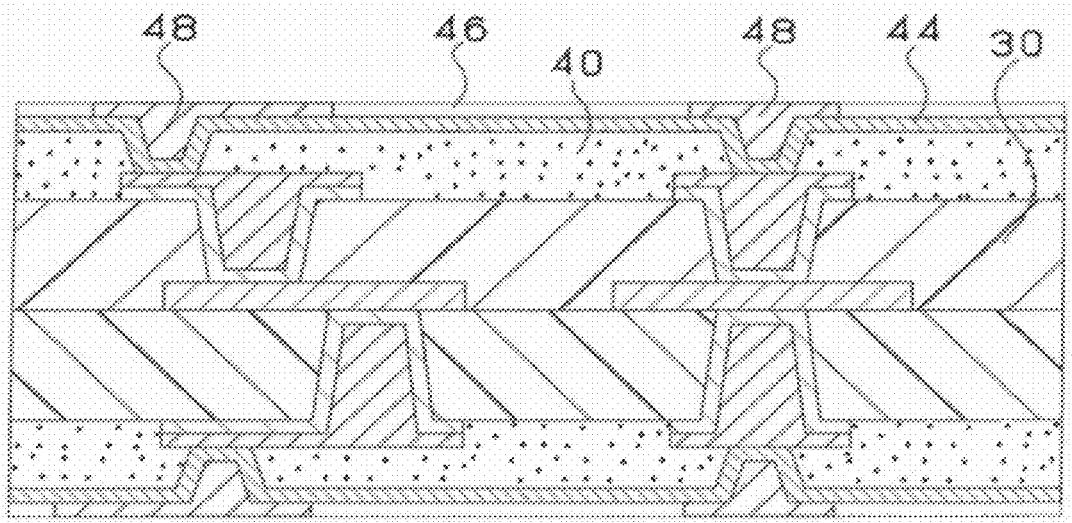
(B)
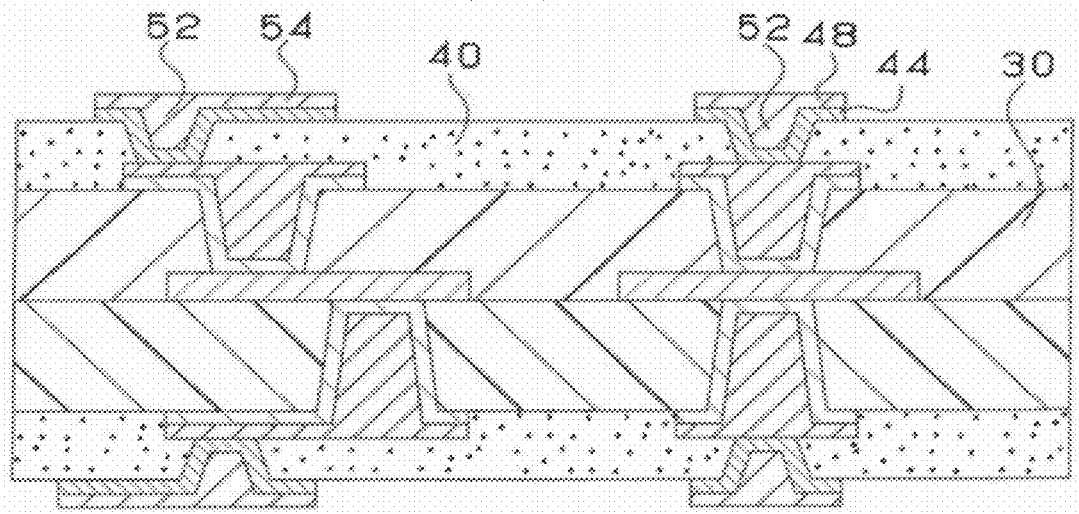

Fig. 5
(A)
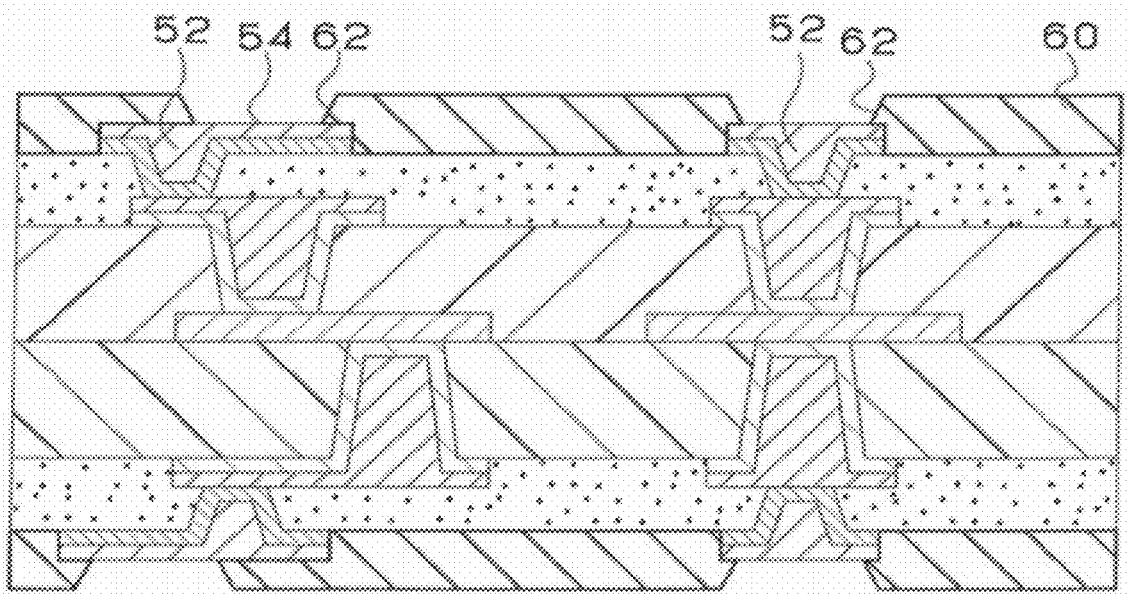
(B)
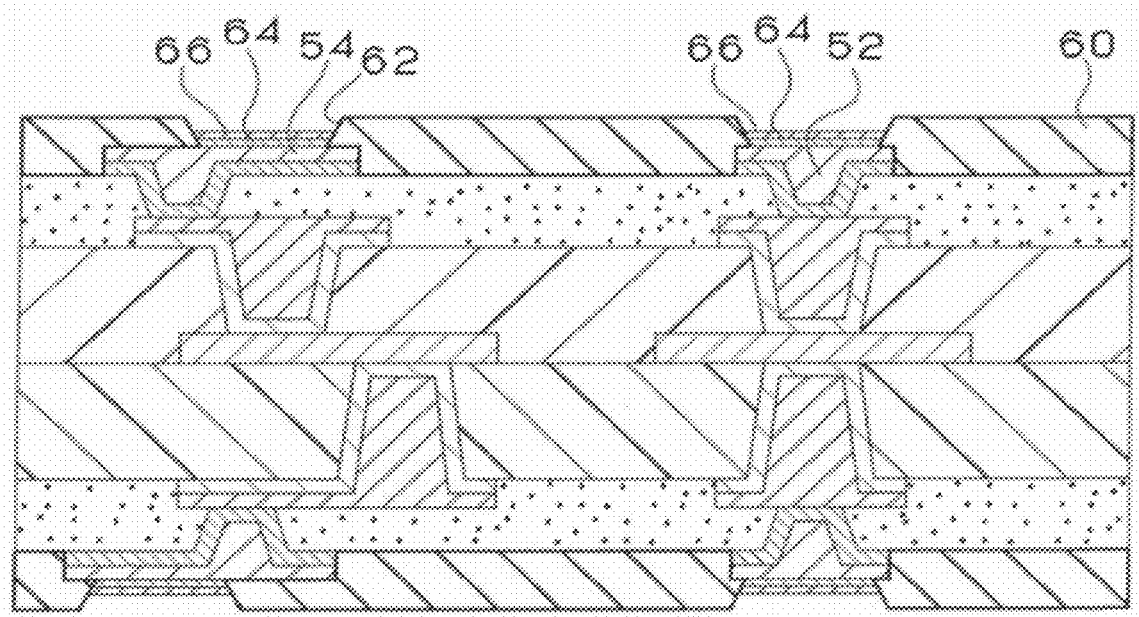

Fig. 7
(A)
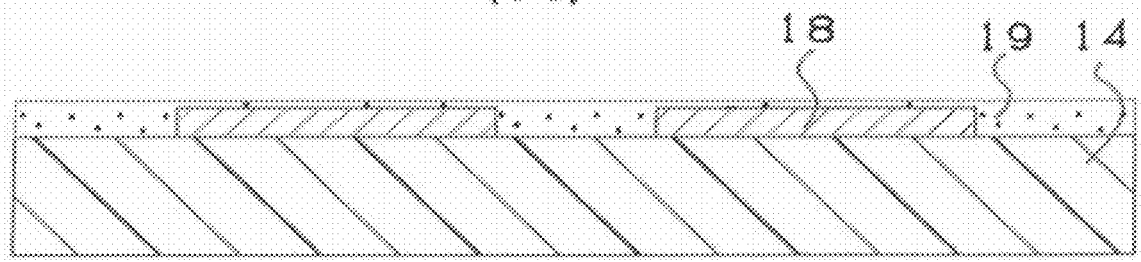
(B)
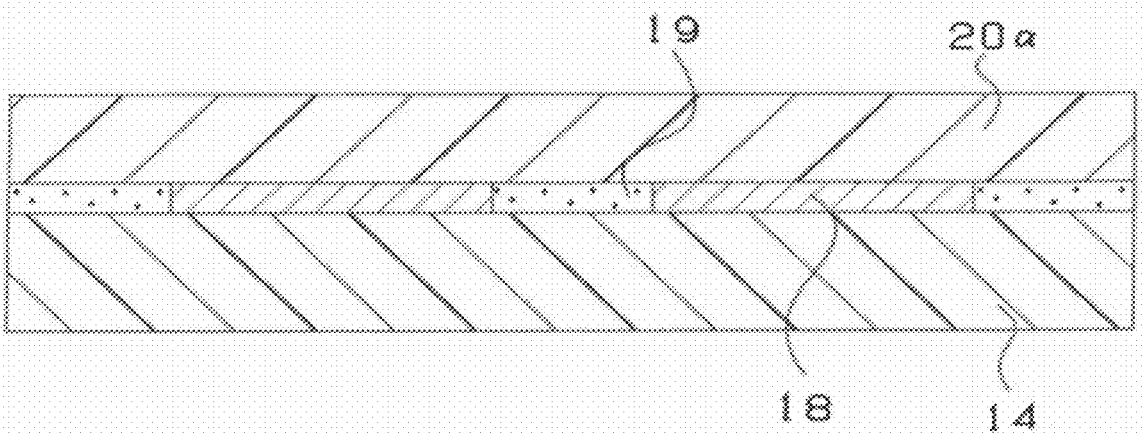

Fig. 8
(A)
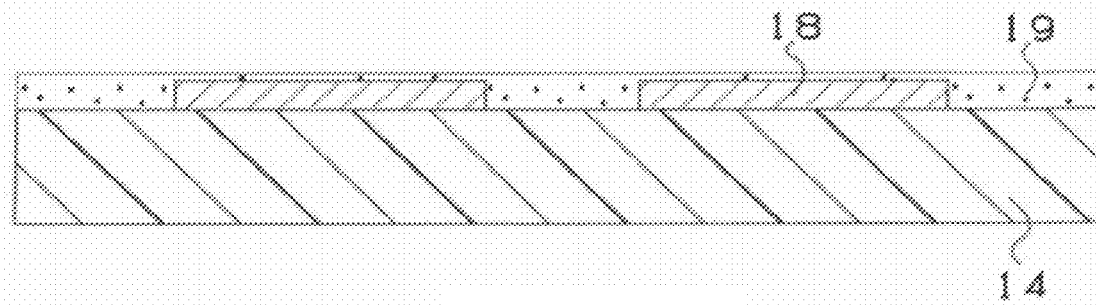
(B)
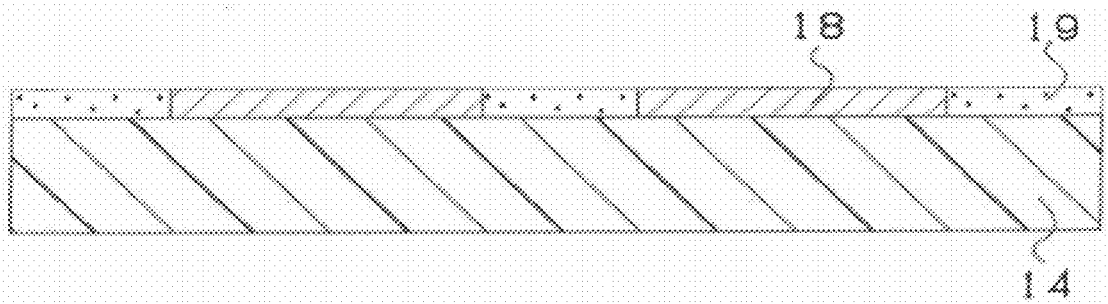
(C)
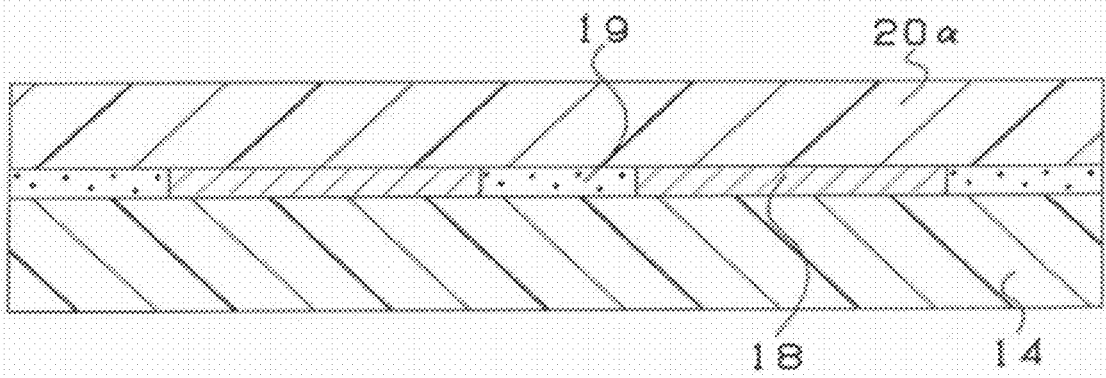

Fig. 9
(A)
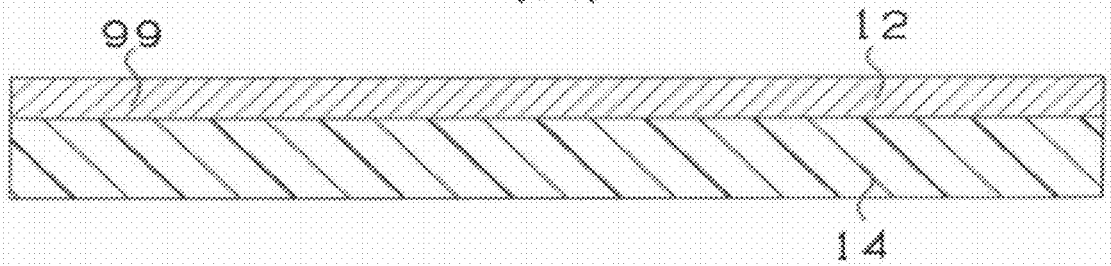
(B)
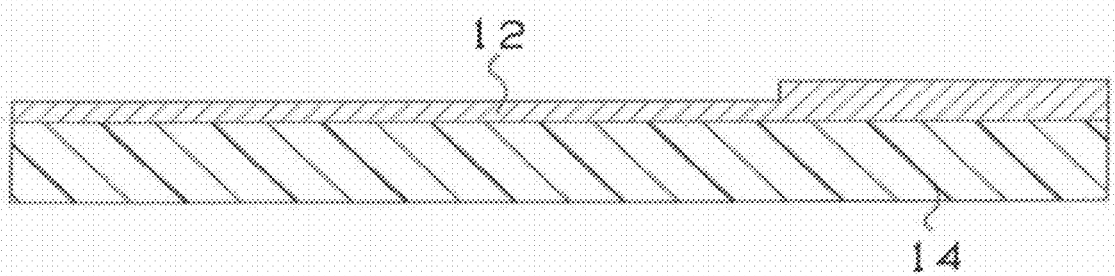
(C)
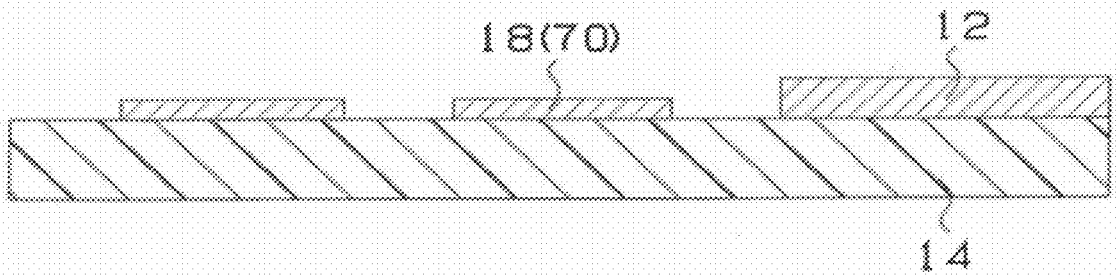

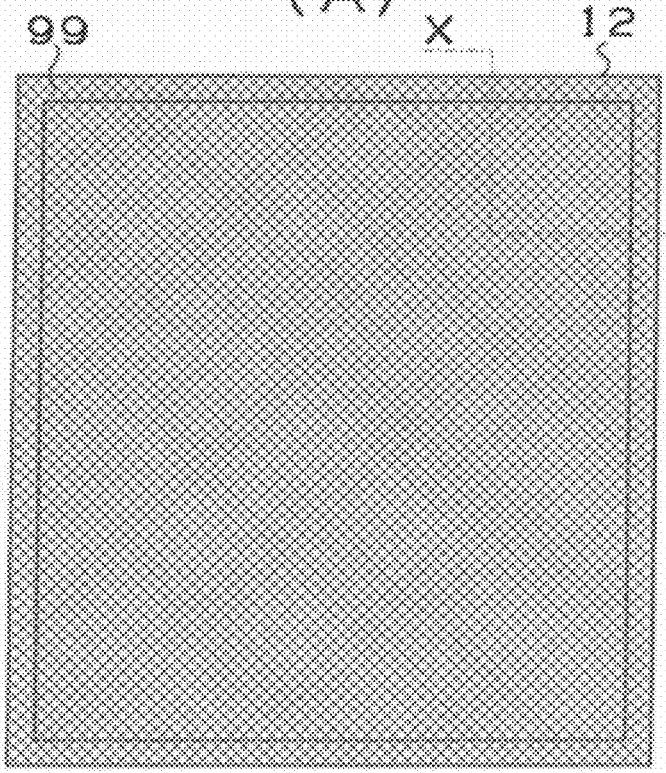
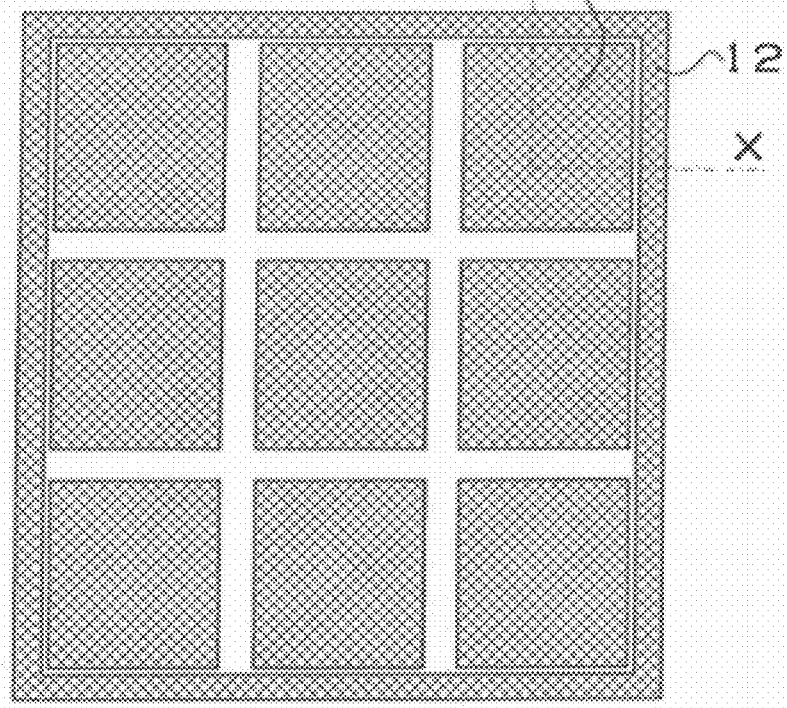
Fig. 10

Fig. 12
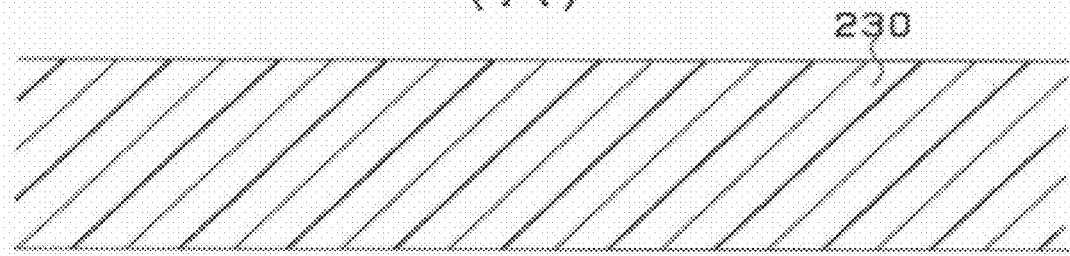
(A)
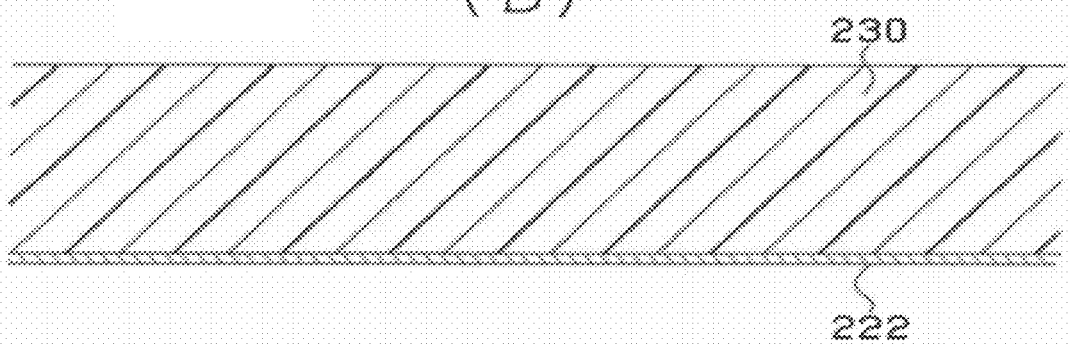
(B)
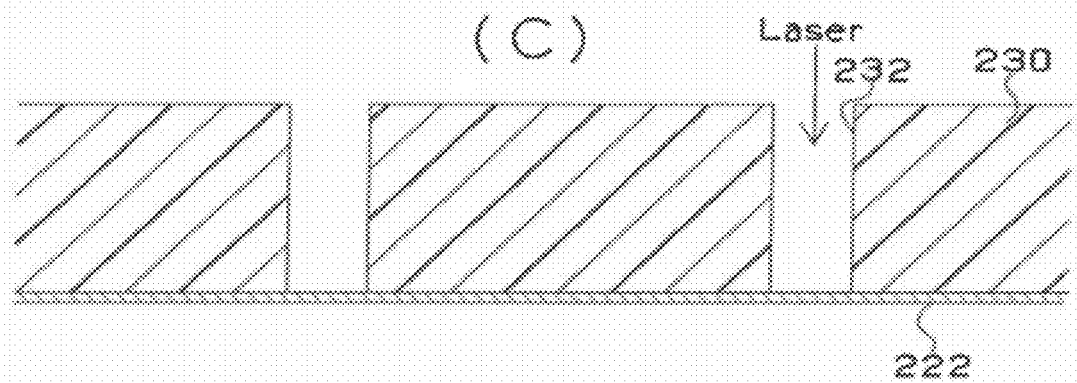
(C)
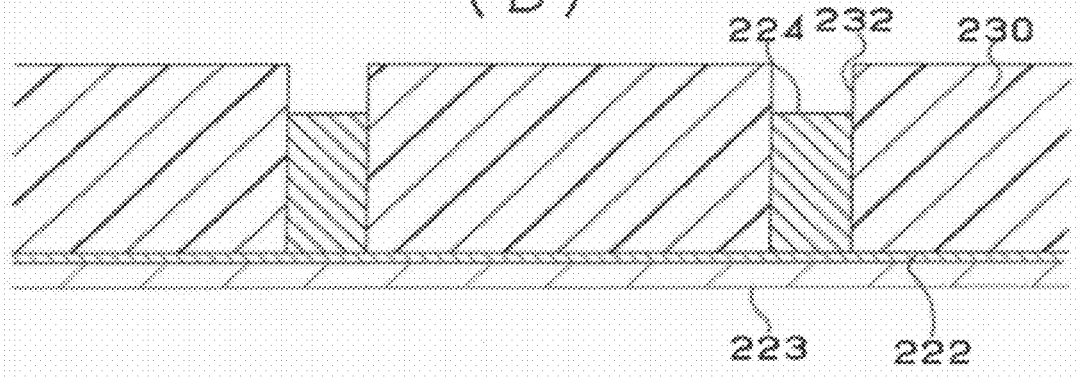
(D)

Fig. 13
(A)
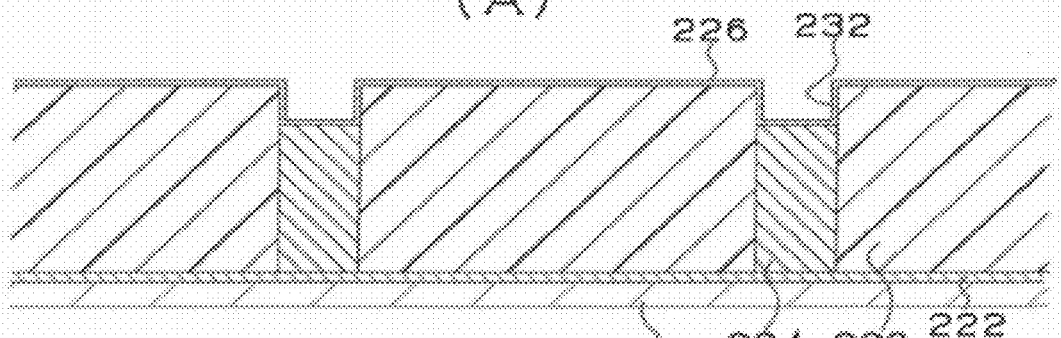
(B)
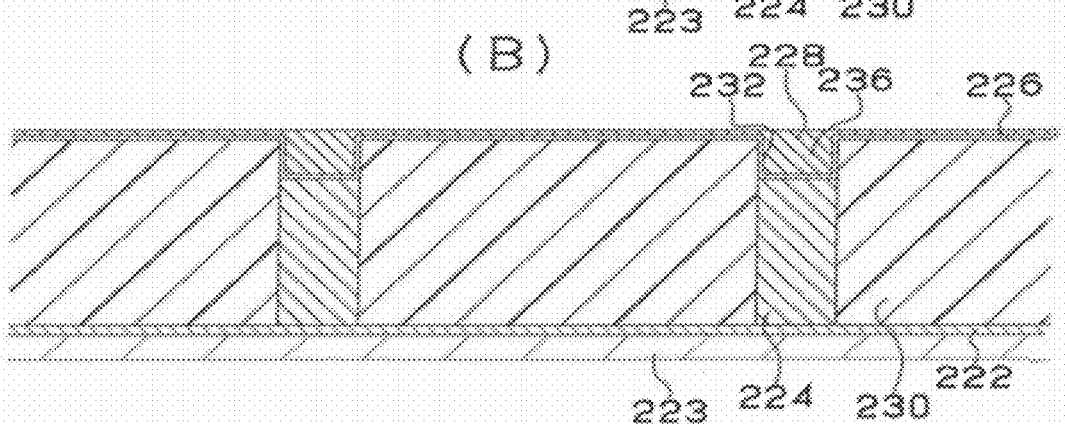
(C)
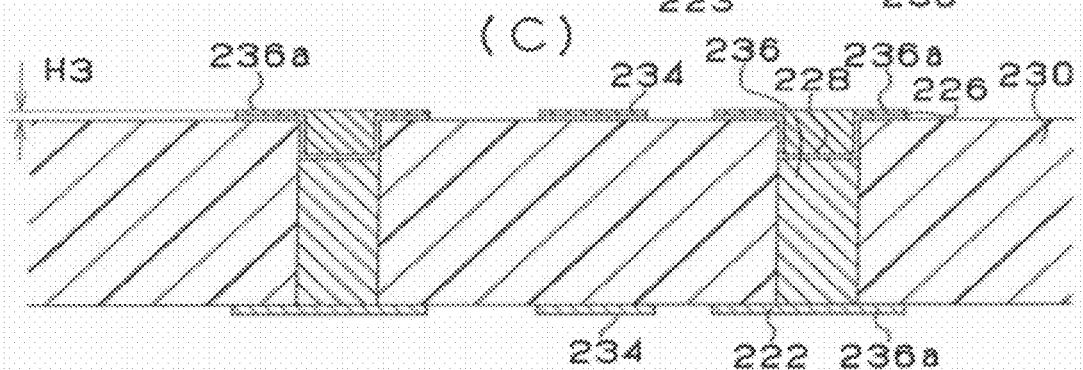
(D)
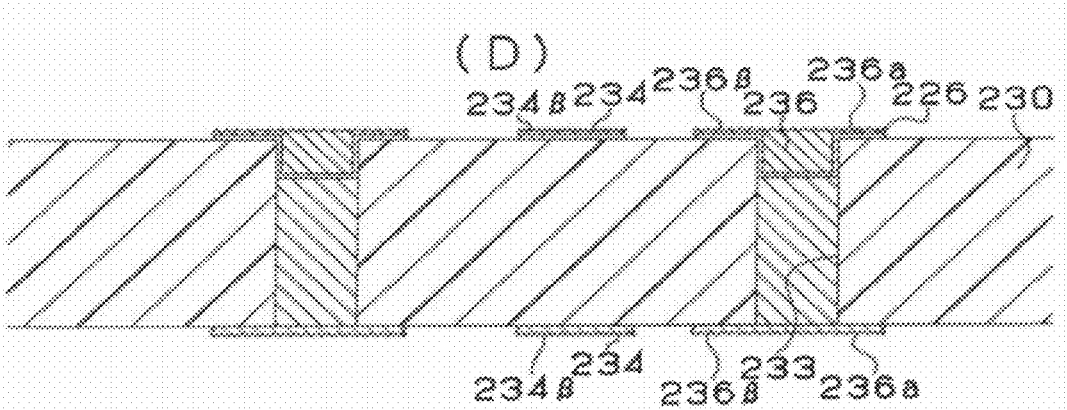

Fig. 14
(A)
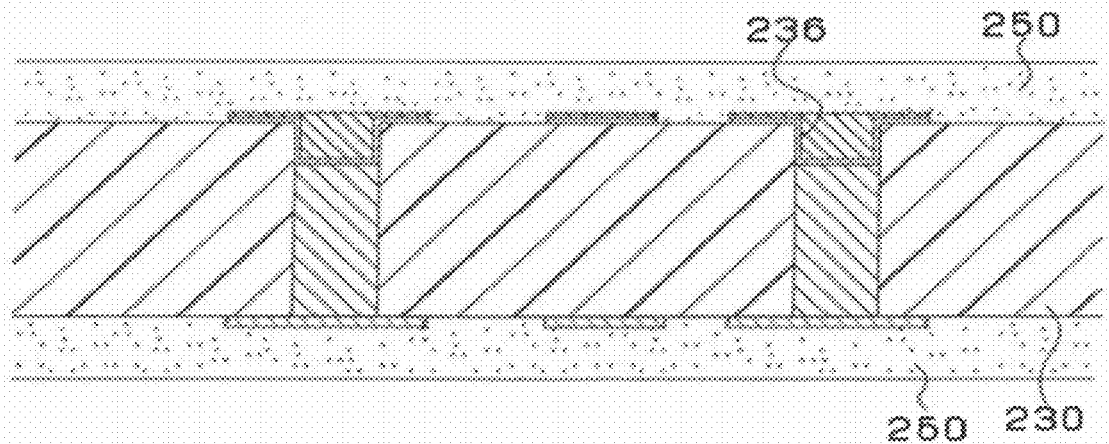
(B)
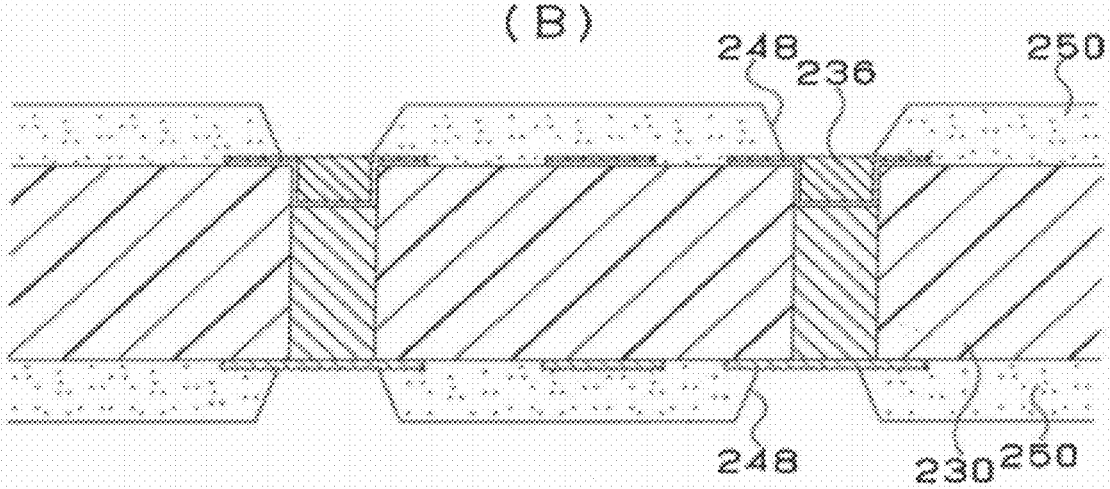
(C)
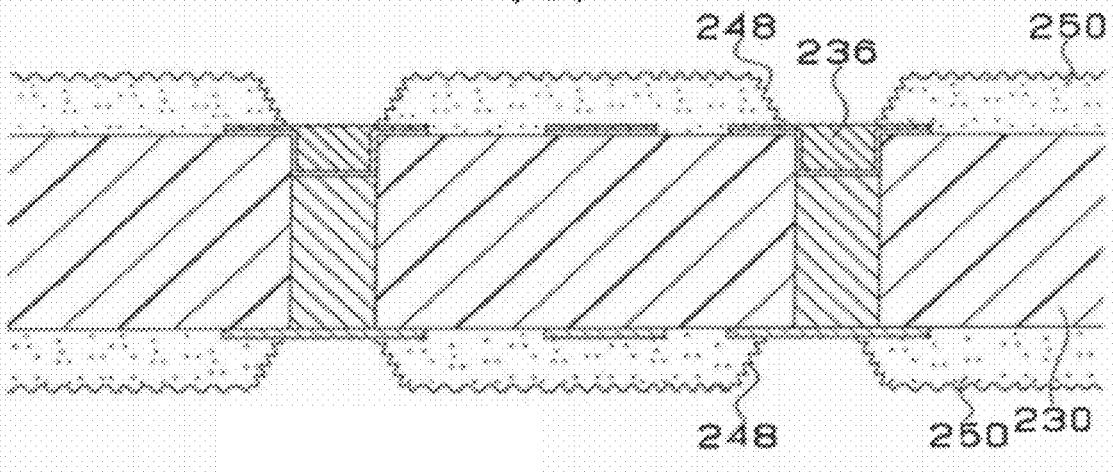

Fig. 15
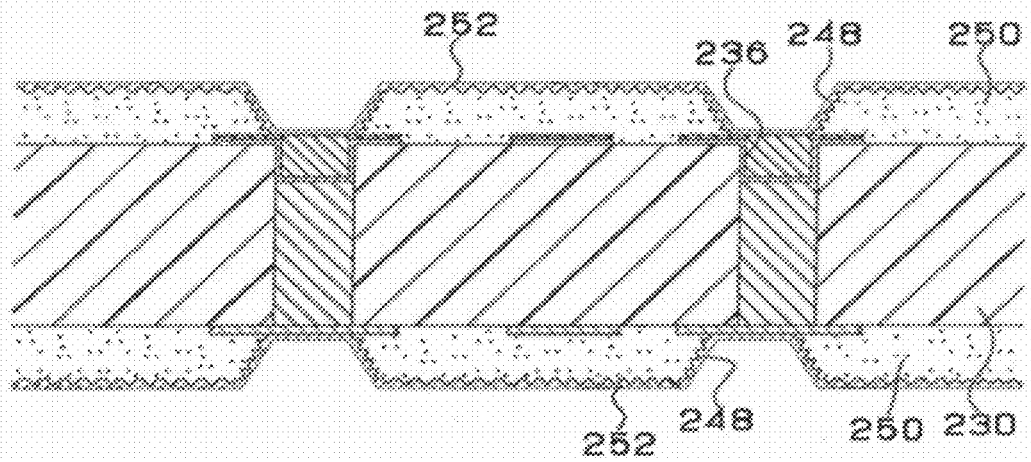
(A)
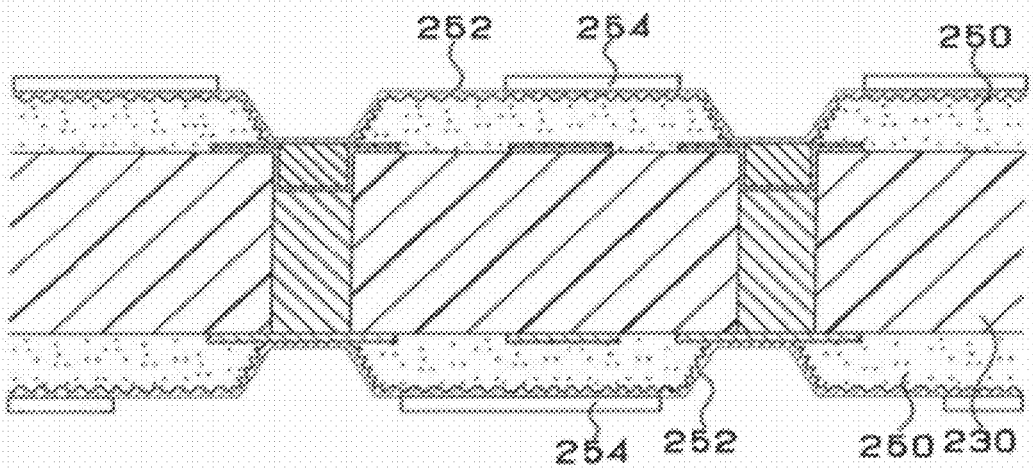
(B)
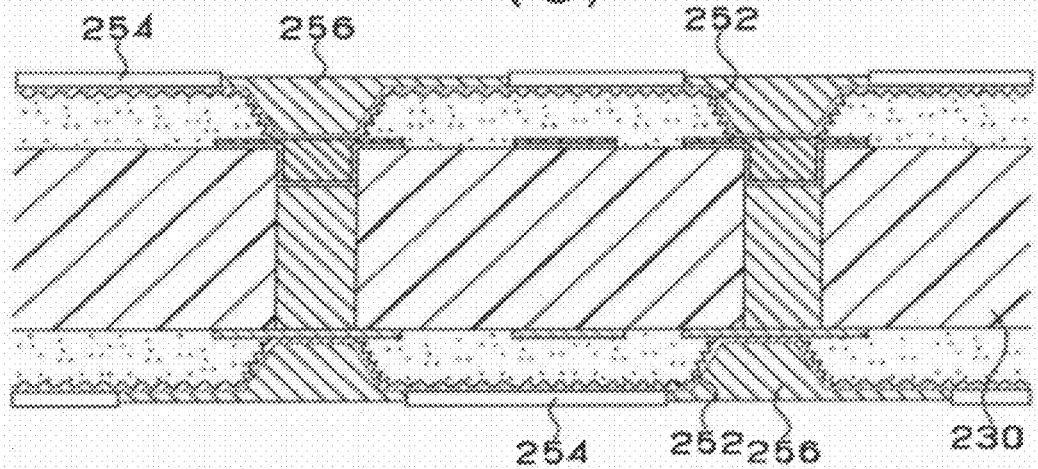
(C)

Fig. 16
(A)
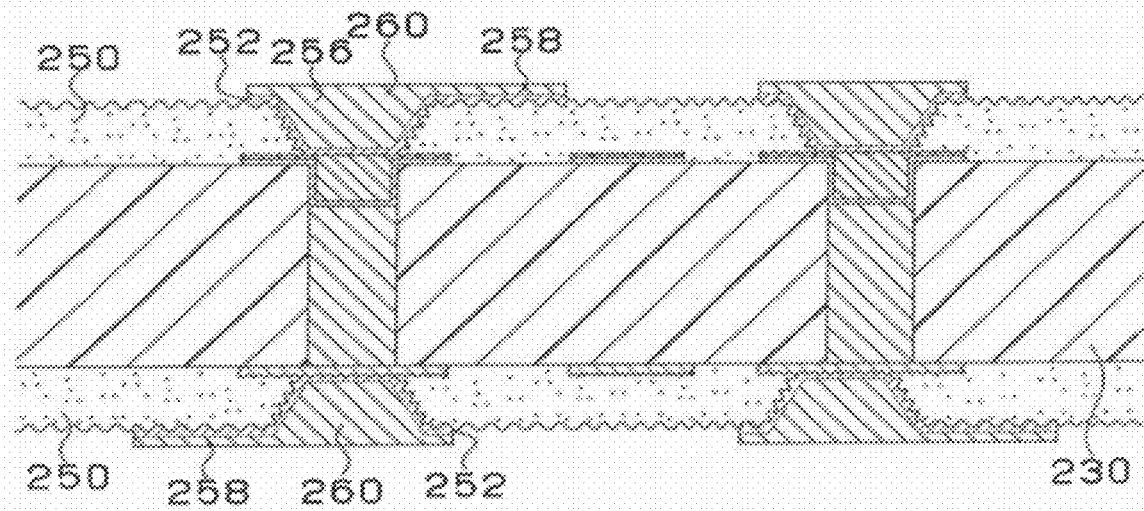
(B)
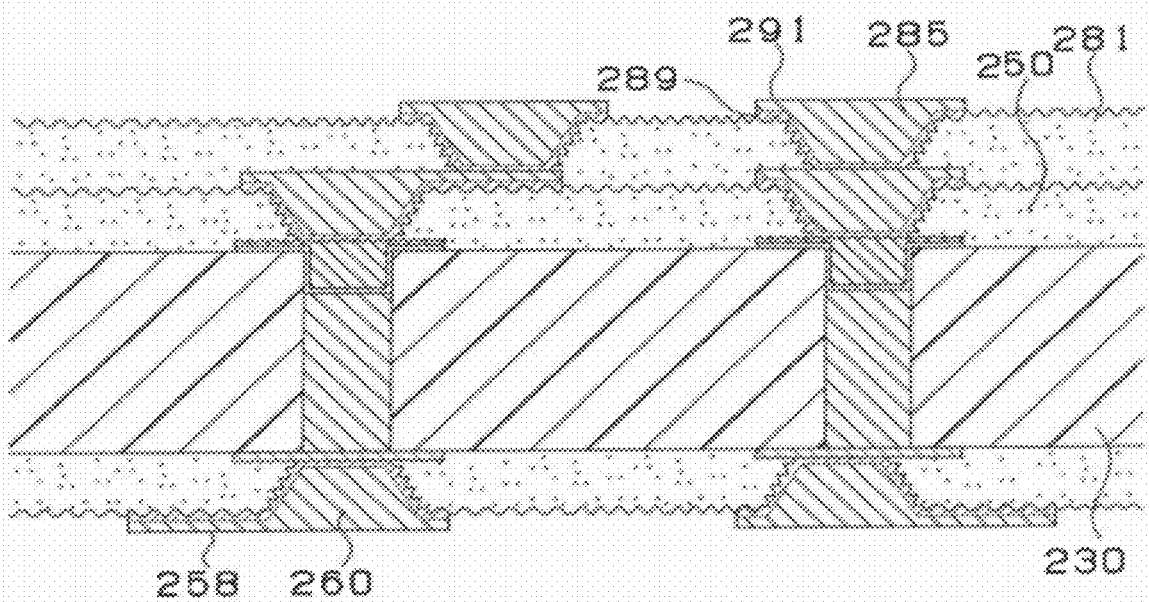

Fig.17
(A)
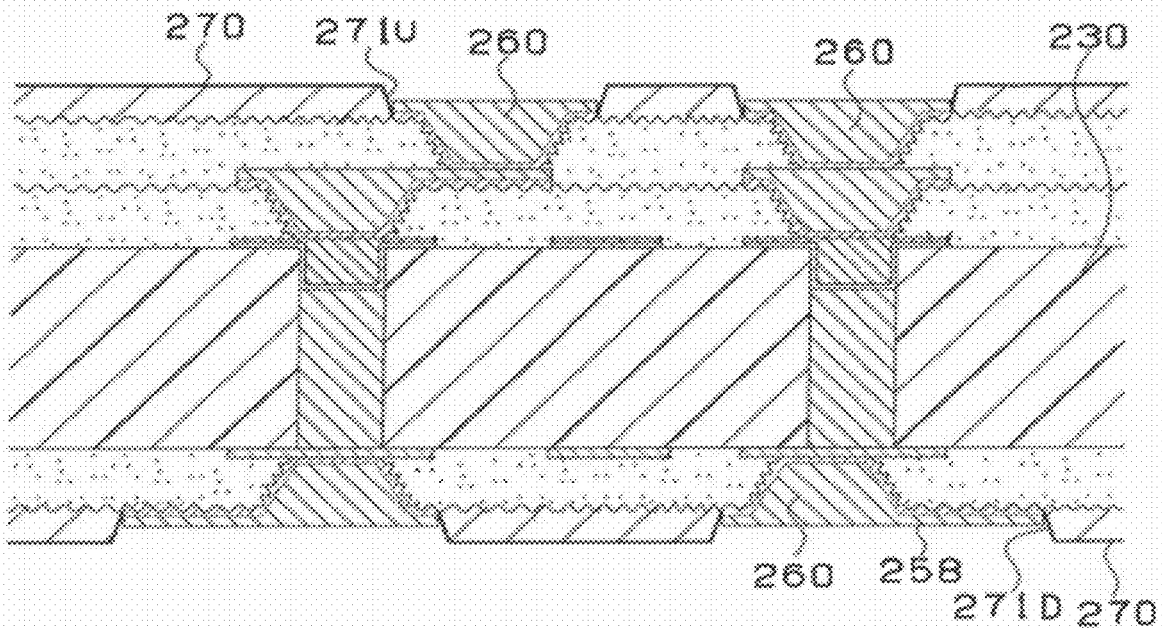
(B)
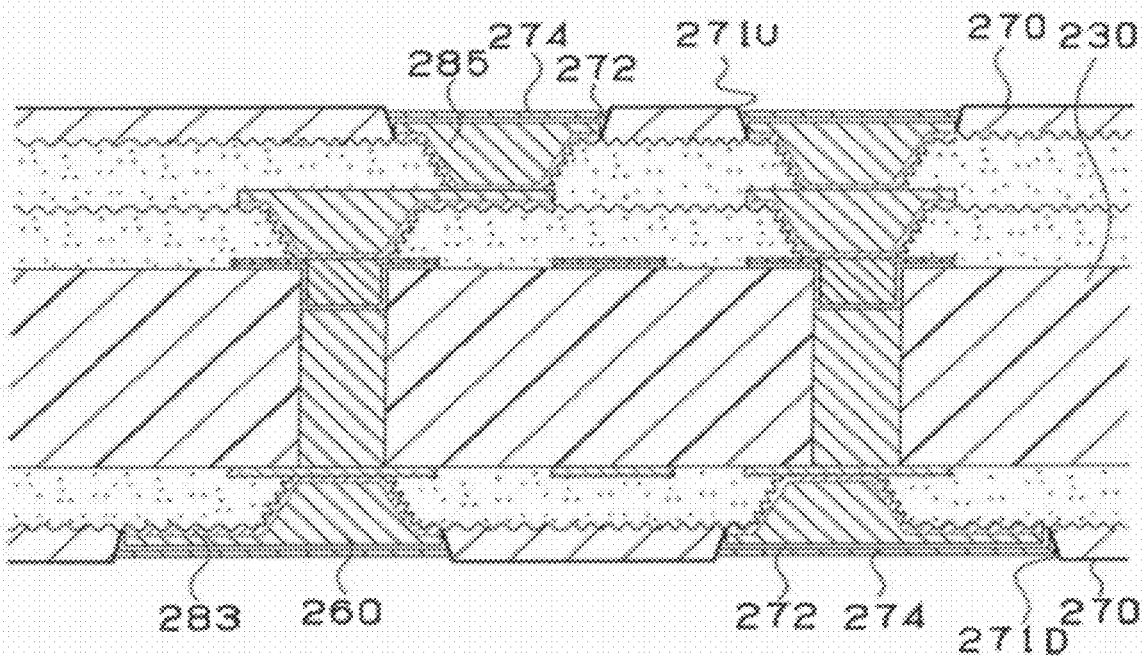

Fig. 19
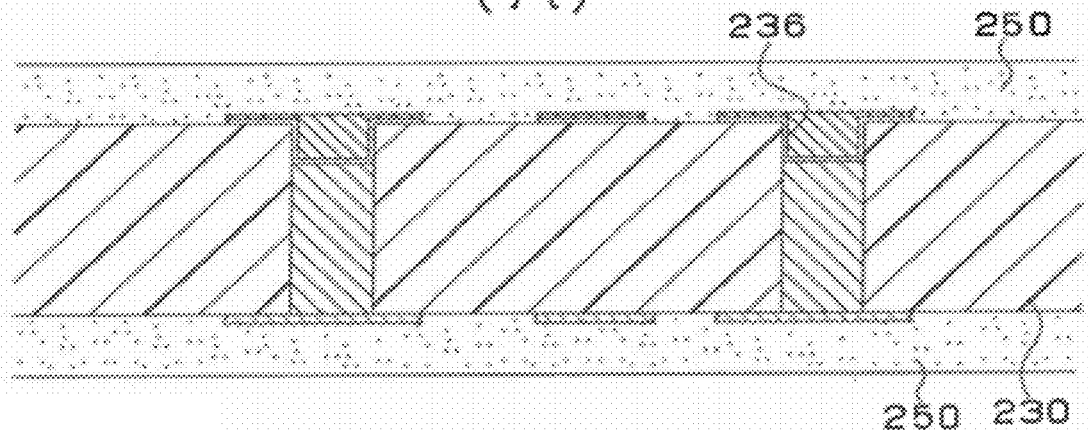
(A)
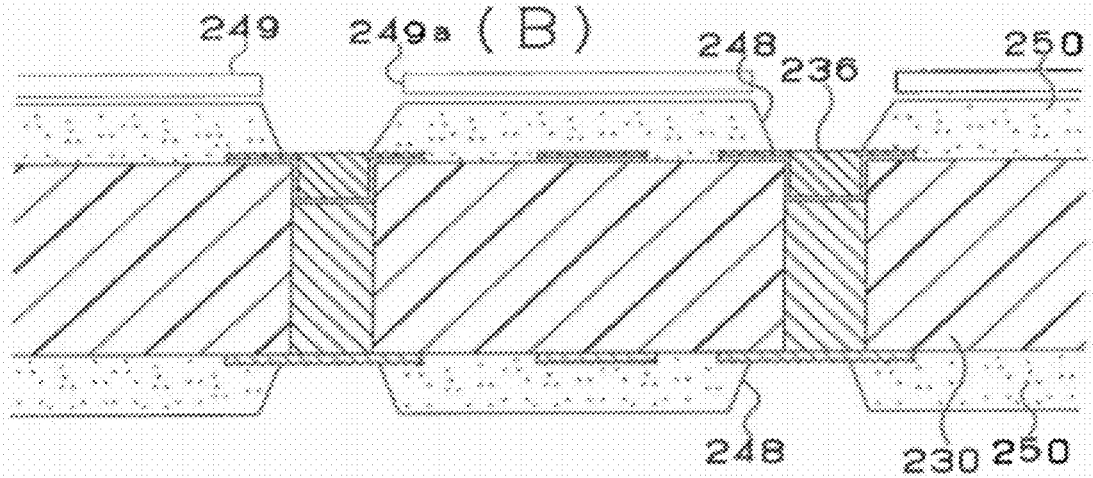
(B)
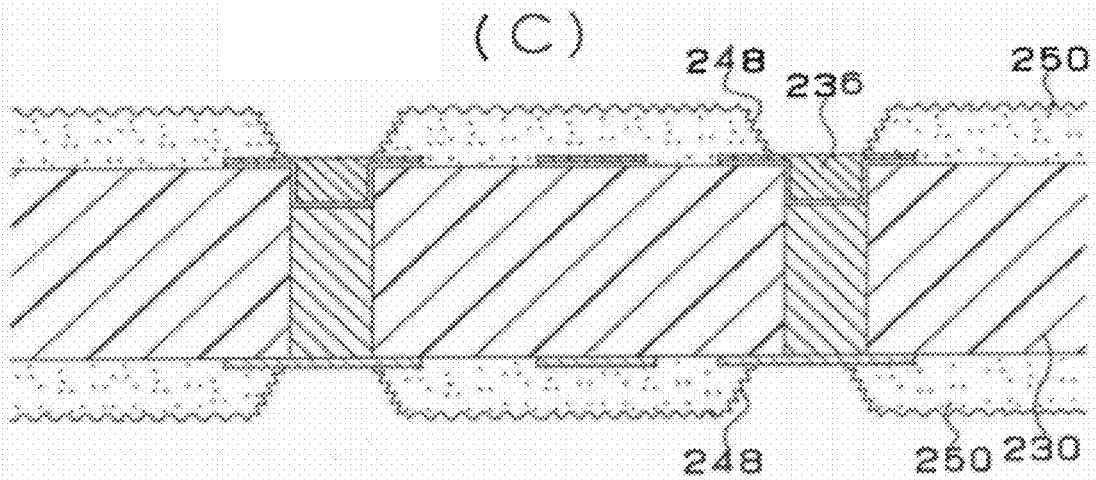
(C)

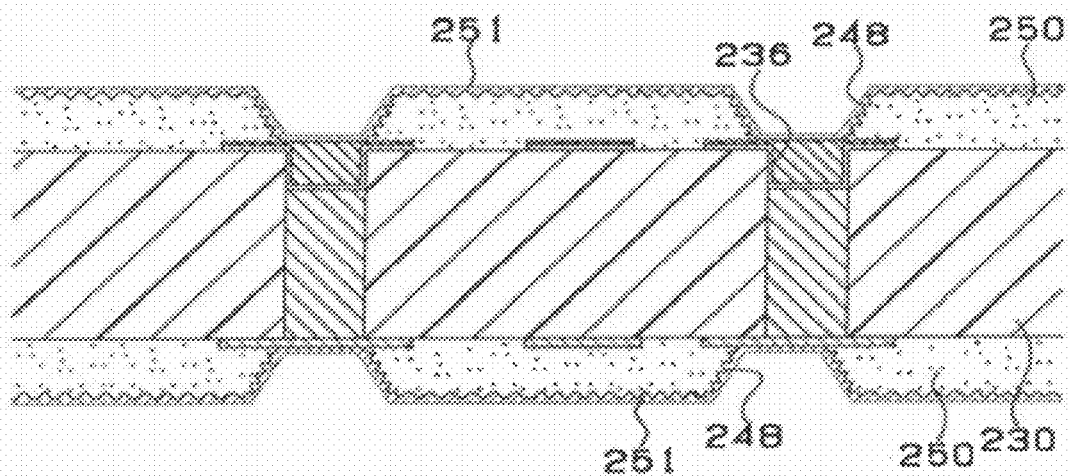
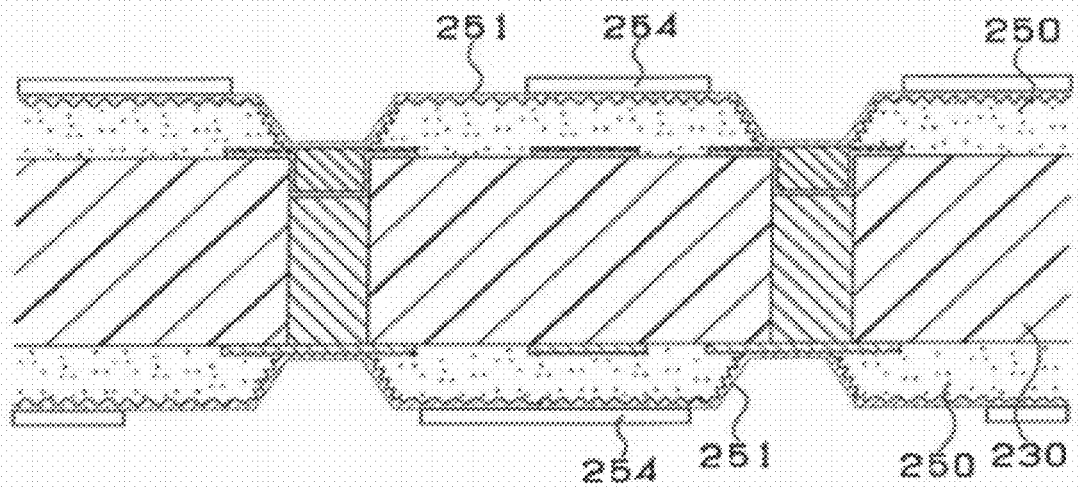
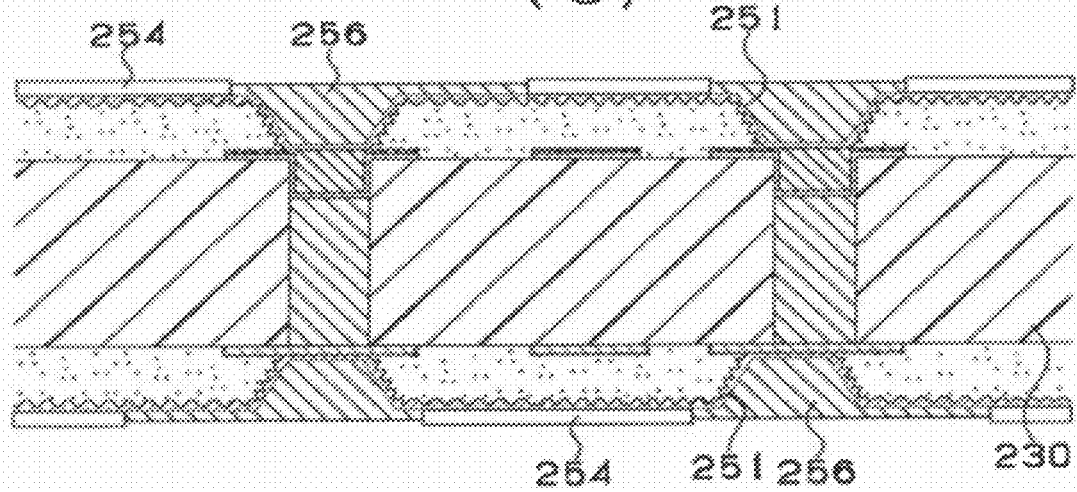
Fig. 20

Fig. 21
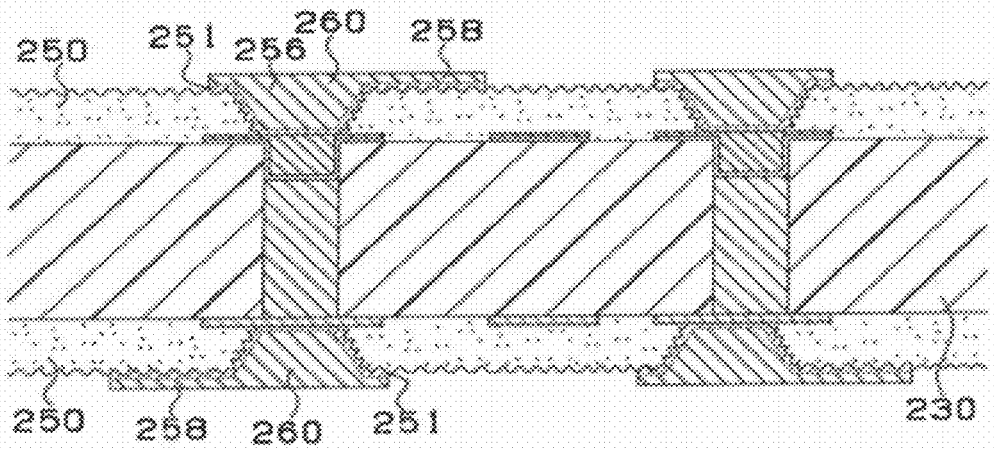
(A)
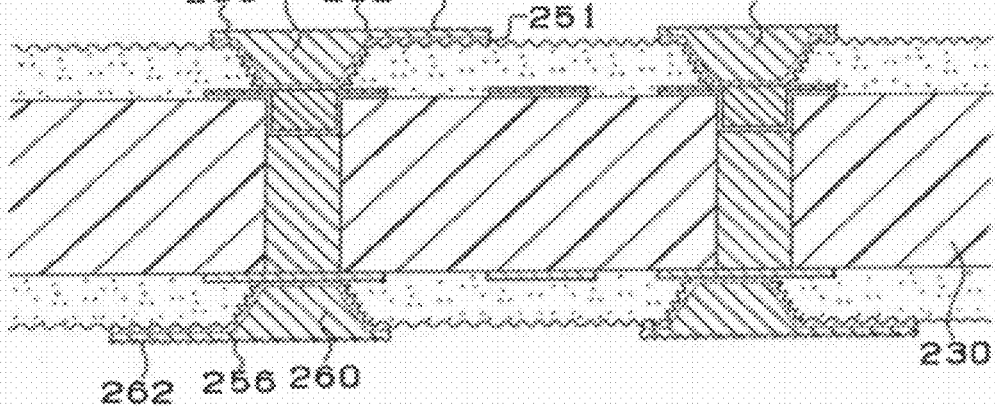
(B)
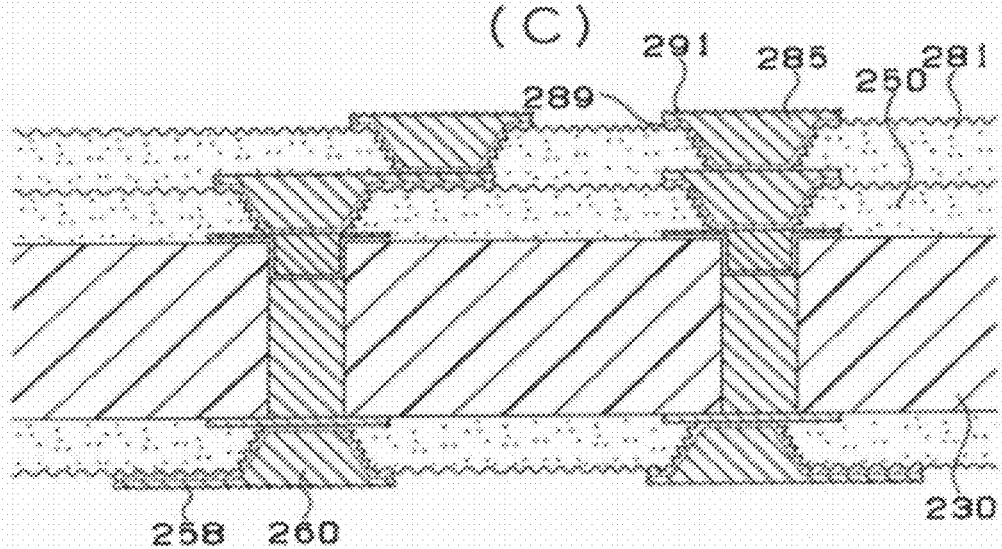
(C)

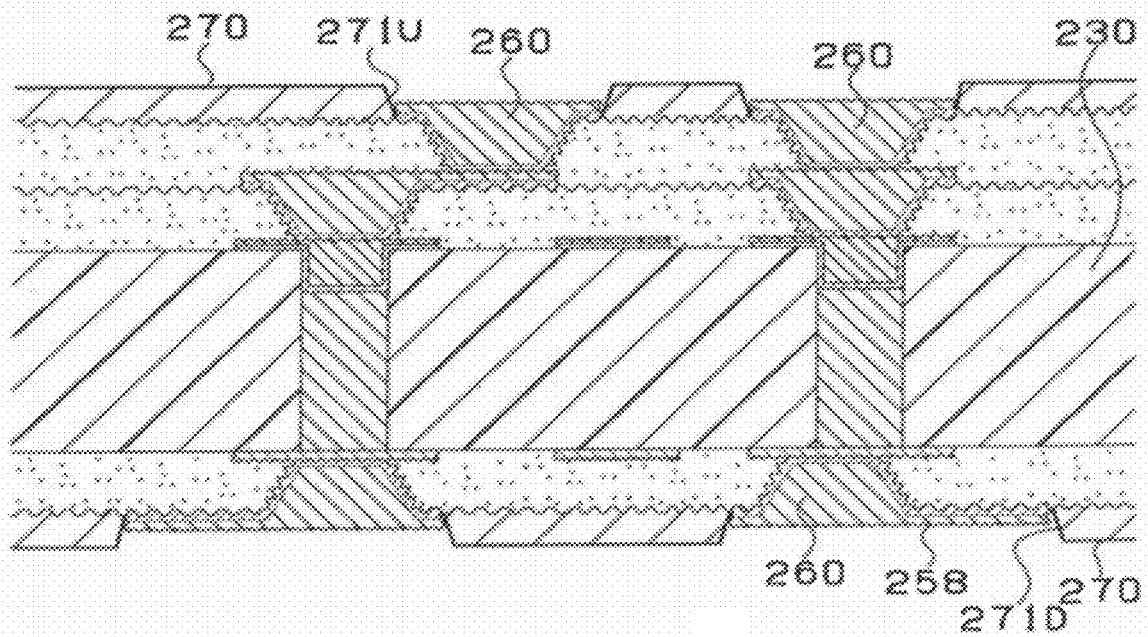
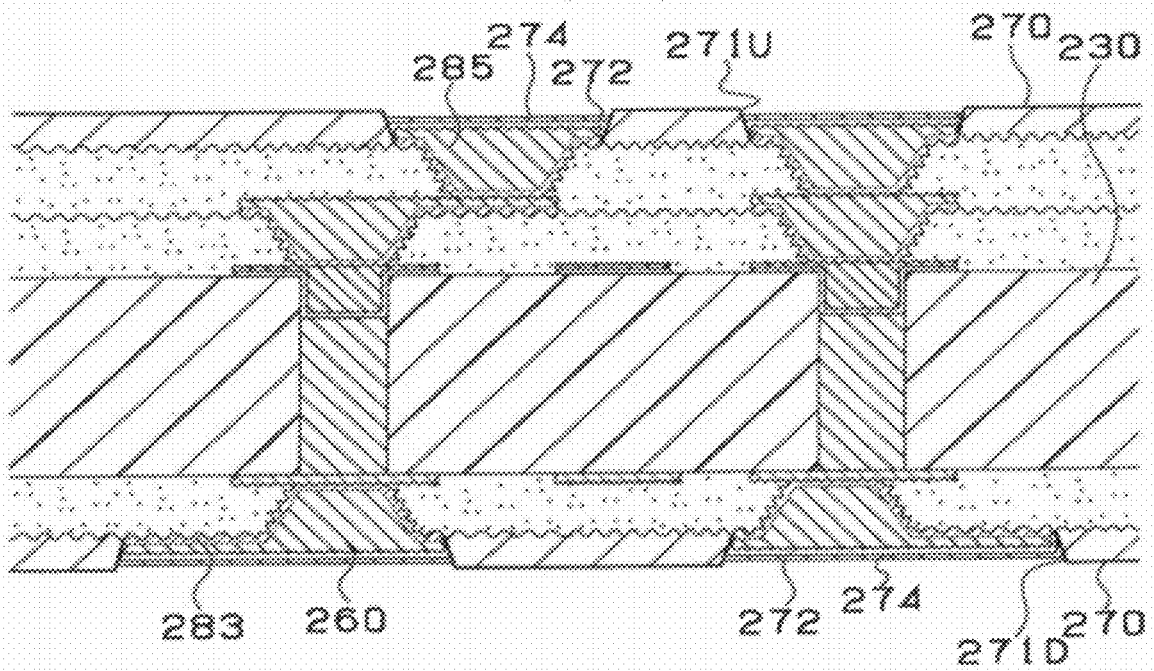
Fig.22
(A)
(B)

Fig.25

| | Warpage after the heat cycle | Disconnection after the heat cycle |
|---|---|---|
| First Embodiment | Not Occur<br>1 μm Within | Not Occur |
| Second Embodiment | Not Occur<br>1 μm Within | Not Occur |
| Third Embodiment | Not Occur<br>1 μm Within | Not Occur |
| Comparative Example 1 | Occur<br>15 μm | Occur |

Fig. 31
(A)
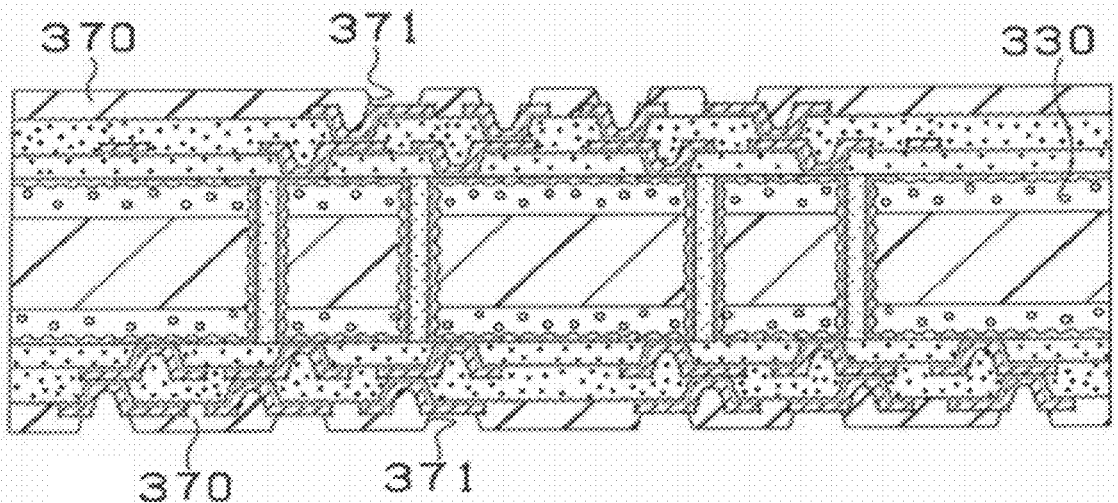
(B)
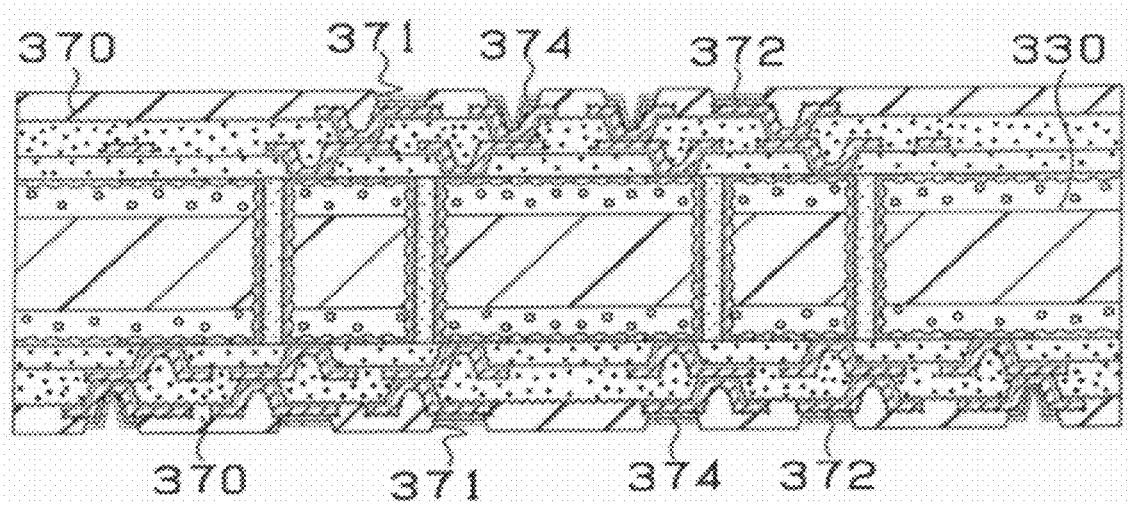

Fig.38
(A)
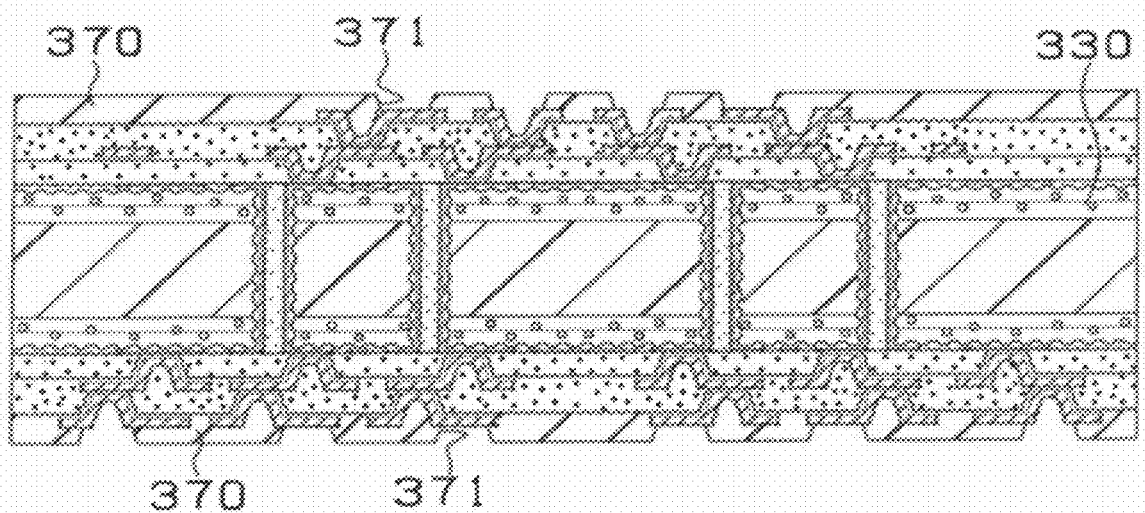
(B)
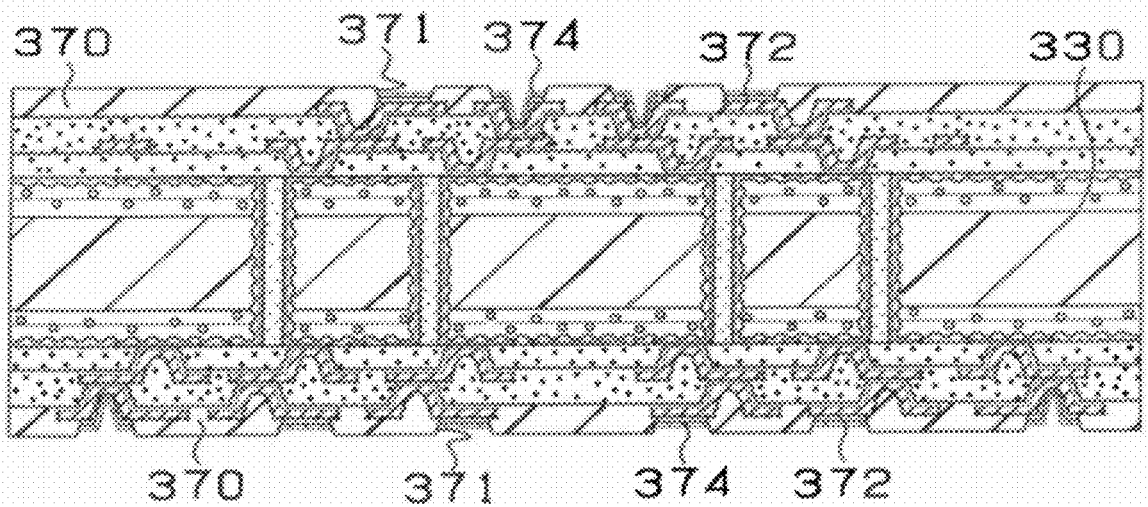

Fig.43
(A)
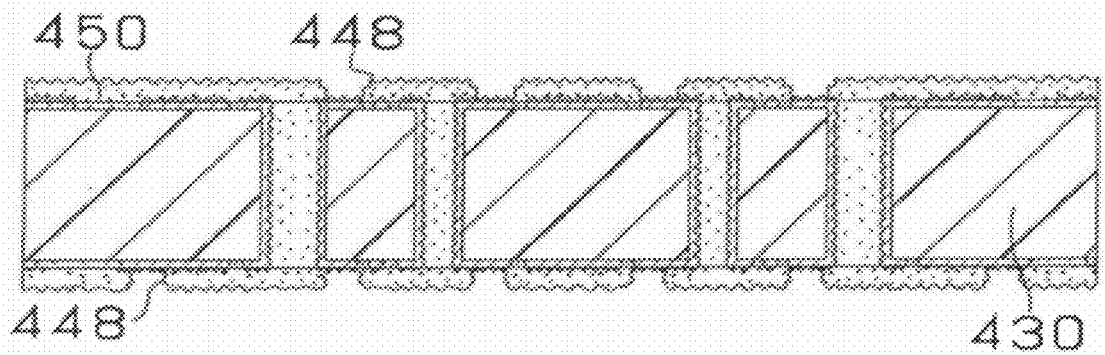
(B)
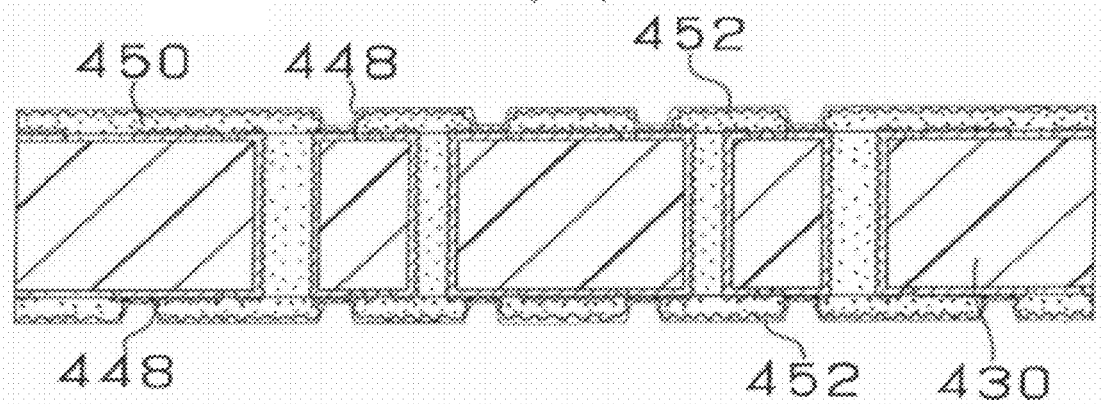
(C)
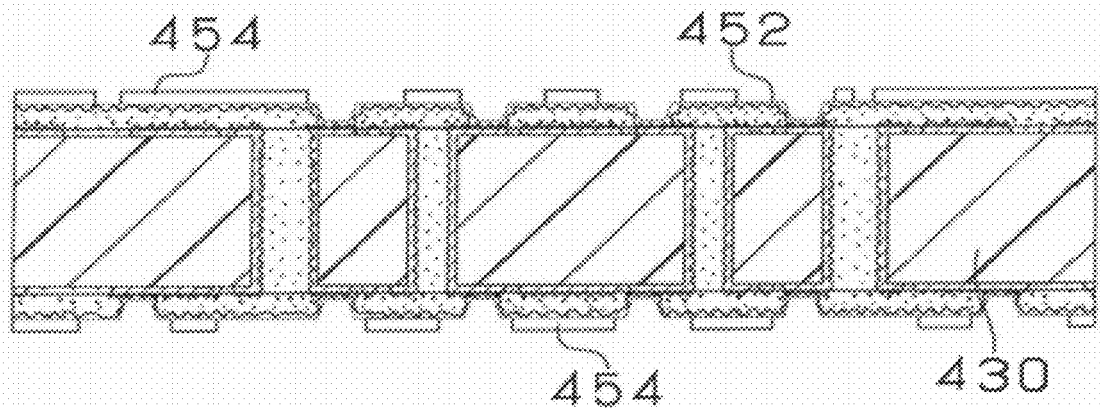

Fig. 44
(A)
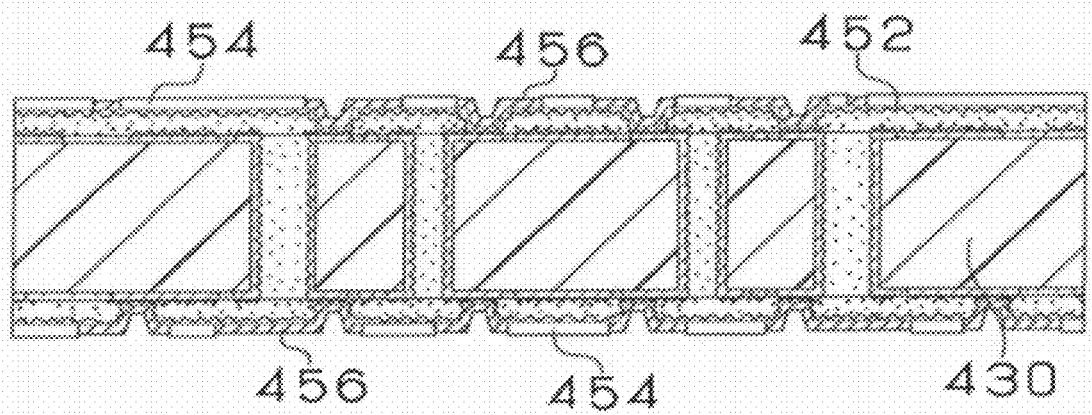
(B)
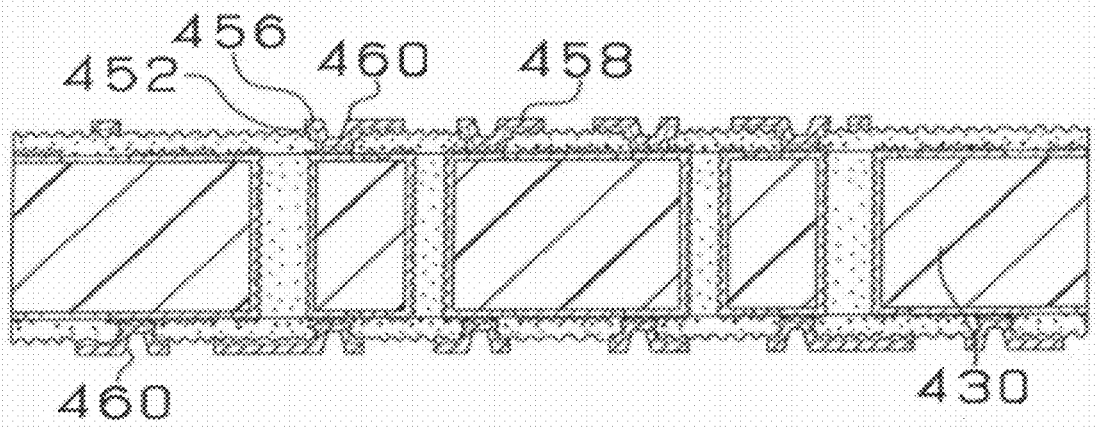
(C)
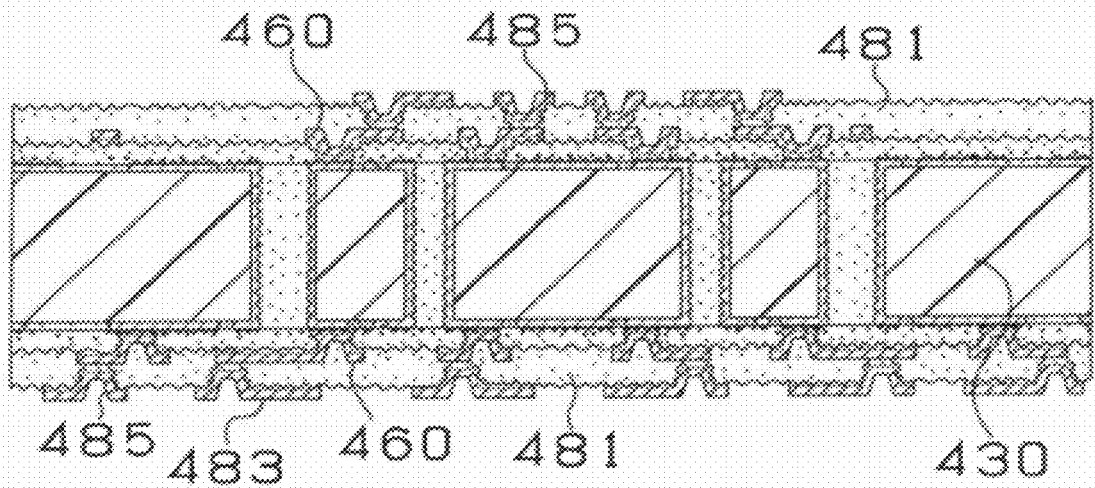

Fig. 45
(A)
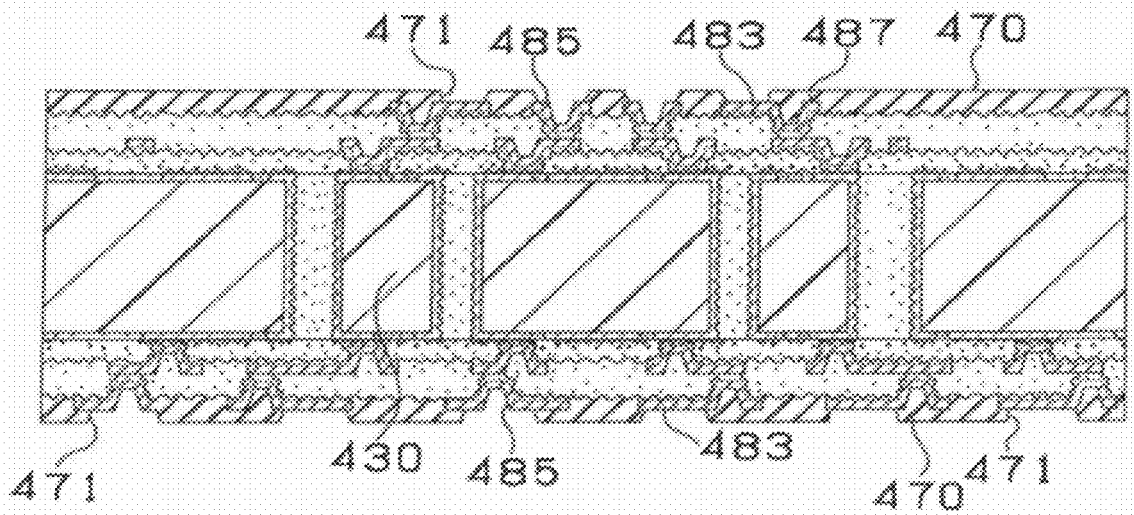
(B)
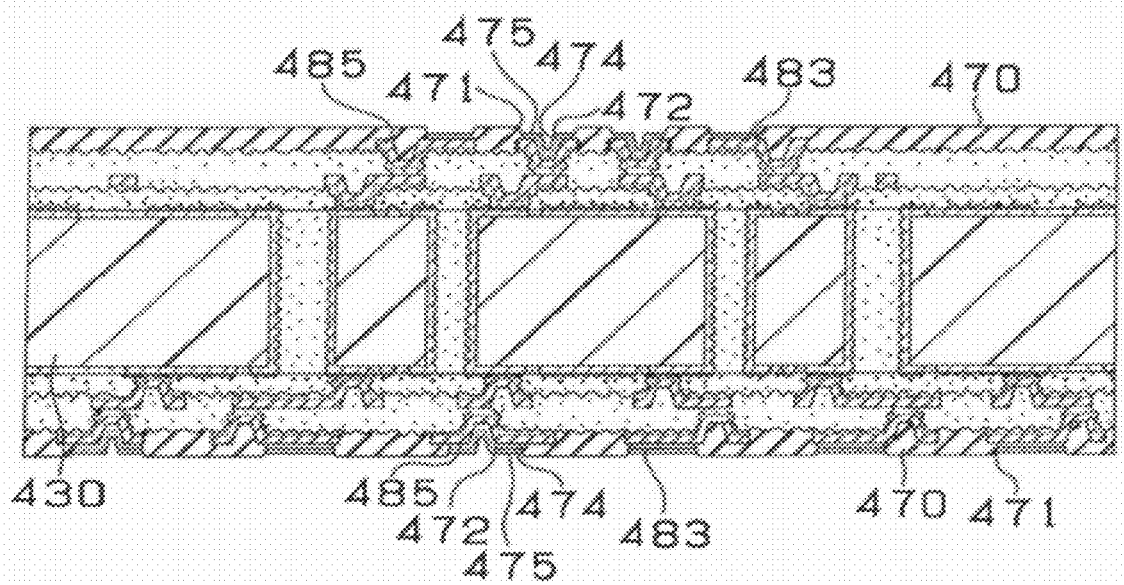

Fig. 48
(A)
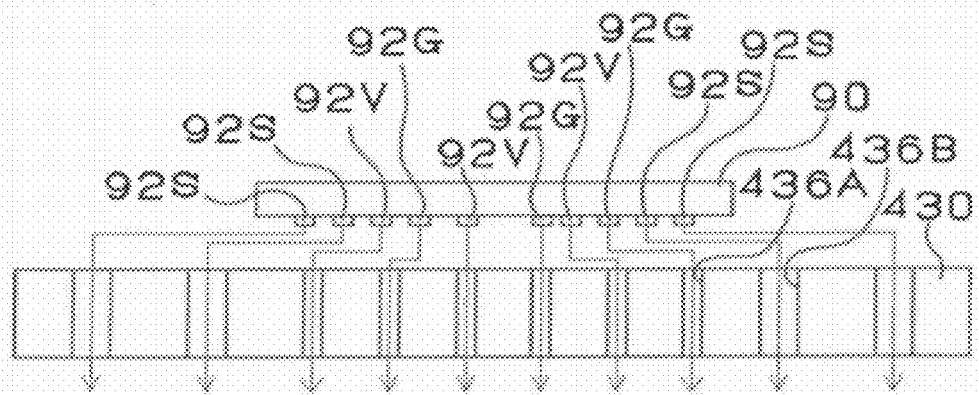
(B)
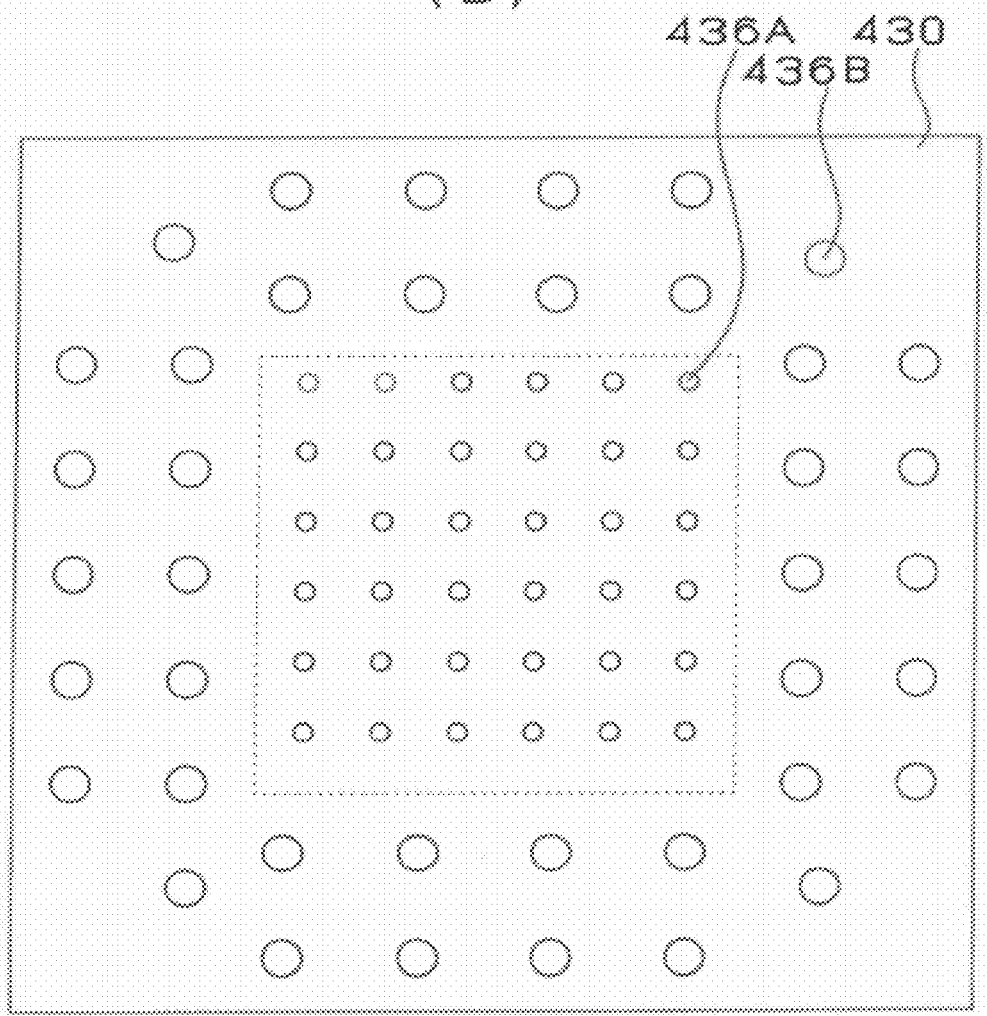

Fig. 53
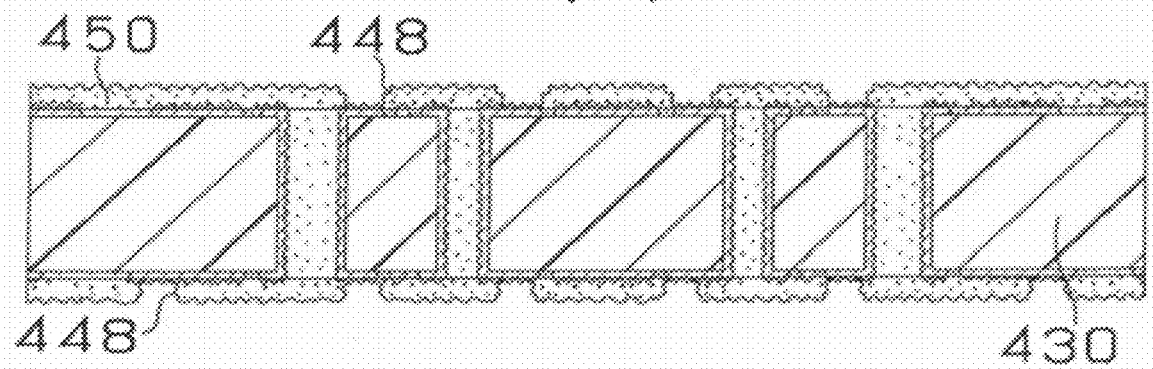
(A)
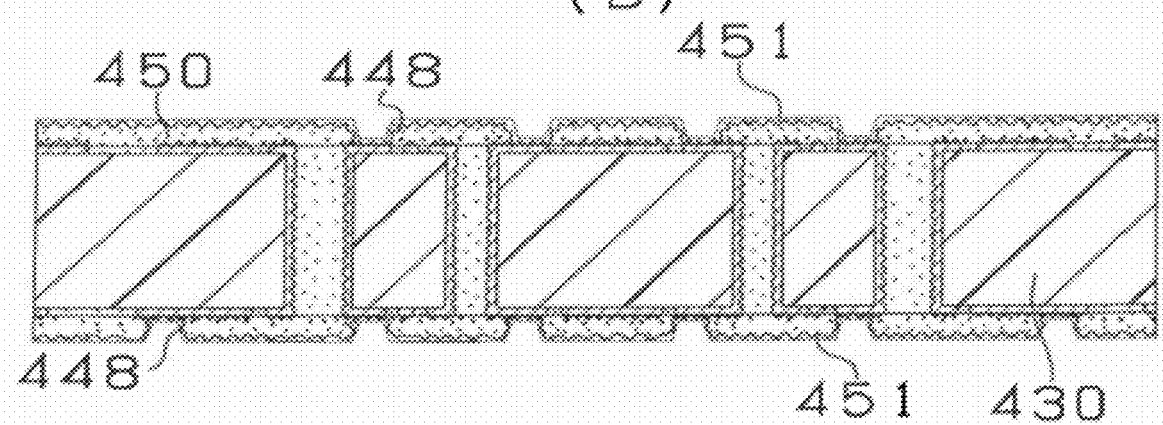
(B)
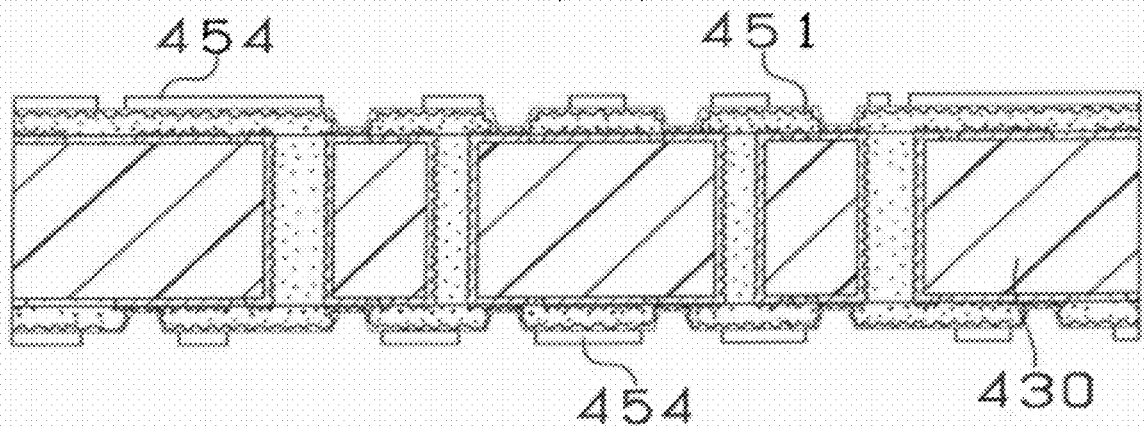
(C)

Fig.54
(A)
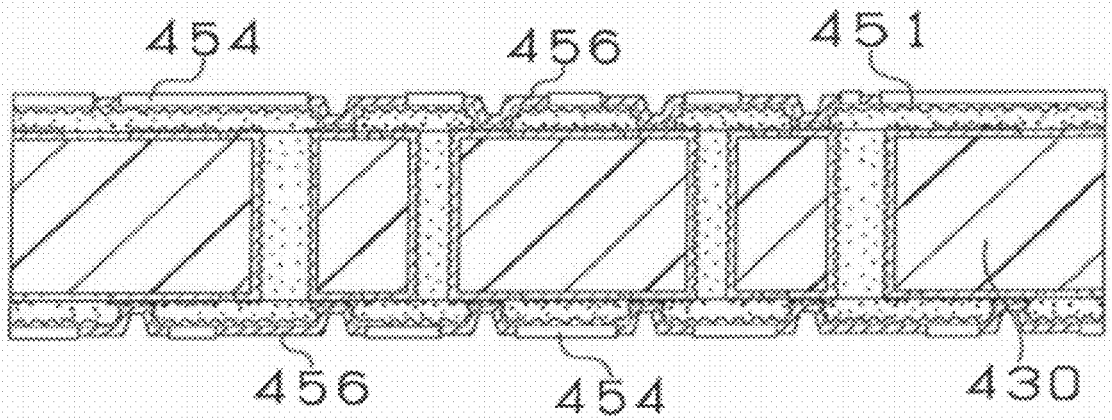
(B)
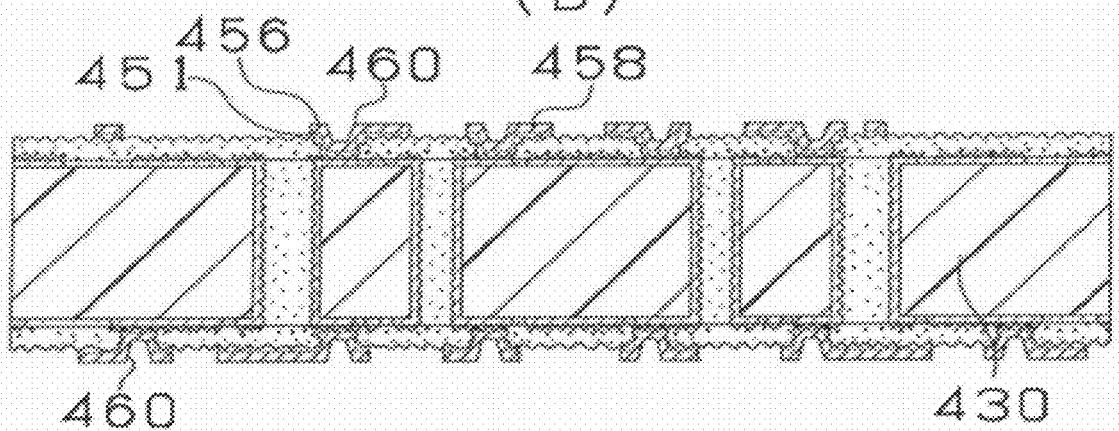
(C)
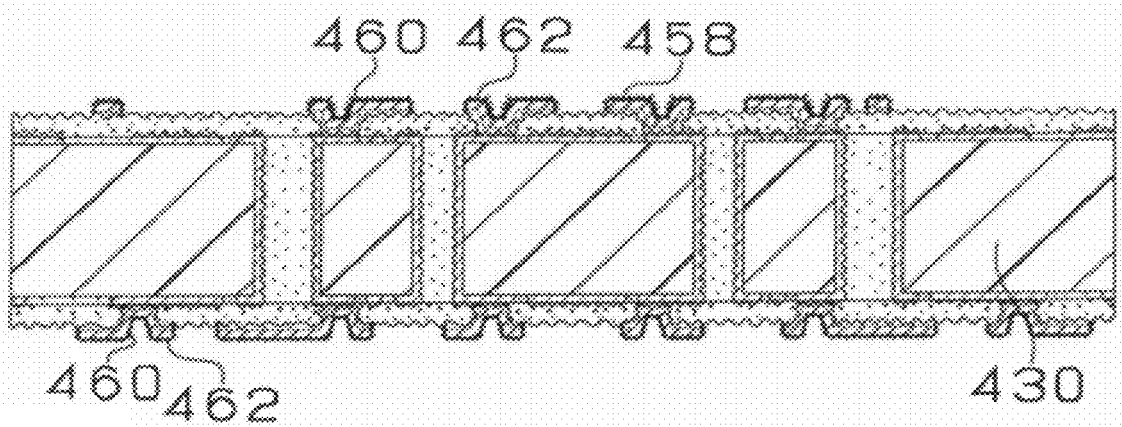

Fig. 55
(A)
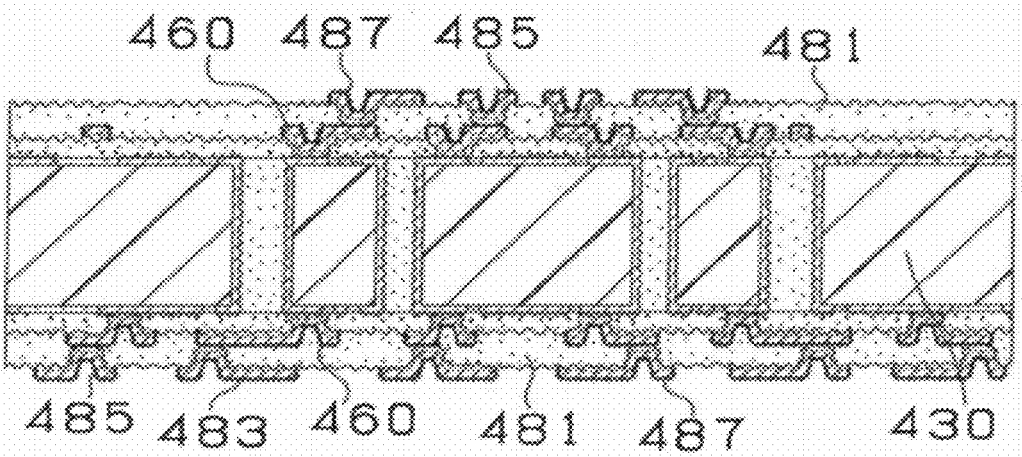
(B)
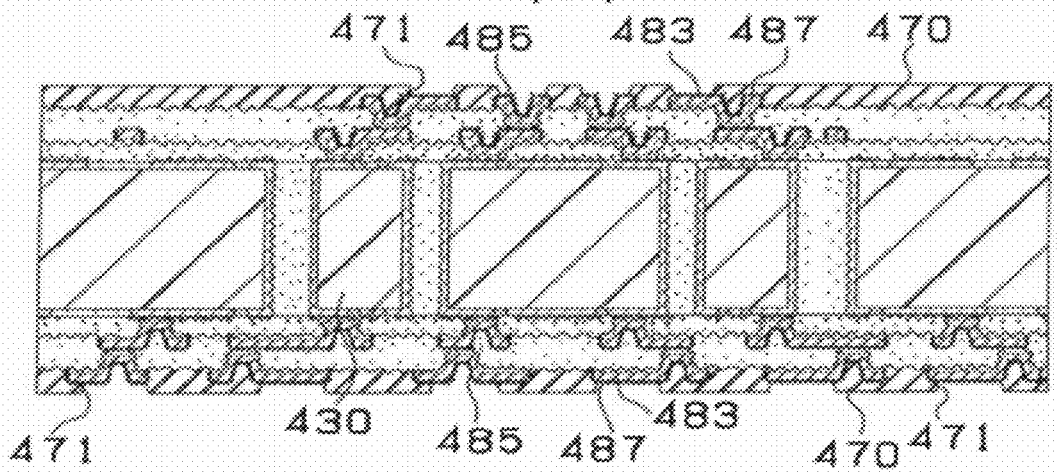
(C)
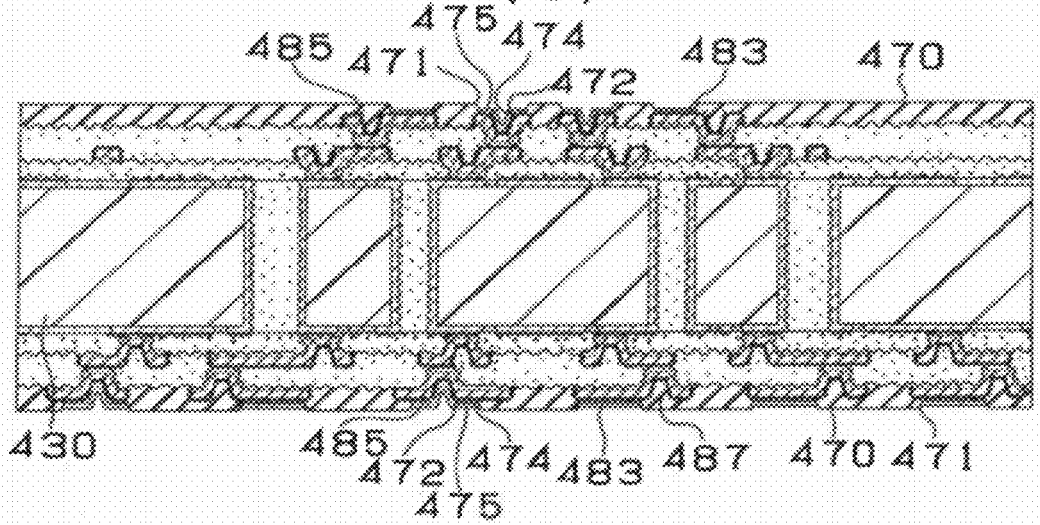

Fig. 63
(A)
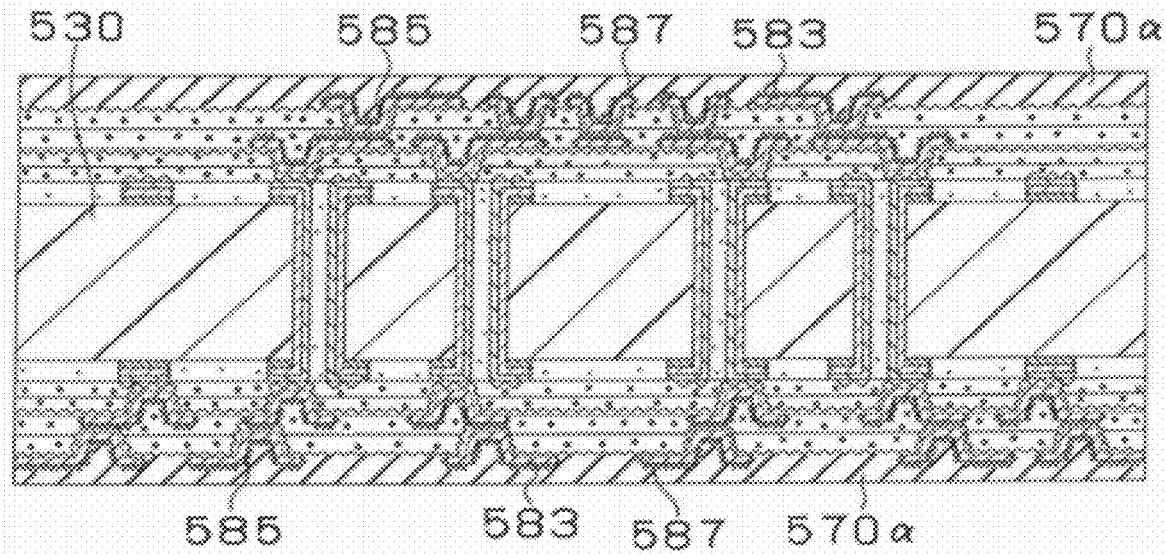
(B)
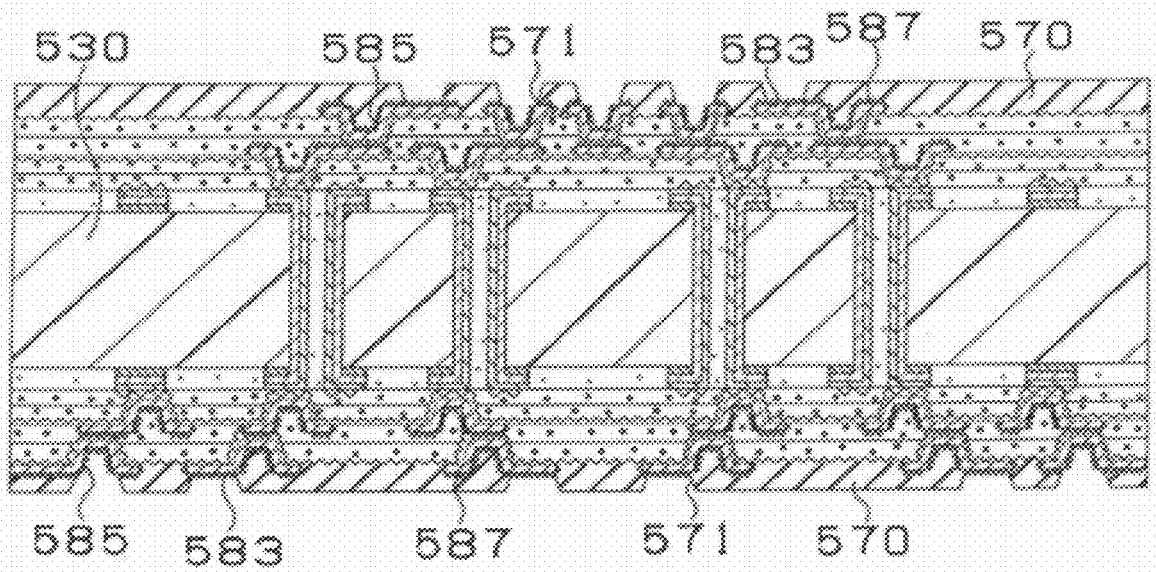

Fig. 64
(A)
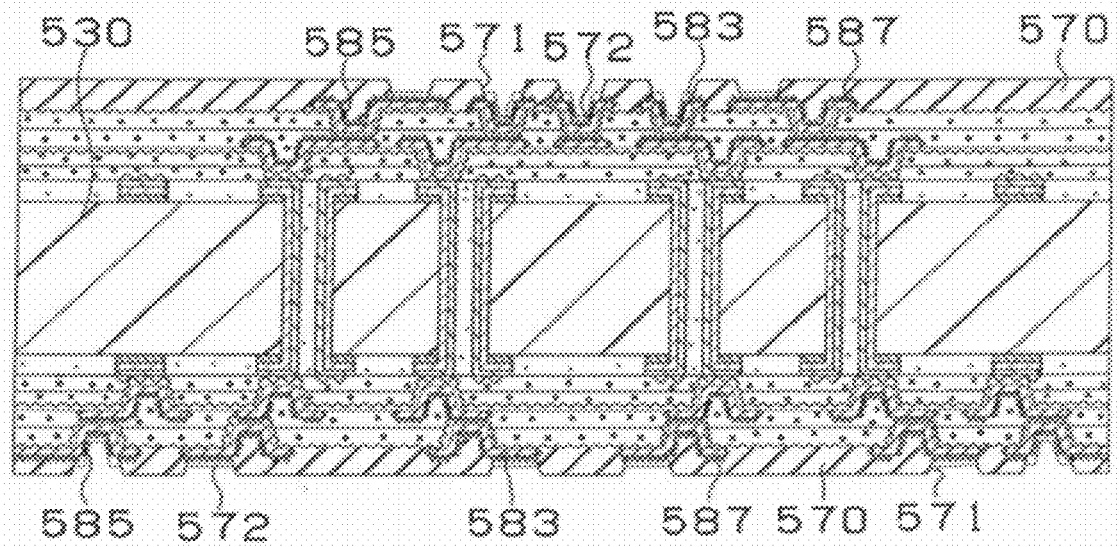
(B)
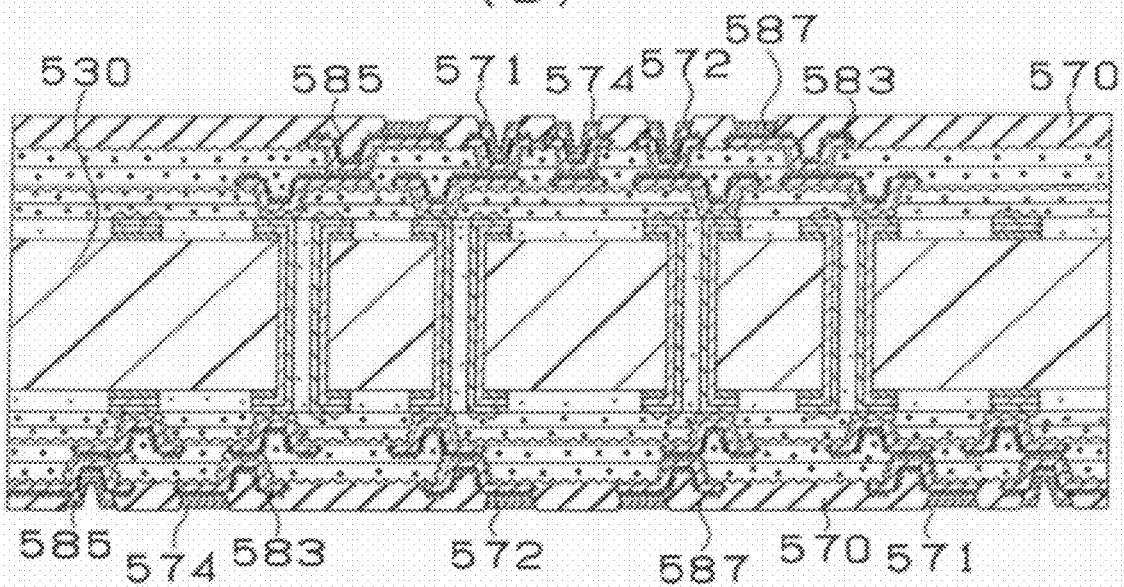

Fig. 68
(A)
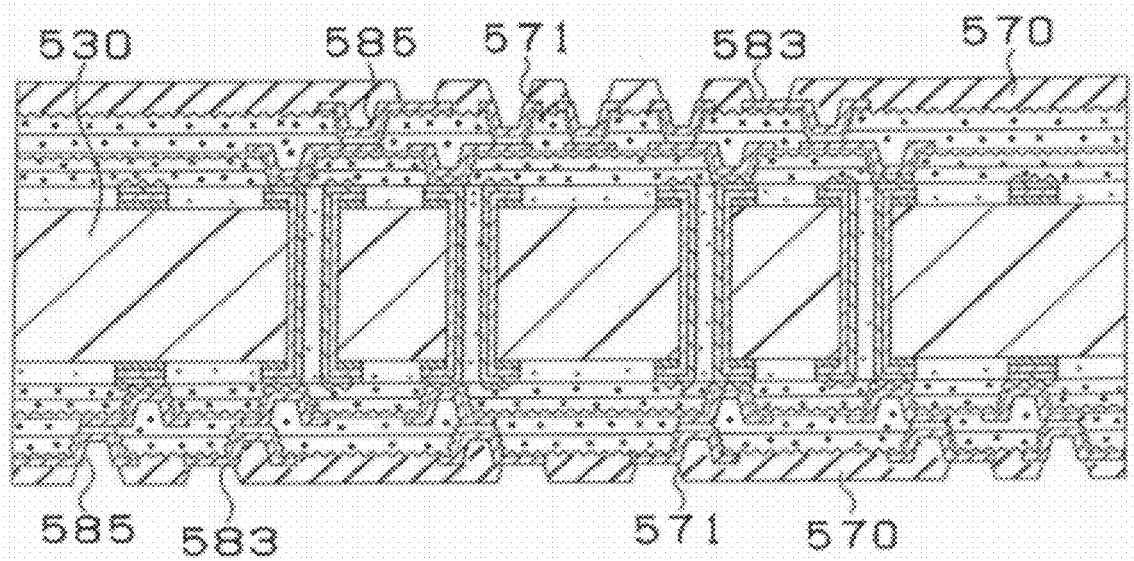
(B)
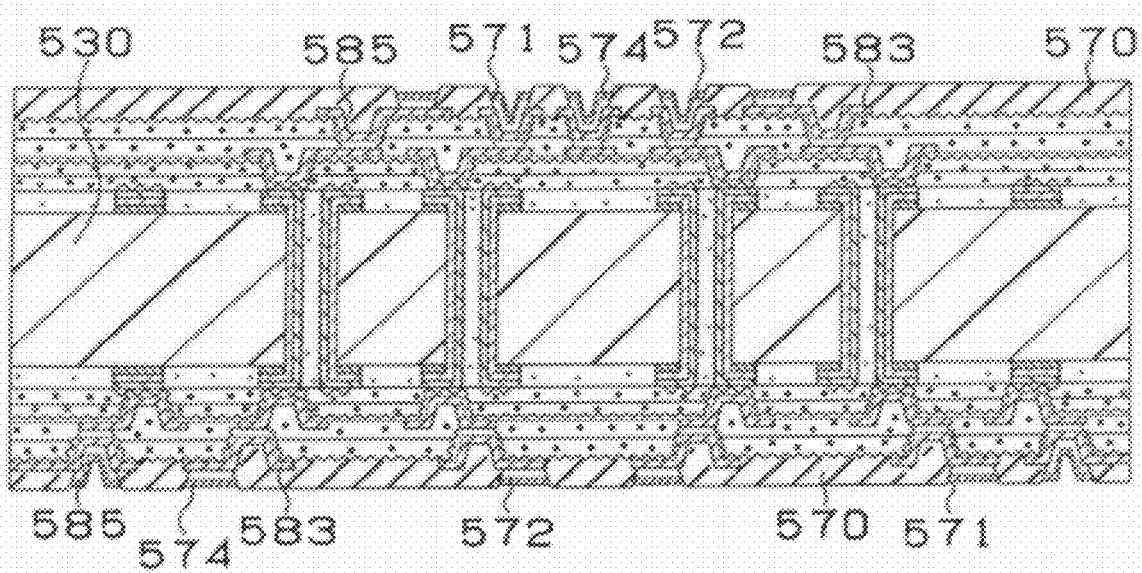

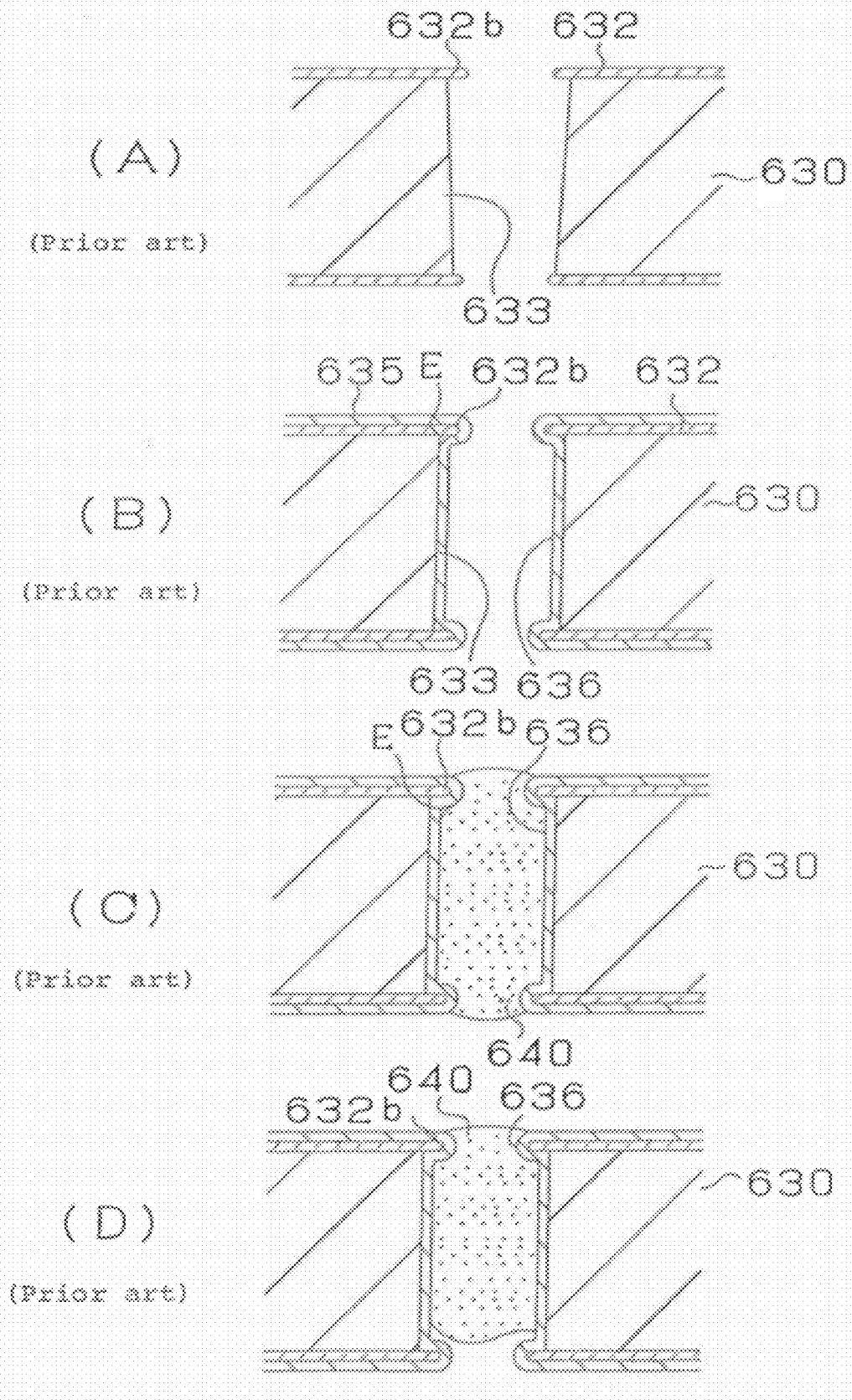

MULTI-LAYER PRINTED CIRCUIT BOARD AND METHOD OF MANUFACTURING MULTILAYER PRINTED CIRCUIT BOARD

CROSS-REFERENCE TO RELATED APPLICATIONS

This application is a continuation of and claims the benefit of priority under 35 U.S.C. §120 from U.S. Ser. No. 10/921,525, filed Aug. 19, 2004, which is a divisional of U.S. Ser. No. 09/979,388, filed Dec. 28, 2001 and a National Stage 35 USC 371, of International Patent Application PCT/JP00/03377, filed May 25, 2000.

TECHNICAL FIELD

The present invention relates to a multilayer printed circuit board which can be employed as a package substrate on which electronic elements, such as IC, are mounted. More particularly, the present invention relates to a multi-layer printed circuit board constituted by building interlayer resin insulating layers up on a core substrate and a method of manufacturing a multi-layer printed circuit board.

BACKGROUND ART

Hitherto, a buildup multi-layer printed circuit board has been manufactured by a method disclosed in Japanese Patent Laid-Open No. 9-130050.

That is, an interlayer resin insulating layer is built on a core substrate having through holes formed therein. Then, a circuit pattern is formed on the interlayer resin insulating layer. The foregoing process is repeated so that the buildup multilayer printed circuit board is obtained.

At present, the through holes are formed in the core substrate by forming penetrating openings by using a drill. Therefore, the smallest limit of the diameter of the penetrating opening is 300 μm. The density of the through holes cannot be raised to a value larger than a value which is defined by the diameter of the drill. Hence it follows that a method using a laser beam to form the core substrate has been investigated. Since the core substrate has a thickness of about 1 mm, fine through holes cannot, however, easily be formed.

On the other hand, the multi-layer printed circuit board, which is employed as the package substrate, must efficiently diverge heat generated in the IC chip. The multi-layer printed circuit board incorporates a core substrate which is constituted by a laminated resin board having a thickness of about 1 mm and on which an interlayer resin insulating layer having a thickness of several tens of μm and a circuit layer are laminated. Therefore, the thickness of the multi-layer printed circuit board is mainly made up by the core substrate. That is, the core substrate causes the thickness of the multi-layer printed circuit board to be enlarged and the thermal conductivity to be decreased.

To solve the above-mentioned problems, an object of the present invention is to provide a multi-layer printed circuit board and a method of manufacturing a multi-layer printed circuit board capable of raising the density at which the through holes are formed and reducing the thickness thereof.

To prevent the occurrence of the warpage and the crack of the upper interlayer resin insulating layer and conductor circuits.

When through holes are formed by laser beams, disconnection sometimes occurs in a heat cycle or the like. Thus, satisfactory reliability cannot be obtained. The cause of the disconnection has been investigated, resulting in detection of mixture of air bubbles in the resin with which the through hole is filled.

The cause of mixture of the air bubbles has furthermore been investigated by the inventor of the present invention. As a result, the mixture is caused by residual burrs of copper foil inwards extending from the opened portion of the through hole when the through holes are formed in a copper-clad laminated board which constitutes the core substrate. That is, as shown in FIG. 70 (A), when a through hole 633 is, by a laser beam, formed in a core substrate 630 constituted by laminating copper foil 632, a burr 632b of the copper foil 632 undesirably left at the edge of the opening of the through hole 633. A tapered through hole 633 is sometimes formed. When a plated film 635 is formed to form the through hole 636 as shown in FIG. 70 (B), air bubble E is sometimes left between the burr 632b and the plated film 635. When the through hole 636 is filled with a resin filler 640 as shown in FIG. 70 (C), air bubble E is sometimes left between the reverse side of the portion including the burr 632b and the resin filler 640. As shown in 70 (D), the portion including the burr 632b of the copper foil extending inwards sometimes prevents smooth injection. In the foregoing case, a portion which is not filled with the resin filler 640 is detected in the through hole 636. Thus, a fact has been detected that the reliability in the connection of the printed circuit board deteriorates owing to the air bubble and the non-filled portion.

Since the hole forming operation using the laser beam is performed, an oxidation-reduction layer is formed as a process which is performed before the laser beam is applied and the number of laser shots is increased. Thus, the process takes a long time and the cost is enlarged.

To overcome the above-mentioned problems, the inventor of the present invention has attempted to employ a BT (Bismaleimide-Triazine) resin board as the core substrate. A fact has, however, been detected that the BT resin board having a flat surface encounters deterioration in the adhesiveness with a metal film formed on the right side of the core substrate. Therefore, the inventors or the present invention have attempted to improve the adhesiveness with the metal film formed on the right side of the core substrate by employing a resin film constituted by dispersing soluble particles in refractory resin. Thus, there arises problems in that the resin film, however, encounters decrease in the strength required for the core substrate and the interlayer resin insulating layer cannot be formed in the upper layer.

To overcome the foregoing problems, another object of the present invention is to provide a printed circuit board and a method of manufacturing a printed circuit board capable of forming adequately forming through holes by using laser beams.

Since the core substrate is filled with core materials, such as glass cloths, the laser beam must be applied to each hole for a long time to form the through holes in the core substrate having a thickness of about 1 mm by using laser beams. To form hundreds of through holes, an excessively long machining time is required and the manufacturing cost cannot be reduced. On the other hand, the through holes each having a small diameter sometimes encounters disconnection during the heat cycle. Therefore, satisfactory reliability cannot be realized as compared with conventional through holes formed by drilling and each having a large diameter.

To achieve the foregoing objects, a still further object of the present invention is to provide a multi-layer printed circuit board and a method of manufacturing a multi-layer printed circuit board capable of improving high-frequency characteristics of a ground line and a power supply line and preventing a malfunction of an IC chip caused from insufficient quantity of electric power to be supplied.

On the other hand, the diameter of each penetrating opening can be reduced as compared with an opening which is formed by drilling when the penetrating openings are formed in the core substrate by using laser beams. When the penetrating openings are formed in a copper-clad laminated board employed to serve as the core substrate, the number of laser shots are increased excessively and an excessively long time is required. When the openings are formed by the laser beams, a portion of copper for forming copper foil on the surface of the inner wall of the through hole is undesirably left. It leads to a fact that undesirable separation of the plated film formed in the through hole takes place.

To overcome the foregoing problems, its still further object of the present invention is to provide a printed circuit board excellent in connection characteristics and reliability and permitting a high-density structure which is manufactured by forming openings in a resin plate which serves as a core substrate by using laser beams and by performing sputtering to for a sputtered layer to form penetrating opening each having a small diameter and which is free from any separation of the plated films in the through holes and a method of manufacturing a printed circuit board.

DISCLOSURE OF THE INVENTION

To solve the above-mentioned problems, a multi-layer printed circuit board according to one embodiment of the present invention is characterized by comprising: a core substrate incorporating a metal layer sandwiched by resins; and an interlayer resin insulating layer built up on said core substrate.

The multi-layer printed circuit board may be characterized by comprising: an interlayer resin insulating layer built up on a core substrate thereof, wherein said core layer is constituted by sandwiching a metal layer between two resin layers, and a conductor is provided for each of non-penetrating openings which are formed in said resin and which reach said metal layer so that through holes are formed.

A method of manufacturing a multi-layer printed circuit board according to another embodiment of the present invention includes at least the following steps (A) to (C):

(A) forming a resin insulating layer on an upper layer of a resin insulating layer having an upper surface on which a metal layer is formed so that a core substrate is formed;

(B) forming non-penetrating openings in said resin insulating layer of said core substrate by applying laser beams such that said non-penetrating openings reach said metal layer; and (C) providing a conductor for each non-penetrating opening formed in said resin insulating layer so that throughholes are formed.

The multi-layer printed circuit boards and the method of manufacturing a multi-layer printed circuit board may be arranged to maintain required strength of a core substrate thereof by sandwiching a metal layer by resin. Thus, the thickness of the core substrate can be reduced. Hence it follows that the thickness of the multi-layer printed circuit board can be reduced. Since non-penetrating openings which reach the metal layer are simply required to be formed in the resin layer, the depth of each of penetrating openings which are formed by laser beams can be reduced to half or smaller as compared with the conventional core substrate. Therefore, fine non-penetrating openings can easily be formed by laser beams and, therefore, through holes each having a small diameter can be formed. As a result, a degree of integration of the multi-layer printed circuit board can be raised. Moreover, the core substrate is formed into the multilayer structure and, therefore, the metal layer between resin portions which constitute the core substrate permits wiring to be arranged. As a result, the number of layers of the multi-layer printed circuit board can be reduced. Since the non-penetrating openings are filled with plating, the intensity increases and the warpage does not easily occur.

A method of manufacturing a multi-layer printed circuit board according to another embodiment of the present invention includes at least the following steps (A) to (D)

(A) etching a metal layer of a one-side metal-clad resin plate to form a circuit pattern;

(B) laminating a resin film to the surface of said circuit pattern to constitute a core substrate;

(C) forming non-penetrating openings in a resin insulating layer of said core substrate by applying laser beams such that said non-penetrating openings reach said circuit pattern; and (D) providing a conductor for each non-penetrating opening of said resin insulating layer to form through holes.

A method of manufacturing a multi-layer printed circuit board according to yet another embodiment of the present invention includes at least the following steps (A) to (E):

(A) etching a metal layer of a one-side metal-clad resin plate to form a circuit pattern;

(B) coating the surface of said circuit pattern with resin and polishing said circuit pattern so that said circuit pattern is flattened;

(C) laminating a resin film to the surface of said circuit pattern to constitute a core substrate;

(D) forming non-penetrating openings in a resin insulating layer of said core substrate by applying laser beams such that said non-penetrating openings reach said circuit pattern; and (E) providing a conductor for each non-penetrating opening of said resin insulating layer to form through holes.

The methods of manufacturing a multi-layer printed circuit board may be arranged to maintain required strength of a core substrate thereof by sandwiching a circuit pattern by resin. Thus, the thickness of the core substrate can be reduced. Hence it follows that the thickness of the multi-layer printed circuit board can be reduced. Since non-penetrating openings which reach the circuit pattern are simply required to be formed in the resin layer, the depth of each of penetrating openings which are formed by laser beams can be reduced to half or smaller as compared with the conventional core substrate. Therefore, fine non-penetrating openings can easily be formed by laser beams and, therefore, through holes each having a small diameter can be formed. As a result, a degree of integration of the multi-layer printed circuit board can be raised. Moreover, the core substrate is formed into the multilayer structure and, therefore, the circuit pattern between resin portions which constitute the core substrate permits wiring to be arranged. As a result, the number of layers of the multi-layer printed circuit board can be reduced.

To solve the above-mentioned problems, a multi-layer printed circuit board according to yet another embodiment of the present invention is characterized by comprising: a core substrate having through holes; and an interlayer resin insulating layer built up on said core substrate, wherein said through holes are constituted by filling a first metal layer formed by electroplating, a metal film formed by electroless plating, sputtering or evaporation and a second metal layer formed by electroplating.

Since the through holes are formed by enclosing plating material, via holes for establishing the connection can be formed on the through holes. Therefore, the wiring density of the via holes can be raised. Since through holes are filled with electroplating, electroless plating and electroplating, insufficient enclosure in each through hole can be prevented. The reliability in the heat-cycle can be improved. Since through holes are filled with electroplating, electroless plating and electroplating, the intensity increases and the warpage does not easily occur.

A method of manufacturing a multi-layer printed circuit board according to yet another embodiment of the present invention includes at least the following steps (A) to (E):

(A) forming non-penetrating openings in a resin insulating layer incorporating a metal layer formed on either side thereof by applying laser beams such that said non-penetrating openings reach said metal layer;

(B) passing an electric current to each non-penetrating opening formed in said resin insulating layer through said metal layer to fill a first metal layer with electroplating;

(C) forming a metal film on the opposite surface of said resin insulating layer on which said metal layer is formed;

(D) passing an electric current to each non-penetrating opening formed in said resin insulating layer through said metal layer to fill a second metal layer with electroplating; and (E) etching said metal layer and said metal film of said resin insulating layer to form lands of through holes.

Since the through holes formed by laser beams, the diameter of each through hole can be reduced to 50 .mu.m to 250 .mu.m. Therefore, the wiring density of the through holes can be raised. Since the through holes are formed by enclosing plating, the strength of the core substrate can be increased. Thus, warpage does not easily occur. Hence it follows that the thickness of the core substrate can be reduced and, therefore, the heat radiation characteristic of the multi-layer printed circuit board can be improved. Since the through holes are filled with electroplating, insufficient filling in each through hole can be prevented. Since a second metal layer is formed in each through hole after metal films serving as lands of the through holes, separation of the lands can be prevented. It leads to a fact that the reliability of the through holes can be improved. Since satisfactory reliability in the connection can be improved, the thickness of each land can be reduced. Therefore, the smoothness and flatness of the interlayer resin insulating layer which is an upper layer can be improved. As a result, separation and formation of a crack in the interlayer resin insulating layer can be prevented.

The method of manufacturing a multi-layer printed circuit board may further include a step for forming a metal layer by electroless plating, sputtering or evaporation.

In the method, electroless plating may be employed so that the metal layer can be formed with a low cost. When sputtering is employed as a forming method, a metal layer exhibiting excellent adhesiveness and a small thickness can be formed. When an evaporation forming method is employed, a more thin metal layer can be formed.

The method of manufacturing a multi-layer printed circuit board may be characterized in that said step for forming said metal film on the opposite surface of said resin insulating layer on which said metal layer is formed is arranged to perform electroless plating, sputtering or evaporation.

In the method, electroless plating may be employed so that the metal film can be formed with a low cost. When sputtering is employed as a forming method, a metal layer exhibiting excellent adhesiveness and a small thickness can be formed. When an evaporation forming method is employed, a thin metal layer can be formed.

To solve the above-mentioned problems, a printed circuit board according to yet another embodiment of the present invention is characterized by comprising: a core substrate; and through holes formed in said core substrate, wherein said core substrate incorporates a core member and a resin insulating layer formed on each of two sides of said core member and having a roughened surface, and each of said through holes is constituted by providing a metal film for a penetrating opening formed by a laser beam.

In the printed circuit board, laser beams may be used to form penetrating in a core substrate constituted by a core member and resin insulating layer formed on each of the two sides of the core member. Since the penetrating openings are, by laser beams, formed in the core substrate which is in a state where the metal film is formed, any retention of an air bubble can be prevented when the metal films are deposited in the penetrating openings to form the through holes. Thus, any corner crack starting with a burr does not occur and, therefore, the reliability in the connection of the through holes can be improved. Since a rough surface is formed on the surface of the core substrate, the adhesiveness with the metal film constituting the through hole can be improved.

In the printed circuit board, the core member may be formed by causing the core member to be impregnated with resin. Thus, the strength required for the core substrate can be maintained.

In the printed circuit board, the resin insulating layer may be constituted by dispersing soluble particles in refractory resin. Since soluble particles are dissolved, a rough surface can be formed on the surface of the core substrate. Therefore, the adhesiveness of the metal film which is formed on the surface of the core substrate and which constitutes the through hole can be improved.

In the printed circuit board, the resin insulating layer may be composed of soluble resin and refractory resin. Since the soluble resin is dissolved, a rough surface can be formed on the surface of the core substrate. Thus, the adhesiveness of the metal film which is formed on the surface of the core substrate can be improved.

According to still another embodiment of the invention, a method of manufacturing a printed circuit board includes at least the following steps (A) to (D):

(A) laminating a resin insulating layer on each of two sides of a core member to form a core substrate;

(B) forming penetrating openings in said core substrate by applying laser beams;

(C) forming a rough surface on said core substrate; and (D) providing a metal film for each penetrating opening to form through holes.

In the method, penetrating openings are, by laser beams, formed in a core substrate composed of a core member and a resin insulating layer formed on each of the two sides of the core member. Then, a rough surface is formed on the surface of the core substrate, and then a metal film is formed in the penetrating opening Thus, through holes are formed. The laser beams are used to form the penetrating openings in the core substrate which is in a state before the metal film is formed. Therefore, when the metal film is deposited in each penetrating opening to form the through holes or when the through hole is filled with a filler, retention of any air bubble can be prevented. Thus, any corner crack starting with a burr does not formed and, therefore, reliability in the connection of the through holes can be improved. Since the rough surface is formed on the surface of the core substrate, the adhesiveness with the metal film constituting the through hole can be improved.

In the method, the core member is formed by causing the core member to be impregnated with resin. Thus, the strength required for the core substrate can be maintained.

The method of manufacturing a printed circuit board may include said resin insulating layer formed by dispersing soluble particles in refractory resin. Soluble particles are dissolved so that a rough surface is formed on the surface of the core substrate. Thus, the adhesiveness of the metal film which is formed on the surface of the core substrate can be improved.

To solve the above-mentioned problems, a multi-layer printed circuit board according to still another embodiment of the present invention includes a core substrate having through holes for connecting the upper and lower surfaces to each other and having a structure that interlayer resin insulating layers and conductor circuits are alternately laminated on said core substrate, wherein through holes having different diameters are formed in said core substrate.

In the multi-layer printed circuit board, through holes having different diameters are formed in the core substrate. Therefore, the degree of freedom of the wiring density of the through holes can be improved. Since through holes having small diameters serve as power supply lines and ground lines, a multiplicity of power supply lines and ground lines can be provided. Thus, an influence of the inductance of the power supply lines and the ground lines which is exerted on the IC chip can be reduced. As a result, malfunction of the IC chip can prevented.

A multi-layer printed circuit board according to still another embodiment of the present invention includes a core substrate having through holes for connecting the upper and lower surfaces to each other and having a structure that interlayer resin insulating layers and conductor circuits are alternately laminated on said core substrate, wherein through holes each having a small diameter are mainly formed in the central portion of said core substrate, and through holes each having a large diameter are mainly formed in the outer periphery.

The multi-layer printed circuit board may be characterized by said through holes each having the small diameter are mainly provided with power supply lines and ground lines, and said through holes each having the large diameter are mainly provided with signal lines.

In the multi-layer printed circuit board, through holes each having a small diameter are formed in the central portion of the core substrate and through holes each having a large diameter are formed in the outer periphery. Therefore, the wiring density in the central portion can be raised. Since the through holes formed in the central portion and each having the small diameter serve as the power supply line and the ground lines, a multiplicity of power supply lines and ground lines can be provided. Moreover, the length opening electric wires from the IC chip to an external substrate can be shortened. Therefore, an influence of the inductance of the power supply lines and the ground lines which is exerted on the IC chip can be reduced. As a result, malfunction of the IC chip can be prevented. Note that substitution of expression "immediately below" for the "central portion" is permitted.

A method of manufacturing a multi-layer printed circuit board according to still another embodiment of the present invention includes at least the following steps (A) and (B);

(A) providing penetrating openings which are formed into through holes and each of which has a small diameter for a core substrate; and (B) providing penetrating openings which are formed into through holes each having a large diameter for said core substrate.

In the method, penetrating openings serving as the through holes and each having a small diameter and penetrating openings each having a large diameter and serving as through holes may be formed in the core substrate. Therefore, a core substrate exhibiting a high degree of freedom of the wiring density can be manufactured with a low cost. Each through hole may be formed by either of a laser beam or drilling. It is preferable that the through hole having the small direction is formed by a laser beam. The laser beam may be a carbon dioxide gas laser beam, excimer laser beam, a YAG laser beam or an UV layer. As an alternative to this, an area process using a mask having penetrating opening formed therein or combination of two or more types of laser beams may be employed.

A method of manufacturing a multi-layer printed circuit board according to still another embodiment of the present invention includes at least the following steps (A) and (B):

(A) irradiating the central portion of a core substrate with laser beams or drilling the central portion to form penetrating openings which are formed into through holes and each of which has a small diameter; and (B) irradiating the central portion of said core substrate with laser beams or drilling the central portion to form penetrating openings which are formed into through holes and each of which has a large diameter.

The method of manufacturing a multi-layer printed circuit board may be characterized by said through holes each having the small diameter are mainly provided with power supply lines and ground lines, and said through holes each having the large diameter are mainly provided with signal lines.

In the method, through holes each having a small direction are formed in the central portion of the core substrate by laser beams or by drilling and through holes each having a large diameter may be formed in the outer periphery by drilling or a laser beam. Therefore, a core substrate having a high degree of freedom of the wiring density can be formed in the central portion with a low cost. When the through holes each having the small diameter and formed in the central portion serve as the power supply lines and the ground lines, a multiplicity of power supply line and ground lines can be formed. Moreover, the length of each electric wire from the IC chip to the external substrate can be shortened. Therefore, an influence of the inductance of the power supply lines and the ground lines which is exerted on the IC chip can be reduced. As a result, malfunction of the IC chip can be prevented. The through holes each having the large diameter and a low probability of occurrence of a defect in the connection are mainly used as signal lines. Moreover, the through holes each having the small diameter and having a high probability of a defect in the connection are mainly used s the power supply line and the ground lines. Therefore, in a case where the through holes serving as the power supply line and the ground lines encounters disconnection, the multi-layer printed circuit board is able to continue a normal operation.

The printed circuit board and the method of manufacturing a printed circuit board may include a core substrate having the surface on which resin insulating layers and conductor circuits are alternately built up, wherein said core substrate is constituted by forming openings in a resin plate by applying laser beams and by forming a sputtered layer on said resin plate by sputtering which is performed after said openings have been formed.

The printed circuit board and the method of manufacturing a printed circuit board may include at least the following steps (A) to (F):

(A) forming openings in a resin plate which is formed into a core substrate by applying laser beams;

(B) performing sputtering to form a sputtered layer on said resin plate;

(C) performing electroless plating through said sputtered layer;

(D) forming a resist having a predetermined pattern after said electroless plating has been performed;

(E) performing electroplating to form an electroplated layer in a portion in which said resist is not formed; and (F) performing etching after said resist has been removed to remove said sputtered layer and said electroless plated layer below said resist so as to form a conductor circuit.

The foregoing process (a) may be performed by using one type of the laser beam or a mixed laser beam of two or more laser beams.

The printed circuit board and the method of manufacturing a printed circuit board may be characterized by a carbon dioxide laser process, an excimer laser process, a YAG laser process and an UV laser process, when said openings are formed in said resin plate by applying laser beams.

The printed circuit board and the method of manufacturing a printed circuit board may be characterized in that at least one type of materials selected from Cu, Ni, Cr, Pd and Mo, is employed, when said sputtered layer is formed on said resin plate by sputtering.

The printed circuit board and the method of manufacturing a printed circuit board may have a structure that the resin plate has openings formed by $CO_2$ laser beams (YAG laser beams, excimer laser beams or UV laser beams). Therefore, penetrating openings each having a smaller diameter as compared with that of each of penetrating openings formed by drilling can be formed. As distinct from a structure that openings are formed in a copper-clad laminated board by laser beams, leaving of copper in the through hole which causes a plated film formed in the through hole to be separated can be prevented. Moreover, time required to form the openings can be shortened. The openings are formed in the resin plate by using laser beams, and then one or more elements selected from Cu, Ni, Cr, Pd and Mo is brought into contact with the resin. Therefore, strength between the sputtered layer and the resin of 1.0 kg/cm.sup.2 can be realized which is substantially the same as that realized by the conventional copper-clad laminated board.

BRIEF DESCRIPTION OF DRAWINGS

FIGS. 4 (A) and 4 (B) are diagrams showing a process for manufacturing a multi-layer printed circuit board according to the first embodiment;

FIGS. 5 (A) and 5 (B) are diagrams showing a process for manufacturing a multi-layer printed circuit board according to the first embodiment;

FIGS. 7 (A) and 7 (B) are diagrams showing a process for manufacturing a multi-layer printed circuit board according to a first modification of the first embodiment;

FIGS. 8 (A) and 8 (B) are diagrams showing a process for manufacturing a multi-layer printed circuit board according to a second modification of the first embodiment;

FIGS. 9 (A), 9 (B) and 9 (C) are diagrams showing a process for manufacturing a multi-layer printed circuit board according to a third modification of the first embodiment;

FIGS. 10 (A) and 10 (B) are plan views showing a copper-clad laminated board constituting the multi-layer printed circuit board according to third modification of the first embodiment;

FIGS. 12 (A), 12 (B), 12 (C) and 12 (D) are diagrams showing a process for manufacturing a multi-layer printed circuit board according to a second embodiment;

FIGS. 13 (A), 13 (B), 13 (C) and 13 (D) are diagrams showing a process for manufacturing the multi-layer printed circuit board according to the second embodiment;

FIGS. 14 (A), 14 (B) and 14 (C) are diagrams showing a process for manufacturing the multi-layer printed circuit board according to the second embodiment;

FIGS. 15 (A), 15 (B) and 15 (C) are diagrams showing a process for manufacturing the multi-layer printed circuit board according to the second embodiment;

FIGS. 16 (A) and 16 (B) are diagrams showing a process for manufacturing the multi-layer printed circuit board according to the second embodiment;

FIGS. 17 (A) and 17 (B) are diagrams showing a process for manufacturing the multi-layer printed circuit board according to the second embodiment;

FIGS. 19 (A), 19 (B) and 19 (C) are diagrams showing a process for manufacturing a multi-layer printed circuit board according to a first modification of the second embodiment;

FIGS. 20 (A), 20 (B) and 20 (C) are diagrams showing a process for manufacturing the multi-layer printed circuit board according to the first modification of the second embodiment;

FIGS. 21 (A), 21 (B) and 21 (C) are diagrams showing a process for manufacturing the multi-layer printed circuit board according to the first modification of the second embodiment;

FIGS. 22 (A) and 22 (B) are diagrams showing a process for manufacturing the multi-layer printed circuit board according to the first modification of the second embodiment;

FIG. 25 is a graph showing results of a heat cycle test of the second embodiment;

FIGS. 31 (A) and 31 (B) are diagrams showing a process for manufacturing the printed circuit board according to the third embodiment;

FIGS. 38 (A) and 38 (B) are diagrams showing a process for manufacturing the printed circuit board according to the first modification of the third embodiment;

FIGS. 43 (A), 43 (B) and 43 (C) are diagrams showing a process for manufacturing the printed circuit board according to the fourth embodiment;

FIGS. 44 (A), 44 (B) and 44 (C) are diagrams showing a process for manufacturing the printed circuit board according to the fourth embodiment;

FIGS. 45 (A) and 45 (B) are diagrams showing a process for manufacturing the printed circuit board according to the fourth embodiment;

FIG. 48 (A) is a diagram showing wiring of electric lines in a core substrate according to the fourth embodiment and FIG. 48 (B) is a plan view showing the core substrate;

FIGS. 53 (A), 53 (B) and 53 (C) are diagrams showing a process for manufacturing the printed circuit board according to the first modification of the fourth embodiment;

FIGS. 54 (A), 54 (B) and 54 (C) are diagrams showing a process for manufacturing the printed circuit board according to the first modification of the fourth embodiment;

FIGS. 55 (A), 55 (B) and 55 (C) are diagrams showing a process for manufacturing the printed circuit board according to the first modification of the fourth embodiment;

FIGS. 63 (A) and 63 (B) are diagrams showing a process for manufacturing the printed circuit board according to the fifth embodiment;

FIGS. 64 (A) and 64 (B) are diagrams showing a process for manufacturing the printed circuit board according to the fifth embodiment;

FIGS. 68 (A) and 68 (B) are diagrams showing a process for manufacturing the printed circuit board according to the fifth embodiment;

FIGS. 70 (A), 70 (B), 70 (C) and 70 (D) are diagrams showing a process for manufacturing a conventional printed circuit board.

BEST MODE FOR CARRYING OUT THE INVENTION

[First Embodiment]

The structure of a multi-layer printed circuit board according to a first embodiment of the present invention will now be described with reference to FIG. 6 which is a cross sectional view.

Figure 6:
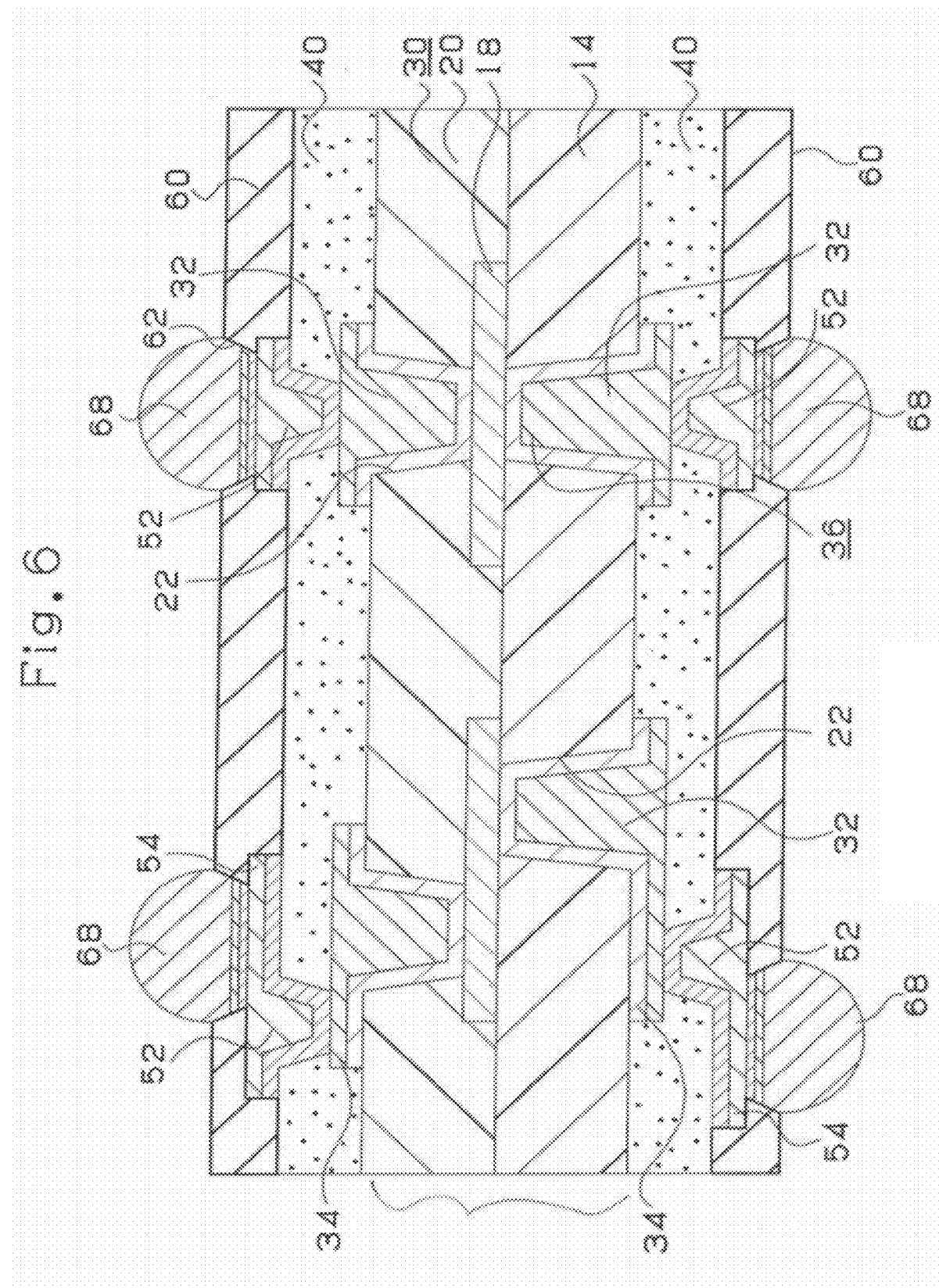
FIG. 6 is a diagram showing the cross section of the multi-layer printed circuit board according to the first embodiment.

As shown in FIG. 6, a multi-layer printed circuit board 10 incorporates a core substrate 30 having right and reverse sides on which conductor circuits 34 are formed. Moreover, interlayer resin insulating layers 40 are formed on the conductor circuits 34. Vias 52 and conductor circuit 54 are formed on the interlayer resin insulating layers 40. Solder resists 60 are formed above the interlayer resin insulating layers 40. Solder bumps 68 are formed on the vias 52 and conductor circuits 54 through openings 62 of the solder resists 60.

The multi-layer printed circuit board according to this embodiment incorporate the core substrate 30 is constituted such that a lower insulating layer 14 and an upper insulating layer 20 sandwich a metal layer (a circuit pattern) 18. Vias 32 are formed to vertically correspond to each other through the circuit pattern 18 so that each through hole 36 is formed. On the other hand the upper and lower vias 32 across the circuit pattern 18 are deviated from each other so that each electric line is wired through the circuit pattern 18.

In the first embodiment, the metal layer (the circuit pattern) 18 is sandwiched by resins (insulating layers) 20 and 14 so that strength is maintained. Thus, the thickness of the core substrate 30 can be reduced. Hence it follows that the thickness of the multi-layer printed circuit board can be reduced and the thermal conductivity can be improved.

In the first embodiment, non-penetrating openings 22 which reach the metal layer 18 are formed in the lower insulating layer 14 and the upper insulating layer 20 of the core substrate 30 by a laser process and filled with plating so that the vias 32 are formed. Since the non-penetrating openings 22 which reach the metal layer 18 are simply required to be formed in the lower insulating layer 14 and the upper insulating layer 20, the depth of each penetrating opening which is formed by a laser beam can be halved as compared with a conventional core substrate. That is, the conventional technique is required to form the penetrating opening serving as the through hole such that the thickness of the penetrating opening corresponds to the total thickness of the lower insulating layer 14 and the upper insulating layer 20. On the other hand, this embodiment is permitted to individually form the penetrating opening in each of the lower insulating layer 14 and the upper insulating layer 20. Therefore, the depth of each penetrating opening is halved. Therefore, fine non-penetrating openings can easily be formed by using laser beams. Hence it follows that through holes each having a small diameter can be formed. Thus, the degree of integration of the multi-layer printed circuit board can be raised.

Since the core substrate 30 has a multilayer structure, electric wires can be wired in each metal layer (the circuit pattern) 18 between the lower insulating layer 14 and the upper insulating layer 20 constituting the core substrate. Therefore, the number of the layers of the multi-layer printed circuit board can be reduced.

A method of manufacturing the above-mentioned multi-layer printed circuit board described with reference to FIG. 6 will now be described with reference to FIGS. 1 to 5.

Figure 1:
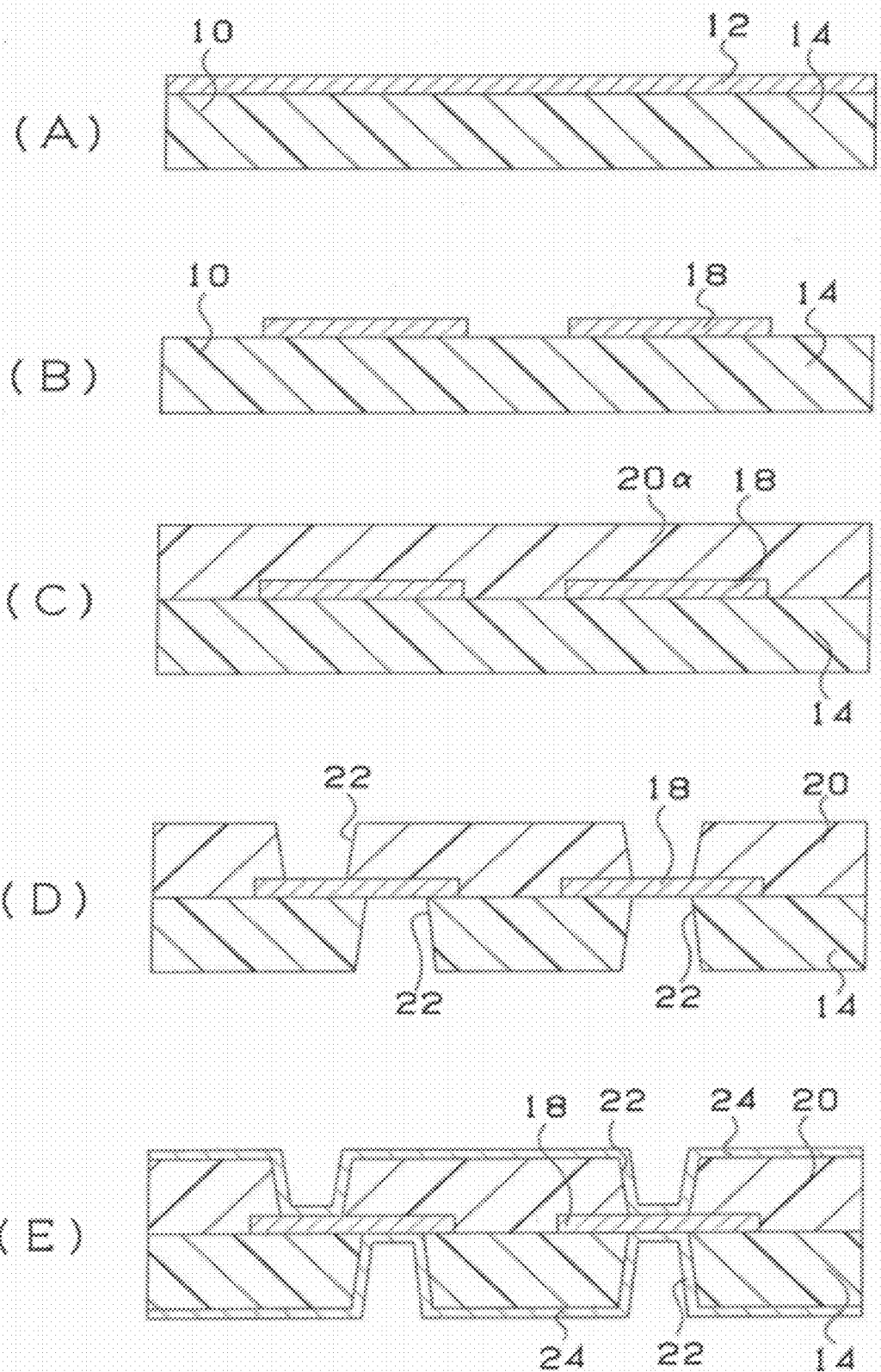
FIGS. 1 (A), 1 (B), 1 (C), 1 (D) and 1 (E) are diagrams showing a process for manufacturing a multi-layer printed circuit board according to a first embodiment of the present invention.

(1) A one-side copper-clad plate 10 incorporating a substrate (the lower insulating layer) 14 which is constituted by resin having a thickness of 30 μm to 300 μm and on which copper foil 12 having a thickness of 5 μm to 50 μm is laminated is employed as a starting material (FIG. 1 (A)). The lower insulating layer 14 is constituted by a glass cloth or an aramid cloth impregnated with epoxy, BT (Bismaleimide-Triazine), polyimide or olefin. As an alternative to this, resin having no core member, such as the glass cloth or the aramid cloth, or a resin film having a reinforcing resin layer laminated thereon may be employed.

Initially, the one-side copper-clad plate 10 is etched according to a pattern so that a circuit pattern 18 is formed on the upper surface of the substrate 14 (FIG. 1 (B)). Then, a film 20 a constituted by resin having a thickness of 30 μm to 300 μm is bonded to the upper surface of the circuit pattern 18 by pressing (FIG. 1 (C)). The resin film 20 α may be constituted by the above-mentioned glass cloth or the aramid cloth impregnated with epoxy, BT (Bismaleimide-Triazine), polyimide or olefin. As an alternative to this, resin having no core member, such as the glass cloth or the aramid cloth may be employed. That is, the lower insulating layer 14 and the upper insulating layer 20 may be constituted by the same material or different materials. It is preferable that the same material and the same structure (whether or not the core member is provided) are employed as the characteristics of the multi-layer printed circuit board. When different materials and different structures are employed, more various materials can be selected. When the lower insulating layer 14 and the upper insulating layer 20 are constituted by the resin having the core member made of the glass cloth or the aramid cloth, the strength of the core substrate 30 can be increased. When the core member is not used, metal migration through the core member can be prevented. Thus, the insulating characteristic between through holes can be maintained for a long time. Although the resin film is bonded in this embodiment, resin may be applied and the resin is hardened as a substitute for the resin film. The rough surface may be formed on the circuit pattern. The rough surface may be formed by oxidizing/reducing process, etching or electroless plating. The rough surface can improve the adhesiveness.

Then, the resin film 20 α is heated and hardened so that the upper insulating layer 20 is formed. Then, $CO_2$ laser, YAG laser or excimer laser is used to form the non-penetrating opening 22 which reaches the circuit pattern 18 and having a diameter of 50 μm and 250 μm is formed in the upper insulating layer 20 and the lower insulating layer 14 (FIG. 1 (D)). The range of 75 to 150 is desirable. Since this embodiment has the structure that each of the upper insulating layer 20 and the lower insulating layer 14 has the small thickness of 30 μm to 200 μm, fine openings can be formed by applying laser beams.

Then, a desmear process is performed, and then a palladium catalyst is supplied. Then, the core substrate 30 is immersed in electroless plating solution so that an electroless plated film 24 having a thickness of 15 μm is uniformly deposited on the surface of the core substrate 30 (FIG. 1(E)). Although the electroless plating is employed in this embodiment, a metal film made of copper or nickel may be formed by sputtering. Although sputtering is disadvantage from a viewpoint of cost reduction, the sputtering has an advantage that the adhesiveness with the resin can be improved.

Then, a photosensitive dry film is bonded to the surface of the core substrate 30, and then a mask is placed to form exposure and development processes. Thus, a plating resist 26 having a thickness of 15 μm is formed (FIG. 2 (A)). Then, the core substrate 30 is immersed in electroless plating solution, and then an electric current is supplied through the electroless plated film 24 so that an electroplating 28 is formed in a portion in which the resist 26 is not formed. At this time, the surface of the non-penetrating opening 22 is flattened by enclosing the electroplating 28 (FIG. 2 (B)).

Then, the resist 26 is separated and removed with 5% KOH, and then etching is performance by using a mixed solution of sulfuric acid and hydrogen peroxide so that the electroless plated film 24 below the resist is dissolved and removed. Thus, the conductor circuits 34 composed of the electroless plated film 24 and the electroplating 28 and having a thickness of 18 μm (10 μm to 30 μm) and the vias 32 are obtained (FIGS. 2 (C)). In the first embodiment, the vias 32 are formed to correspond to each other across the circuit pattern 18 so that the through hole 36 is formed. On the other hand, the positions of the upper and lower vias 32 across the circuit pattern 18 are deviated from each other, electric lines are wired through the circuit pattern 18.

Moreover, the core substrate 30 is immersed in chromic acid for 3 minutes to perform a process for etching the surface of the core substrate 30 between the conductor circuits 34 by 1 μm so as to remove the palladium catalyst on the surface. Then, etching solution containing a cupric salt complex and an organic acid is used to form a rough surface (not shown) on the surface of each of the conductor circuit 34 and the via 32. Then, the surfaces is subjected to Sn substitution.

Figure 2:
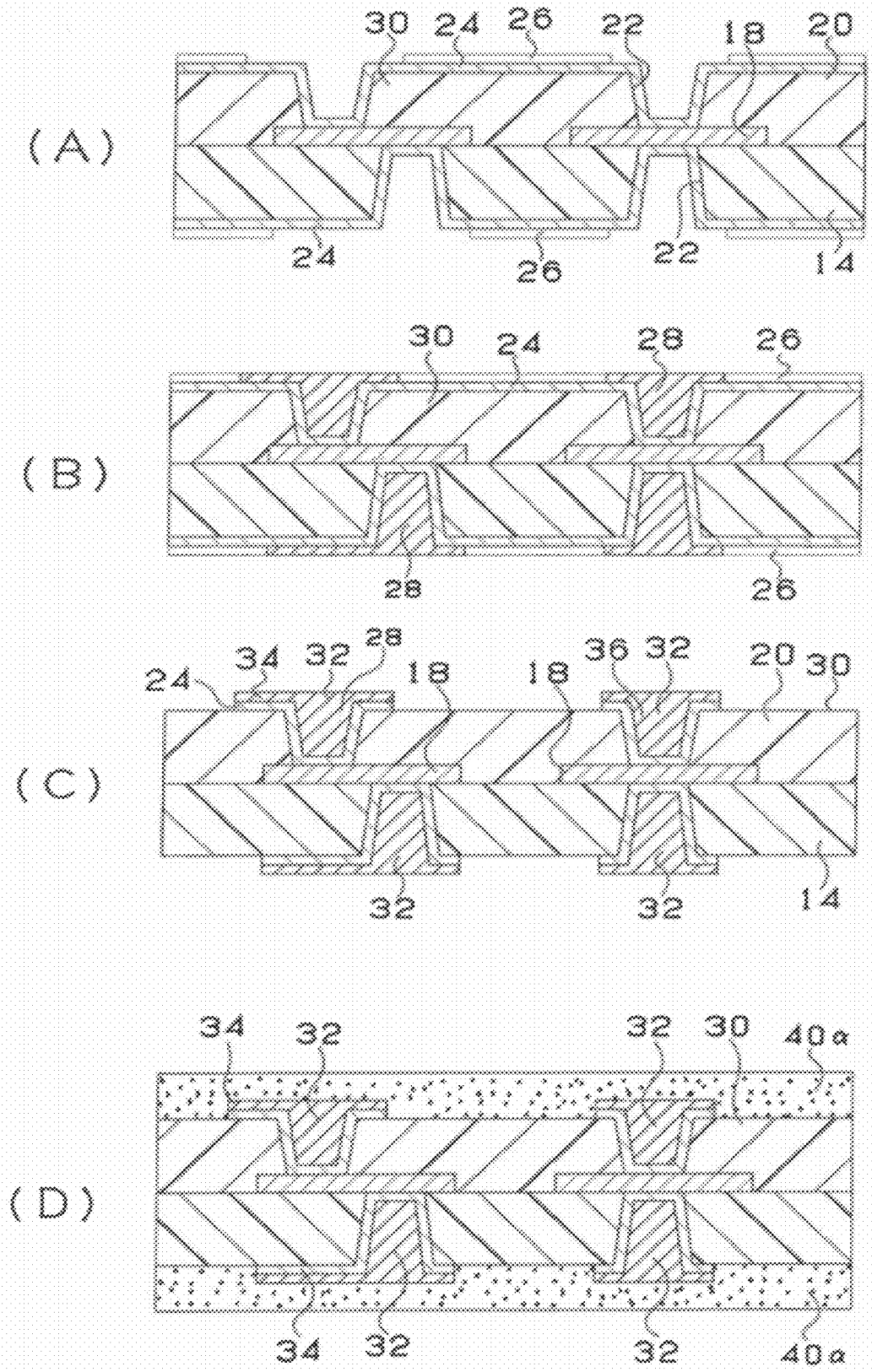
FIGS. 2 (A), 2 (B), 2 (C) and 2 (D) are diagrams showing a process for manufacturing a multi-layer printed circuit board according to the first embodiment.

A thermosetting resin 36 α made of epoxy, BT, polyimide or olefin is applied to the surface of the core substrate 30, and then the core substrate 30 is dried (pre-baked) (FIG. 2 (D)). Then, $CO_2$ laser, YAG laser or excimer laser is used to form non-penetrating openings 42 which reach the conductor circuit 34 and the via 32 and each having a diameter of 100 μm to 250 μm. Then, heating is performed so that the interlayer resin insulating layers 40 each having the non-penetrating opening 42 is formed (FIG. 3 (A)). The interlayer resin insulating layer may be made of the resin which is the same as the resin constituting the lower insulating layer 14 and the upper insulating layer 20. As an alternative to this, different resin may be employed. A mixed material of thermosetting resin and thermoplastic resin may be employed as a substitute for the thermosetting resin. Moreover, a filler made of silicon or resin may be mixed. When a soluble filler is mixed and the filler is dissolved with a chemicals solution, the surface of the interlayer resin insulating layer can be roughened. Although the resin is applied in this embodiment, a resin film may be employed similarly to the upper insulating layer 20. In the embodiment, it is desirable that the interlayer resin insulating layer does not have a core part and has a high coefficient of thermal expansion. Thus, a via can be easily made.

The resin film contains refractory resin, soluble particles, a hardening agent and other components. The materials will now be described.

The thermosetting resin film for use in the resin insulating layer in the manufacturing method according to the present invention has a structure that particles soluble in acid or an oxidizer (hereinafter called "soluble particles") are dispersed in resin which is refractory with respect to acid or an oxidizer (hereinafter called "refractory resin").

The expressions "refractory" and "soluble" will now be described. When materials are immersed in solution composed of the same acid or the same oxidizers for the same time, a material of a type which is dissolved at a relatively high dissolving rate is called a "soluble" material for convenience. A material of a type which is dissolved at a relatively slow dissolving rate is called a "refractory material" for convenience.

The soluble particles are exemplified by resin particles which are soluble in acid or an oxidizer (hereinafter called "soluble resin particles"), inorganic particles which are soluble in acid or an oxidizer (hereinafter called "inorganic soluble particles") and metal particles which are soluble in acid or an oxidizer (hereinafter called "soluble metal particles"). The foregoing soluble particles may be employed solely or two or more particles may be employed.

The shape of each of the soluble particles is not limited. The shape may be a spherical shape or a pulverized shape. It is preferable that the particles have a uniform shape. The reason for this lies in that a rough surface having uniformly rough pits and projections can be formed.

It is preferable that the mean particle size of the soluble particles is 0.1 μm to 10 μm. When the particles have the diameters satisfying the foregoing range, particles having two or more particle sizes may be employed. That is, soluble particles having a mean particle size of 0.1 μm to 0.5 μm and soluble particles having a mean particle size of 1 μm to 3 μmm may be mixed. Thus, a more complicated rough surface can be formed. Moreover, the adhesiveness with the conductor circuit can be improved. In the present invention, the particle size of the soluble particles is the length of a longest portion of each of the soluble particles.

The soluble resin particles may be resin particles constituted by thermosetting resin or thermoplastic resin. When the particles are immersed in solution composed of acid or an oxidizer, the particles must exhibit dissolving rate higher than that of the foregoing refractory resin.

Specifically, the soluble resin particles are exemplified by particles constituted by epoxy resin, phenol resin, polyimide resin, polyphenylene resin, polyolefin resin or fluorine resin. The foregoing material may be employed solely or two or more materials may be mixed.

The soluble resin particles may be resin particles constituted by rubber. Rubber above is exemplified by polybutadiene rubber, a variety of denatured polybutadiene rubber, such as denatured epoxy rubber, denatured urethane rubber or denatured (metha) acrylonitrile rubber, and (metha) acrylonitrile butadiene rubber containing a carboxylic group. When the foregoing rubber material is employed, the soluble resin particles can easily be dissolved in acid or an oxidizer. That is, when the soluble resin particles are dissolved with acid, dissolution is permitted with acid except for strong acid. When the soluble resin particles are dissolved, dissolution is permitted with permanganate which has a relatively weak oxidizing power. When chromic acid is employed, dissolution is permitted even at a low concentration. Therefore, retention of the acid or the oxidizer on the surface of the resin can be prevented. When a catalyst, such as palladium chloride, is supplied after the rough surface has been formed as described later, inhibition of supply of the catalyst and oxidation of the catalyst can be prevented.

The inorganic soluble particles are exemplified by particles made of at least a material selected from a group consisting of an aluminum compound, a calcium compound, a potassium compound, a magnesium compound and a silicon compound.

The aluminum compound is exemplified by alumina and aluminum hydroxide. The calcium compound is exemplified by calcium carbonate and calcium hydroxide. The potassium compound is exemplified by potassium carbonate. The magnesium compound is exemplified by magnesia, dolomite and basic magnesium carbonate. The silicon compound is exemplified by silica and zeolite. The fore going material may be employed solely or two or more materials may be mixed.

The soluble metal particles are exemplified by particles constituted by at least one material selected from a group consisting of copper, nickel, iron, zinc, lead, gold, silver, aluminum, magnesium, potassium and silicon. The soluble metal particles may have surfaces coated with resin or the like in order to maintain an insulating characteristic.

When two or more types of the soluble particles are mixed, it is preferable that the combination of the two types of soluble particles is combination of resin particles and inorganic particles. Since each of the particles has low conductivity, an insulating characteristic with the resin film can be maintained. Moreover, the thermal expansion can easily be adjusted with the refractory resin. Thus, occurrence of a crack of the interlayer resin insulating layer constituted by the resin film can be prevented. Thus, separation between the interlayer resin insulating layer and the conductor circuit can be prevented.

The refractory resin is not limited when the resin is able to maintain the shape of the rough surface when the rough surface is formed on the interlayer resin insulating layer by using acid or oxidizer. The refractory resin is exemplified by thermosetting resin, thermoplastic resin and their composite material. As an alternative to this, the foregoing photosensitive resin of a type having photosensitive characteristic imparted there to may be employed. When the photosensitive resin is employed, exposure and development processes of the interlayer resin insulating layers can be performed to form the openings for the via holes.

In particular, it is preferable that the resin containing thermosetting resin is employed. In the foregoing case, the shape of the rough surface can be maintained against plating solution and when a variety of heating processes are performed.

The refractory resin is exemplified by epoxy resin, phenol resin, phenoxy resin, polyimide resin, polyphenylene resin, polyolefin resin and fluorine resin. The foregoing material may be employed solely or two or more types of the materials may be mixed.

It is preferable that epoxy resin having two or more epoxy groups in one molecule thereof is employed. The reason for this lies in that the foregoing rough surface can be formed. Moreover, excellent heat resistance and the like can be obtained. Thus, concentration of stress onto the metal layer can be prevented even under a heat cycle condition. Thus, occurrence of separation of the metal layer can be prevented.

The epoxy resin is exemplified by cresol novolac epoxy resin, bisphenol-A epoxy resin, bisphenol-F epoxy resin, phenol novolac epoxy resin, alkylphenol novolac epoxy resin, biphenol-F epoxy resin, naphthalene epoxy resin, dicyclopentadiene epoxy resin, an epoxy material constituted by a condensation material of phenol and an aromatic aldehyde having a phenol hydroxyl group, triglycidyl isocyanurate and alicyclic epoxy resin. The foregoing material may be employed solely or two or more material may be mixed. Thus, excellent heat resistance can be realized.

It is preferable that the soluble particles in the resin film according to the present invention are substantially uniformly dispersed in the refractory resin. The reason for this lies in that a rough surface having uniform pits and projections can be formed. When via holes and through holes are formed in the resin film, adhesiveness with the metal layer of the conductor circuit can be maintained. As an alternative to this, a resin film containing soluble particles in only the surface on which the rough surface is formed may be employed. Thus, the portions of the resin film except for the surface is not exposed to acid or the oxidizer. Therefore, the insulating characteristic between conductor circuits through the interlayer resin insulating layer can reliably be maintained.

It is preferable that the amount of the soluble particles which are dispersed in the refractory resin is 3 wt % to 40 wt % with respect to the resin film. When the amount of mixture of the soluble particles is lower than 3 wt %, the rough surface having required pits and projections cannot be formed. When the amount is higher than 40 wt %, deep portions of the resin film are undesirably dissolved when the soluble particles are dissolved by using acid or the oxidizer. Thus, the insulating characteristic between the conductor circuits through the interlayer resin insulating layer constituted by the resin film cannot be maintained. Thus, short circuit is sometimes is caused to occur.

It is preferable that the resin film contains a hardening agent and other components as well as the refractory resin.

The hardening agent is exemplified by an imidazole hardening agent, an amine hardening agent, a guanidine hardening agent, an epoxy adduct of each of the foregoing hardening agents, a microcapsule of each of the foregoing hardening agents and an organic phosphine compound, such as triphenylphosphine or tetraphenyl phosphonium tetraphenyl borate.

It is preferable that the content of the hardening agent is 0.05 wt % to 10 wt % with respect to the resin film. When the content is lower than 0.05 wt %, the resin film cannot sufficiently be hardened. Thus, introduction of acid and the oxidizer into the resin film occurs greatly. In the foregoing case, the insulating characteristic of the resin film sometimes deteriorates. When the content is higher than 10 wt %, an excessively large quantity of the hardening agent component sometimes denatures the composition of the resin. In the foregoing case, the reliability sometimes deteriorates.

The other components are exemplified by an inorganic compound which does not exert an influence on the formation of the rough surface and a filler constituted by resin. The inorganic compound is exemplified by silica, alumina and dolomite. The resin is exemplified by polyimide resin, polyacrylic resin, polyamideimide resin, polyphenylene resin, melanine resin and olefin resin. When any one of the foregoing fillers is contained, conformity of the thermal expansion coefficients can be established. Moreover, heat resistance and chemical resistance can be improved. As a result, the performance of the printed circuit board can be improved.

The resin film may contain solvent. The solvent is exemplified by ketone, such as acetone, methylethylketone or cyclohexane; aromatic hydrocarbon, such as ethyl acetate, butyl acetate, cellosolve acetate, toluene or xylene. The foregoing material may be employed solely or two or more materials may be mixed.

Figure 3:
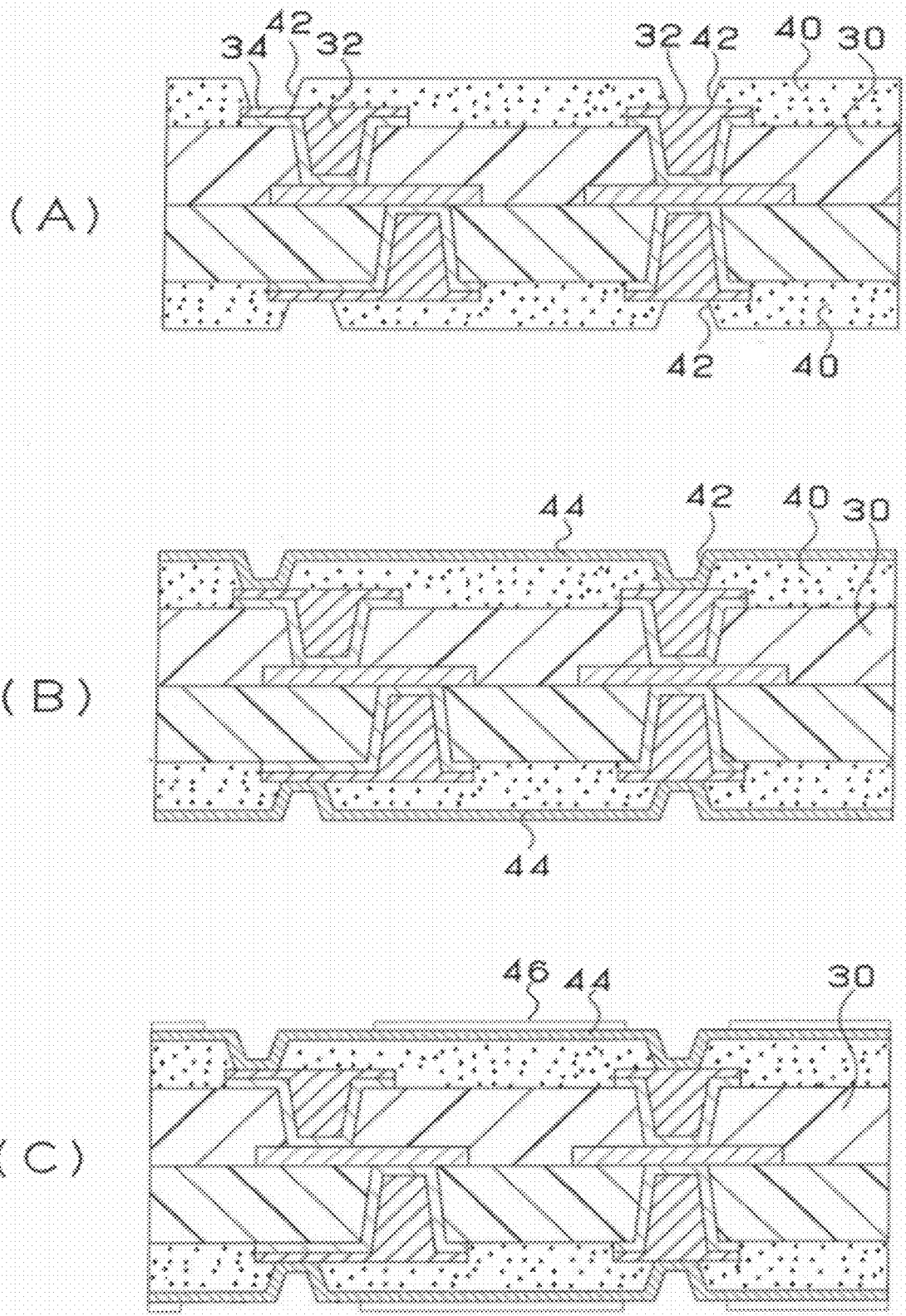
FIGS. 3 (A), 3 (B) and 3 (C) are diagrams showing a process for manufacturing a multi-layer printed circuit board according to the first embodiment.

Then, a desmear process is performed, and then a palladium catalyst is supplied, and then immersion into electroless plating solution is performed so that an electroless plated film 44 having a thickness of 15 μm is uniformly deposited on the surface of the interlayer resin insulating layers 40 (FIG. 3 (B)).

Then, a plating resist 46 is formed on the surface of the electroless plated film 44 (FIG. 3 (C)). Then, an electroplating 48 is formed on a portion in which the resist 46 is not formed (FIG. 4 (A)).

Then, the resist 46 is separated and removed, and then etching is performed so that the electroless plated film 42 below the plating resist is dissolved and removed. Thus, a conductor circuit 54 composed of the electroless plated film 42 and the electroplating 48 and having a thickness of 18 μm (10 μm to 30 μm) and vias 52 are obtained (FIG. 4 (B)). Then, a rough layer (not shown) is formed on the surface of each of the conductor circuit 54 and the vias 52.

Then, solder bumps are formed on the above-mentioned multi-layer printed circuit board. Initially, 46.67 g of oligomer (having a molecular weight of 4000) which is obtained by forming 50% of epoxy groups of 60 wt % cresol novolac epoxy resin (manufactured by Nippon Kayaku) dissolved in DMDG into an acrylic structure and which imparts photosensitive characteristic, 15.0 g of 80 wt % bisphenol A epoxy resin (Epicoat 1001 manufactured by Yuka Shell) dissolved in methylethyl ketone, 1.6 g of imidazole hardening material (2E4MZ-CN manufactured by Shikoku Chemicals), 3 g of polyhydric acryl monomer which is a photosensitive monomer (R604 manufactured by Nippon Kayaku), 1.5 g of polyhydric acryl monomer (DPE6A manufactured by Kyoei Chemical) and 0.71 g of dispersing defoaming agent (S-65 manufactured by Sannopuko) were mixed with one another. Then, 2 g of benzophenone (manufactured by Kanto Chemical) serving as a photoinitiator and 0.2 g of Michler's ketone (manufactured by Kanto Chemical) serving as a photosensitizer were added. Then, the viscosity was adjusted to 2.0 Pa·s at 25° C. so that a solder resist composition was obtained.

Note that the viscosity was measured by using No. 4 rotor of a B-type viscometer (DVL-B manufactured by Tokyo Keiki (Tokimec)) when the velocity was 60 rpm and No. 3 rotor of the same when the velocity was 6 rpm.

A solder resist composition 70 α was applied to each side of the multi-layer printed circuit board to have a thickness of 20 µm. Then, a drying process was performed at 70° C. for 20 minutes and 70° C. for 30 minutes. Then, a photomask film having a circular pattern (a mask pattern) drawn thereon and a thickness of 5 mm was made hermetic contact and placed. Then, exposure was performed with ultraviolet rays with 1000 mJ/cm$^2$, and then a DMTG development process was performed. Then, a heat process was performed at 80° C. for one hour, 100° C. for one hour, 120° C. for one hour and 150° C. for three hours. Thus, a solder resist layer (having a thickness of 20 mm) 60 having the opening 62 (having a diameter of 200 µm) formed in the solder pad portions (including the via holes and their land portions) was formed (FIG. 5 (A)).

Then, immersion in electroless nickel plating solution composed of 2.3×10$^{-1}$ mol/l nickel chloride, 2.8×10$^{-1}$ mol/l sodium hypophosphite and 1.6×10$^{-1}$ mol/l sodium citrate and having pH 4.5 is performed for 20 minutes. Thus, a metal layer 64 having a thickness of 5 µm is formed in the opening 62. Then, immersion in electroless gold plating solution is performed which is composed of 7.6×10$^{-3}$ mol/l gold potassium cyanide, 1.9×10$^{-1}$ mol/l ammonia chloride, 1.2×10$^{-1}$ mol/l sodium citrate and 1.7×10$^{-1}$ mol/l sodium hypophosphite is performed under condition of 80° C. for 7.5 minutes. Thus, a gold plated layer 66 having a thickness of 0.03 µm is formed on the metal layer 72 (FIG. 5 (B)).

Then, the opening 62 of the solder resist layer 60 is filled with solder paste (not shown). Then, solder enclosed in the opening 62 is reflowed at 200° C. so that solder bump (solder) 68 is formed (see FIG. 6).

After the flux is cleaned, an apparatus incorporating a rooter is operated to section and cut the substrate to have a proper size. Then, a checker process is performed in which short circuit and disconnection of the printed circuit board are inspected so that a required printed circuit board is obtained.

(First Modification of First Embodiment)

A method of manufacturing a multi-layer printed circuit board according to a first modification of the first embodiment will now be described with reference to FIG. 7.

The first modification is arranged to perform the processes according to the first embodiment shown in FIGS. 1 (A) and 1 (B). In the first embodiment, the film 20 which is formed into the upper insulating layer 20 is directly bonded in the process shown in FIG. 1 (C). In the first modification, as shown in FIG. 7 (A), resin 19 is applied to the upper surface of a circuit pattern 18. Then, the resin is semi-dried until stage B is realized, and then the film 20 a is brought into hermetic contact by pressing (FIG. 7 (B)). The core substrate according to the first modification is excellent in the surface smoothness as compared with the first embodiment.

(Second Modification of First Embodiment)

A method of manufacturing a multi-layer printed circuit board of a multi-layer printed circuit board according to a second modification of the first embodiment will now be described with reference to FIG. 8.

The second modification is arranged to perform a process similar to that according to the first modification shown in FIG. 1 (A). In the first modification, the film 20 serving as the upper insulating layer 20 is directly bonded to the resin 19 in the process shown in FIG. 1 (B). On the other hand, the second modification is arranged as shown in FIG. 8 (A) such that the resin 19 is applied to the surface of the circuit pattern 18. Then, the resin is semi-hardened until a stage-B state is realized. Then, buffing of the resin 19 is performed by means of belt sander polishing using #600 belt sand-paper (manufactured by Sankyo Chemical) so that the resin 19 is smoothed (FIG. 8 (B)). Then, a heat process is performed so that the resin 19 is hardened. Then, the film 20 α is brought into hermetic contact by using a press (FIG. 8 (C)). The core substrate according to the second modification is excellent in the surface smoothness as compared with the first modification.

In the second modification, the vias 32 and the conductor circuits 34 are provided for the core substrate 30 (a process shown in FIG. 2 (C)). The foregoing resin is applied and polished before the resin 40 α which is formed into the interlayer resin insulating layer is applied (a process shown in FIG. 2 (D)) so that the surfaces of the vias 32 and the conductor circuits 34 are smoothed.

(Third Modification of First Embodiment)

A method of manufacturing a multi-layer printed circuit board according to a third modification of the first embodiment will now be described with reference to FIGS. 9 and 10.

In the third modification, a one-side copper-clad plate 110 incorporates the copper foil 12 which has a thickness (100 µm) smaller than that according to the first embodiment FIG. 9 (A)). Initially, a mask is applied to the outer periphery of the one-side copper-clad plate 110 so that etching is performed. Thus, the thickness of the copper foil in the central portion is reduced to about 30 µm (FIG. 9 (B)). FIG. 10 (A) is a plan view showing the one-side copper-clad plate 110 shown in FIG. 9 (B). FIG. 9 (B) corresponds to a cross sectional view taken along X-X shown in FIG. 10 (A), that is, a portion adjacent to the right-hand end.

Then, the copper foil 12 is etched according to the pattern so that the circuit pattern 18 is formed in the central portion such that the copper foil 12 having the thickness of 100 µm is left (FIG. 9 (C)). FIG. 10 (B) is a plan view of the one-side copper-clad plate 110 shown in FIG. 9 (C). As shown in the drawing, the copper foil 12 is left in the outer periphery of the one-side copper-clad plate 110. Moreover, 9 circuit patterns 70 are formed on the inside of the copper foil 12. The circuit patterns 70 is a set of circuit patterns 18 shown in FIG. 9 (C).

The one-side copper-clad plate 110 according to the third modification permits 9 multi-layer printed circuit boards to be obtained. The following process is performance so that the interlayer resin insulating layer, the circuits and so forth are formed similarly to the first embodiment. Then, cutting is performed so that the 9 multi-layer printed circuit boards are formed. When the cutting process is performed, the residual outer periphery of the copper foil 12 is discarded.

The multi-layer printed circuit board according to the third modification has the thick copper foil 12 left in the outer periphery of the lower insulating layer 14. Therefore, in a case where the circuit pattern (the metal layer) 18, the lower insulating layer 14 and the upper insulating layer 20 (the core substrate) each having a small thickness are employed, warpage of the core substrate does not occur in the manufacturing process.

(Fourth Modification of First Embodiment)

Figure 11:
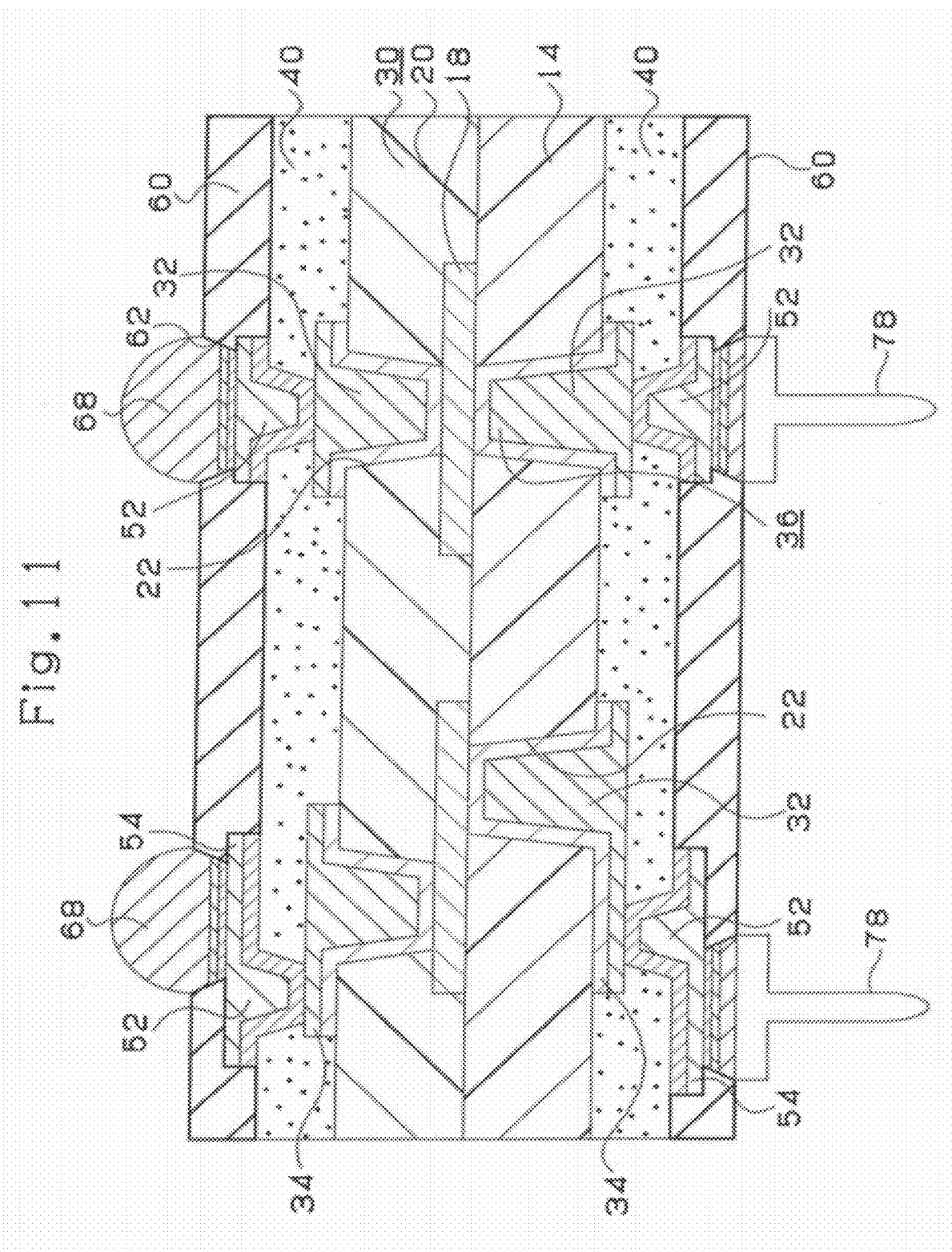
FIG. 11 is a diagram showing a process for manufacturing a multi-layer printed circuit board according to a fourth modification of the first embodiment.

The structure of a multi-layer printed circuit board according to a fourth modification of the first embodiment will now be described with reference to FIG. 11.

The multi-layer printed circuit board according to the first embodiment described with reference to FIG. 6 incorporates the solder bumps 68 for connecting a daughter board, the solder bumps 68 being disposed on the lower surface of the multi-layer printed circuit board.

On the other hand, the fourth modification incorporates conductive connection pins 78. Since the other structure is similar to that of the multi-layer printed circuit board described with reference to FIG. 6, the other structure is omitted from description.

[Second Embodiment]

Figure 18:
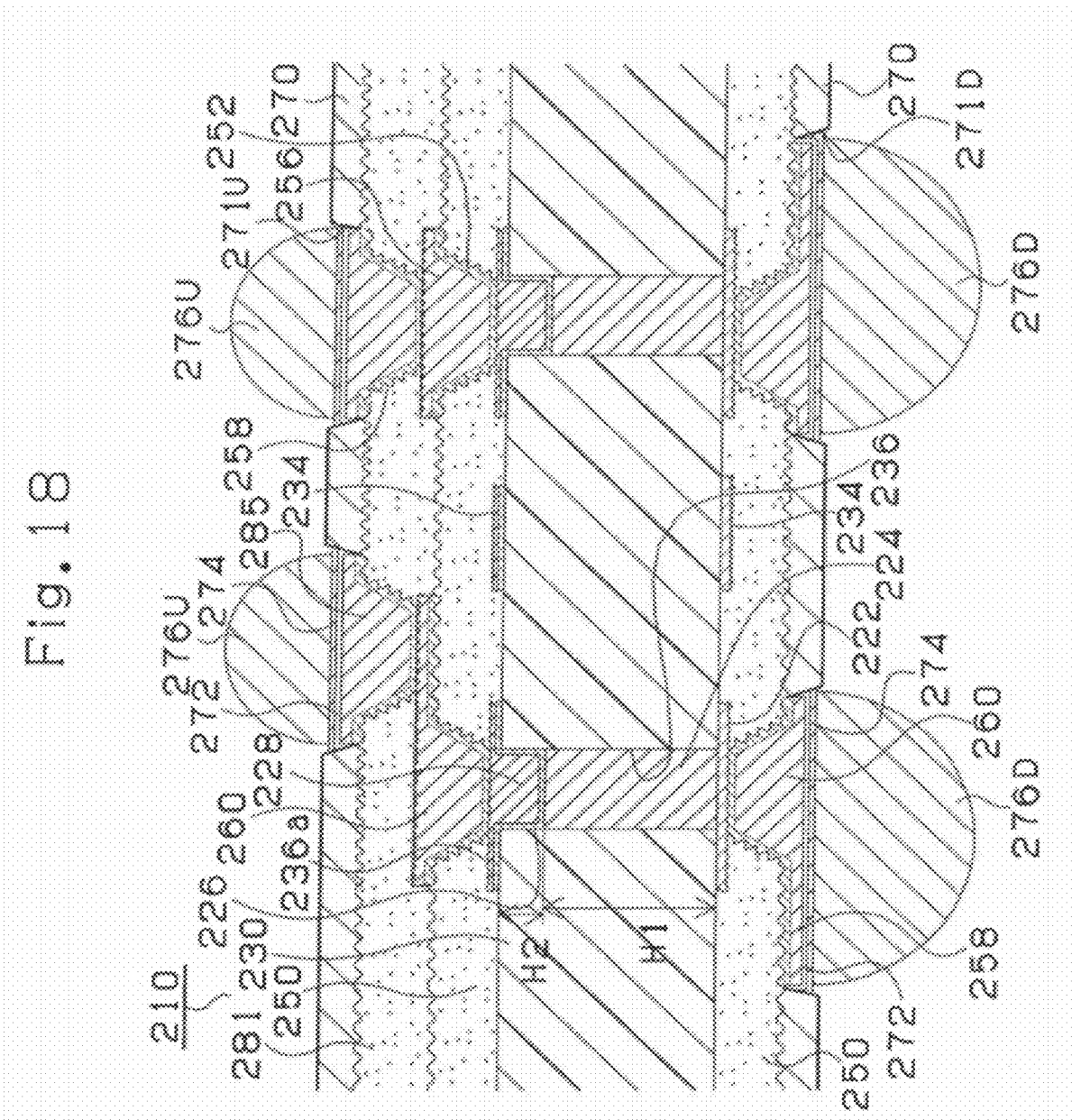
FIG. 18 is a cross-sectional view showing the multi-layer printed circuit board according to the second embodiment.

The structure of the multi-layer printed circuit board according to a second embodiment of the present invention will now be described with reference to FIG. 18 which is a cross sectional view.

A multi-layer printed circuit board 210 according to the second embodiment incorporates conductor circuit 234 formed on each of the upper surface and the lower surface of a core substrate 230. An interlayer resin insulating layer 250 is formed on each conductor circuit 234. The lower interlayer resin insulating layer 250 has via holes 260 and conductor circuits 258. An upper interlayer resin insulating layer 281 having via holes 285 is formed on the lower interlayer resin insulating layer 250 which is the upper layer. A solder resist layer 270 is formed on the surface of the upper interlayer resin insulating layer 281 of the upper layer and the lower interlayer resin insulating layer 250 which is the lower layer.

Solder bumps 276U for establishing the connection with the IC chip is disposed in the opening 271U of the solder resist layer 270 on the upper surface of the multi-layer printed circuit board 210. On the other hand, the package substrate has a bottom surface on which the solder resist layer 270 is formed in which openings 271D are formed in which solder bumps 276D for establishing the connection with the daughter board are disposed.

The solder bumps 276U are connected to throughholes 236 through via holes 285 formed in the interlayer resin insulating layer 281 and the via holes 260 formed in the interlayer resin insulating layer 250. On the other hand, the solder bumps 276D are connected to the through holes 236 through via holes 260 formed in the interlayer resin insulating layer 250.

Each of the through holes 236 formed in the core substrate 230 incorporates a first electroplated layer 224, an electroless plated film 226 and a second electroplated layer 228. Since the through holes 236 are formed by enclosing plating, the strength of the core substrate 230 can be increased. Thus, warpage does not easily occur. Hence it follows that the thickness of the core substrate can be reduced and the heat radiating characteristic of the multi-layer printed circuit board can be improved. Since each through hole 236 is formed by enclosing the first electroplated layer 224, the electroless plated film 226 and the second electroplated layer 228, insufficient enclosure in the through hole can be prevented.

As described later, the multi-layer printed circuit board according to the second embodiment incorporates the through holes 236 which are formed by laser beams. Therefore, through holes 236 each having a small diameter can be formed at short pitches. It leads to a fact that a high degree of integration can be realized.

A method of manufacturing a multi-layer printed circuit board 210 shown in FIG. 18 will now be described with reference to the drawings.

(1) A substrate 230 obtained by causing a glass cloth or an aramid cloth to be impregnated with BT (Bismaleimide-Triazine) resin, polyimide resin, olefin adjacent or polyphenol ether resin is employed as a starting material (FIG. 12 (A)). It is preferable that the thickness of the substrate 230 satisfies a range from 20 μm to 800 μm, more preferably 100 μm to 500 μm. The reason for this lies in that the foregoing thickness enables the strength required as the core substrate to be maintained. Thus, non-penetrating openings can easily be formed by laser beams. Although the core member is impregnated with the resin, resin having no core member or resin obtained by laminating reinforcing resin laser may be employed as a substitute for the foregoing structure.

(2) A metal layer 222 having a thickness of 6 μm to 20 mm is formed on the lower surface of the substrate 230 by sputtering (FIG. 12 (B)). The metal layer 222 may be made of copper, nickel, chrome, cobalt or aluminum. It is preferable that copper or an alloy mainly composed of copper is employed because the cost can be reduced and electric resistance can be decreased. In this embodiment, sputtering is employed which is excellent in the adhesiveness with the substrate 230 constituted by resin and with which the thickness can be reduced. As an alternative to this, low-cost electroless plating or evaporation with which a thin metal layer can be formed at a low cost may be employed. As an alternative to this, electroplating may be performed after the electroless plating, sputtering or the evaporation. As the core substrate, a copper-clad laminated board incorporating laminated copper foil may be employed. It is preferable that the thickness of the metal layer 222 satisfies a range from 6 μm to 20 μm, more preferably a range from 8 μm to 15 μm. Since the foregoing thickness permits the strength to be maintained, warpage can be prevented. Moreover, laser beam energy can be absorbed when the non-penetrating openings are formed in the substrate 230 as described later.

(3) Then, the substrate 230 is irradiated with carbon dioxide laser beam through the surface in which the metal layer 222 is not formed so that non-penetrating openings 232 which reach the metal layer 222 are formed (FIG. 12 (C)). It is preferable that the diameter of each non-penetrating opening is 50 μm to 250 μm, more preferably 75 μm to 150 μm. It is preferable that the pitch is 400 μm to 600 μm. It is preferable that the radius of each non-penetrating opening 232 has a small diameter to raise the wiring density. However, the manufacturing yield deteriorates in inverse proportion to the radius. Each non-penetrating opening 232 may be formed by the carbon dioxide laser or a mask having penetrating openings may be placed on the substrate 230 to collectively form the non-penetrating openings. Although the carbon dioxide laser is employed because of a low cost and a large output of the carbon dioxide laser, excimer, UV or YAG may be employed as a substitute for the carbon dioxide laser. The foregoing lasers may be mixed.

Then, acid or an oxidizer is used to perform a process for desmearing the inside portion of each non-penetrating opening 232. Then, oxygen, carbon tetrachloride or nitrogen may be used to perform a dry process, such as a plasma process, a corona process or an UV process so as to smooth the inner wall of each non-penetrating opening 232.

(4) Then, a film 23 is brought into hermetic contact with the metal film 20, and then the substrate 230 is immersed in electrolytic copper plating solution to supply an electric current through the metal layer 222 so as to form a first plated layer 224 on the inner surface of each non-penetrating opening 232 (FIG. 12 (D)). It is preferable that the first electroplated layer is formed by copper plating with which electric resistance can be decreased. As an alternative to this, nickel, chrome, cobalt or aluminum may be employed.

(5) A metal film 226 having a thickness of 0.1 μm to 10 μm is formed on the upper surface of the substrate 230 by electroless plating (FIG. 13 (A)). The metal layer may be made of copper, nickel, chrome, cobalt or aluminum. It is preferable that copper or an alloy mainly composed of copper is employed because the cost can be reduced and the electric resistance can be decreased. As an alternative to the electroless plating, sputtering or evaporation excellent in the adhesiveness with the substrate 230 made of the resin may be employed. It is preferable that the thickness of the metal film 226 satisfies a range from 0.1 μm to 10 μm. When the thickness satisfies the foregoing range, the circuit can be formed in a case where etching is performed. It is preferable that the thickness satisfies a range from 0.5 μm to 5 μm.

(6) The substrate 230 is immersed in electrolytic copper plating solution to supply an electric current to the metal film 226 so that the non-penetrating opening 232 is filled with a second plated layer 228 so that each through hole 236 is formed (FIG. 13 (B)). It is preferable that the electroplating is performed by using the same metal as that for constituting the first plated layer. As described above with reference to FIG. 18, it is preferable that height H1 of the first plated layer 224 and height H2 of the second plated layer 228 are substantially the same. When the height are not same, it is desirable that the width of H2 is 5 to 100 μm. Thus, the second plated layer is easily plated and the flatness of the land can be improved. To smooth the surface of the second plated layer 228, etching, buffing, belt-sander polishing or jet scrub polishing with which abrasive grains are sprayed may be performed.

(7) The film 23 is separated, and then etching resist is applied according to a predetermined pattern so that patterning is performed. Thus, a conductor circuit 234 is formed on the surface of the core substrate 230. Moreover, a land 236a is formed around each through hole 236 (FIG. 13 (C)). It is preferable that the shape of the land is a circular shape or an elliptic shape. As an alternative to this, a square shape or a rectangular shape may be employed. It is preferable that the diameter of the land 236a is 1.00 time to 1.25 times the diameter of the through hole. It is preferable that thickness H3 of each of the land 236a and the conductor circuit is minimized to smooth the interlayer resin insulating layer which is the upper layer.

The multi-layer printed circuit board according to the second embodiment is manufactured such that the metal film 226 serving as the land 236a of the through hole 236 is formed. Then, the second plated layer 228 is formed in the through hole. Therefore, separation of the land 236a constituted by the metal film 226 can be prevented so that the reliability of the through hole 236 can be improved. Since excellent reliability in connection can be realized, the thickness of the land can be reduced. As a result, the smoothness of the interlayer resin insulating layer which is the upper layer and which is formed in the process to be described later can be improved. Thus, occurrence of separation and a crack of the foregoing interlayer resin insulating layer can be prevented.

(8) The substrate having the conductor circuits 234 and the lands 236a is cleaned with water, and then the substrate is dried. Then, etching solution is sprayed to both sides of the substrate so that the surface of the lower conductor circuit 234 and the surface of each land 236a of each through hole 236 is etched. Thus, a rough surface 234 β is formed on the overall surface of each conductor circuit 234. Moreover, a rough surface 236 β is formed on each land 236a of each through hole 236 (FIG. 13 (D)). The etching solution is mixed solution of 10 parts by weight of copper (II) imidazole complex, 7 parts by weight of glycolic acid, 5 parts by weight of potassium chloride and 78 parts by weight of ion exchange water.

In the process (1) of this embodiment is performed such that the rough surface is formed by etching. As an alternative to this, a rough layer may be formed by electroless plating. In the foregoing case, the substrate 230 having the conductor circuits 234 formed thereon is degreased with alkali so as to be subjected to soft etching. Then, a process using catalyst solution composed of palladium chloride and organic acid is performed to supply Pd catalyst. Then, the foregoing catalyst is activated. Then, the substrate 230 is immersed in electroless plating solution composed of $-3.2 \times 10^{-2}$ mol/l copper sulfate, $3.9 \times 10^{-3}$ mol/l nickel sulfate, $5.4 \times 10^{-2}$ mol/l complexing agent, $3.3 \times 10^{-1}$ mol/l sodium hypophosphite, $5.0 \times 10^{-1}$ boric acid, 0.1 g/l surface active agent (Surfil 465 manufactured by Nissin Chemical) having PH=9. After immersion has been performed for one minute, the substrate 230 is vibrated vertically and laterally one time for four seconds. Thus, a coating layer and a rough layer constituted by a needle alloy made of Cu—Ni—P are formed on the surface of each conductor circuit 234 and each land 236a of the through hole 236. Moreover, a metal layer constituted by Sn, Pb or Ni is formed on the surface of the rough layer.

(9) Then, a thermosetting olefin resin sheet having a thickness of 50 μm is, at a pressure of 5 kg/cm², vacuum-seal laminated to each of the two sides of the substrate subjected to the foregoing process while the temperature is being raised to 50° C. to 150° C. Thus, an interlayer resin insulating layer 250 constituted by cycloolefin resin is formed (FIG. 14 (A)). Note that the degree of vacuum realized when the vacuum sealing process is performed is 10 mmHg.

(10) Then, $CO_2$ gas laser beams having a wavelength of 10.4 μm are used for under conditions that the beam diameter is 5 mm, the mode is a top-hat mode, the pulse width is 15 μs, the diameter of the opening in the mask is 0.5 mm and three shots were performed so that an opening 248 serving as a via hole and having a diameter of 80 μm is formed in the lower interlayer resin insulating layer 250 made of olefin resin (FIG. 14 (B)). Then, oxygen plasma is used to perform a desmear process.

(11) Then, a plasma process was performed by using SV-4540 manufactured by Nihon Shinku Gijyutu to roughen the surface of the interlayer resin insulating layer 250 (FIG. 14 (C)). At this time, argon gas was used as the inactive gas to perform a plasma process for two minutes under conditions that the electric power was 200 W, the gas pressure was 0.6 Pa and the temperature was 70° C.

(12) Then, the same apparatus was operated to change the internal argon gas, and then sputtering was performed such that a Ni—Cu alloy was a target under conditions that the atmospheric pressure was 0.6 Pa, the temperature was 80° C., electric power was 200 W and the duration was 5 minutes. Thus, a Ni—Cu alloy layer 252 was formed on the surface of a polyolefin interlayer resin insulating layer 250. The thickness of the formed Ni—Cu alloy layer 252 was 0.2 μm (FIG. 15 (A)).

(13) A marketed photosensitive dry film was bonded to each of the two sides of the processed substrate, and then a photomask was placed. Then, exposure was performed with 100 mJ/cm$^2$, and then a development process was performed by using 0.8% sodium carbonate. Thus, a pattern of a plating resist 254 having a thickness of 15 μm was formed (FIG. 15 (B)).

(14) Then, electric plating was performed under the following conditions so that an electroplated film 256 having a thickness of 15 μm was formed (FIG. 15 (C)). The electroplated film 256 results in enlargement of the thickness of a portion which is formed into the conductor circuit 258 in a process to be described later and completion of enclosure of plating in the portion which will be formed into the via hole 260. Note that the additive to be added to the electroplating solution is Kapalasid HL manufactured by Atotech Japan.

| [Electroplating Solution] | |
| --- | --- |
| sulfuric acid | 2.24 mol/l |
| copper sulfate | 0.26 mol/l |
| additive | 19.5 mol/l |

| [Electroplating Conditions] | |
| --- | --- |
| current density | 1 A/dm$^2$ |
| duration | 65 minutes |
| temperature | 22 ± 2° C. |

(15) Then, the plating resist 254 was separated and removed with 5% NaOH, and then the Ni—Cu alloy layer 252 present below the plating resist 254 was dissolved and removed by etching which uses mixed solution of nitric acid, sulfuric acid and hydrogen peroxide. Thus, the conductor circuit 258 (including the via holes 260) constituted by electro-copper plated film 256 or the like and having a thickness of 16 μm was formed (FIG. 16 (A)).

(16) Then, the processes (10) to (16) are repeated so that the upper interlayer resin insulating layer 281 and the via holes 285 were formed (FIG. 16 (B)).

(17) Then, a solder resist composition similar to that according to the first embodiment was applied to the both sides of the multi-layer printed circuit board to have a thickness of 20 μm. Then, a drying process was performed under conditions that the duration was 20 minutes at 70° C. and 30 minutes at 70° C. Then, a photomask having a pattern of the opening drawn thereon and a thickness of 5 mm was brought into hermetic contact with the resist layer. Then, exposure was performed by using 1000 mJ/cm$^2$ ultraviolet rays, and then a development process was performed by using DMTG solution. Thus, openings 271U each having a diameter of 200 μm were formed in the upper surface and openings 271D each having a diameter of 500 μm were formed in the lower surface.

Then, a heating process was performed under conditions that the durability was one hour at 80° C., one hour at 100° C., one hour at 120° C. substrate and three hours at 150° C. Thus, the solder resist layer was hardened so that the solder resist layer (the organic resin insulating layer) 270 having openings corresponding to the solder pad portions and a thickness of 20 μm was formed (FIG. 17 (A)). The non-hardened resin film was used to press and exposure, development or a laser beam may be employed to provide solder pads.

(18) Then, the nickel-plated layer 272 having a thickness of 5 μm was, similarly to the first embodiment, formed in the surface of the opening 271 of the substrate having the solder resist layer (the organic resin insulating layer) 270 formed thereon. Moreover, the gold-plated layer 274 having a thickness of 0.03 μm was formed on the nickel-plated layer 272 (FIG. 17 (B)).

(19) Then, solder paste was printed to the openings 271U and 271D of the solder resist layer 270, and reflowing is performed at 200° C. Thus, the solder bumps (solder) 276U and 276D were formed so that the multi-layer printed circuit board 210 was manufactured (FIG. 18).

(First Modification of Second Embodiment)

A multi-layer printed circuit board and a manufacturing method therefor according to a first modification of the second embodiment will now be described.

Figure 23:
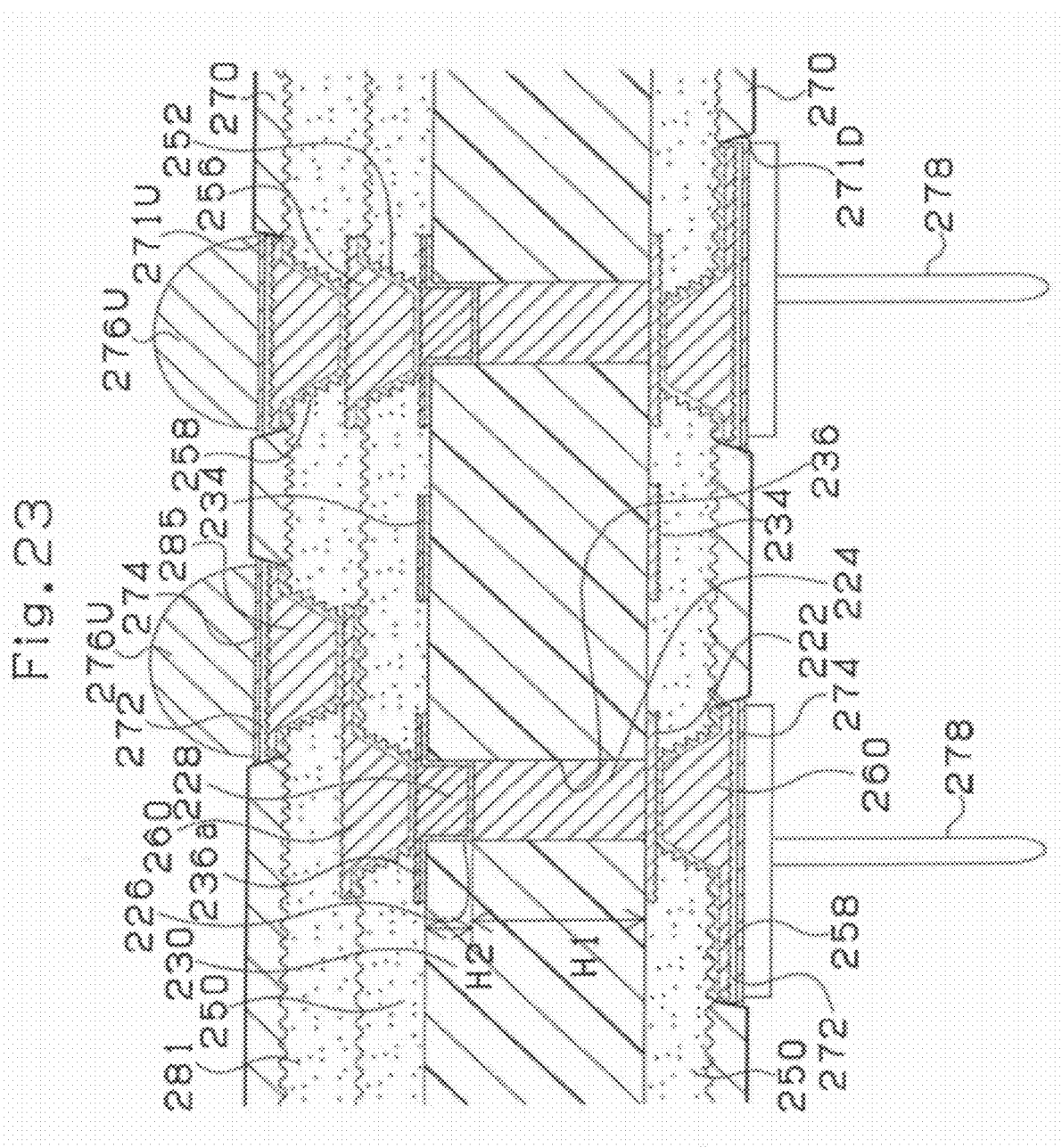
FIG. 23 is across-sectional view showing the multi-layer printed circuit board according to the first modification of the second embodiment.

FIG. 23 shows the cross section of the multi-layer printed circuit board according to the first modification which is applied to a package substrate. The multi-layer printed circuit board according to the first modification has a structure similar to that according to the second embodiment described with reference to FIG. 18. The second embodiment is structured such that the solder bumps 276D are provided for the portion adjacent to the daughter board. On the other hand, the first modification has the structure that the conductive connection pins 278 are provided.

The method of manufacturing the multi-layer printed circuit board according to the first modification will now be described. The method of forming the core substrate is similar to processes (1) to (8) according to the second embodiment described with reference to FIGS. 12 and 13. Therefore, description of the method is omitted.

The method of manufacturing a resin film for forming the interlayer resin insulating layer will now be described.

Thirty parts by weight of bisphenol-A epoxy resin (Epicoat 1001 having an epoxy equivalent of 469 and manufactured by Yuka Shell), 40 parts by weight of cresol novolac epoxy resin (epichron N-673 having an epoxy equivalent of 215 and manufactured by Dainippon Ink & Chemicals), 120 parts by weight of phenol novolac resin containing a triazine structure (Phenolight KA-7052 having a phenol hydroxyl group equivalent of 120 and manufactured by Dainippon Ink & Chemicals) were heated and dissolved in 20 parts by weight of ethyldiglycol acetate and 20 parts by weight of solvent naphtha such that stirring was performed. Then, 15 parts by weight of polybutadiene rubber having epoxy terminal (Denalex R-45EPT manufactured by Nagase Chemicals), 1.5 part by weight of pulverized 2-phenyl-4,5-bis(hydroxymethyl) imidazole, 2 parts by weight of particle-size reduced silica and 0.5 part by weight of silicon defoaming agent were added. Thus, an epoxy resin composition was prepared.

The obtained epoxy resin composition was applied to the surface of a PET film having a thickness of 38 μm by using a roll coater such that the thickness after the PET film was dried was 50 μm. Then, drying was performed at 80° C. to 120° C. for 10 minutes. Thus, a resin film for forming the interlayer resin insulating layer was manufactured.

(9) The thus-manufactured resin film for the interlayer resin insulating layer was placed on each side of the substrate 230 shown in FIG. 13 (D). Then, temporal pressing under conditions that the pressure was 4 kgf/cm$^2$, the temperature was 80° C. and the pressing duration was 10 seconds, and then cutting was performed. Then, a vacuum laminator apparatus was operated to bond the resin film so that the interlayer resin insulating layer 250 was formed (FIG. 19 (A)). That is, main pressing of the resin film for the interlayer resin insulating layer to the surface of the substrate was performed under conditions that the degree of vacuum was 0.5 Torr, the pressure was 4 kgf/cm$^2$, the temperature was 80° C. and the pressing duration was 60 seconds. Then, hardening with heat was performed at 170° C. for 30 minutes.

(10) A mask 249 incorporating penetrating openings 249a formed therein and having a thickness of 1.2 mm is placed on the interlayer resin insulating layer 250. Then, a CO$_2$ gas laser beam having a wavelength of 10.4 μmm was used to form openings 248 for the via holes each having a diameter of 80 μm were formed in the interlayer resin insulating layer 250 under conditions that the beam diameter was 4.0 mm, the mode was the top-hat mode, the pulse width was 5.0 μs, the diameter of each penetrating opening in the mask was 1.0 mm and one short is performed (FIG. 19 (B)).

(11) The substrate 230 having the openings 248 for the via holes was, for 10 minutes, immersed in solution which contained 60 g/l permanganic acid and the temperature of which was 80° C. Thus, epoxy resin particles present on the surface of the interlayer resin insulating layer 250 are dissolved and removed. As a result, the surface of the interlayer resin insulating layer 250 including the inner wall of each opening 248 for the via hole was roughened (FIG. 19 (C)).

(12) Then, the substrate subjected to the foregoing process was immersed in neutral solution (manufactured by Siplay), and then cleaned with water. The surface of the substrate subjected to the roughening process (depth of roughness was 3 μm) is supplied with palladium catalyst. Thus, the catalyst cores were allowed to adhere to the surface of the interlayer resin insulating layer 250 and the inner wall of each opening 248 for the via hole.

(13) Then, the substrate was immersed in electroless copper plating solution having the following composition so that an electroless copper plated film 251 having a thickness of 0.6 μm to 3.0 μm was formed on the overall surface of the rough surface (FIG. 20 (A)).

| [Electroless Plating Solution] | |
|---|---|
| NiSO$_4$ | 0.003 mol/l |
| tartaric acid | 0.200 mol/l |
| copper sulfate | 0.030 mol/l |
| HCHO | 0.050 mol/l |
| NaOH | 0.100 mol/l |
| α,α'-bipyridyl | 40 mg/l |
| polyethylene glycol (PEG) | 0.10 g/l |

[Electroless Plating Conditions]
40 minutes in a state where the temperature of the solution was 35° C.

(14) A marketed photosensitive dry film was bonded to the electroless-copper-plated film 251. Then, a mask was placed so that exposure was performed with 100 mJ/cm$^2$. Then, a development process was performed by using 0.8% sodium carbonate so that a plating resist 254 having a thickness of 30 μm was formed (FIG. 20 (B)).

(15) Then, the substrate was cleaned with water, the temperature of which was 50° C. to remove grease. Then, cleaning with water, the temperature of which was 25° C., so that an electroless copper-plated film 256 having a thickness of 20 μm was formed (FIG. 20 (C)).

| [Electroplating Solution] | |
|---|---|
| sulfuric acid | 2.34 mol/l |
| copper sulfate | 0.26 mol/l |
| additive | 19.5 mol/l |

(Kapalacid HL manufactured by Atotech Japan)

| [Electroplating Conditions] | |
|---|---|
| Current Density | 1 A/dm$^2$ |
| Duration | 65 minutes |
| Temperature | 22 ± 2° C. |

(16) The plating resist 254 was separated and removed with 5% NaOH, and then the electroless-plated film 251 below the plating resist 254 was dissolved and removed by performing etching using mixed solution of sulfuric acid and hydrogen peroxide. Thus, a conductor (including via holes 260) 258 constituted by electroless copper-plated film 251 and electrolytic copper-plated film 256 and having a thickness of 18 μm was formed (FIG. 21 (A)).

(17) A process similar to the process (8) for roughening the conductor circuit 234 according to the second embodiment was performed. Etching solution containing cupric complex and organic acid was used to form a rough surface 262 (FIG. 21 (B)).

(18) The foregoing processes (9) to (17) were repeated so that the interlayer resin insulating layer 281, the conductor circuit 283 and the via holes 285 were formed on the upper interlayer resin insulating layer 250. Thus, the multi-layer printed circuit board was obtained (FIG. 21 (C)).

(19) Then, a solder resist composition similar to that according to the second embodiment and having a thickness of 20 μm was applied to each side of the multi-layer printed circuit board. Then, a drying process was performed at 70° C. for 20 minutes and at 70° C. for 30 minutes. Then, a photomask having a pattern of the opening of the solder resist drawn thereon and having a thickness of 5 mm was brought into contact with the solder resist layer. Then, exposure was performed at 1000 mJ/cm², and then a development process was performed by using DMTG solution so that the openings 271U and 271D were formed.

Then, a heat process was performed at 80° C. for one hour, 100° C. for one hour, 120° C. for one hour and 150° C. for three hours to harden the solder resist layer. Thus, the solder resist pattern layer 270 having openings and a thickness of 20 μm was formed (FIG. 22 (A)). The solder resist composition may be a marketed solder resist composition.

(20) Then, similarly to the second embodiment, a nickel-plated layer 272 having a thickness of 5 μm was provided for each of the openings 271U and 271D. Then, the gold-plate layer 274 having a thickness of 0.03 μm was provided for the surface of the nickel-plate layer 272 (FIG. 22 (B)).

(21) Then, solder paste containing tin-lead was printed to each opening 271U in the solder resist layer 270 on the surface of the substrate on which the IC chip was mounted. Moreover, solder paste containing tin-antimony was printed to each opening 271D in the solder resist layer 270 on the other surface. Then, reflowing at 200° C. was performed so that solder bumps 276U were provided for the upper surface. Then, the conductive connection pins 278 were provided for the lower surface. Thus, the printed circuit board was manufactured (see FIG. 23).

(Second Modification of Second Embodiment)

Figure 24:
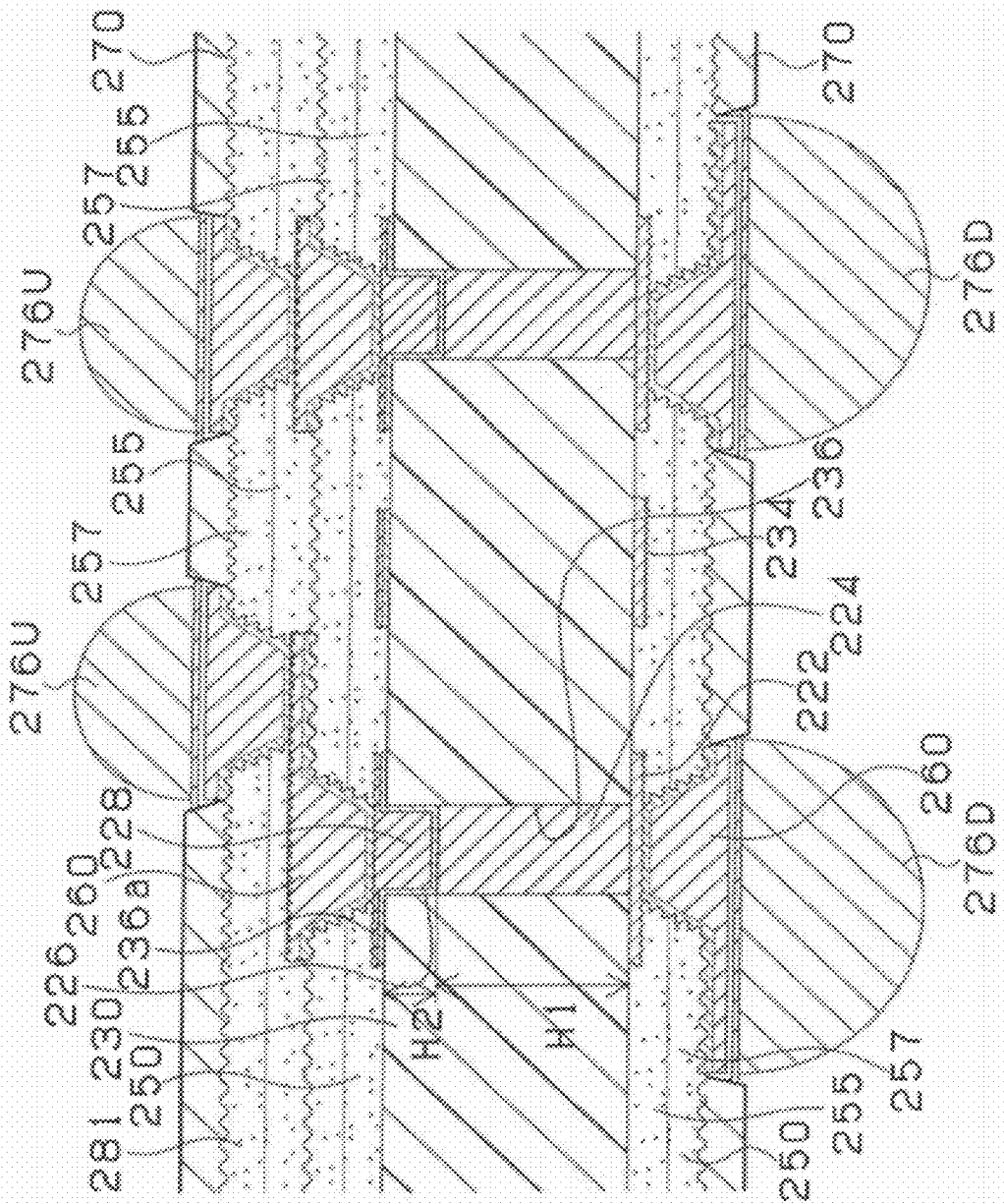
FIG. 24 is a cross sectional view showing a multi-layer printed circuit board according to a second modification of the second embodiment.

The cross section of a multi-layer printed circuit board according to a second modification is shown in FIG. 24. The structure of the second modification is similar to that according to the second embodiment. Note that the multi-layer printed circuit board according to the second modification has the structure that the interlayer resin insulating layer 250 and the interlayer resin insulating layer 281 are constituted by adhesive agent 257 for the upper layer and adhesive agent 255 for the lower layer each having the following composition. Moreover, coating in the liquid state is Performed, and then exposure and development were performed to form the openings.

A. Raw Material Composition for Preparing Adhesive Agent for Electroless Plating (Adhesive Agent for Upper Layer)

[Resin Composition (1)]

Mixing and stirring of 35 parts by weight of resin solution obtained by dissolving 25% acryl material of cresol novolac epoxy resin (manufactured by Nippon Kayaku and having a molecular weight of 2500) in DMDG at a concentration of 80 wt %, 3.15 parts by weight of photosensitive monomer (Aronix M315 manufactured by Toagosei Chemical), 0.5 part by weight of defoaming agent (S-65 manufactured by Sannopuko) and 3.6 parts by weight of NMP were performed so that the composition was obtained.

[Resin Composition (2)]

Mixing of 12 parts by weight of polyether sulfon (PES), 7.2 parts by weight of epoxy resin particles (Polymerpol manufactured by Sanyo Chemical) having a mean diameter of 1.0 μm and 3.09 parts by weight of the epoxy resin particles having a mean diameter of 0.5 μm was performed. Then, 30 parts by weight of NMP were added, and then stirring and mixing using beads mill were performed. Thus, the composition was obtained.

[Hardening Agent Composition (3)]

Mixing of 2 parts by weight of imidazole hardening agent (2E4MZ-CN manufactured by Shikoku Chemicals), 2 parts by weight of photoinitiator (Ilugacur I-907 manufactured by Chibagaigi), 0.2 part by weight of a photosensitizer (DETX-S manufactured by Nihon Kayaku) and 1.5 part by weight of NMP was performed, and then stirring was performed. Thus, the composition was obtained.

B. Raw Material Composition for Preparing Interlayer Resin Insulating Agent (Adhesive Agent for Lower Layer)

[Resin Composition (1)]

Mixing of 35 parts by weight of resin solution obtained by dissolving 25% acrylic material of cresol novolac epoxy resin (manufactured by Nihon Kayaku and having a molecular weight of 2500) was dissolved in DMDG at a concentration of 80 wt %, 4 parts by weight of photosensitive monomer (Aronix M315 manufactured by Toagosei Chemical), 0.5 part by weight of defoaming agent (S-65 manufactured by Sannopuko) and 3.6 parts by weight of NMP was performed, and then stirring was performed. Thus, the composition was obtained.

[Resin Composition (2)]

Mixing of 12 parts by weight of polyether sulfon (PES) and 14.49 parts by weight of epoxy resin particles (Polymer Pol manufactured by Sanyo Chemical) having a mean particle size of 0.5 μm was performed. Then, 30 parts by weight of NMP were added, and the stirring and mixing were performed. Thus, the composition was obtained.

[Hardening Agent Composition (3)]

Mixing of 2 parts by weight of imidazole hardening agent (2E4MZ-CN manufactured by Shikoku Chemicals), 2 parts by weight of photoinitiator (Ilugacur I-907 manufactured by Chibagaigi), 0.2 part by weight of a photosensitizer (DETX-S manufactured by Nihon Kayaku) and 1.5 part by weight of NMP was performed, and then stirring was performed. Thus, the composition was obtained.

COMPARATIVE EXAMPLE 1

The multi-layer printed circuit board according to comparative example 1 has a similar structure to that according to the second embodiment. In the second embodiment, plating is enclosed in each through hole 236. In comparative example 1, a resin filler is enclosed.

Each of the second embodiment, the first modification, the second modification and the comparative example 1 was subject to a heat cycle test (1000 cycles each cycle was such that −65° C./3 minutes+130° C./3 minutes). Results were shown in table in FIG. 25. The second embodiment, the first modification and the second modification were free of warpage and disconnection even after the heat cycle was completed. Comparative example 1 encountered warpage. Note that the amount of warpage was measured such that the height of the end of the substrate placed on a flat frame was measured by a measuring instrument.

[Third Embodiment]

Figure 32:
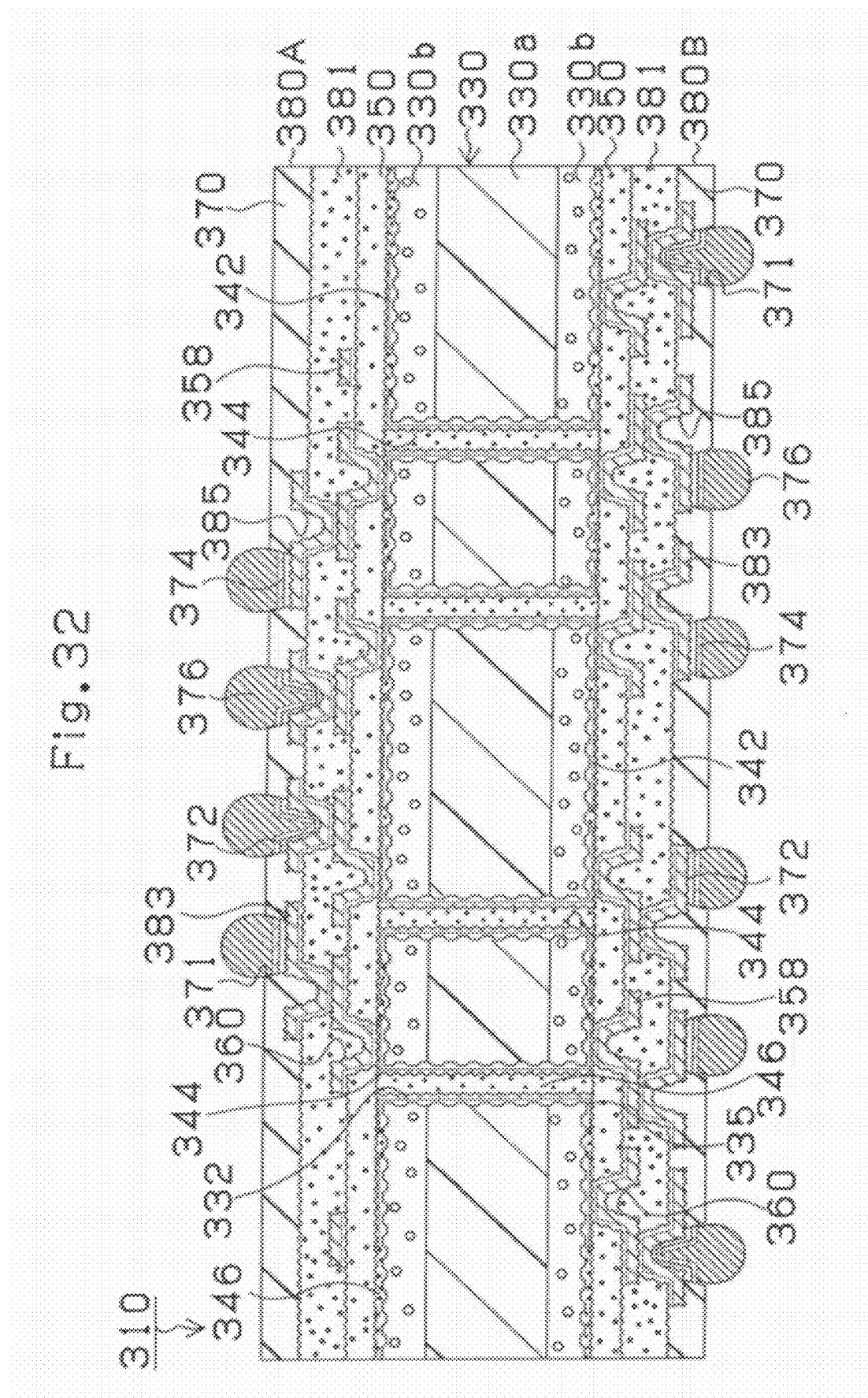
FIG. 32 is a cross sectional view showing a printed circuit board according to the third embodiment.

The structure of a printed circuit board according to a third embodiment will now be described with reference to FIG. 32 which shows the cross section of a printed circuit board 310.

The printed circuit board 310 incorporates a core substrate 330 and buildup circuit layers 380A and 380B. The buildup circuit layers 380A and 380B are constituted by interlayer resin insulating layers 350 and 381, respectively. The interlayer resin insulating layer 350 has via holes 360 and conductor circuits 358. The interlayer resin insulating layer 381 has via holes 385 and conductor circuits 383. A solder resist layer 370 having openings 371 is formed on the interlayer resin insulating layer 381.

The core substrate 330 incorporates a core member 330a having a core impregnated with resin; and a resin insulating layer 330b in which soluble particle are dispersed in refractory resin. The resin insulating layer 330b is roughened by dissolving particles on the surface thereof. Each of the through holes 344 formed in the core substrate 330 has a structure that a metal film 335 is formed in a penetrating opening 332 in the core substrate 330.

In this embodiment, the penetrating openings 332 in the core substrate 330 are formed by laser beams as described later. Since the penetrating openings 332 are formed in a state where the metal film is not formed, proper through holes can be formed. When the metal film 335 is deposited in the penetrating opening 332 to form the through hole 344 and when a filler 346 has been enclosed in the through hole 344, retention any air bubble can be prevented. Therefore, as distinct from the conventional printed circuit board described with reference to FIG. 70, occurrence of a corner crack starting with a burr can be prevented. As a result, reliability in connection of the through hole 344 can be improved. Since the rough surface is provided for the surface of the core substrate 330, the adhesiveness of the metal film 335 can be improved. The warpage does not easily occur.

A method of manufacturing the printed circuit board described with reference to FIG. 32 will now be described with reference to FIGS. 26 to 32.

Figure 26:
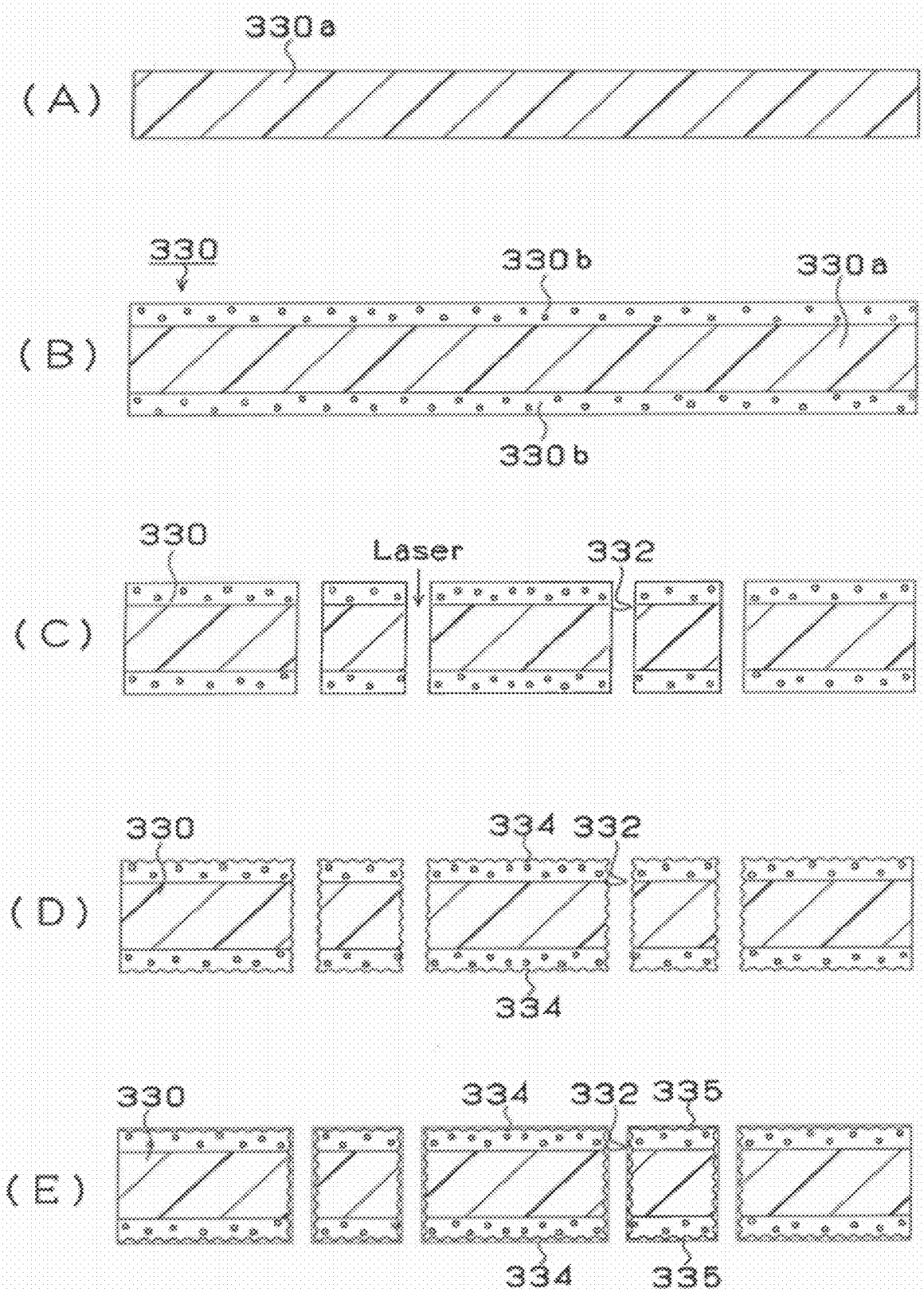
FIGS. 26 (A), 26 (B), 26 (C), 26 (D) and 26 (E) are diagrams showing a process for manufacturing a printed circuit board according to a third embodiment.

(1) A core member 330a constituted by BT (Bismaleimide-Triazine), FR-4 or FR-5 having a thickness of 0.05 mm to 1.0 mm is employed as a starting material (FIG. 26 (A)). Since the core member 330a is constituted by any one of BT (Bismaleimide-Triazine), FR-4 or FR-5 having a core made of glass fibers or polyimide fibers and impregnated with resin, the strength required for the core substrate can be maintained. It is preferable that the thickness is 0.1 mm to 0.8 mm. The reason for this lies in that both of opening easiness of the through hole by using the laser beam and the strength required for the core substrate can be realized.

(2) Then, a thermosetting resin insulating film having a thickness of 0.01 mm to 0.1 mm and to be described later is bonded to each of the two sides of the core member 330a. Thus, the resin insulating layer 330b constituted by the thermosetting resin is formed.

As a result of the foregoing process, the core substrate 330 constituted by the core member 330a and the resin insulating layer 330b is formed (FIG. 26 (B)). It is preferable that the thickness of the core substrate 330 is 0.12 mm to 1.2 mm.

(3) Then, penetrating openings 332 for through holes are formed in the core substrate 330 by using laser beams (FIG. 26 (C)). The core substrate 330 constituted by the core member 330a and the resin insulating layers 330b formed on the two sides of the core member 330a is different from the conventional copper-clad laminated board, the penetrating openings 332 can properly be formed by using laser beams.

(4) Then, the overall surface of the core substrate 330 is roughened with acid or an oxidizer so that a rough surface 334 is formed on the overall surface of the core substrate 330 (FIG. 26 (D)). It is preferable that the rough surface 334 has Ra (mean roughness height) of 0.1 μm to 3.0 μm. The thermosetting resin for constituting the resin insulating layer 330b provided on the right side of the core substrate has a structure that the soluble particles are dispersed in the refractory resin. Therefore, when the surface soluble particles are dissolved by using acid or the like, the rough surface 334 can be formed on the surface of the core substrate 330.

(5) Then, the metal film 335 constituted by Cu is formed on the overall surface of the core substrate 330 by sputtering (FIG. 26 (E)). As an alternative to sputtering, evaporation or electroless plating may be employed. Then, the core substrate 330 is subjected to electroplating so that an electroplated film 336 is formed on the metal film 335 (FIG. 27 (A)). Since a rough surface 324 is formed on the surface of the core substrate 330 by performing the foregoing process, the adhesiveness with the metal film 335 formed on the surface of the core substrate 330 can be improved. Since retention of an air bubble can be prevented when the metal film 335 has been deposited in each penetrating opening 332, the reliability in connection of the through hole 344 can be improved.

(6) Then, a marketed dry film is bonded to each of the two sides of the substrate 330, and then a photomask film is placed. Then, exposure and development processes are performed so that the pattern of the resist 338 is formed (FIG. 27 (B)).

(7) Then, the resist 338 is separated and removed with 5% NaOH, and then the metal film 335 and the electroplated film 336 present below the resist 338 are dissolved and removed by etching using mixed solution of nitric acid, sulfuric acid and hydrogen peroxide. Thus, a lower conductor circuit 342 and through holes 344 constituted by the metal film 335 and the electroplated film 336 are formed (FIG. 27 (C)). Note the pattern of the lower conductor core substrate 342 and the through holes 344 may be formed by a semi-additive method.

Figure 27:
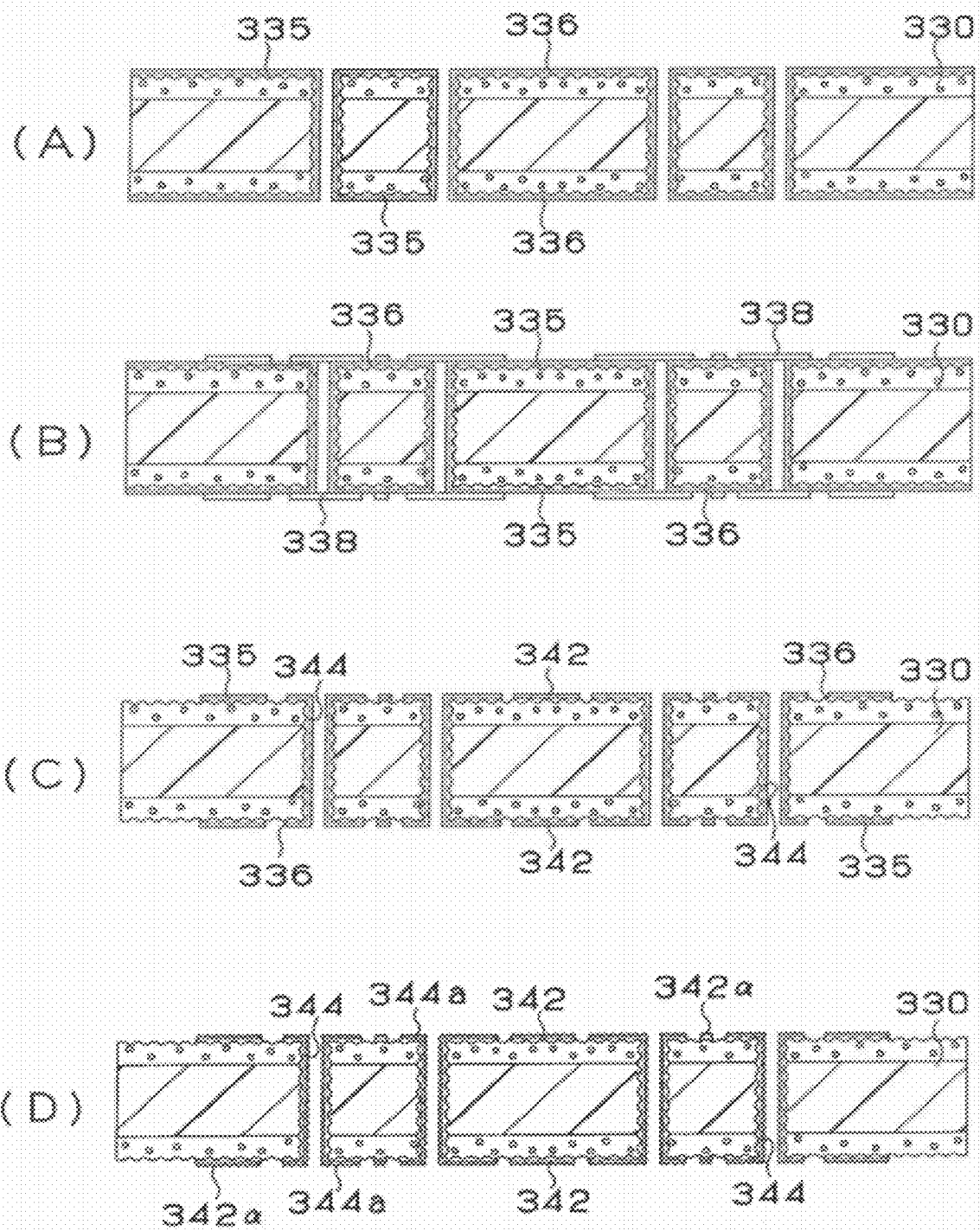
FIGS. 27 (A), 27 (B), 27 (C) and 27 (D) are diagrams showing a process for manufacturing the printed circuit board according to the third embodiment.

(8) Similarly to the second embodiment, the surface of the lower conductor circuit 342 and the surface 344a of the land of the through hole 344 are etched, a rough surface 342 α is formed on the overall surface of the lower conductor circuit 342 (FIG. 27 (D)).

(9) A resin filler 346 mainly composed of epoxy resin is applied to each of the two sides of the substrate 330 by operating a printer. Thus, the space between the lower conductor circuits 342 or the inside portion of the through hole 344 is filled with the resin filler 346. Then, heating and drying are performed. That is, the foregoing process causes the resin filler 346 to be enclosed between the lower conductor circuits 342 or the inside portion of the through holes 344 (FIG. 28 (A)). As distinct from the conventional printed circuit board described with reference to FIG. 70, no burr is present in each through hole. Therefore, when the resin filler 346 has been enclosed in each through holes 344, retention of an air bubble or non-filling does not occur. Therefore, no corner crack occurs and, therefore, the reliability of the through holes 344 can be improved.

(10) Either side of the substrate 330 subjected to the process (9) is polished in a belt sander manner using belt abrasive paper (manufactured by Sankyo Chemical). Thus, polishing is performed in such a manner that the resin filler 346 is not left on the surface of the lower conductor circuit 342 and the surfaces 344a of the lands of the through holes 344. Then, buffing is performed to remove damage caused from the belt sander polishing. The foregoing sequential polishing process is performed for the other surface of the substrate 330. Then, the enclosed resin filler 346 is heated and hardened (FIG. 28 (B)).

(11) Then, etching solution which is the same as the etching solution employed in the foregoing process (8) is sprayed to both sides of the substrate 330 subjected to the process (10). Thus, the surface of the lower conductor circuit 342 which has temporarily been smoothed and the surfaces 344a of the lands of the through holes 344 are etched. Thus, a rough surface 342 β is formed on the overall surface of the lower conductor circuit 342 (FIG. 28 (C)).

Figure 28:
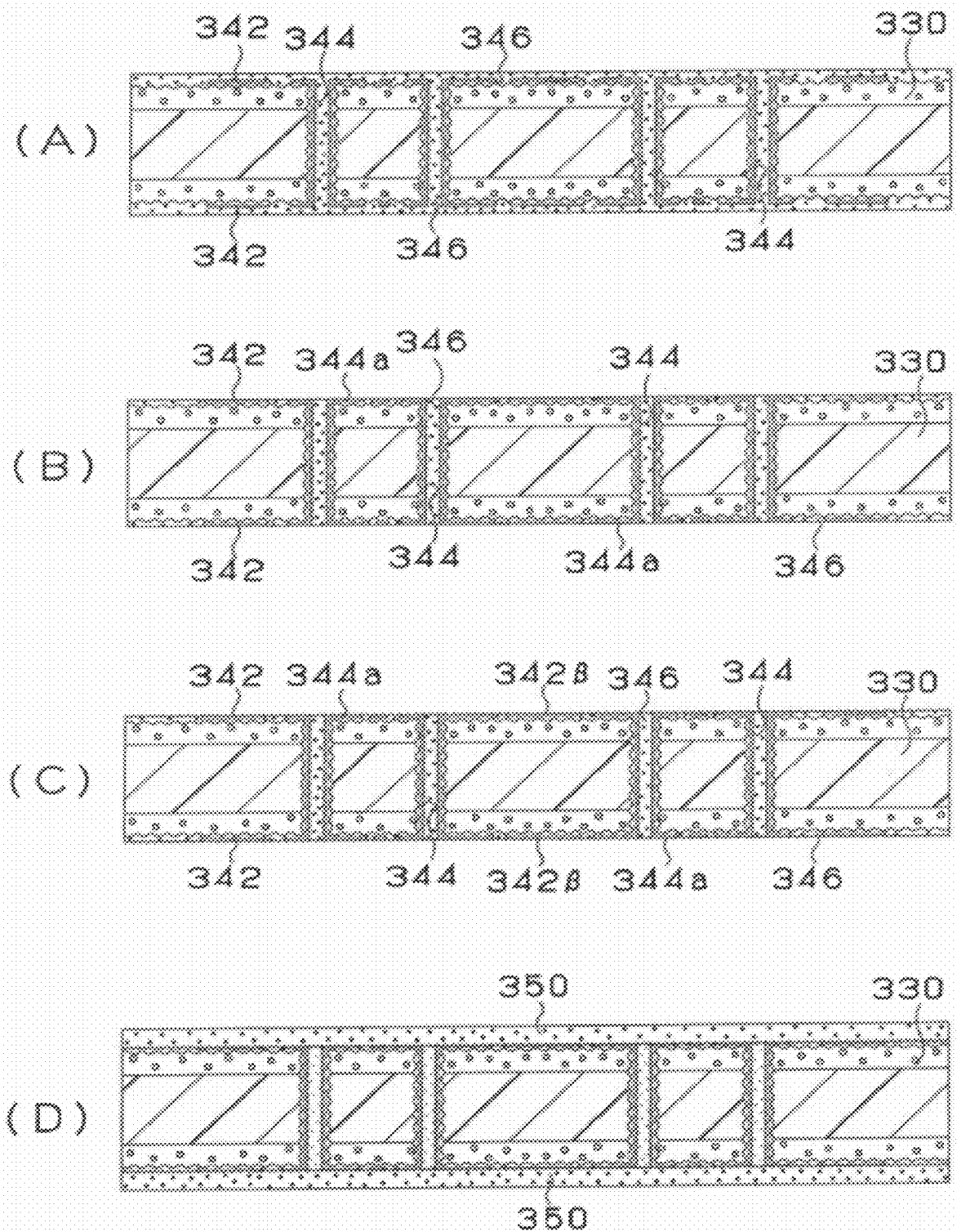
FIGS. 28 (A), 28 (B), 28 (C) and 28 (D) are diagrams showing a process for manufacturing the printed circuit board according to the third embodiment.

(12) Then, similarly to the second embodiment, interlayer resin insulating layers 350 constitute by cyclo-olefin resin are provided for the substrate 330 subjected to the foregoing process (FIG. 28 (D)).

Figure 29:
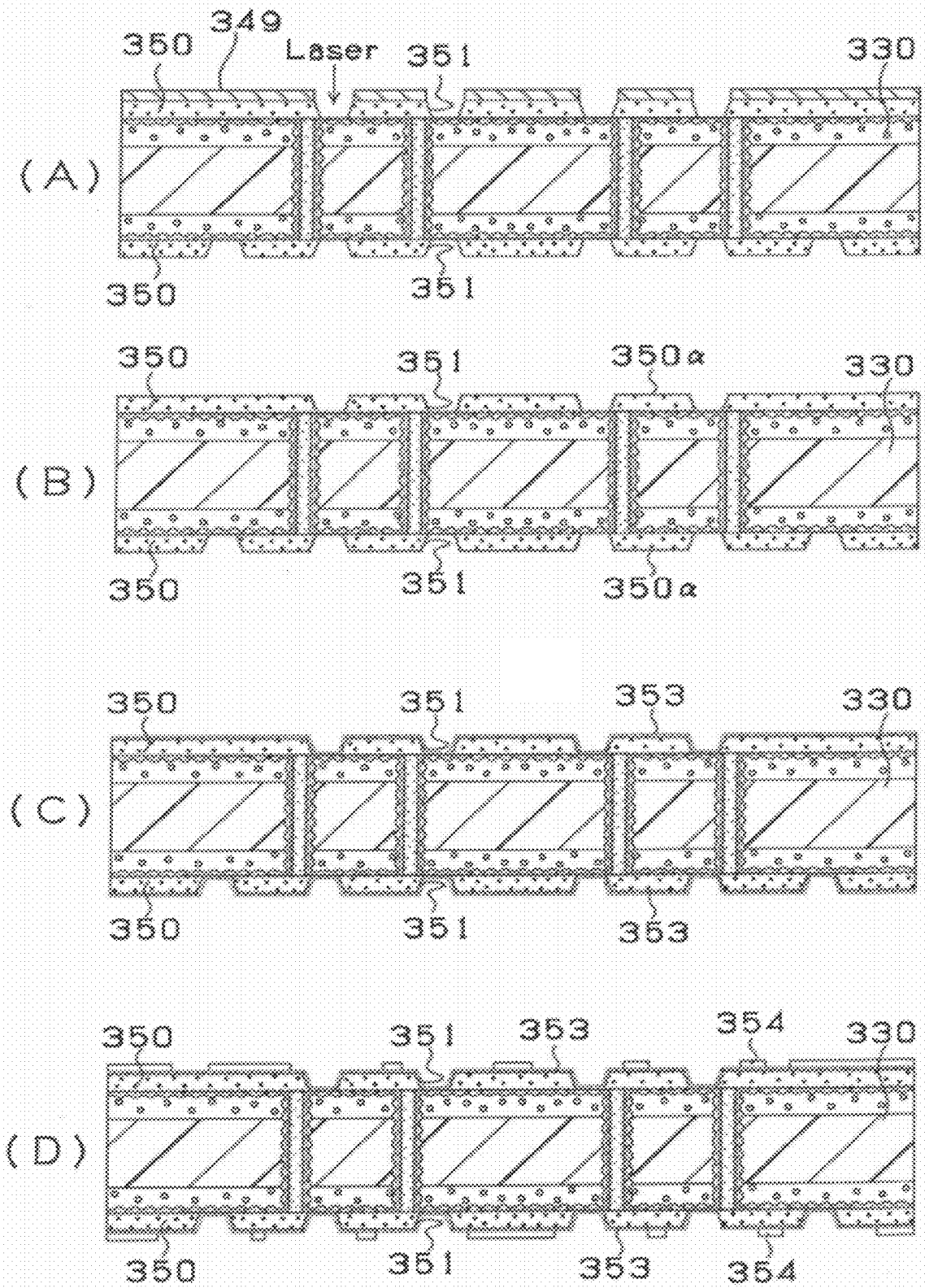
FIGS. 29 (A), 29 (B), 29 (C) and 29 (D) are diagrams showing a process for manufacturing the printed circuit board according to the third embodiment.

(13) Then, similarly to the second embodiment, a mask 349 having openings and $CO_2$ gas laser beams are use to form openings 351 for via holes each having a diameter of 80 µm mare formed in the interlayer resin insulating layer 350 (FIG. 29 (A)).

(14) Then, similarly to the second embodiment, a plasma process is performed so that a rough surface 350 α is formed on each interlayer resin insulating layer 350 (FIG. 29 (B)).

(15) Then, similarly to the second embodiment, a Ni/Cu metal layer 353 is formed on the surface of each interlayer resin insulating layer 350 (FIG. 29 (C)).

(16) Similarly to the second embodiment, a pattern of a plating resist 354 having a thickness of 15 µm is formed on the substrate subjected to the foregoing process (FIG. 29 (D)).

Figure 30:
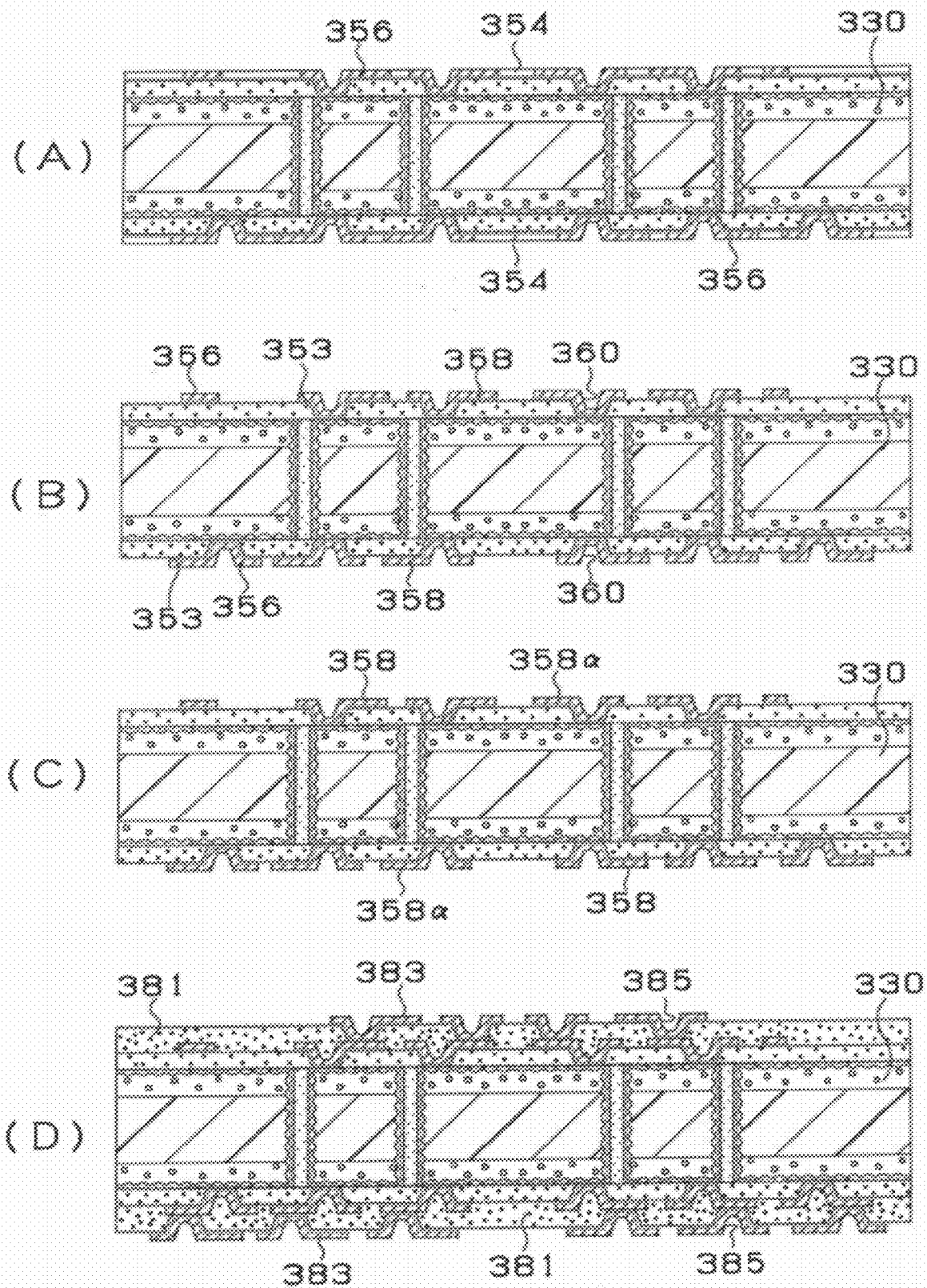
FIGS. 30 (A), 30 (B), 30 (C) and 30 (D) are diagrams showing a process for manufacturing the printed circuit board according to the third embodiment.

(17) Then, similarly to the second embodiment, electroplating is performed so that an electroplated film 356 having a thickness of 15 µm is formed (FIG. 30 (A)).

(18) Then, similarly to the second embodiment, a conductor circuit 358 (including via holes 360) constituted by the Ni/Cu metal layer 353 or the like and having a thickness of 16 µm is formed (FIG. 30 (B)). Then, the etching process which is the same as the process

(11) is performed to roughen the surface of the conductor circuit 358. Thus, a rough surface 358 α is formed (FIG. 30 (C)).

(19) Then, the processes (12) to (18) are repeated so that an interlayer resin insulating layer 381 and a conductor circuit 383 (including via holes 385) are formed at the further upper positions (FIG. 30 (D)).

(20) Then, similarly to the first embodiment, the two sides of the substrate are coated with the solder resist composition so that solder resist layers (organic resin insulating layers) 70 incorporating openings 371 and each having a thickness of 20 µm are formed (FIG. 31 (A)).

(21) Then, similarly to the first embodiment, a nickel-plated layer 372 is formed on each of the openings 371 of the substrate having the solder resist layer 370 formed thereon. Then, a gold-plated layer 374 is formed on the nickel-plated layer 372 (FIG. 31 (B)).

(22) Then, solder paste is printed on each of the openings 371 in the solder resist layer 370, and then reflowing is performed at 200° C. Thus, solder bumps (solder) 376 are formed so that a printed circuit board 310 having the solder bumps 376 is manufactured (see FIG. 32).

The thermosetting resin film contains refractory resin, soluble particles, a hardening agent and other components same as the first embodiment.

(First Modification of Third Embodiment)

Figure 39:
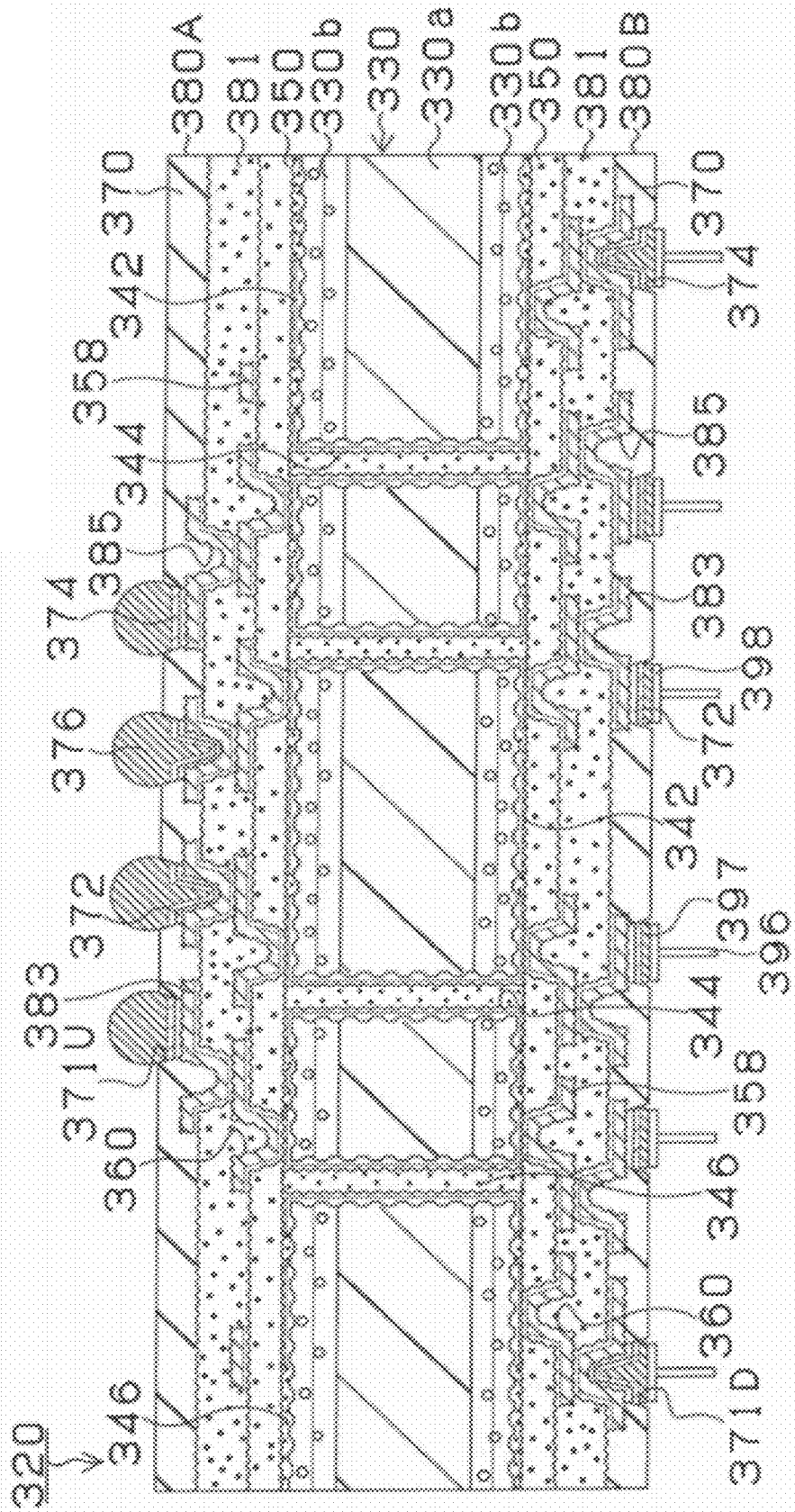
FIG. 39 is a cross sectional view showing the printed circuit board according to the first modification of the third embodiment.

A printed circuit board 320 according to a first modification of the third embodiment will now be described with reference to FIG. 39. In the third embodiment, the BGA is provided. The first modification has a structure similar to that according to the third embodiment. As shown in FIG. 39, a PGA method is employed with which connection is established through conductive connection pins 396 as shown in FIG. 39.

A method of manufacturing the printed circuit board according to the first modification of the present invention will now be described. When the printed circuit board according to the first modification is manufactured, the following materials are employed. A. a raw material composition (an adhesive agent for the upper layer) for preparing an adhesive agent for electroless plating and B. a raw material composition (an adhesive agent for the lower layer) for preparing the resin insulating agent are similar to those according to the second modification of the second embodiment. C. the resin film for the interlayer resin insulating layer is similar to that according to the first modification of the second embodiment. Therefore, D. a resin filler will now be described.

D. Preparation of Resin Filler

The following materials are introduced into a container: 100 parts by weight of bisphenol-F epoxy monomer (YL983U manufactured by Yuka Shell and having a molecular weight of 310), 170 parts by weight of $SiO_2$ spherical particles (CRS 1101-CE manufactured by Adotech) having surfaces each of which is coated with a silane coupling agent and a mean particle size of 1.6 µm and structured such that the diameter of the largest particle is 15 µm or smaller and 1.5 part by weight of a leveling agent (Pelenol S4 manufactured by Sannopuko). The materials are stirred and mixed so that a resin filler having viscosity of 45 Pa·s to 49 Pa·s at 23±1° C. is prepared.

Note that 6.5 parts by weight of imidazole hardening agent (2E4MZ-CN manufactured by Shikoku Chemicals) are employed as the hardening agent.

A method of manufacturing the printed circuit board described with reference to FIG. 39 will now be described with reference to FIGS. 33 to 39.

Figure 33:
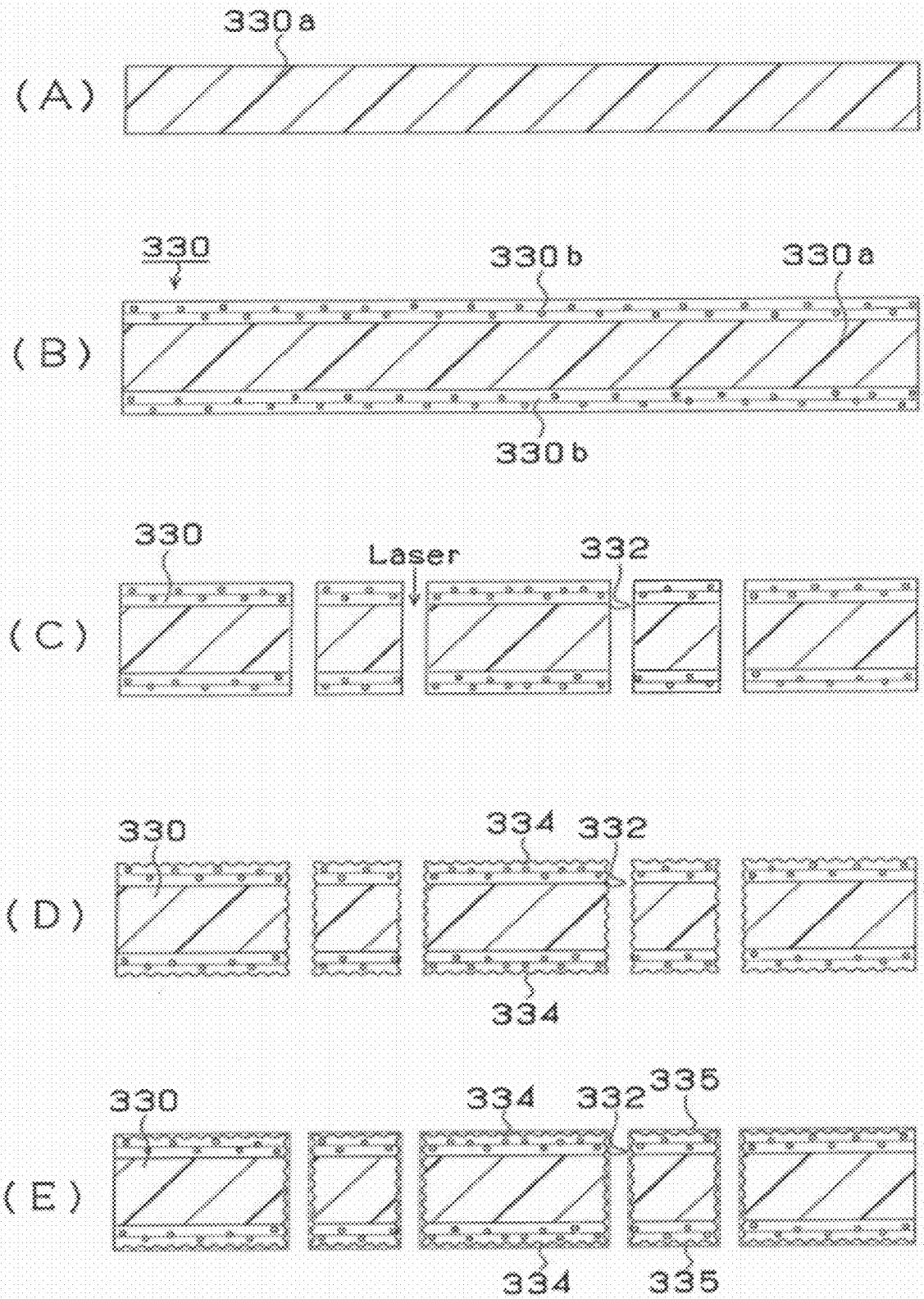
FIGS. 33 (A), 33 (B), 33 (C), 33 (D) and 33 (E) are diagrams showing a process for manufacturing a printed circuit board according to a first modification of the third embodiment.
Figure 34:
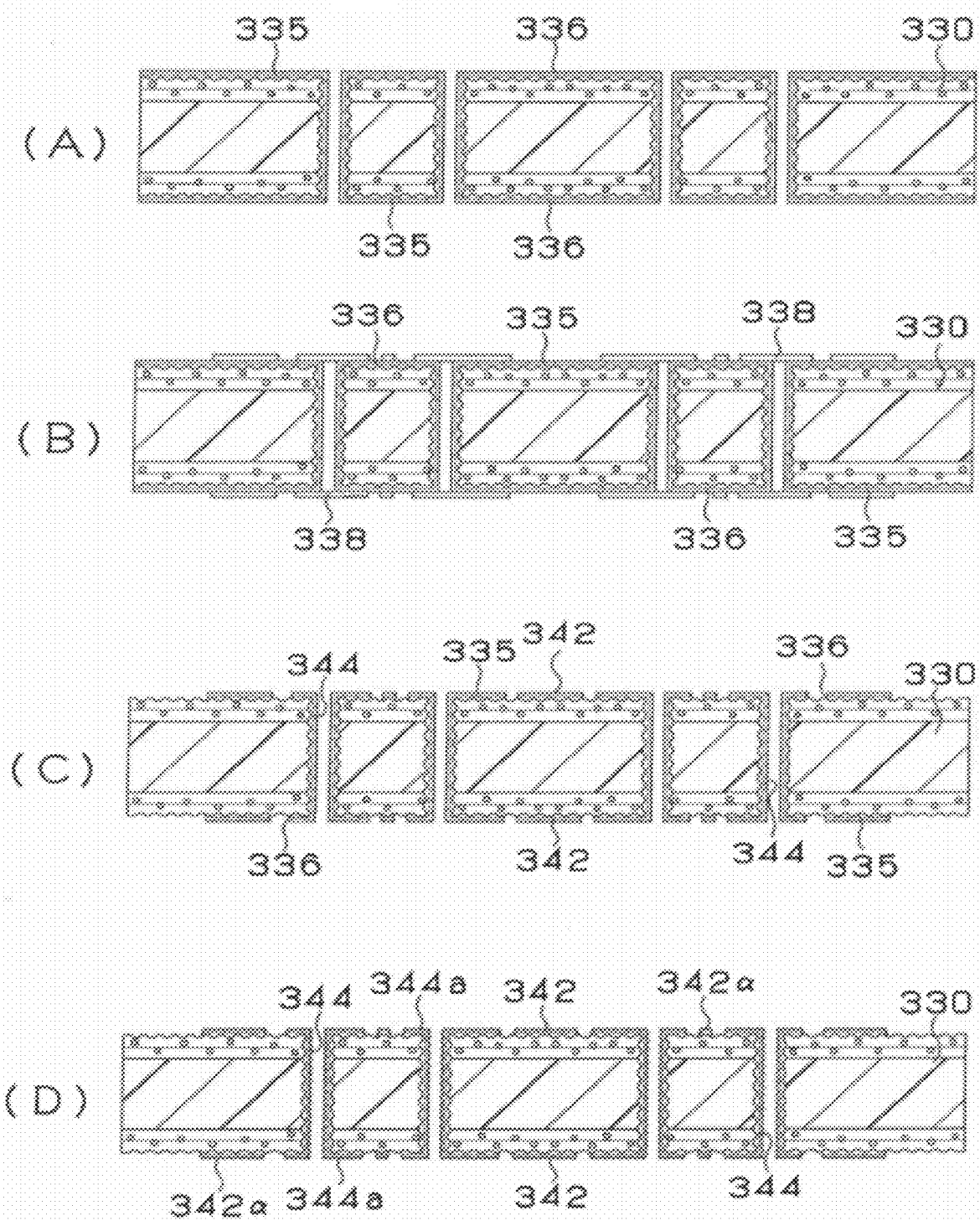
FIGS. 34 (A), 34 (B), 34 (C) and 34 (D) are diagrams showing a process for manufacturing the printed circuit board according to the first modification of the third embodiment.

(1) A core member 330*a* constituted by any one of BT (Bismaleimide-Triazine), FR-4 and FR-5 having a thickness of 0.1 mm to 1.0 mm is employed as the starting material (FIG. 33 (A)). When any one of BT, FR-4 and FR-5 having a structure that the core is impregnated with resin is employed as the core member 330*a*, the strength required for the core substrate can be maintained.

(2) Then, the raw material composition B for preparing the resin insulating agent is stirred and mixed so that the viscosity is adjusted to 1.5 Pa·s. Thus, the interlayer resin insulating agent (for the lower layer) is obtained.

Then, the raw material composition A for preparing the adhesive agent for electroless plating is stirred and mixed so that the viscosity is adjusted to 7 Pa·s. Thus, adhesive agent solution (for the upper layer) for electroless plating is obtained.

(3) Then, the resin insulating agent (for the lower layer) obtained in the process (2) and having the viscosity of 1.5 Pa·s is applied to each of the two side of the core member 330*a* within 24 hours after the preparation by using a roll coater. Then, the core member 330*a* in a state where it is placed horizontally is allowed to stand for 20 minutes. Then, drying (prebaking) is performed at 60° C. for 30 minutes. Then, the adhesive agent solution (for the upper layer) obtained in the process (2) and having the viscosity 7 Pa·s is applied within 24 hours after the preparation. Then, the core member 330*a* in a state where it is placed horizontally is allowed to stand for 20 minutes. Then, drying (prebaking) is performed at 60° C. for 30 minutes. Thus, the resin insulating layer 330*b* is formed. It is preferable that the thickness of the resin insulating layer 330*b* is 0.01 mm to 0.1 mm.

As a result of the foregoing processes, the core substrate 330 constituted by the core member 330*a* and the resin insulating layer 330*b* can be formed (FIG. 33 (B)). It is preferable that the thickness of the core substrate 330 is 0.12 mm to 1.2 mm.

(4) Then, penetrating openings 332 for through holes are formed in the core substrate 330 by applying laser beams (FIG. 33 (C)). As distinct from the conventional copper-clad laminated board, penetrating openings can properly be formed in the core substrate 330 constituted by the core member 330*a* and the resin insulating layer 330*b* formed on each of the two sides of the core member 330*a* such that laser beams are applied.

(5) Then, the overall surface of the core substrate 330 is roughened with acid or the oxidizer so that the rough surface 334 is formed on the overall surface of the core substrate 330 (FIG. 33 (D)). It is preferable that Ra (mean roughness height)

of the formed rough surface 334 is 0.1 µm to 3.0 µm. The resin for constituting the resin insulating layer 330b formed on each of the two sides of the core substrate has the structure that soluble particles are dispersed in the refractory resin. Therefore, when the soluble particles on the surface are dissolved by using acid or the like, the rough surface can be formed on the surface of the core substrate.

(6) Then, the metal film 335 is formed on the overall surface of the core substrate 330 (FIG. 33 (E)). At this time, evaporation or sputtering may be employed as a substitute for electroless plating. Then, the core substrate 330 is electroless-plated so that the electroplated film 336 is formed on the metal film 335 (FIG. 34 (A)). Since the surface of the core substrate 330 has been roughened as a result of the foregoing process, the adhesiveness with the metal film 335 formed on the surface of the core substrate 330 can be improved. Moreover, the reliability of the through holes can be improved. Since any air bubble is not left when the metal film 335 is deposited in each of the penetrating openings 332, the reliability in connection of the through hole 344 can be improved.

(7) Then, a marketed photosensitive dry film is bonded to each of the two sides of the substrate 330. Then, a photomask is placed, and then exposure and development processes are performed. Thus, the pattern of the resist 338 is formed (FIG. 34 (B)).

(8) Then, the resist 338 is separated and removed with 5% NaOH, and then the metal film 335 and the electroplated film 336 present below the resist 338 are dissolved and removed by performing etching using mixed solution of nitric acid, sulfuric acid and hydrogen peroxide. Thus, the lower conductor circuit 342 and the through holes 344 constituted by the metal film 335 and the electroplated film 336 are formed (FIG. 34 (C)). Note that the pattern of the lower conductor circuit 342 and the through holes 344 may be formed by the semi-additive method.

(9) Then, the substrate 330 having the through holes 344 and the lower conductor circuit 342 formed thereon is cleaned with water and dried. Then, a blacking process is performed by using a blacking bath (an oxidizing bath) which is solution containing NaOH (10 g/l), $NaClO_2$ (40 g/l) and $Na_3PO_4$ (6 g/l). Moreover, a reducing process is performed by using a reducing bath which is solution containing NaOH (10 g/l) and $NaBH_4$ (6 g/l). Thus, the rough surface 342 α is formed on the overall surface of the lower conductor circuit 342 including the through holes 344 (FIG. 34 (D)).

(10) The resin filler described in D is prepared, and then the following method is employed to form a layer of the resin filler 346 in each of the through holes 344 and the portion of either side of the substrate 330 in which the lower conductor circuit 342 is not formed within 24 hours from preparation. That is, initially a squeeze is used to inwards push the resin filler 346 into each of the through holes 344. Then, drying is performed at 100° C. for 20 minutes. As distinct from the conventional printed circuit board described with reference to FIG. 70, no burr is present in the through hole. Therefore, leaving of any air bubble and non-filling occur when the resin filler 346 has been enclosed in the through hole 344. Therefore, occurrence of a corner crack can be prevented. Hence it follows that the reliability of the through hole 344 can be improved.

Then, a mask having opening corresponding to the portions in which the lower conductor circuit 342 is not formed is placed on the substrate 330. Then, a squeeze is used to form a layer of the resin filler 346 in the portion in which the lower conductor circuit 342 is not formed and which is formed into a recess portion. Then, drying is performed at 100° C. for 20 minutes (FIG. 35 (A)).

(11) Either side of the substrate 330 subjected to the process (10) is polished in a belt-sander polishing method using #600 belt abrasive paper (manufactured by Sankyo Chemical) in such a manner that the resin filler 346 is not left on the surface of the lower conductor circuit 342 and surfaces 344a of the lands of the through holes 344. Then, buffing is performed to remove damage caused from the belt-sander polishing process. The foregoing sequential polishing processes are performed for another surface of the substrate 330. Then, a heating process is performed at 100° C. for one hour and 150° C. for one hour so that the resin filler 346 is hardened.

Thus, the surface portion of the resin filler 346 and the surface of the lower conductor circuit 342 formed in the through holes 344 and the portion in which the lower conductor circuit 342 is not formed are flattened. Thus, a substrate is obtained which has the structure that the resin filler 346, the lower conductor circuit 342 and the through holes 344 are in firmly contact with one another through the rough surface 342α (FIG. 35 (B)). That is, as a result of the foregoing process, the surface of the resin filler 346 and that of the lower conductor circuit 342 are flushed with each other.

(12) The substrate 330 is cleaned with water and degreased with acid, and then soft etching is performed. Then, etching solution is sprayed to the two sides of the substrate 330 so as to etch the surface of the lower conductor circuit 342 and surfaces of the lands 344a of the through holes 344. Thus, the rough surface 342 β is formed on the overall surface of the lower conductor circuit 342 (FIG. 35 (C)). The etching solution is etching solution (Mech Etch Bond manufactured by Mec Company Ltd.) composed of 10 parts by weight of imidazole copper (II) complex, 7 parts by weight of glycolic acid and 5 parts by weight of potassium chloride.

Figure 35:
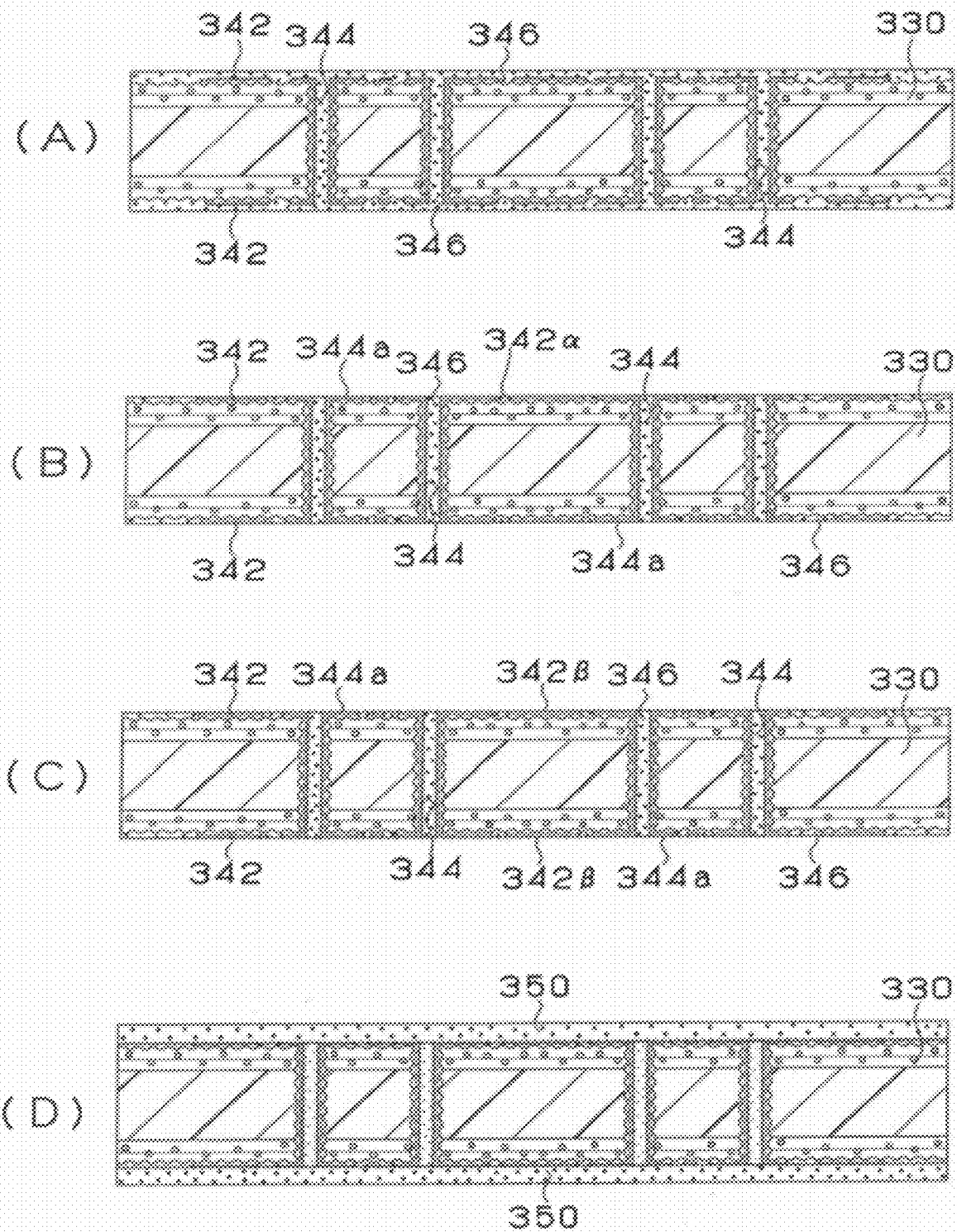
FIGS. 35 (A), 35 (B), 35 (C) and 35 (D) are diagrams showing a process for manufacturing the printed circuit board according to the first modification of the third embodiment.

(13) Similarly to the first modification of the second embodiment, the interlayer resin insulating layer 350 is formed on the substrate 330 (FIG. 35 (D)).

Figure 36:
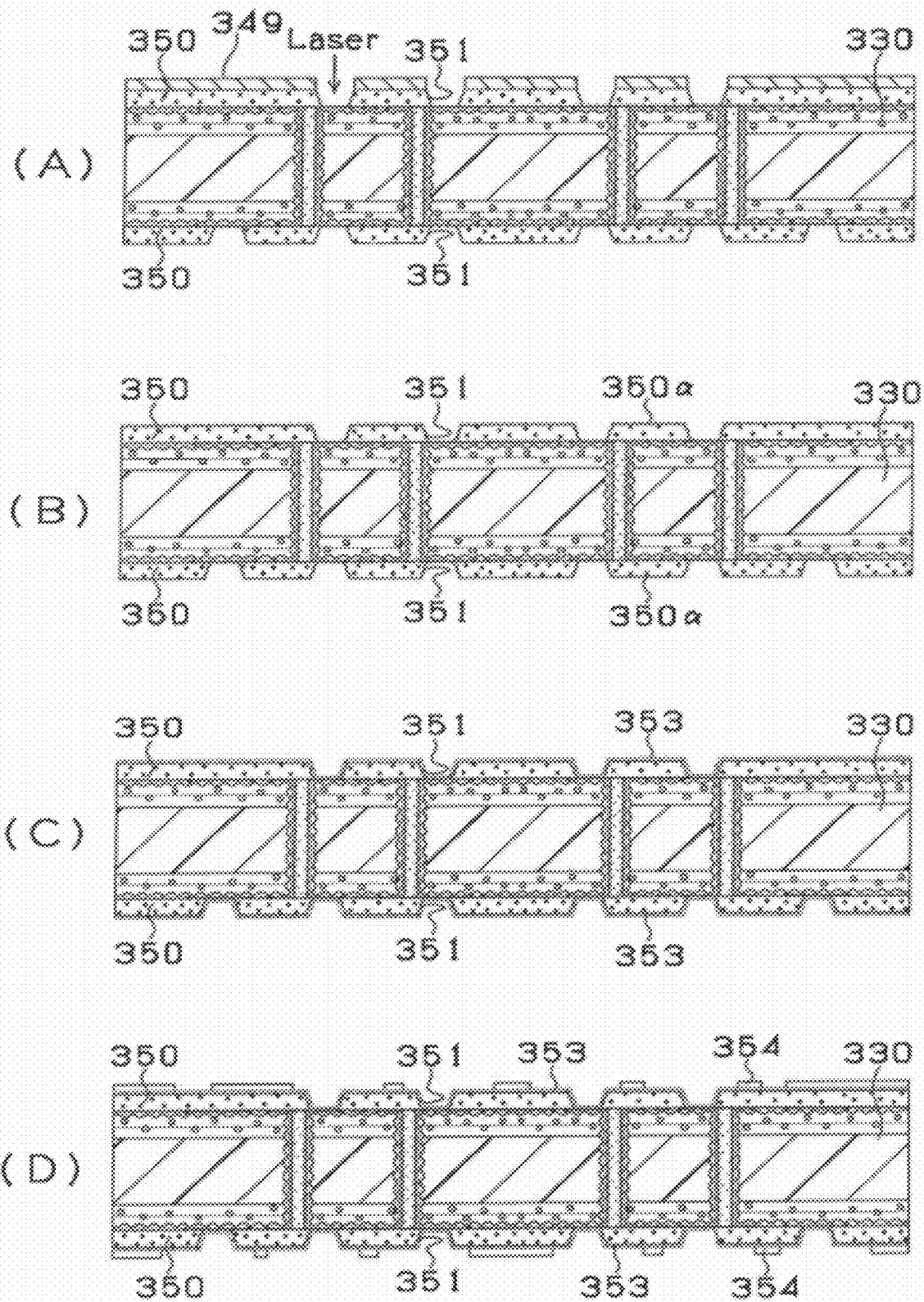
FIGS. 36 (A), 36 (B), 36 (C) and 36 (D) are diagrams showing a process for manufacturing the printed circuit board according to the first modification of the third embodiment.

(14) Then, similarly to the first modification of the second embodiment, the mask 349 having openings is used to form openings 351 for via holes each having a diameter of 80 µm are formed in the interlayer resin insulating layer 350 by applying $CO_2$ gas laser beams (FIG. 36 (A)).

(15) Then, similarly to the first modification of the second embodiment, the rough surface 350 α is formed on the surface of the interlayer resin insulating layer 350 including the inner walls of the openings 351 for via holes (FIG. 36 (B)).

(16) Then, the substrate 330 subjected to the foregoing process is, similarly to the first modification of the second embodiment, subjected to a process such that catalyst cores are allowed to adhere to the surface of the interlayer resin insulating layer 350 and the inner walls of the openings 351 for via holes.

(17) Then, similarly to the first modification of the second embodiment, the electroless copper-plated film 353 having a thickness of 0.6 µm to 3.0 µm is formed to the overall surface of the rough surface 350 α (FIG. 36 (C)).

(18) Similarly to the first modification of the second embodiment, the plating resist 354 having a thickness of 30 µm is formed (FIG. 36 (D)).

Figure 37:
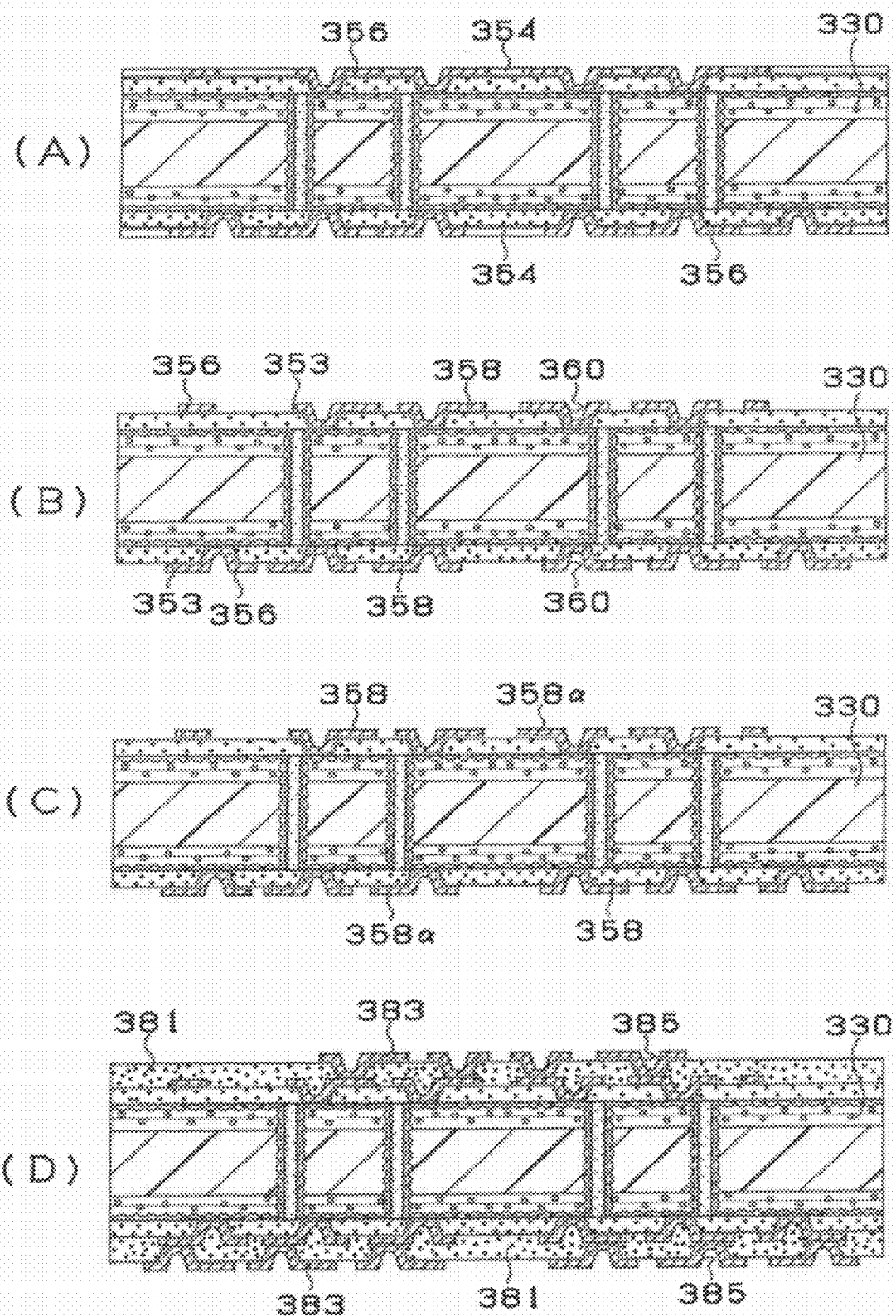
FIGS. 37 (A), 37 (B), 37 (C) and 37 (D) are diagrams showing a process for manufacturing the printed circuit board according to the first modification of the third embodiment.

(19) Similarly to the first modification of the second embodiment, electroless plating is performed so that the electrolytic copper-plated film 356 having a thickness of 20 µm is formed (FIG. 37 (A)).

(20) Similarly to the first modification of the second embodiment, an etching process for dissolution and removal is performed so that the conductor circuit 358 (including the via holes 360) composed of the electroless copper-plated film 353 and the electrolytic copper-plated film 356 and having a thickness of 18 µm is formed (FIG. 37 (B)).

(21) A process similar to the process (12) is performed so that etching solution containing cupric complex and organic acid is used to form the rough surface 358 α (FIG. 37 (C)).

(22) The processes (13) to (21) are repeated so that the interlayer resin insulating layer 385 and the conductor circuit 383 (including the via holes 385) are formed in the upper layer portion (FIG. 37 (D)).

(23) Then, a solder resist composition similar to that according to the first embodiment is applied to each of the two sides of the substrate to have thickness of 20 μm. Thus, the solder resist layer 370 is formed which incorporates openings 371U and 371D and which has a thickness of 20 μm (FIG. 38 (A)).

(24) Then, similarly to the first embodiment, the nickel-plated layer 372 having a thickness of 5 μm is provided for the openings 371U and 371D in the substrate having the solder resist layer 370 formed thereon. Then, the gold-plated layer 374 having a thickness of 0.03 μm is formed on the nickel-plated layer 372 (FIG. 38 (B)).

(25) Then, solder paste containing tin-lead is printed to the opening 371U of the solder resist layer 370 on the surface of the substrate on which the IC chip is mounted. Moreover, solder paste serving as the conductive adhesive agent 397 is printed to the inner surfaces of the openings 371D on the other surface of the substrate. Then, the conductive connection pins 396 are joined to a proper pin holding unit so as to be supported. A fixing portion 398 of each of the conductive connection pins 396 is brought into contact with the conductive adhesive agent 397 in each of the conductive connection pins 396. Then, reflowing is performed so that the conductive connection pins 396 are secured to the conductive adhesive agent 397. The conductive connection pins 396 are joined by a method with which the conductive adhesive agent 397 is formed into a ball shape which is introduced into each of the openings 371D. Another method may be employed with which the conductive adhesive agent 397 is joined to the fixing portions 398 so as to join the conductive connection pins 396, after which reflowing is performed. Thus, a printed circuit board 20 having the conductive connection pins 396 can be obtained (see FIG. 39).

In the foregoing embodiment, the resin insulating layer constituting the core substrate has the structure that soluble particles are dispersed in the refractory resin so as to roughen the surface. As an alternative to employment of the resin containing the soluble particles, the resin insulating layer may be constituted by soluble resin and refractory resin to dissolve the soluble resin to roughen the surface of the resin insulating layer. A method may be employed with which the surface of the interlayer resin insulating layer is subjected to a plasma process or a polishing process so as to roughen the surface.

The third embodiment enables through holes each having a diameter of 100 μm or smaller can reliably be formed. Moreover, any air bubble is not formed and the interlayer resin insulating layer can be flattened. Therefore, the connection easiness and the reliability can be improved. When the interlayer material (the resin insulating layer) of the core substrate is made of the same material as that of the interlayer resin insulating layer, the layers does not easily separated. As a result, the reliability can furthermore be improved.

[Fourth Embodiment]

Figure 46:
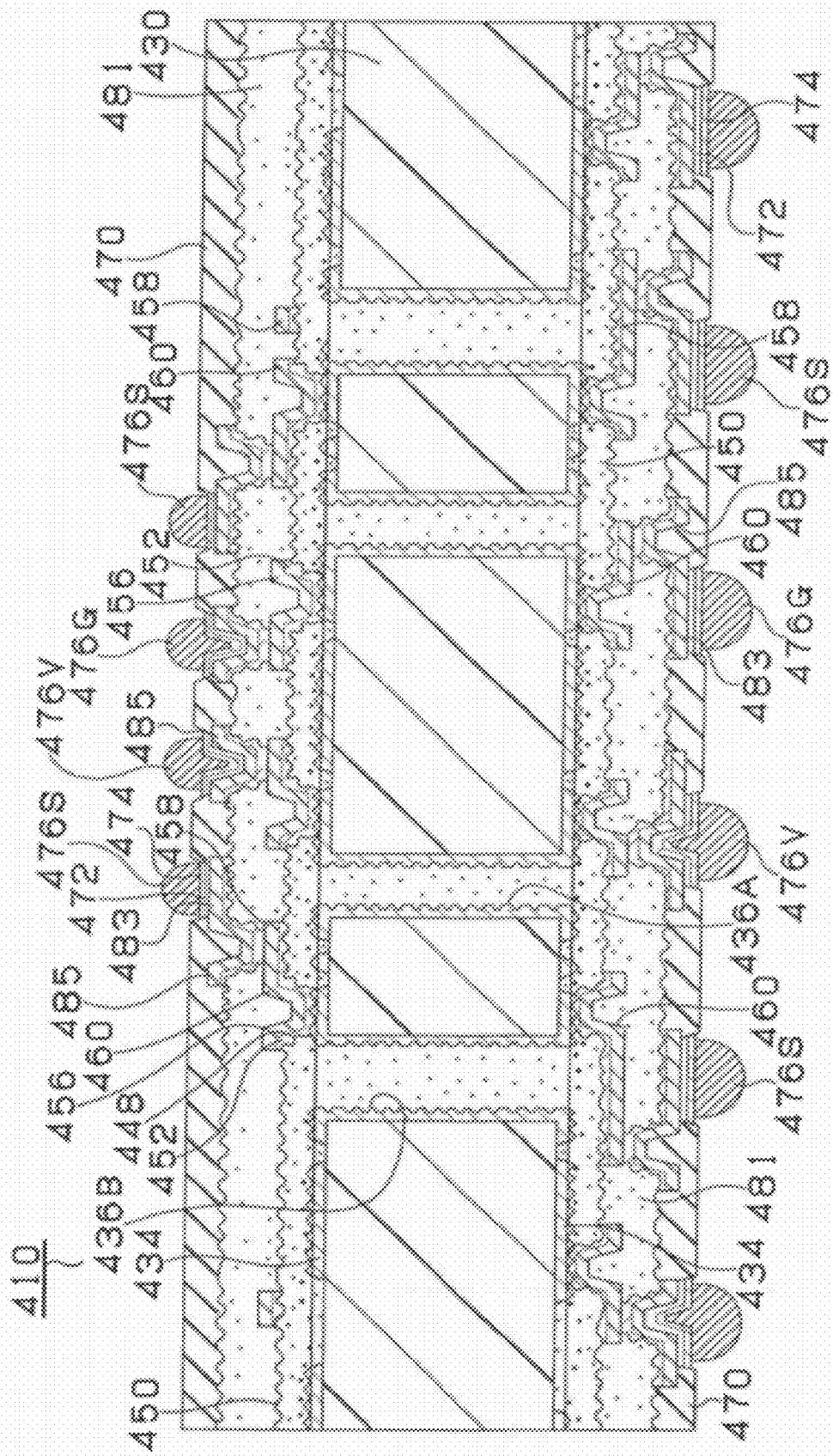
FIG. 46 is a cross-sectional view showing the multi-layer printed circuit board according to the fourth embodiment.
Figure 47:
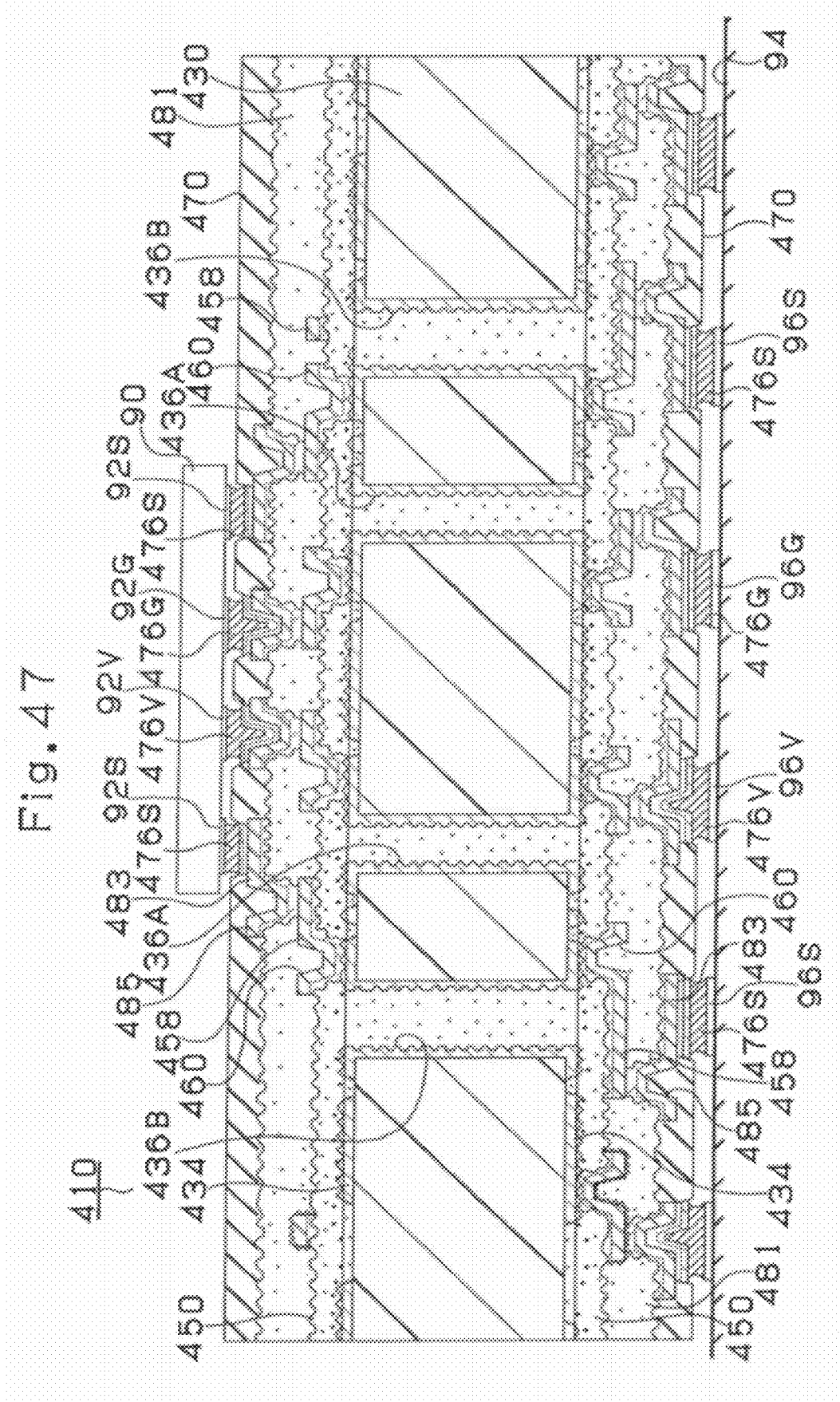
FIG. 47 is a cross-sectional view showing the multi-layer printed circuit board according to the fourth embodiment.

The structure of a multi-layer printed circuit board according to a fourth embodiment will now be described with reference to FIG. 46 which is a cross-sectional view showing a multi-layer printed circuit board 410 serving as a package substrate and FIG. 47 showing a state in which an IC chip has been mounted so as to be joined to a daughter board.

As shown in FIG. 47, the multi-layer printed circuit board 410 incorporates a core substrate 430 having through holes 436A each having a small diameter (100 μm) formed in the central portion thereof. Moreover, through holes 436B each having a large diameter (300 μm) are formed in the outer periphery of the core substrate 430. A conductor circuit 434 is formed on each of the two sides of the core substrate 430. A lower interlayer resin insulating layer 450 having via holes 460 and a conductor circuit 458 is formed on the core substrate 430. An upper interlayer resin insulating layer 481 having via holes 485 and a conductor circuit 483 is formed on the lower interlayer resin insulating layer 450. A solder resist layer 470 is formed on the upper interlayer resin insulating layer 481.

Solder bumps 476S, 476V and 476G for establishing the connection to the IC chip are disposed in the openings in the solder resist layer 470 on the upper surface of the multi-layer printed circuit board 410. On the other hand, solder bumps 476S, 476V and 476G for establishing the connection to the daughter board are disposed in the openings of the solder resist layer 470 on the bottom surface of the package substrate.

The IC chip 90 has a pad 92S for a signal, a pad 92V for the power source and a grounding pad 92G. The pad 92S for a signal is allowed to pass through the via hole 485 of the upper interlayer resin insulating layer 481 and the via hole 460 of the lower interlayer resin insulating layer 450 through the solder bump 476S for a signal so as to be connected to the through holes 436B formed in the outer periphery of the core substrate 430 and having a large diameter. Then, the connection is established from the through holes 436B having the large diameter to pass through the lower via holes 460 and 485 and the solder bump 476S for a signal to the pad 96S for a signal adjacent to the daughter board 94.

On the other hand, the pad 92V for the power source of the IC chip 90 is allowed to pass through the solder bump 476V for the power source and the upper via holes 485 and 460 so as to be connected to the through hole 436A formed in the central portion of the core substrate 430 and having a small diameter. Then, the connection is established from the through hole 436A having the small diameter to pass through the lower via holes 460 and 485 so as to be connected to the pad 96V for the power source adjacent to the daughter board 94 from the solder bump 476V for the power source. Similarly, the grounding pad 92G of the IC chip 90 is, through the grounding solder bump 476G and the upper via holes 485 and 460, connected to the through holes 436A formed in the central portion of the core substrate 430 and having the small diameter. Then, the connection is established from the through hole 436A having the small diameter to be connected to the grounding pad 96G adjacent to the daughter board 94 from the grounding solder bump 476G through the lower via holes 460 and 485.

The method of wiring the electric lines between the IC chip and the core substrate is shown in FIG. 48 (A). The upper surface of the core substrate 430 is shown in FIG. 48 (B). Note that FIG. 47 shows a state where the numbers of the through holes 436A and 436B are decreased for convenience in drawing.

As shown in FIG. 48 (B), the through holes 436A each having the small diameter are formed in the central portion of the core substrate 430. On the other hand, the through holes 436B each having the large diameter are formed in the outer periphery of the substrate. As shown in FIG. 48 (A), electric lines from the pad 92V for the power source and the grounding pad 92G of the IC chip 90 are mainly wired in the through holes 436A each having the small diameter and provided for the core substrate 430. Electric lines from the signal pads 92S of the IC chip 90 are mainly wired in the through holes 436B each having the large diameter and provided for the core substrate. As described later, it is preferable that the through holes 436A each having the small diameter are formed by laser beams and the through holes 436B each having the large diameter are formed by drilling. As an alternative to this, all of the through holes 436A each having the small diameter and the through holes 436B each having the large diameter may be formed by laser beams or drilling.

In the fourth embodiment, the through holes 436A each having the small diameter are, by laser beams, formed in the central portion of the core substrate 430. Moreover, the through holes 436B each having the large diameter are, by drilling, formed in the outer periphery. Therefore, the core substrate exhibiting a high wiring density in the central portion thereof can be formed with a low cost. Since the through holes 436A each having the small diameter and formed in the central portion are used as the power supply lines and the ground lines, a multiplicity of power source lines and ground lines can be provided. Moreover, the length of the electric from the IC chip 90 to the daughter board 94 can be shortened. Therefore, the inductance of the power supply line and the ground line to the IC chip can be reduced. As a result, electric power can instantaneously be supplied, change in the earth level can be prevented and, therefore, malfunction of the IC chip can be prevented. The through holes 436B each having the large diameter having low probability of occurrence of defective connection are mainly used as the signal lines. The through holes 436A each having the small diameter having a high probability of occurrence of the defective connection are mainly used as the power source lines and the ground lines. Therefore, the normal operation of the multi-layer printed circuit board can be continued in case where the power source line or the through hole adjacent to the ground line encounters disconnection. The warpage does not easily occur.

A method of manufacturing the multi-layer printed circuit board 410 shown in FIGS. 46 and 47 will now be described with reference to the drawings.

Figure 49:
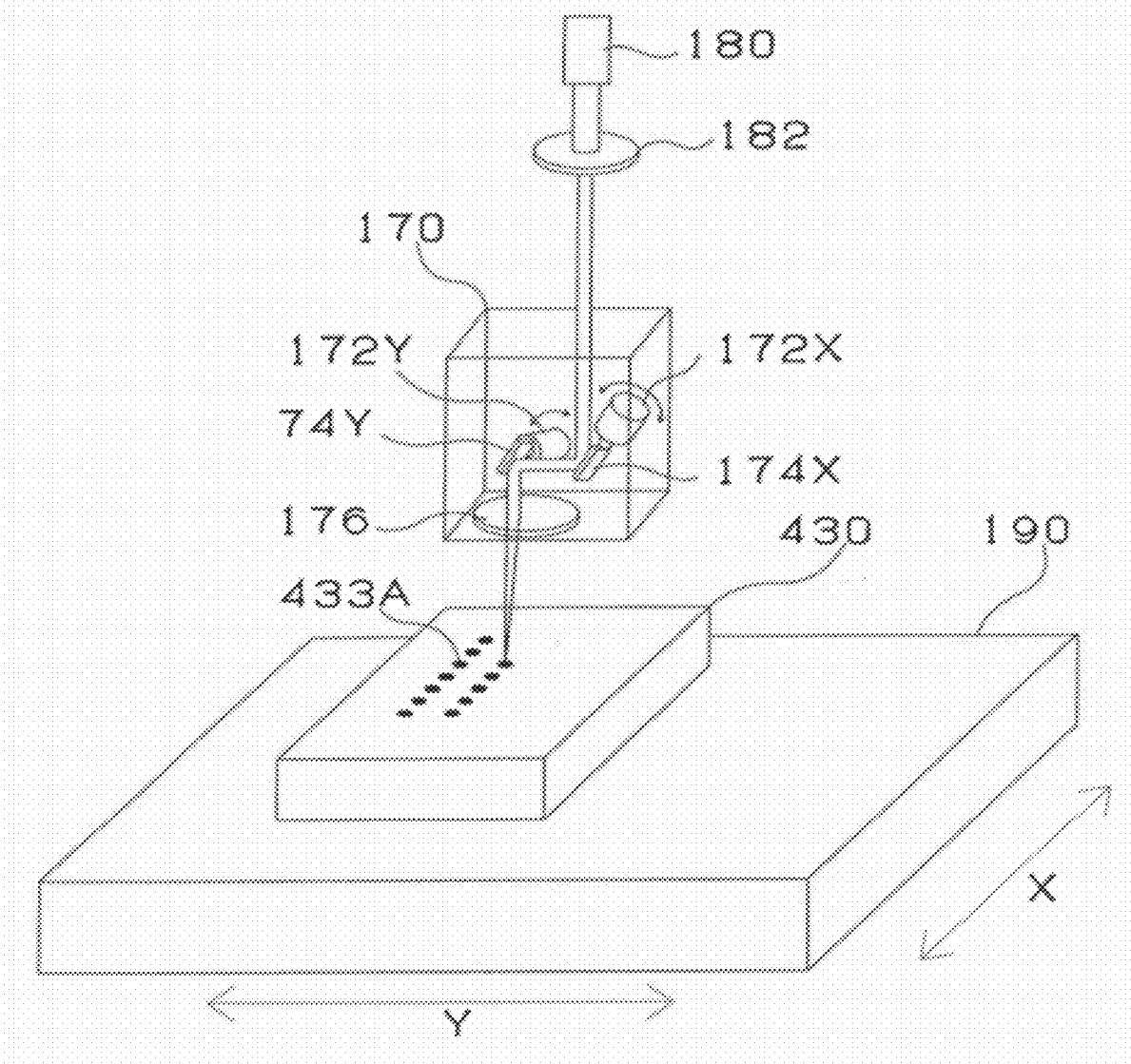
FIG. 49 is a diagram showing a carbon dioxide gas laser unit for forming openings in the multi-layer printed circuit board according to the fourth embodiment.

The schematic structure of a carbon dioxide gas laser for forming penetrating openings in the core substrate 430 and the lower interlayer resin insulating layer 450 will now be described with reference to FIG. 49.

As the laser unit according to this embodiment, ML505GT manufactured by Mitsubishi Electric is employed. As a $CO_2$ laser emitter 180, ML5003D2 manufactured by Mitsubishi Electric is employed.

A light beam emitted from the laser emitter 180 is allowed to pass through a transferring mask 182 for clearing the focal point on the substrate so as to be made incident on a galvano head 170. The galvano head 170 incorporates a galvano mirror in the form of one pair consisting of two mirrors which are a galvano mirror 174X for scanning the laser beam in the X direction and a galvano mirror 174Y for scanning the laser beam in the Y direction. The mirrors 174X and 174Y are moved by control motors 172X and 172Y. The motors 172X and 172Y responds to a control command issued from a control unit (not shown) to adjust the angle of each of the mirrors 174X and 174Y. Moreover, the motors 172X and 172Y transmits detection signals supplied from included encoders to the computer.

The laser beam is allowed to pass through the galvano mirrors 174X and 174Y so as to be scanned in the X-Y directions. Then, the laser beam is allowed to pass through a f-θ lens 176 so that penetrating openings 433A for the through holes are formed in the core substrate 430. The core substrate 430 is placed on an X-Y table 190 which moves in the X-Y directions.

The process for manufacturing the multi-layer printed circuit board according to the fourth embodiment will now be described with reference to FIGS. 40 to 45. In the fourth embodiment, the multi-layer printed circuit board is formed by the semi-additive method.

Figure 40:
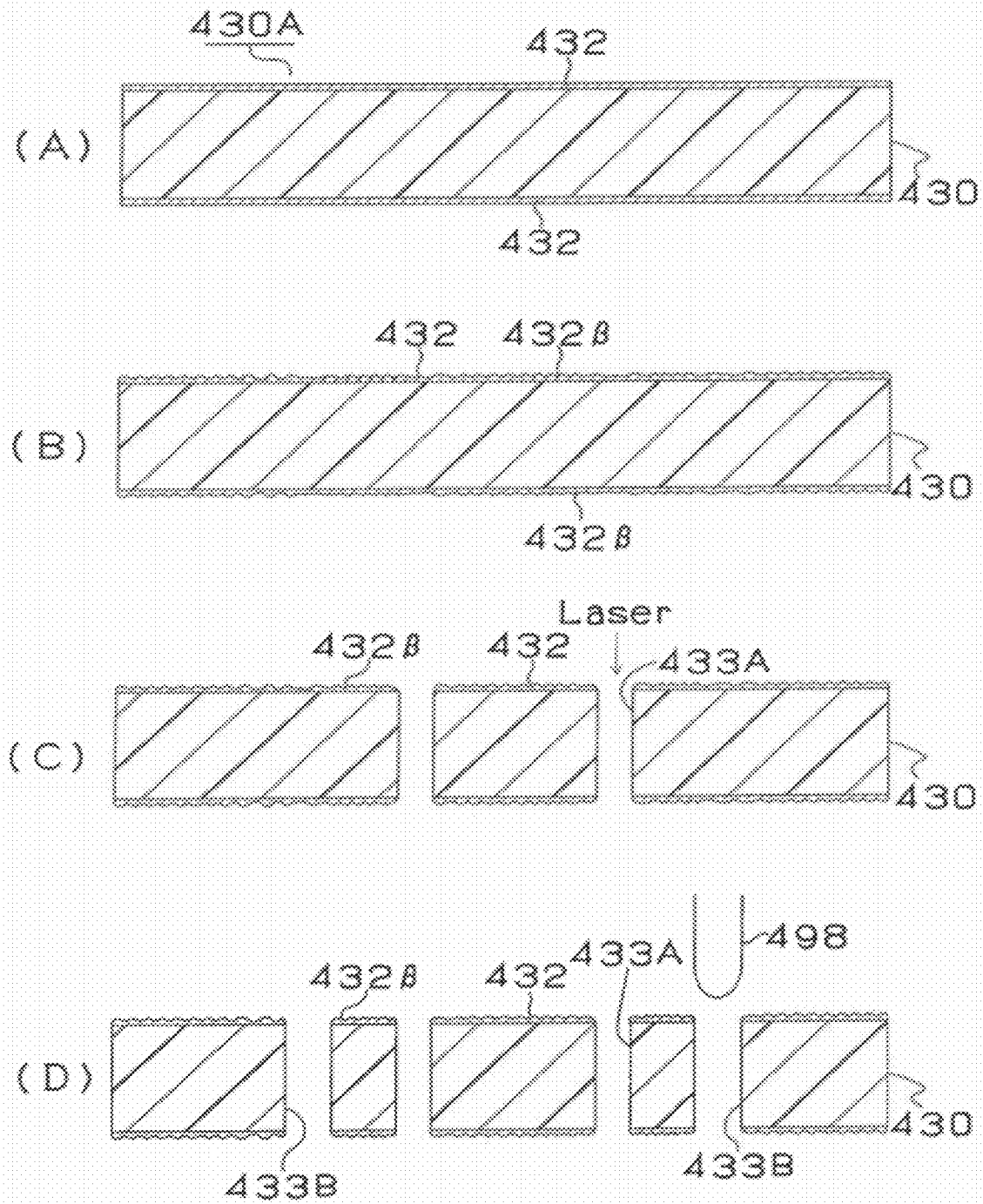
FIGS. 40 (A), 40 (B), 40 (C) and 40 (D) are diagrams showing a process for manufacturing a printed circuit board according to a fourth embodiment.
Figure 41:
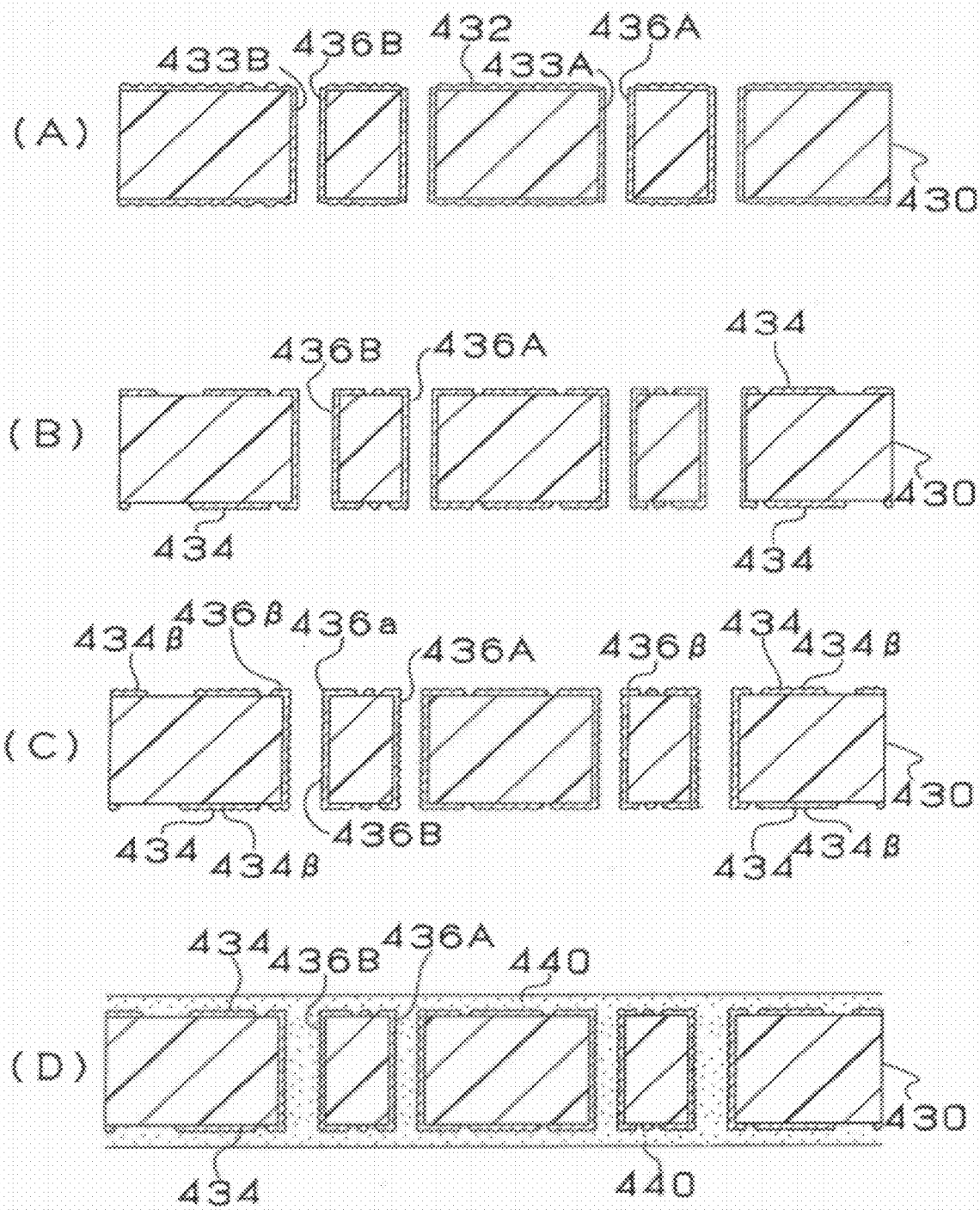
FIGS. 41 (A), 41 (B), 41 (C) and 41 (D) are diagrams showing a process for manufacturing the printed circuit board according to the fourth embodiment.

(1) As shown in FIG. 40 (A), a copper-clad laminated board 430A incorporating the substrate 430 constituted by glass epoxy resin or BT (Bismaleimide-Triazine) resin having a thickness of 0.8 mm and having two sides to each of which copper foil 432 having a thickness of 18 µm is laminated is employed as the starting material. The copper-clad laminated board 430A is subjected to a blacking process using a blacking bath (an oxidizing bath) which is solution containing NaOH (10 g/l), $NaClO_2$ (40 g/l) and $Na_3PO_4$ (6 g/l). Moreover, a reducing process is performed by using a reducing bath which is solution containing NaOH (10 g/l) and $NaBH_4$ (6 g/l). Thus, the rough surface 432 β is formed on the overall surface of the copper foil 432 (FIG. 40 (B)). Although the blacking and reducing processes are employed to form the rough surface, the rough surface may be formed by etching or electroless plating to be described later.

(2) Then, the substrate 430 is placed on the X-Y table 190 of the carbon dioxide laser unit described with reference to FIG. 49. Then, $CO_2$ gas laser beams having a wavelength of 10.4 µm are used under conditions that the beam diameter is 5 mm, the mode is the top-hat mode, the pulse width is 50 µs and the number of shots is 10 to form penetrating openings 433A each having a diameter of 100 µm and formed in the central portion of the substrate 430 at pitches of 300 µm (see FIGS. 40 (C) and 48 (B)).

(3) A drill 498 is used to form penetrating openings 433B each having a diameter of 300 µm in the outer periphery of the substrate 430 at pitches of 600 µm (FIGS. 40 (D) and 48 (B)).

Then, the substrate 430 is immersed in electroless plating solution so as to cause copper-plated film to deposit on the side wall of each of the penetrating openings 433A and 433B. Thus, the through holes 436A and 436B are formed (FIG. 41 (A)). Then, a usual method is employed to perform etching in accordance with the pattern so that inner copper pattern (the lower conductor circuit) 434 is formed on each of the two sides of the substrate (FIG. 41 (B)).

(4) The substrate having the lower conductor circuit 434 formed thereon is cleaned with water, and then the substrate is dried. Then, etching solution is sprayed to the two sides of the substrate so as to etch the surface of the lower conductor circuit 434 and the surfaces of the lands 436a of the through holes 436A and 436B. Thus, a rough surface 434 β is formed on the overall surface of the lower conductor circuit 434 and a rough surface 436 β is formed on each of the lands 436a of the through holes 436A and 436B and the inner walls (FIG. 41 (C)). The rough surfaces can be formed by the blacking and reducing processes. In the foregoing case, the blacking process is performed by using a blacking bath (an oxidizing bath) which is solution containing NaOH (10 g/l), $NaClO_2$ (40 g/l) and $Na_3PO_4$ (6 g/l). Moreover, the reducing process is performed by using a reducing bath which is solution containing NaOH (10 g/l) and $NaBH_4$ (6 g/l).

The rough surfaces can be formed by immersing the substrate in etching solution composed of the cupric complex, organic acid salt, hydrogen peroxide and sulfuric acid or by spraying the foregoing etching solution. The rough surfaces can be formed by electroless plating. When the rough surfaces are formed by electroless plating, the substrate 430 having the conductor circuit 434 formed thereon is degreased with alkali to perform soft etching. Then, a process using catalyst solution composed of palladium chloride and organic acid is performed to impart Pd catalyst. Then, the catalyst is activated. Then, the substrate 430 is immersed in electroless plating solution composed of $3.2\times10^{-2}$ mol/l copper sulfate, $3.9\times10^{-3}$ mol/l nickel sulfate, $5.4\times10^{-2}$ mol/l complexing agent, $3.3\times10^{-1}$ mol/l sodium hypophosphite, $5.0\times10^{-1}$ mol/l boric acid, 0.1 g/l surface active agent (Surfil 465 manufactured by Nissin Chemical) having PH=9. After immersion has been performed for one minute, the substrate 430 is vibrated vertically and laterally one time for four seconds. Thus, a coating layer and a rough layer constituted by a needle alloy made of Cu—Ni—P are formed on the surface of each conductor circuit 434 and each land 436*a* of the through hole 436.

(5) A resin filler 440 mainly composed of cyclo-olefin resin or epoxy resin is applied to the two sides of the substrate by using a printer. Thus, the resin filler 440 is enclosed between the conductor circuits 434 and into the through holes 436A and 436B. Then, heating and drying processes are performed. That is, the foregoing process causes the resin filler 440 to be enclosed between the lower conductor circuits 434 and into the through holes 436A and 436B (FIG. 41 (D)).

Figure 42:
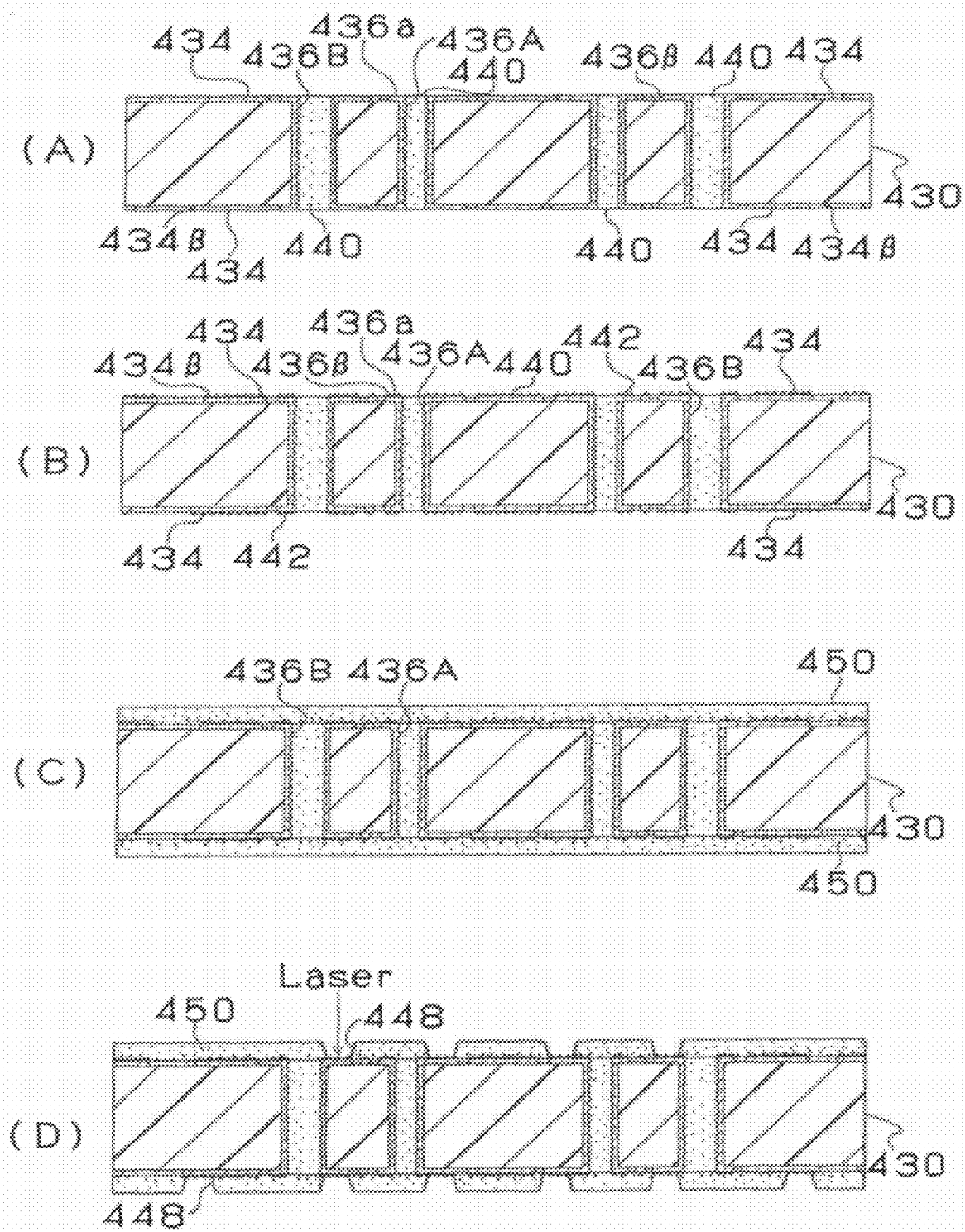
FIGS. 42 (A), 42 (B), 42 (C) and 42 (D) are diagrams showing a process for manufacturing the printed circuit board according to the fourth embodiment.

(6) The substrate subjected to the process (5) is polished, heated and hardened (FIG. 42 (A)).

(7) The etching solution which is the same as that used in the process (4) is sprayed to the two sides of the substrate subjected to the process (6). Thus, the surface of the conductor circuit 434 and the surfaces of the lands 436*a* of the through holes 436 which have temporarily be flattened are etched. Thus, the rough surface 434 β is formed on the overall surface of the lower conductor circuit 434. Moreover, the rough layer 436 β is formed on the surfaces of the lands 436*a* of the through holes (FIG. 42 (B)). Although the rough surfaces are formed by etching in the foregoing process, the rough layers may be formed by electroless plating.

(8) Then, the substrate subjected to the foregoing process is provided with the lower interlayer resin insulating layer 450 constituted by cyclo-olefin resin (FIG. 42 (C)).

(9) Then, similarly to the second embodiment, $CO_2$ gas laser beams were applied to form openings 448 for via holes each having a diameter of 80 μm in the interlayer resin insulating layer 450 (FIG. 42 (D)). Then, oxygen plasma was used to perform a desmear process.

(10) Then, a plasma process is performed to roughen the surface of the interlayer resin insulating layer 450 (FIG. 43 (A)).

(11) Then, similarly to the second embodiment, a Ni—Cu alloy layer 452 was formed on the surface of a polyolefin interlayer resin insulating layer 450 (FIG. 43 (B)).

(12) A pattern of a resist 454 was, similarly to the second embodiment, formed on the substrate subjected to the foregoing process (FIG. 43 (C)).

(13) Then, similarly to the second embodiment, electroplating was performed so that an electrolytic-plated film 456 having a thickness of 15 μm was formed (FIG. 44 (A)).

(14) Then, similarly to the second embodiment, etching was performed to perform dissolution and removal so that a conductor circuit 458 (including via holes 460) constituted by electrolytic copper-plated film 456 and having a thickness of 16 μm was formed (FIG. 44 (B)).

(15) Then, the foregoing processes (5) to (13) are repeated so that further upper interlayer resin insulating layer 150, the conductor circuit 483 and the via holes 485 were formed (FIG. 44 (C)).

(16) Then, a solder resist composition is, similarly to the first embodiment, applied to the two sides of the multi-layer printed circuit board to have a thickness of 20 μm. Thus, the solder resist layer (an organic resin insulating layer) 470 having the openings 471 corresponding to the solder pad portions and having a thickness of 20 μm was formed (FIG. 45 (A)).

(17) Then, similarly to the first embodiment, the nickel-plated layer 472 having a thickness of 5 μm was formed in each opening 471. Moreover, the gold-plated layer 474 having a thickness of 0.03 μm was formed on the nickel-plated layer 472 (FIG. 45 (B)).

(18) Then, solder paste is printed to the openings in the solder resist layer 470, and then reflowing is performed at 200° C. Thus, solder bumps (solder) 476S, 476V and 476G are formed. Thus, the multi-layer printed circuit board 410 is manufactured (see FIG. 46).

(19) Finally, the IC chip 90 is placed such that pads 92S, 92V and 92G correspond to the solder bumps 476S, 476V and 476G of the multi-layer printed circuit board 410. Then, reflowing is performed so that the IC chip 90 is joined. Then, the foregoing package substrate 410 is placed on the daughter board 94, and then reflowing is performed so as to be placed on the daughter board (FIG. 47).

(First Modification of Fourth Embodiment)

Figure 56:
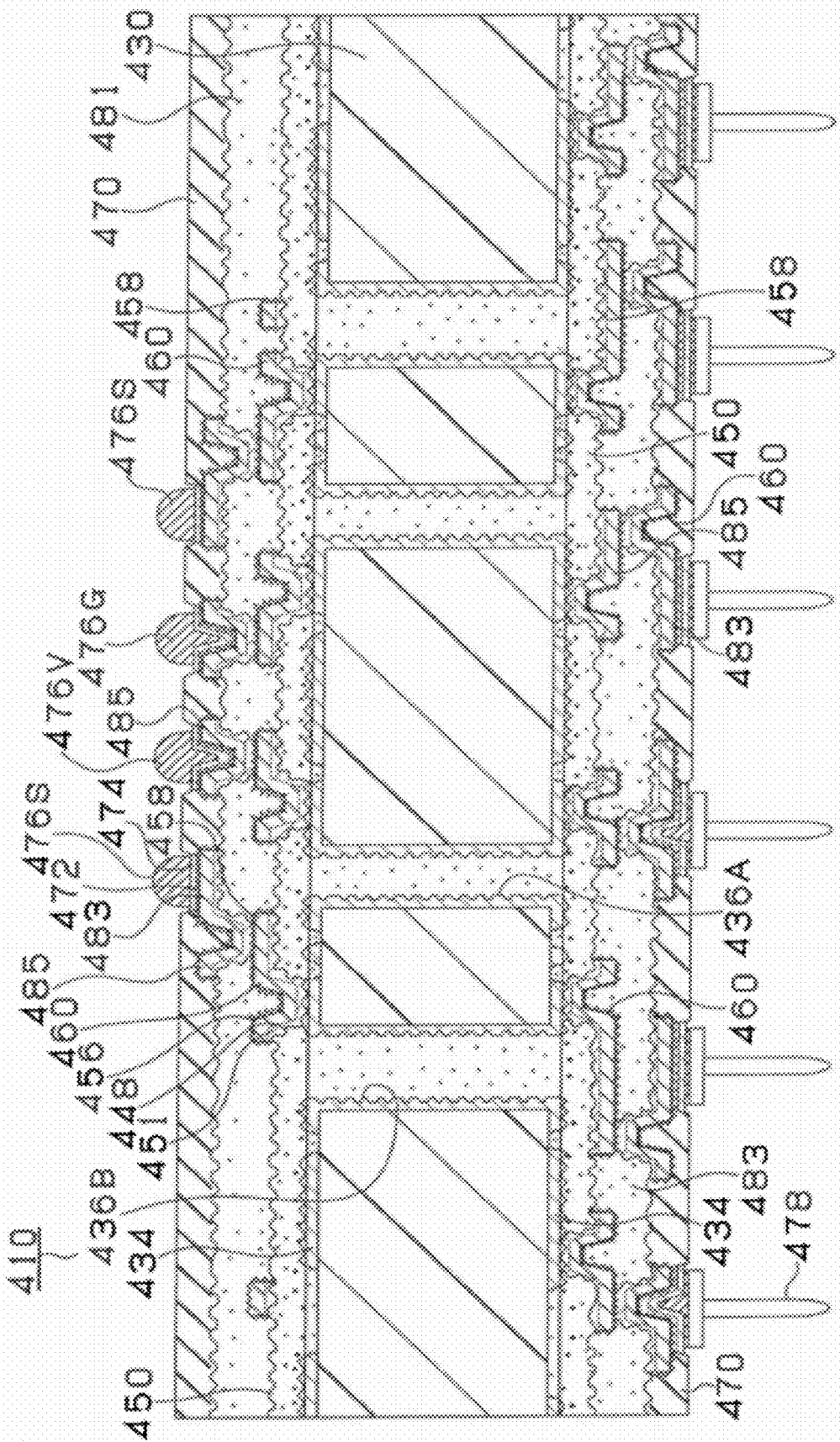
FIG. 56 is a cross sectional view showing the multi-layer printed circuit board according to the first modification of the fourth embodiment.

FIG. 56 shows the cross section of a multi-layer printed circuit board according to a first modification of the fourth embodiment and applied to a package substrate. A multi-layer printed circuit board 110 according to the first modification is similar to that according to the fourth embodiment described with reference to FIG. 46. In the fourth embodiment, the solder bumps 476S, 476V and 476G are formed on the lower surface of the multi-layer printed circuit board. In the first modification, the conductive connection pins 478 are provided.

A method of manufacturing the multi-layer printed circuit board according to the first modification will now be described.

Note that the process A for manufacturing the resin film for the interlayer resin insulating layer is similar to that according to the first modification of the second embodiment. The process B for preparing the resin filler is similar to that according to the first modification of the third embodiment.

Figure 50:
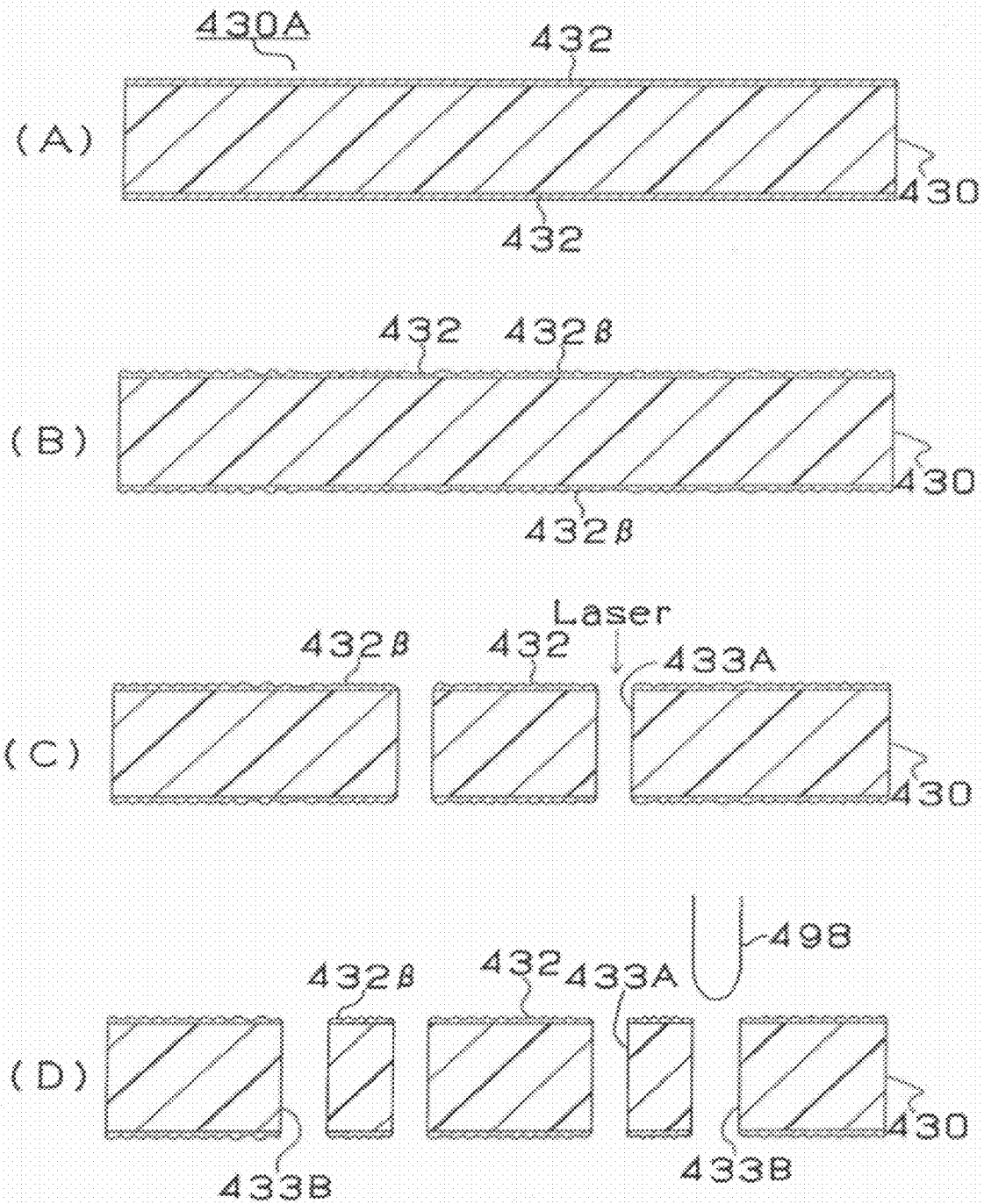
FIGS. 50 (A), 50 (B), 50 (C) and 50 (D) are diagrams showing a process for manufacturing a printed circuit board according to a first modification of the fourth embodiment.

Method of Manufacturing Multi-Layer Printed Circuit Board (1) A copper-clad laminated board 430A incorporating a substrate 430 having a thickness of 0.8 mm and constituted by glass epoxy resin or BT (Bismaleimide-Triazine) and two sides to each of which copper foil 432 having a thickness of 18 μm is laminated was employed as the starting material (FIG. 50 (A)). Initially, the copper-clad laminated board 430A was subjected to a blacking process using a blacking bath (an oxidizing bath) which is solution containing NaOH (10 g/l), $NaClO_2$ (40 g/l) and $Na_3PO_4$ (6 g/l). Moreover, a reducing process was performed by using a reducing bath which was solution containing NaOH (10 g/l) and $NaBH_4$ (6 g/l). Thus, the rough surface 432 β was formed on the overall surface of the copper foil 432 (FIG. 50 (B)). The rough surface 432 β can be omitted.

(2) Then, the substrate 430 is placed on the table of a carbon dioxide laser unit described with reference to FIG. 49. Then, carbon dioxide gas laser beams are applied so that penetrating openings 433A each having a diameter of 100 μm are formed in the central portion of the substrate 430 at pitches of 300 μm (FIG. 50 (C) and 48 (B)).

(3) A drill 98 is used to form penetrating openings 433B each having a diameter of 300 μm in the outer periphery of the core substrate 430 at pitches of 600 μm (FIG. 50 (D) and 48 (B)).

Figure 51:
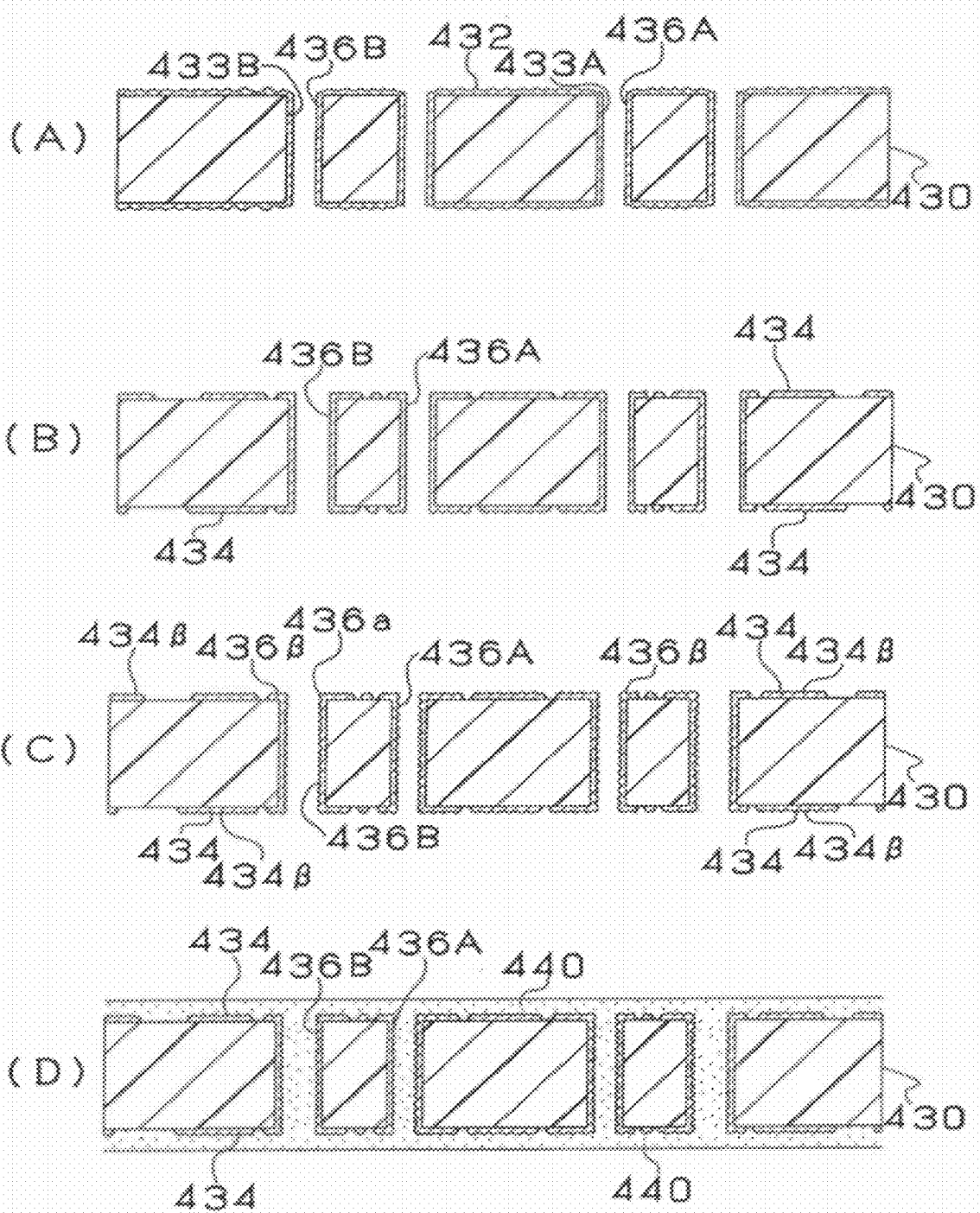
FIGS. 51 (A), 51 (B), 51 (C) and 51 (D) are diagrams showing a process for manufacturing the printed circuit board according to the first modification of the fourth embodiment.

Then, the core substrate 430 was immersed in electroless plating solution to cause copper-plated film to deposit on each of the side walls of the penetrating openings 433A and 433B so that through holes 436A and 436B are formed (FIG. 51 (A)). A usual method is employed to perform etching to correspond to the pattern so that inner copper pattern (the lower conductor circuit) 434 was formed on each of the two sides of the substrate (FIG. 51 (B)).

(4) The substrate having the lower conductor circuit 434 formed thereon was cleaned with water, and then the substrate was dried. Then, etching solution was sprayed to the two sides of the substrate so that the surface of the lower conductor circuit 434 and the surfaces of the lands 436a of the through holes 436A and 436B are etched. Thus, a rough surface 434 β was formed on the overall surface of the lower conductor circuit 434. Moreover, a rough surface 436 β was formed on each of the surfaces and the inner walls of the lands 436a of the through holes 436A and 436B (FIG. 51 (C)).

(5) The resin filler for use in the process B was prepared, and then a layer of the resin filler 440 was formed in through holes 436A and 436B, a portion of either side of the substrate 430 on which the conductor circuit is not formed and the output periphery of the conductor circuit 434 within 24 hours after the preparation (FIG. 51 (D)).

That is, a squeeze was used to inwards push the resin filler 440 into the through holes 436A and 436B. Then, drying was performed at 100° C. for 20 minutes. Then, a mask having openings corresponding to the portions in which the conductor circuit is not formed was placed on the substrate. Then, the squeeze was used to form a layer of the resin filler 440 in the portion which is formed into a recess and in which the conductor circuit is not formed. Then, drying was performed at 100° C. for 20 minutes.

Figure 52:
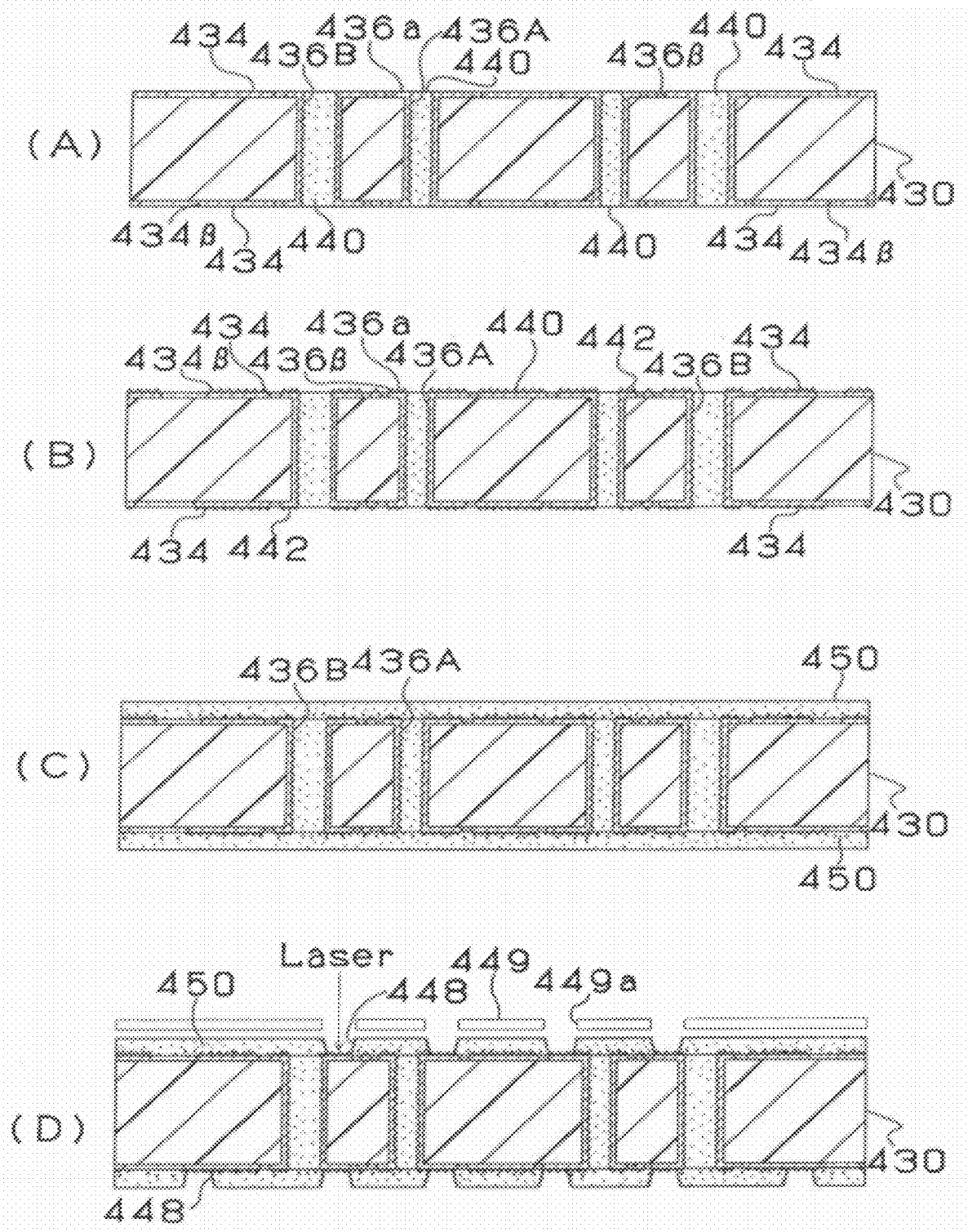
FIGS. 52 (A), 52 (B), 52 (C) and 52 (D) are diagrams showing a process for manufacturing the printed circuit board according to the first modification of the fourth embodiment.

(6) The substrate subjected to the process (5) was polished. Then, the resin filler 440 was hardened (FIG. 52 (A)).

(7) The substrate was cleaned with water, and then the substrate was degreased with acid. Then, soft etching was performed, and then etching solution was sprayed to the two sides of the substrate. Thus, the surface of the lower conductor circuit 434 and the surfaces and the inner walls of the lands 436a of the through holes 436A and 436B were etched. Thus, the rough surface 434 β was formed on the overall surface of the lower conductor circuit 434 and the rough surface 436 β was formed on each of the surfaces of the lands 436a of the through holes (FIG. 52 (B)).

(8) Similarly to the first modification of the second embodiment, a resin film for the interlayer resin insulating layer was placed on each of the two sides of the substrate so as to be bonded. Thus, the interlayer resin insulating layer 450 was formed (FIG. 52 (C)).

(9) Similarly to the first modification of the second embodiment, a mask 449 having a thickness of 1.2 mm and penetrating openings 449a formed therein is placed on the interlayer resin insulating layer 450. Then, $CO_2$ gas laser beams were applied to form the openings 448 each having a diameter of 80 μm in the interlayer resin insulating layer 450 (FIG. 52 (D)).

(10) Similarly to the first modification of the second embodiment, the surface of the interlayer resin insulating layer 450 including the inner wall of each of the openings 448 for the via holes was roughened (FIG. 53 (A)).

(11) Then, catalyst cores were allowed to adhere to the surface of the interlayer resin insulating layer 450 and the inner wall of each of the openings 448 for the via holes.

(12) Similarly to the first modification of the second embodiment, the electroless copper-plated film 451 was formed (FIG. 53 (B)).

(13) Similarly to the first modification of the second embodiment, the plating resist 454 having a thickness of 30 μm was formed (FIG. 53 (C)).

(14) Then, similarly to the first modification of the second embodiment, electrolytic copper plating was performed. Thus, the electrolytic copper-plated film 456 having a thickness of 20 μm was formed (FIG. 54 (A)).

(15) The plating resist 54 was separated and removed with 5% NaOH, and then the electroless plated film 451 below the plating resist 454 was etched with mixed solution of sulfuric acid and hydrogen peroxide. Thus, a conductor circuit (including via holes 460) 458 composed of the electroless copper-plated film 451 and the electrolytic copper-plated film 456 and having a thickness of 18 μm was formed (FIG. 54 (B)).

(16) A process similar to the process (7) was performed such that the etching solution containing cupric complex and organic acid was used to form the rough surface 462 (FIG. 54 (C)).

(17) The processes (8) to (16) were repeated so that further upper interlayer resin insulating layer 487, the conductor circuit 483 and the via holes 485 were formed. Thus, the multi-layer printed circuit board was obtained (FIG. 55 (A)).

(18) The solder resist composition similar to that according to the first embodiment was applied to the two sides of the multi-layer printed circuit board to have a thickness of 20 μm. Thus, openings 471 each having a diameter of 200 μm were formed. Hence it follows that the solder resist layer 470 having a thickness of 20 μm was formed (FIG. 55 (B)).

(19) Then, the nickel-plate layer 472 having a thickness of 5 μm was formed in each of the openings 471 of the substrate having the solder resist layer 470. Then, the gold-plated layer 474 having a thickness of 0.03 μm was formed on the nickel-plated layer 472 (FIG. 55 (C)).

(20) Then, solder paste containing tin-lead was printed to the openings in the solder resist layer 470 on the surface of the substrate on which the IC chip is mounted. Then, solder paste containing tin-antimony was printed in the operations of the solder resist layer 470 on the other surface. Then, reflowing was performed at 200° C. substrate 430 so that solder bumps 476S, 476V and 476G were formed. Then, the conductive connection pins 478 were provided for the lower surface. As a result, the printed circuit board 110 was manufactured (see FIG. 56).

(Second Modification of Fourth Embodiment)

A second modification of the fourth embodiment will now be described. In the first embodiment and first modification, the penetrating openings 433A and 433B are formed in the copper-clad laminated board. On the other hand, the second modification has the structure that the resin layer is formed in the copper-clad laminated board. Then, the penetrating openings 433A and 434B are formed.

A method of forming a core substrate according to the second modification will now be described with reference to FIG. 57.

Figure 57:
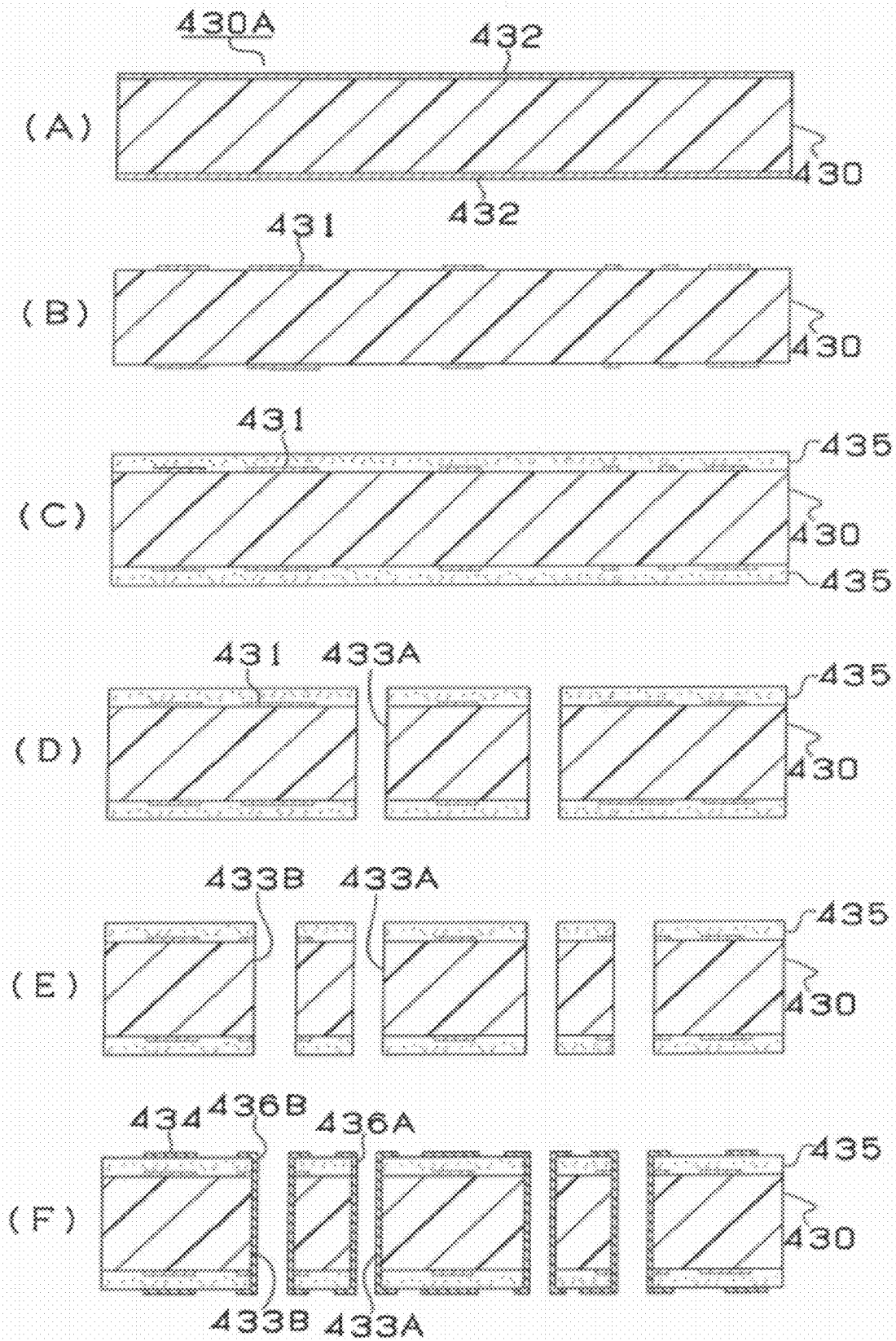
FIG. 57 is a cross sectional view showing a core substrate of a multi-layer printed circuit board according to a second modification of the fourth embodiment.

(1) A copper-clad laminated board 430A incorporating a substrate 430 constituted by glass epoxy resin, BT, FR-4 or FR-5 resin having a thickness of 0.8 mm and having two sides to each of which copper foil 432 having a thickness of 18 μm is laminated was employed as the starting material (FIG. 57 (A)). A usual method was employed to perform etching to correspond to the pattern so that the inner copper pattern (the lower conductor circuit) 431 was formed on each of the two sides of the substrate (FIG. 57 (B)).

(2) A thermosetting resin insulating film similar to that according to the third embodiment is bonded to each of the two sides of the substrate 430 so that the resin layer 435 is formed (FIG. 57 (C)).

(3) The substrate 430 is placed on a table of a carbon dioxide laser unit similar to that according to the fourth embodiment. Then, carbon dioxide gas laser beams are applied so that penetrating openings 433A each having a diameter of 100 µm are formed in the central portion of the substrate 430 at pitches of 300µm (FIG. 57 (D)).

(4) Then, the drill 98 is used to form penetrating openings 433B each having a diameter of 3000 µm in the outer periphery of the core substrate 430 at pitches of 600 µm (FIG. 57 (E)).

(5) Then, immersion in electroless plating solution is performed to cause the copper-plated films to deposit on the side walls of the penetrating openings 433A and 433B. Thus, the through holes 436A and 436B are formed. Then, etching is performed so that the conductor circuit 434 is formed (FIG. 57 (F)). The following processes are similar to those according to the fourth embodiment and the second modification. Therefore, the following processes are omitted from illustration and description.

In the foregoing embodiment, the through holes each having the small diameter are formed in the central portion and the through holes each having the large diameter are formed in the outer periphery.

The present invention is not limited. The through holes each having the small diameter may arbitrarily be formed in a portion in which the wiring density must be raised.

COMPARATIVE EXAMPLE 2

The structure is similar to that according to the fourth embodiment except for a structure that each of the through holes in the core substrate is formed to have a diameter of 100 µm by using laser beams.

COMPARATIVE EXAMPLE 3

The structure is similar to that according to the fourth embodiment except for a structure that each of the through holes in the core substrate is formed to have a diameter of 300 µm by drilling.

COMPARATIVE EXAMPLE 4

The structure is similar to that according to the first modification except for a structure that each of the through holes in the core substrate is formed to have a diameter of 100 µm by using laser beams.

COMPARATIVE EXAMPLE 5

The structure is similar to that according to the first modification except for a structure that each of the through holes in the core substrate is formed to have a diameter of 300 m by drilling.

A high-frequency IC chip adapted to 1 GHz was mounted on each of the multi-layer printed circuit boards according to the fourth embodiment, the first modification and the second modification and the multi-layer printed circuit boards according to comparative examples 2, 3, 4 and 5. Thus, comparative tests were performed.

As a result, the IC chips according to comparative examples 3 and 5 encountered frequent occurrence of errors. A consideration can be made that the foregoing errors are caused from insufficient supply of electric power because the numbers of the power supply lines and the earth lines are too small.

On the other hand, the multi-layer printed circuit boards according to the fourth embodiment, the first modification and the second modification and comparative examples 2 and 4 resulted instable operations. The multi-layer printed circuit boards according to comparative examples 2 and 4 have the structure that all of through holes are formed by laser beams. Therefore, the manufacturing cost is raised excessively as compared with the multi-layer printed circuit boards according to the fourth embodiment, the first modification and the second modification. Thus, the possibility of disconnection of the through hole is raised.

[Fifth Embodiment]

Figure 65:
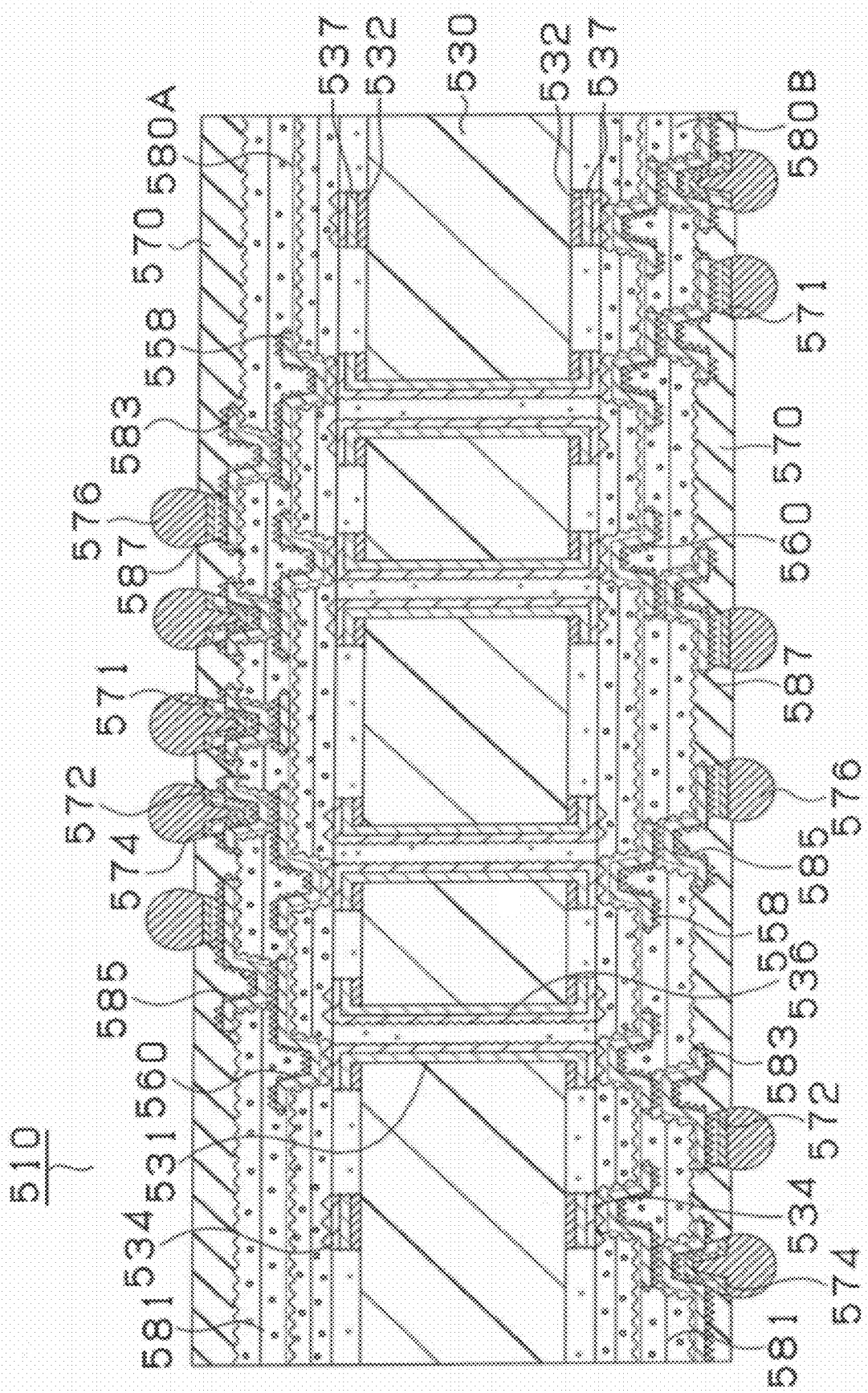
FIG. 65 is a cross-sectional view showing the multi-layer printed circuit board according to a fifth embodiment.

The structure of a multi-layer printed circuit board according to a fifth embodiment of the present invention will now be described with reference to FIG. 65 which is a cross sectional view showing a multi-layer printed circuit board 510. The multi-layer printed circuit board 510 incorporates a core substrate 530 having the right and reverse sides on which buildup multilayer printed circuit boards 580A and 580B are formed. Each of the buildup multilayer printed circuit boards 580A and 580B incorporates an interlayer resin insulating layer 550 having via holes 560 and a conductor circuit 558; and an interlayer resin insulating layer 581 having via holes 585 and a conductor circuit 583. The buildup multilayer printed circuit board 580A and the buildup multilayer printed circuit board 580B are connected to each other throughholes 536 formed in penetrating openings 531 formed in the core substrate. A solder resist 570 is formed on the interlayer resin insulating layer 581. Solder bumps 576 are provided for the via holes 585 and the conductor circuit 583 through openings 571 of the solder resist 570.

In this embodiment, penetrating openings 531 are formed in the core substrate 530 by applying $CO_2$ laser beams (YAG laser, excimer laser or UV laser). Thus, penetrating openings each having a small diameter can be formed. Moreover, a sputtered layer 532 is formed on the core substrate 530 by sputtering. Since the sputtered layer is formed after the penetrating openings have been formed, retention of metal, such as copper, on the inner wall of the through hole when openings have been formed by the laser beams can be prevented which causes separation of the plated film formed on the inner surface of the through hole.

A method of manufacturing the multi-layer printed circuit board 510 will now be described. Note that the material A which is the adhesive agent for electroless plating and the material B which is the interlayer resin insulating agent are similar to those according to the second modification of the second embodiment. Moreover, the composition C of the resin filler is similar to that according to the first modification of the third embodiment.

Figure 58:
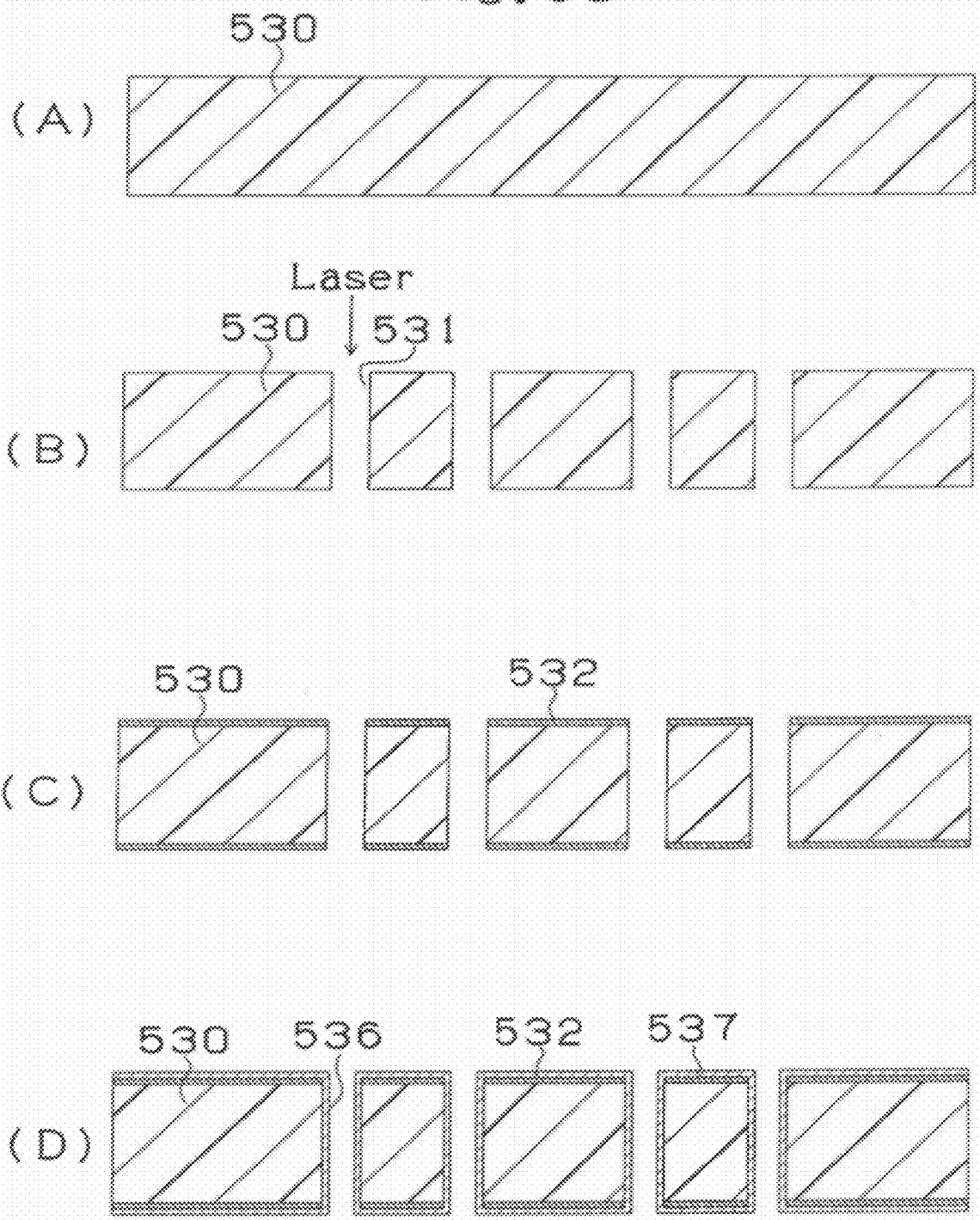
FIGS. 58 (A), 58 (B), 58 (C) and 58 (D) are diagrams showing a process for manufacturing a printed circuit board according to a fifth embodiment.

(1) A core substrate 530 constituted by thermosetting insulating resin, thermoplastic resin insulating resin or their composite material having a thickness of 50 µm to 700 µm is used as the starting material (FIG. 58 (A)). The core substrate is made of one or more types of materials selected from epoxy resin, phenol resin, BT (Bismaleimide-Triazine) resin, FR-5, PPE and polyolefin. A reinforcing agent may be added.

(2) Then, penetrating openings 531 are formed in the core substrate 530 by applying $CO_2$ laser beams (YAG laser, excimer laser or UV laser) (FIG. 58 (B)). It is most preferable that the $CO_2$ laser beam is employed because penetrating openings can adequately be formed in the core substrate. As distinct from the conventional copper-clad laminated board, the penetrating openings are formed in only the resin. Therefore, the penetrating openings can easily be formed. The diameter of each penetrating opening must be 75 μm to 250 μm. As a result of the foregoing process, penetrating openings each having a smaller diameter as compared with the openings formed by the drill can be formed.

(3) A sputtered layer 532 is formed on the core substrate 530 by sputtering (FIG. 58 (C)). The thickness of the sputtered layer 532 must be about 0.01 μm to about 0.1 μm. The metal for use in the sputtering process may be one or more materials selected from Ni, Cr, Pd and Mo as well as Cu. Strength between the sputtered layer and the resin of 1.0 kg/cm$^2$ which is similar to that realized by the conventional copper-clad laminated board can be maintained. After the penetrating openings 531 have been formed, the sputtered layer 532 is formed. Thus, as distinct from the structure that the openings are formed in the copper-clad laminated board by applying laser beams, retention of copper on the inner wall of the through hole after the opening has been formed and, therefore, separation of the plated film formed on the inner surface of the through hole can be prevented.

(4) The core substrate 530 having the through holes 536 formed therein is subjected to the electroless plating process so that an electroless plated layer 537 is formed (FIG. 58 (D)). It is preferable that the thickness of the electroless plating is about 0.1 μm to 0.2 μm. It is preferable that Cu or Ni is employed to form the foregoing layer.

Figure 59:
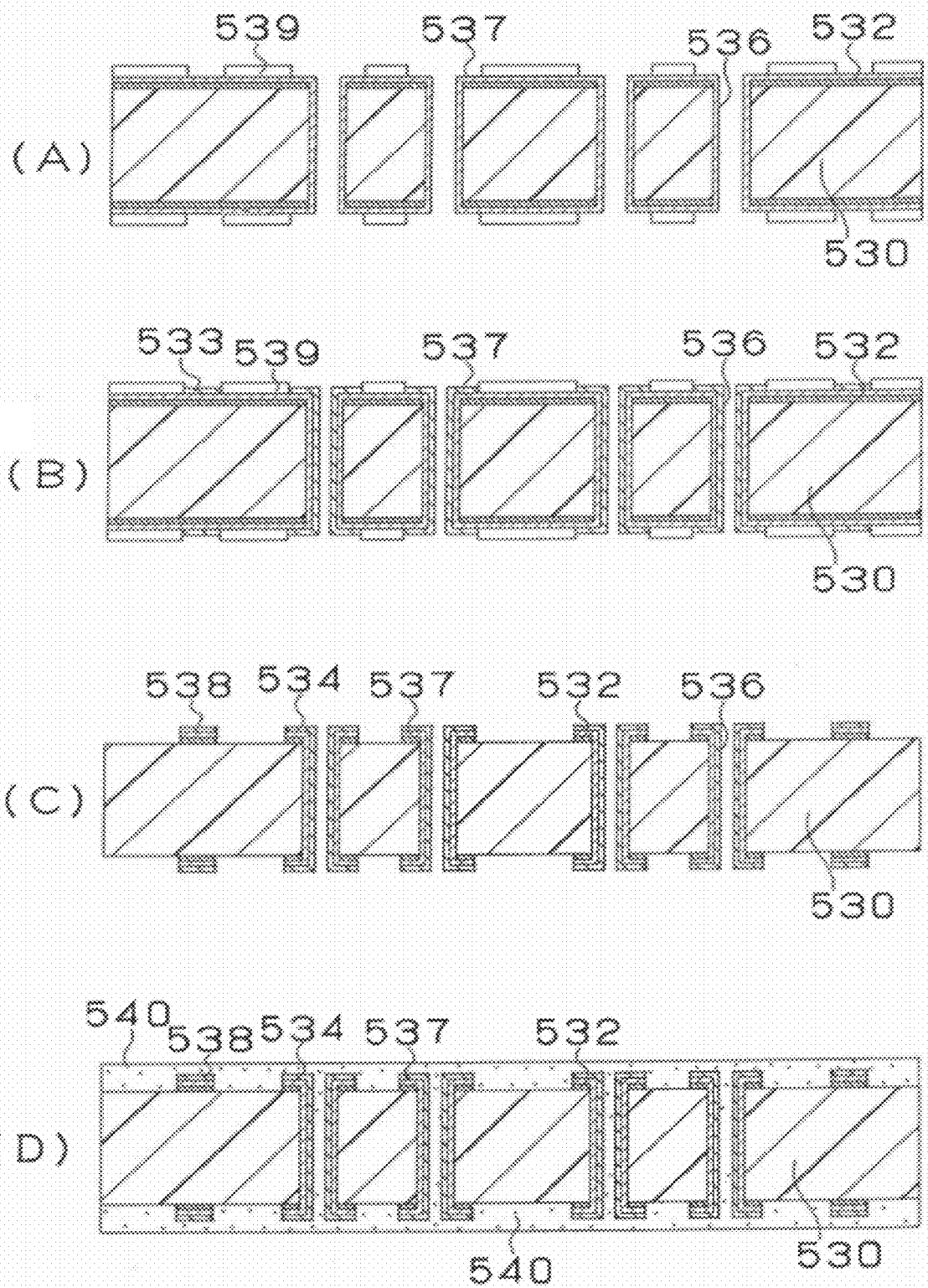
FIGS. 59 (A), 59 (B), 59 (C) and 59 (D) are diagrams showing a process for manufacturing the printed circuit board according to the fifth embodiment.

(5) Then, a resist 539 corresponding to a predetermined pattern is formed on the foregoing layer by applying a dry film or a liquid resist (FIG. 59 (A)). Then, electroplated layer is performed to correspond to the predetermined pattern so that an electroplated layer 533 is formed (FIG. 59 (B)).

(6) Then, the resist 539 on the core substrate 530 is separated and removed. Then, etching is performed so that the sputtered layer 532 and the electroless plated layer 537 below the resist 539 are removed. Thus, a conductor circuit 534 and through holes 536 are formed. Moreover, etching is performed so that a rough layer 538 is formed on the surfaces of the conductor circuit 534 and the through holes 536 (FIG. 59 (C)).

(7) The material C which was the raw material composition for preparing the resin filler was mixed and kneaded so that the resin filler was obtained.

(8) The resin filler temperature in the process (7) was applied and enclosed to the space between the conductor circuits 534 and the inside portions of the through holes 536 within 24 hours after the preparation.

The application was performed by a printing method using a squeeze. The first application operation was performed such that the through holes 536 were mainly filled with the resin filler. Then, drying was performed at a temperature of 100° C. for 20 minutes in a drying furnace.

A second application operation was performed such that recesses formed when the conductor circuit 534 was formed were mainly filled with the resin filler. Moreover, the space between the conductor circuit 534 and the conductor circuit 534 and the inside portion of each of the through holes 536 were filled with the resin filler 540. Then, drying was performed under the same drying conditions (FIG. 59 (D)).

Figure 60:
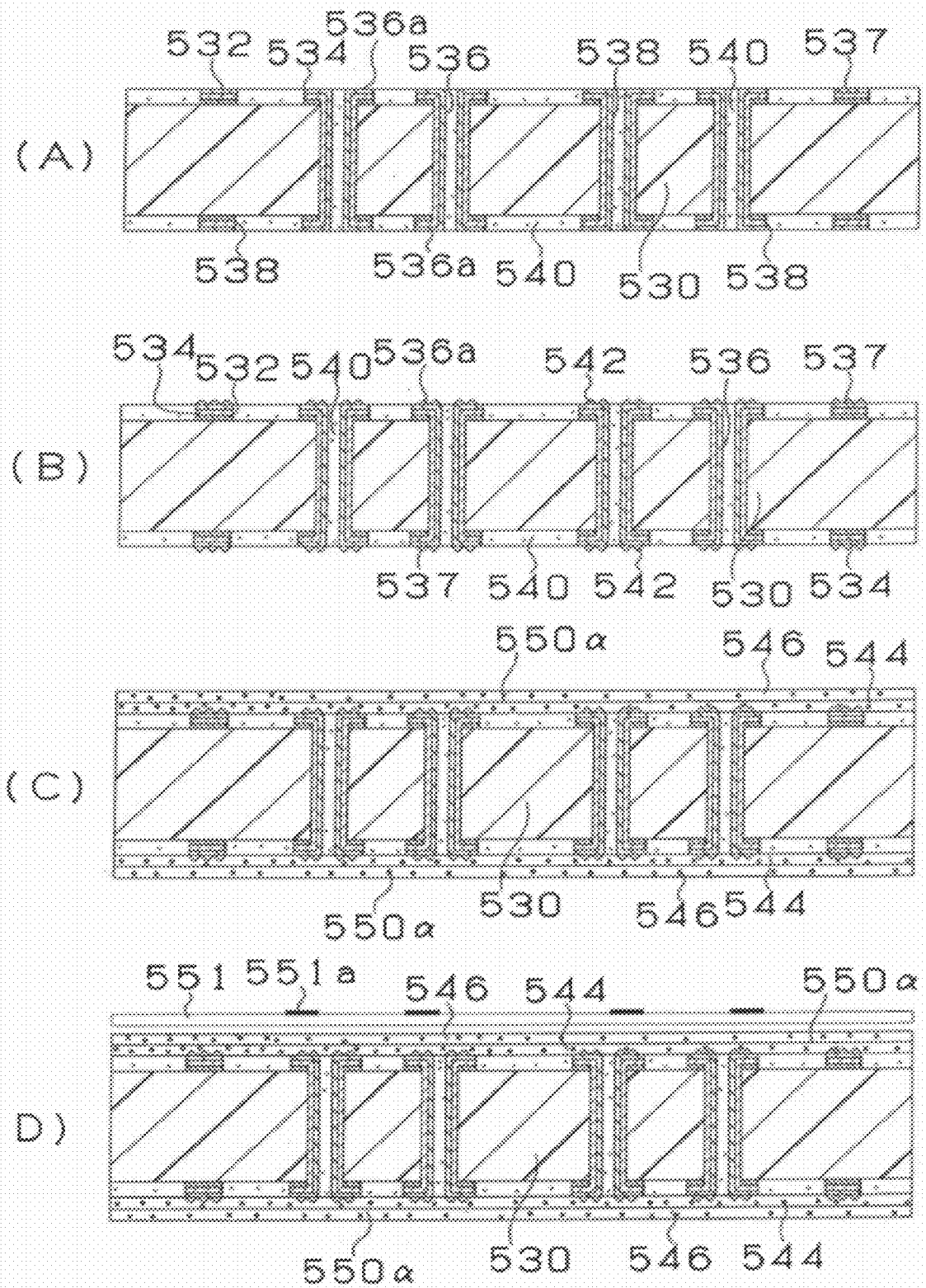
FIGS. 60 (A), 60 (B), 60 (C) and 60 (D) are diagrams showing a process for manufacturing the printed circuit board according to the fifth embodiment.

(9) The substrate 530 subjected to the process (8) is polished and hardened (FIG. 60 (A)).

(10) The substrate 530 having the conductor circuit 534 formed thereon is degreased with alkali to perform soft etching. Then, a process using catalyst solution composed of palladium chloride and organic acid is performed to supply a Pd catalyst. Then, the catalyst is activated, and then a coating layer constituted by a needle alloy made of Cu—Ni—P and a rough layer 542 are formed on the surfaces of the conductor circuit and the lands of the through holes (FIG. 60 (B)).

(11) The raw material composition for preparing the material B which is the interlayer resin insulating agent was stirred and mixed to adjust the viscosity to 1.5 Pa·s. Thus, an interlayer resin insulating material (for the lower layer) is obtained.

Then, the raw material composition for preparing the material A which is the adhesive agent for electroless plating is stirred and mixed, and then the viscosity is adjusted to 7 Pa·s. Thus, adhesive agent solution for electroless plating (for the upper layer) is obtained.

(12) The interlayer resin insulating agent (for the lower layer) 544 obtained in the process (11) and having the viscosity of 1.5 Pa·s is applied to the two sides of the substrate 530 described in (10) within 24 hours after the preparation by using a roll coater. Then, the substrate 530 in a state where it is placed horizontally is allowed to stand for 20 minutes. Then, drying (prebaking) is performed at 60° C. for 30 minutes. Then, photosensitive adhesive agent solution (for the upper layer) 546 obtained in the process (11) and having the viscosity of 7 Pa·s is applied within 24 hours after the preparation. Then, the substrate 530 in a horizontal state is allowed to stand for 20 minutes, and then drying (prebaking) is performed at 60° C. for 30 minutes. Thus, an adhesive agent layer 550 α having a thickness of 35 μm is formed (FIG. 60 (C)).

(13) A photomask film 551 having a black circle 551a having a diameter of 85 μm is brought into hermetic contact with the two sides of the substrate 530 having the adhesive agent layer formed in the process (12). Then, ultra high-pressure mercury lamp was operated to perform exposure at 500 mJ/cm$^2$ (FIG. 60 (D)). Then, spray development using DMTG solution is performed. Then, the foregoing substrate is exposed by the ultra high-pressure mercury lamp at 3000 mJ/cm$^2$. Then, a heating process (post baking) is performed at 100° C. for one hour, 120° C. for one hour and 150° C. for three hours. Thus, an interlayer resin insulating layer (two-layer structure) 550 excellent in the dimension accuracy corresponding to the photomask film, incorporating openings (openings for forming via holes) 548 each having a diameter of 85 μm and having a thickness of 35 μm is formed (FIG. 61 (A)). Note that a tin-plated layer (not shown) was partially exposed in the opening 548 serving as the via hole.

(14) The core substrate 530 having the openings 548 is immersed in chromic acid for 19 minutes to dissolve and remove epoxy resin particles present on the surface of the interlayer resin insulating layer. Thus, the surface of the interlayer resin insulating layer 550 is roughened. Then, the substrate 530 is immersed in neutral solution (manufactured by Shilay), and then the substrate 530 is cleaned with water (FIG. 61 (B)).

Then, a palladium catalyst (manufactured by Atotech) is supplied to the surface of the substrate 530 subjected to the roughening process (depth of the roughened portion is 6 μm). Thus, catalyst cores are allowed to adhere to the surface of the interlayer resin insulating layer 550 and the inner walls of the openings 548 for the via holes. As an alternative to this, strong acid (hydrochloric acid, sulfonic acid, nitric acid or the like) or permanganic acid may be employed.

Figure 61:
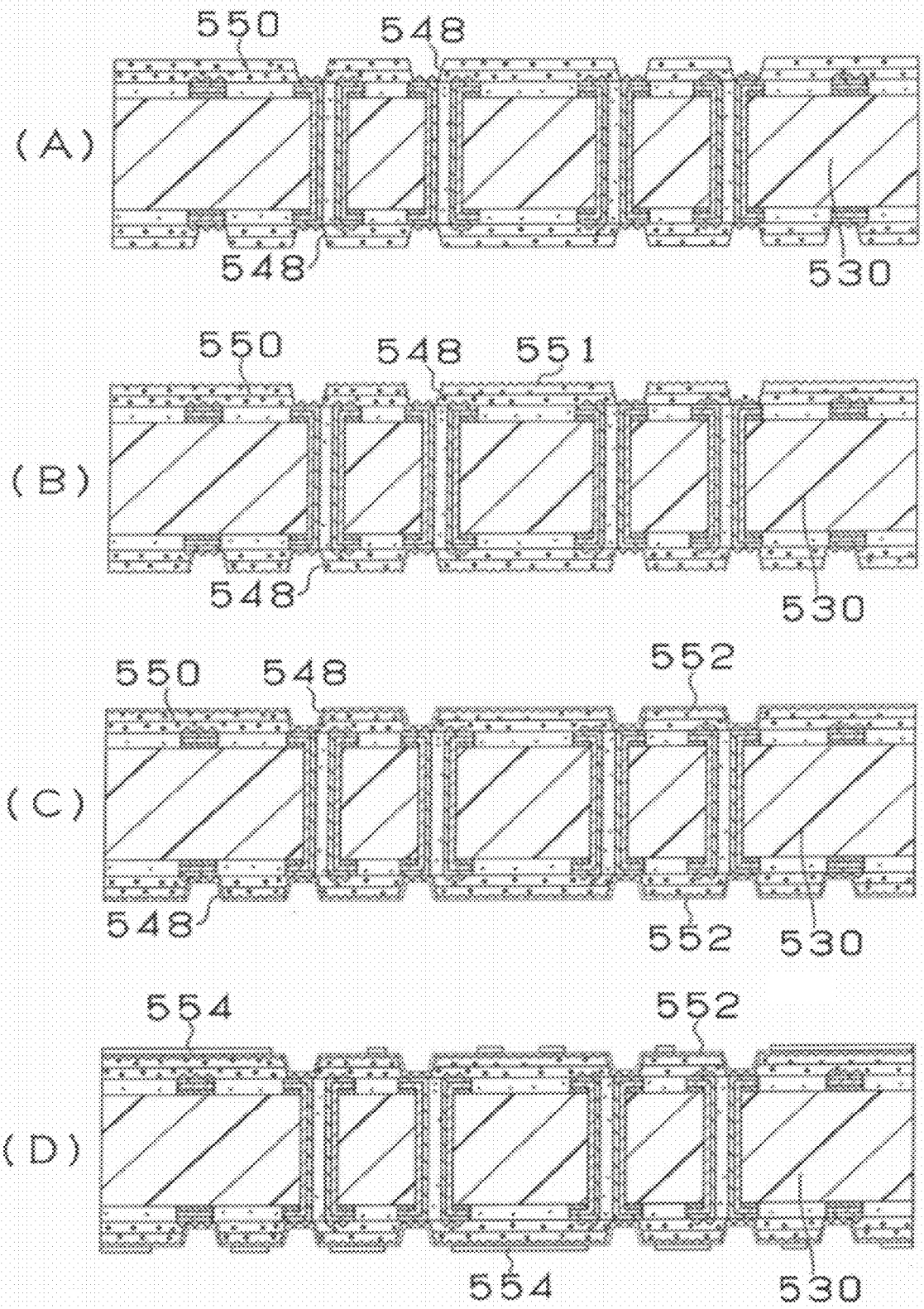
FIGS. 61 (A), 61 (B), 61 (C) and 61 (D) are diagrams showing a process for manufacturing the printed circuit board according to the fifth embodiment.

(15) The substrate 530 is immersed in electroless plating solution having the following composition to form an electroless copper-plated film 552 having a thickness of 0.6 μm to 1.2 μm is formed on the overall rough surface (FIG. 61 (C)).

| [Electroless Plating Solution] | |
| --- | --- |
| EDTA | 0.08 mol/l |
| Copper Sulfate | 0.03 mol/l |
| HCHO | 0.05 mol/l |
| NaOH | 0.05 mol/l |
| α,α'-bipyridyl | 80 mg/l |
| PEG | 0.10 g/l |

[Electroless Plating Conditions]

20 minutes when the temperature of the solution is 65° C.

(16) A marketed photosensitive dry film is bonded to the surface of the electroless copper-plated film 552 formed in the process (15). Then, a mask is placed, and then exposure is performed at 100 mJ/cm$^2$. Then, a development process is performed by using sodium carbonate so that a plating resist 554 having a thickness of 15 μm is obtained (FIG. 61 (D)).

Figure 62:
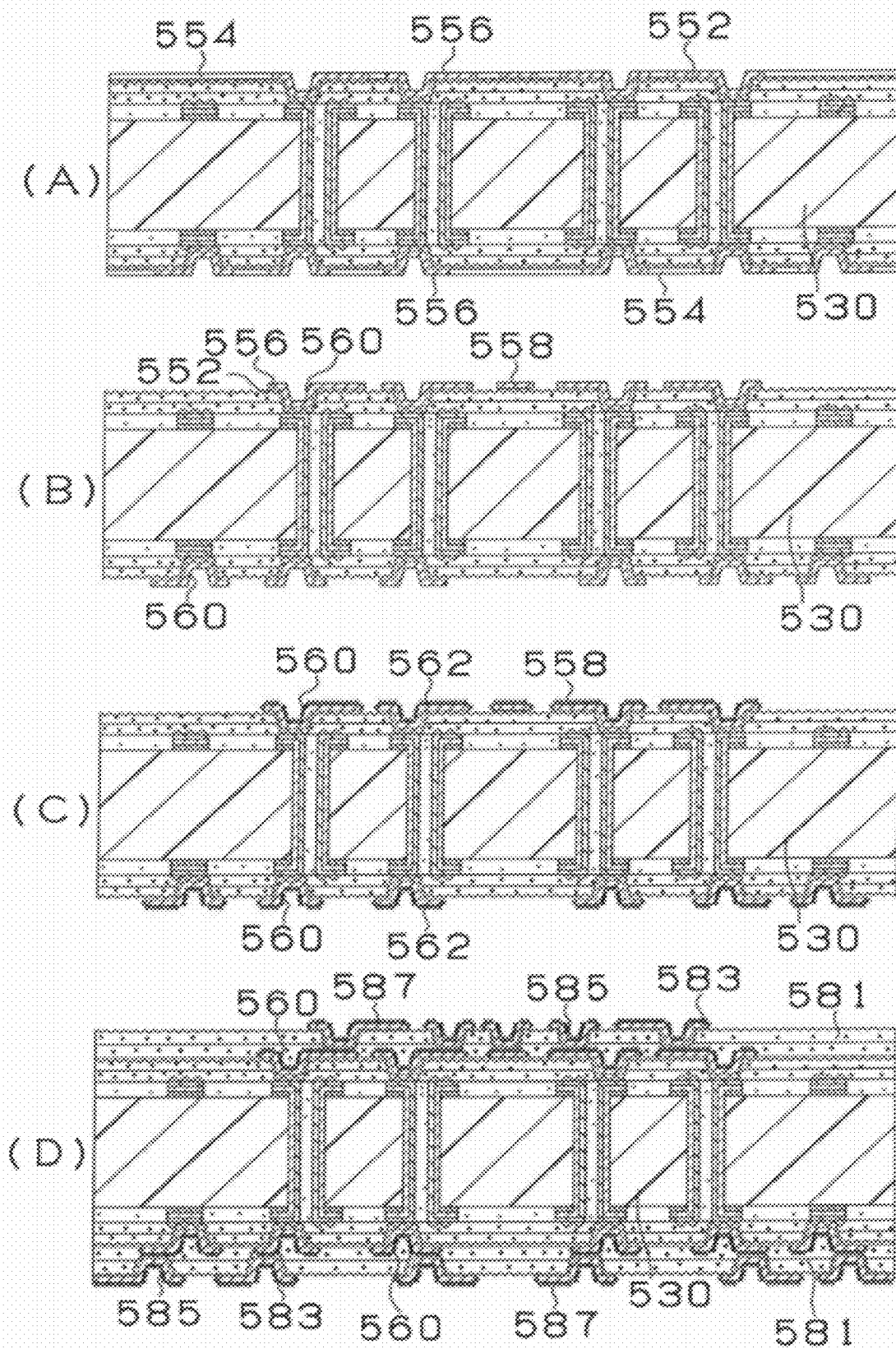
FIGS. 62 (A), 62 (B), 62 (C) and 62 (D) are diagrams showing a process for manufacturing the printed circuit board according to the fifth embodiment.

(17) Then, similarly to the first modification of the second embodiment, the portion in which the resist is not formed is subjected to electrolytic copper plating. Thus, an electrolytic copper-plated film 556 having a thickness of 15 μm is formed (FIG. 62 (A)).

(18) The plating resist 554 was separated and removed with 5% KOH, and then the electroless copper-plated film 552 was subjected to an etching process using mixed solution of sulfuric acid and hydroperoxide so as to be dissolved and removed. Thus, the conductor circuit 558 having a thickness of 18 μm (including the via holes 560) is constituted by the electroless copper-plated film 552 and the electrolytic copper-plated film 556 was formed (FIG. 62 (B)).

(19) A process similar to the process (10) is performed such that etching solution containing cupric complex and organic acid was used to form the rough layer 562. Then, Sn-substitution for the surface was performed (FIG. 62 (C)).

(20) The processes (11) to (19) were repeated so that the further upper interlayer resin insulating layer 581, the conductor circuit 583 and the via holes 585 were formed. Thus, the multi-layer printed circuit board was obtained. Note that the Sn-substitution for the rough surface 162 in the surface layer was not performed (FIG. 62 (D)).

(21) The two sides of the multi-layer printed circuit board were coated with the solder resist composition 570 α similarly to the first embodiment to have a thickness of 20 μm (FIG. 63 (A)). Then, exposure was performed by using ultraviolet rays, and a DMTG process was performed. Then, a heating process was performed so that the solder resist 570 (having a thickness of 20 μm) incorporating openings 571 (each having a diameter of 200 μm) formed in the solder pad portions (including the via holes and their lands) was formed (FIG. 63 (B)).

(22) Then, similarly to the first embodiment, a metal layer 572 having a thickness of 5 μm and constituted by nickel was formed in each of the openings 571 (FIG. 64 (A)). Thus, when the conductor circuit 583 for forming the solder pads 77 has pits and projections, the pits and projections can completely be coated. As a result, the surface condition of the metal layer 572 can be uniformed.

(23) Then, the gold-plated layer 574 having a thickness of 0.03 μm was formed on the metal layer 572 (FIG. 64 (B)).

(24) Then, solder paste was printed to the opening 571 of the solder resist 570. Then, reflowing was performed at 200° C. so that the solder bumps 576 (solder) were formed (see FIG. 65).

(First Modification of Fifth Embodiment)

The structure of the first modification is basically the same as that of the fifth embodiment.

As an alternative to the interlayer resin insulating layer, the thermosetting resin film according to the third embodiment was employed. Thus, an interlayer resin insulating layer having a thickness of 35 μm and incorporating via holes was formed.

Second Modification of Fifth Embodiment

A manufacturing method according to the second modification is basically the same as processes (1) to (10) according to the fifth embodiment.

As an alternative to the interlayer resin insulating layer, the film was previously manufactured by polyolefin which was a low dielectric material. Then, the film was pressed with heat so that via holes were formed by using carbon dioxide laser beams, excimer laser beams or UV laser beams.

Figure 66:
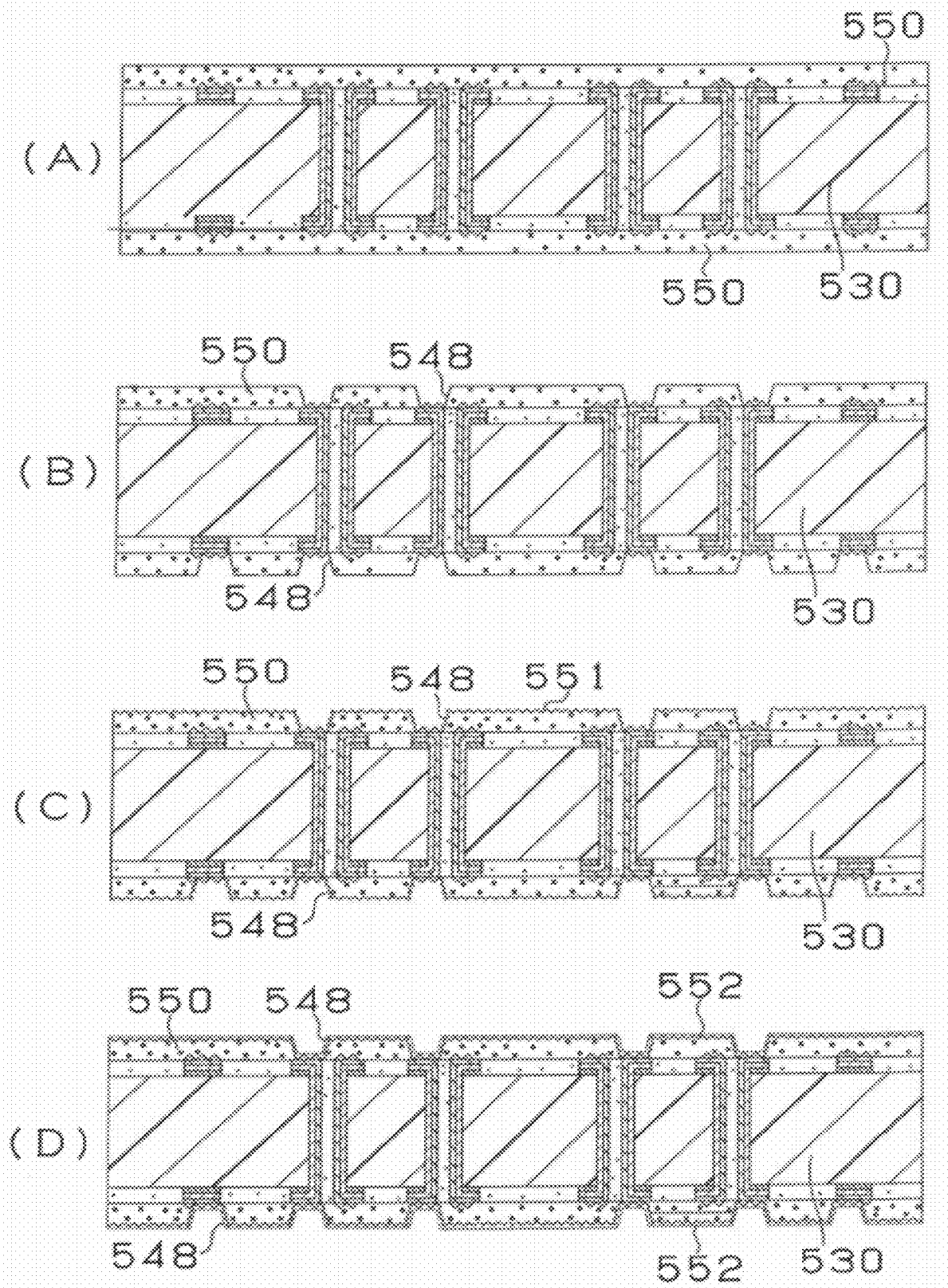
FIGS. 66 (A), 66 (B), 66 (C) and 66 (D) are diagrams showing a process for manufacturing the printed circuit board according to the fifth embodiment.

(11) Then, the substrate subjected to the foregoing process is provided with an interlayer resin insulating layer 550 constituted by cyclo-olefin resin similarly to the second embodiment (FIG. 66 (A)).

(12) Then, similarly to the second embodiment, $CO_2$ gas laser beams were used to form the openings 548 for the via holes each having a diameter of 80 μm in the interlayer resin insulating layer 550 (FIG. 66 (B)).

(13) Then, a plasma process was performed to roughen the surface of the interlayer resin insulating layer 550 (FIG. 66 (C)).

(14) Then, similarly to the second embodiment, the Ni—Cu alloy layer 52 was formed on the surface of the polyolefin interlayer resin insulating layer 550 (FIG. 66 (D)).

Figure 67:
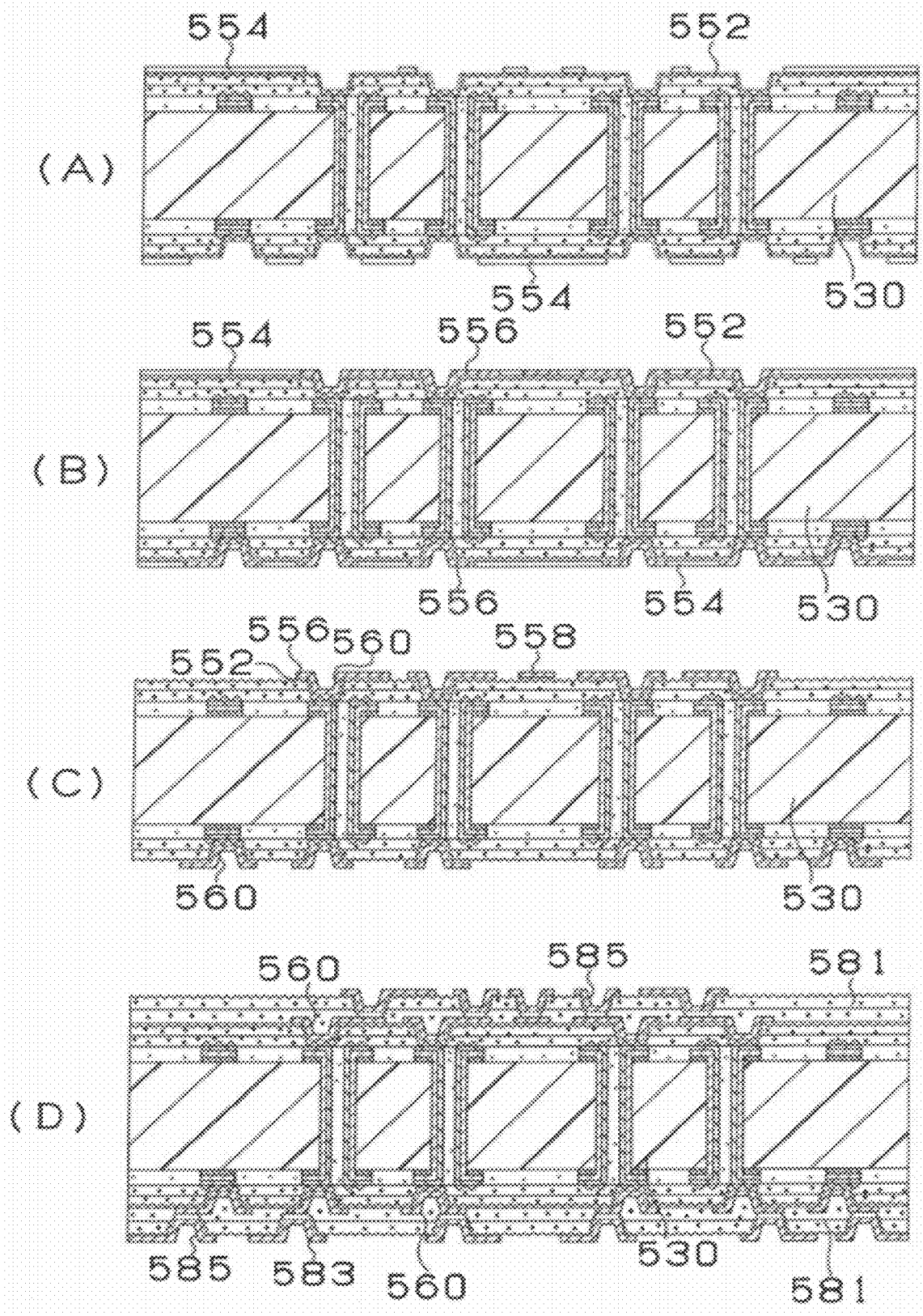
FIGS. 67 (A), 67 (B), 67 (C) and 67 (D) are diagrams showing a process for manufacturing the printed circuit board according to the fifth embodiment.

(15) The substrate subjected to the foregoing process was provided with the pattern of the plating resist 554 similarly to the second embodiment (FIG. 67 (A)).

(16) Then, similarly to the second embodiment, electroplating was performed so that the electrolytic copper-plated film 556 having a thickness of 15 μm was formed (FIG. 67 (B)).

(17) Then, the plating resist 554 was separated and removed with 5% NaOH, and then the electroless Ni—Cu alloy layer 552 present below the plating resist 554 was dissolved and removed by performing etching. Thus, the conductor circuit 558 (including the via holes 560) constituted by the electrolytic copper-plated film 556 and so forth and having a thickness of 16 μm was formed (FIG. 67 (C)).

(18) Then, the processes (11) to (17) are repeated so that upper interlayer resin insulating layer 581, the conductor circuit 583 and the via holes 585 were formed (FIG. 67 (D)).

(19) Then, the solder resist composition was applied to the multi-layer printed circuit board to have a thickness of 20 μm similarly to the first embodiment. Thus, the openings 571 each having a diameter of 200 μm were formed. Then, a heating process was performed to harden the solder resist layer. Thus, the solder resist layer (the organic resin layer) 570 incorporating the openings 571 corresponding to the solder pad portions and having a thickness of 20 μm was formed (FIG. 68 (A)).

(20) Then, the nickel-plated layer 572 having a thickness of 5 μm was formed on the inner surface of each of the openings 571U and 571D of the substrate having the solder resist (the organic resin layer) 570 similarly to the first embodiment. Then, the gold-plated layer 574 having a thickness of 0.03 μm was formed on the metal layer 572 (FIG. 68 (B)).

Figure 69:
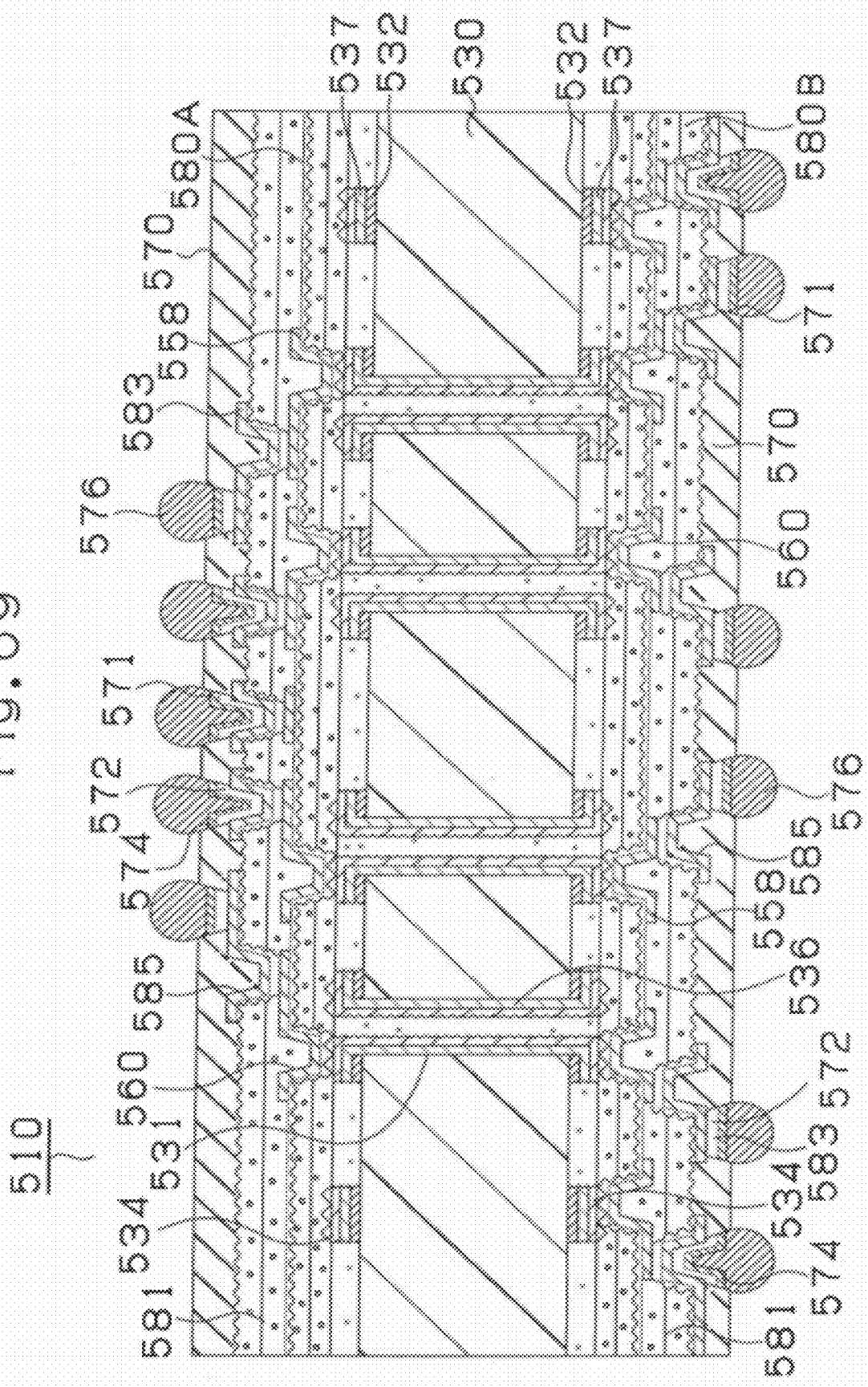
FIG. 69 is a cross sectional view showing a multi-layer printed circuit board according to a second modification of the fifth embodiment.

(21) Then, solder paste is printed to the openings in the solder resist 570. Then, reflowing is performed at 200° C. so that solder bumps (solder) 576 are formed so that the multi-layer printed circuit board 510 is manufactured (FIG. 69).

(Third Modification of Fifth Embodiment)

The third modification is basically the same as the second modification. As an alternative to the resin filler which is enclosed, a resin film is directly bonded to simultaneously perform enclosure of the resin and formation of the insulating layer. The resin film may be a resin film similar to that according to the first modification or the second modification.

The fifth embodiment enables through holes each having a small diameter (100 μm or smaller) to be formed in the core substrate. When reliability tests were performed at high temperatures and high humidity in a state where heat cycles were carried out, the electric characteristics are not different between the right side and the reverse side. Moreover, any separation and crack of the conductor circuit, the resin filler or the interlayer resin insulating layer starting with the through hole was not observed. Therefore, a high-density and reliable multi-layer buildup printed circuit board can be obtained. When the present invention is applied to the buildup multi-layer printed circuit board, a significant effect can be obtained.

What is claimed is:

1. A multi-layer printed circuit board comprising:
a core structure comprising a plurality of resin layers and a metal layer sandwiched by the resin layers, the core structure having a first surface and a second surface on an opposite side of the first surface;
a first conductor layer comprising a plurality of conductor circuits formed on the first surface of the core structure; and
a second conductor layer comprising a plurality of conductor circuits formed on the second surface of the core structure,
wherein the metal layer of the core structure comprises a plurality of conductor circuits, the core structure has a plurality of openings extending to one of the conductor circuits of the metal layer through the plurality of resin layers, respectively, and includes a first via hole and a second via hole formed in the openings, respectively, such that the first via hole and the second via hole sandwich the one of the conductor circuits of the metal layer in the core structure and are positioned vertically to form a through hole electrically connecting respective ones of the conductor circuits of the first and the second conductor layers, each of the first via hole and the second via hole comprises a plating material filling to a respective top of the openings and extending to a respective one of the first conductor layer and the second conductor layer, the first via hole has a bottom surface connected to the one of the conductor circuits of the metal layer in the core structure, the bottom surface of the first via hole has a diameter which is smaller than a diameter of the first via hole at an interface between the first conductor layer and the first surface of the core substrate, the second via hole has a bottom surface connected to the one of the conductor circuits of the metal layer in the core structure, and the bottom surface of the second via hole has a diameter which is smaller than a diameter of the second via hole at an interface between the second conductor layer and the second surface of the core substrate.

2. The multi-layer printed circuit board according to claim 1, further comprising:
a first interlayer resin insulating layer formed on the first surface of the core structure and the first conductor layer; and
a second interlayer resin insulating layer formed on the second surface of the core structure and the second conductor layer.

3. The multi-layer printed circuit board according to claim 2, wherein the first and second interlayer resin insulating layers have no core member having a glass cloth.

4. The multi-layer printed circuit board according to claim 2, wherein the first and second interlayer resin insulating layers have no core member having an aramid cloth.

5. The multi-layer printed circuit board according to claim 2, wherein each of the first and second interlayer resin insulating layers has a core member.

6. The multi-layer printed circuit board according to claim 2, wherein each of the first and second interlayer resin insulating layers has a core member having a glass cloth.

7. The multi-layer printed circuit board according to claim 2, wherein each of the first and second interlayer resin insulating layers has a core member having an aramid cloth.

8. The multi-layer printed circuit board according to claim 2, wherein the first interlayer resin insulating layer has a via hole formed through the first interlayer resin insulating layer, and the via hole formed in the first interlayer resin insulating layer is positioned directly on the first via hole.

9. The multi-layer printed circuit board according to claim 1, wherein each of the resin layers has a core member having a glass cloth.

10. The multi-layer printed circuit board according to claim 1, wherein each of the resin layers has a core member having an aramid cloth.

11. The multi-layer printed circuit board according to claim 1, wherein each of the resin layers has a thickness which is from 30 μm to 200 μm.

12. The multi-layer printed circuit board according to claim 1, wherein each of the first via hole and second via hole comprises an electroless plated layer and the plating material deposited on the electroless plated layer, and the plating material is an electrolytic plating material.

13. The multi-layer printed circuit board according to claim 1, wherein the plating material is an electrolytic plating material, and each of the first via hole and second via hole comprises an electroless plated layer and the plating material deposited on the electroless plated layer such that the electrolytic plating material of the first via hole and second via hole fills the openings and extends over the first surface and second surface of the core structure, respectively.

14. The multi-layer printed circuit board according to claim 1, wherein the metal layer comprises a metal foil.

15. The multi-layer printed circuit board according to claim 1, wherein the metal layer comprises a copper foil.

16. The multi-layer printed circuit board according to claim 1, wherein each of the resin layers has a core member.

17. The multi-layer printed circuit board according to claim 1, wherein the first and second conductor layers include a first land portion and a second land portion, respectively, the first land portion of the first conductor layer is formed around an end portion of the first via hole, and the second land portion of the second conductor layer is formed around an end portion of the second via hole.

* * * * *